United States Patent
Sieber et al.

(10) Patent No.: US 9,528,184 B2
(45) Date of Patent: Dec. 27, 2016

(54) ATOMIC-LAYER DEPOSITION METHOD USING COMPOUND GAS JET

(71) Applicant: Eastman Kodak Company, Rochester, NY (US)

(72) Inventors: Kurt D. Sieber, Rochester, NY (US); Kam Chuen Ng, Rochester, NY (US); Ronald Steven Cok, Rochester, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 28 days.

(21) Appl. No.: 14/621,428

(22) Filed: Feb. 13, 2015

(65) Prior Publication Data
US 2016/0237564 A1   Aug. 18, 2016

(51) Int. Cl.
  *C23C 16/455* (2006.01)
  *C23C 16/458* (2006.01)
(52) U.S. Cl.
  CPC ....... *C23C 16/45525* (2013.01); *C23C 16/458* (2013.01); *C23C 16/4551* (2013.01)
(58) Field of Classification Search
  None
  See application file for complete search history.

(56) References Cited

U.S. PATENT DOCUMENTS

| | | |
|---|---|---|
| 3,368,760 A | 2/1968 | Vaalimaa et al. |
| 3,416,730 A | 12/1968 | Perry |
| 3,466,079 A | 9/1969 | Mammel |
| 3,627,590 A | 12/1971 | Mammel |
| 4,196,437 A | 4/1980 | Hertz |
| 4,302,311 A | 11/1981 | Lowe et al. |
| 4,378,209 A | 3/1983 | Berge et al. |
| 4,969,676 A | 11/1990 | LaMagna |
| 5,067,762 A | 11/1991 | Akashi |
| 5,096,017 A | 3/1992 | Rey et al. |
| 5,155,062 A | 10/1992 | Coleman |
| 5,370,709 A | 12/1994 | Kobayashi |
| 5,470,420 A | 11/1995 | Yokajty |

(Continued)

FOREIGN PATENT DOCUMENTS

| | | |
|---|---|---|
| WO | 96/29446 | 9/1996 |
| WO | 02/100558 | 12/2002 |

OTHER PUBLICATIONS

Hashimoto JP-620744 04-078130 07-1990—original and English translation.*

(Continued)

*Primary Examiner* — Joseph Miller, Jr.
(74) *Attorney, Agent, or Firm* — William R. Zimmerli; Kevin E. Spaulding

(57) ABSTRACT

A method for depositing a thin film on a substrate using atmospheric pressure atomic-layer deposition includes providing a chamber having an atmosphere and a stationary support located in the chamber. The moveable substrate is located in a spatial relationship with the stationary support. A pressurized compound fluid flow, including an inert fluid surrounding a reactive fluid, is provided simultaneously through the stationary support that impinges on at least a portion of the moveable substrate to fluidically levitate the moveable substrate and expose the moveable substrate to the compound fluid flow to deposit a thin film on the moveable substrate.

19 Claims, 27 Drawing Sheets embodiment of fluidic levitation apparatus with compound coaxial jet

(56) References Cited

U.S. PATENT DOCUMENTS

| | | | |
|---|---|---|---|
| 5,492,566 | A | 2/1996 | Sumnitsch |
| 5,967,578 | A | 10/1999 | Frey |
| 6,206,976 | B1* | 3/2001 | Crevasse .......... C23C 16/45521 118/500 |
| 6,377,387 | B1 | 4/2002 | Duthaler et al. |
| 6,601,888 | B2 | 8/2003 | McIlwraith |
| 6,699,356 | B2 | 3/2004 | Bachrach et al. |
| 6,805,749 | B2 | 10/2004 | Granneman et al. |
| 7,037,854 | B2 | 5/2006 | Bachrach et al. |
| 7,312,156 | B2 | 12/2007 | Granneman et al. |
| 7,328,617 | B2 | 2/2008 | Miyachi et al. |
| 7,794,634 | B2 | 9/2010 | Ripoll et al. |
| 8,057,602 | B2 | 11/2011 | Koelmel et al. |
| 8,361,413 | B2 | 1/2013 | Mott et al. |
| RE44,508 | E | 9/2013 | Ripoll et al. |
| 2004/0067641 | A1 | 4/2004 | Yudovsky |
| 2004/0142558 | A1 | 7/2004 | Granneman et al. |
| 2004/0182316 | A1 | 9/2004 | Watanabe |
| 2005/0221002 | A1* | 10/2005 | Nakamura .......... C23C 16/4581 427/248.1 |
| 2006/0220248 | A1* | 10/2006 | Suzuki ................ C23C 16/045 257/751 |
| 2007/0215437 | A1 | 9/2007 | Cassagne |
| 2008/0122151 | A1 | 5/2008 | Ito et al. |
| 2009/0081886 | A1* | 3/2009 | Levy ................ C23C 16/45551 438/790 |
| 2009/0130858 | A1 | 5/2009 | Lev |
| 2011/0263123 | A1* | 10/2011 | Gomi ................ C23C 16/16 438/681 |
| 2012/0203315 | A1 | 8/2012 | Kolberg et al. |
| 2014/0027952 | A1 | 1/2014 | Fan et al. |
| 2014/0035975 | A1 | 2/2014 | Essien et al. |

OTHER PUBLICATIONS

"Vapor Levitation Epitaxial Growth of InGaAsP Alloys Using Trichloride Sources" by H.M. Cox, S.G. Hummel and V.G. Keramidas, Inst. Phys. Conf. Ser. No. 79: Chapter 13, p. 735 (1986).

"Vapor Levitation Epitaxy: System Design and Performance" by H.M. Cox, S.G. Hummel and V.G. Keramidas, J. Crystal Growth 79(1986) 900-908.

"Vapor Levitation Epitaxy Reactor Hydrodynamics" by J.S. Osinski, S.G.Hummel and H.M. Cox, Journal of Electronic Materials 16(6) (1987) 397-403.

"Grasping leather plies by Bernoulli grippers", by Dini, Fantoni, and Failli (G. Dini, G. Fantoni, and F. Failli ; CRIP Annals, Manufacturing Technology 58 (2009) 21-24).

"Analysis of vortex levitation"; by X. Li, K. Kawashima, and T. Kagawa; Experimental Thermal and Fluid Science, 32 (2008) 1448-1454).

"Particle image velocimetry studies on the swirling flow structure in the vortex gripper", by Wu, Ye, and Meng; Proceedings of the Institution of Mechanical Engineers, Part C , Journal of Mechanical Engineering Science 0(0),(2012)1-11; DOI :10.1177/ 0954406212469323).

"Levitation in Physics" by E.H. Brandt (Science vol. 243, p. 349-355, 1989).

"Inertial Levitation" by A.D. Fitt, G. Kozyreff, and J.R. Ockendon; Journal of Fluid Mechanics (J. Fluid Mech. (2004) vol. 508, pp. 165-174; p. 172.

"A liquid compound jet" (J. Fluid Mech. (1983), by Hertz and Hermanrud in 1983, vol. 131, pp. 271-287).

"Bernoulli levitation", Chris Waltham, Sarah Bendall, Andrzej Kotlicki; Am. J. Phys. 71 (2), Feb. 2003.

"Area selective atomic layer deposition of titanium dioxide: Effect of precursor chemistry", by Ashwini Sinha, Dennis W. Hess and Clifford L. Henderson, J. Vac. Science Technology B24(6), Nov./ Dec. 2006, pp. 2523-2532.

"MOCVD process model for deposition of complex oxide ferroelectronic thin films", by Tompa, Colibara-Evulet, Cuchiaro, Provost, etc, Integrated Ferroelectrics, 2001, vol. 36, pp. 135-152.

* cited by examiner

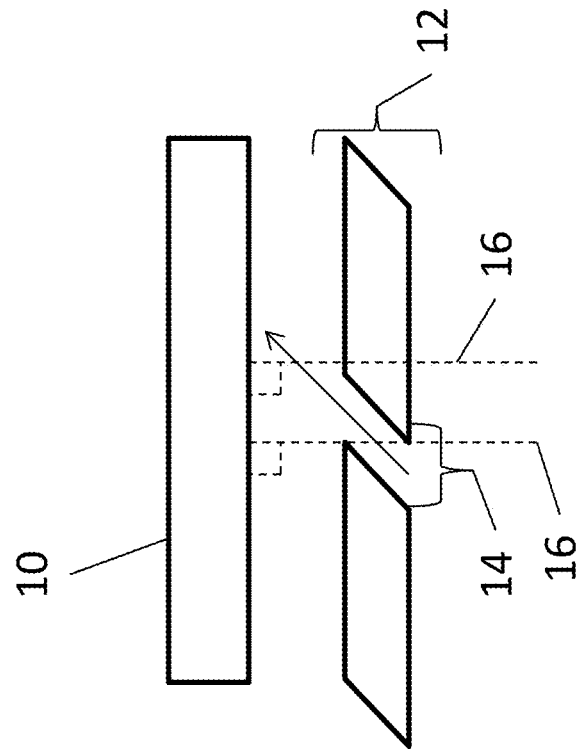
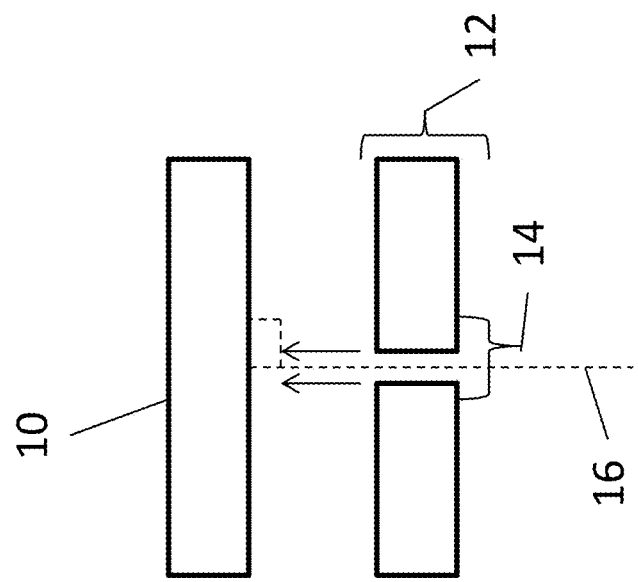
Figure 1 - Prior Art

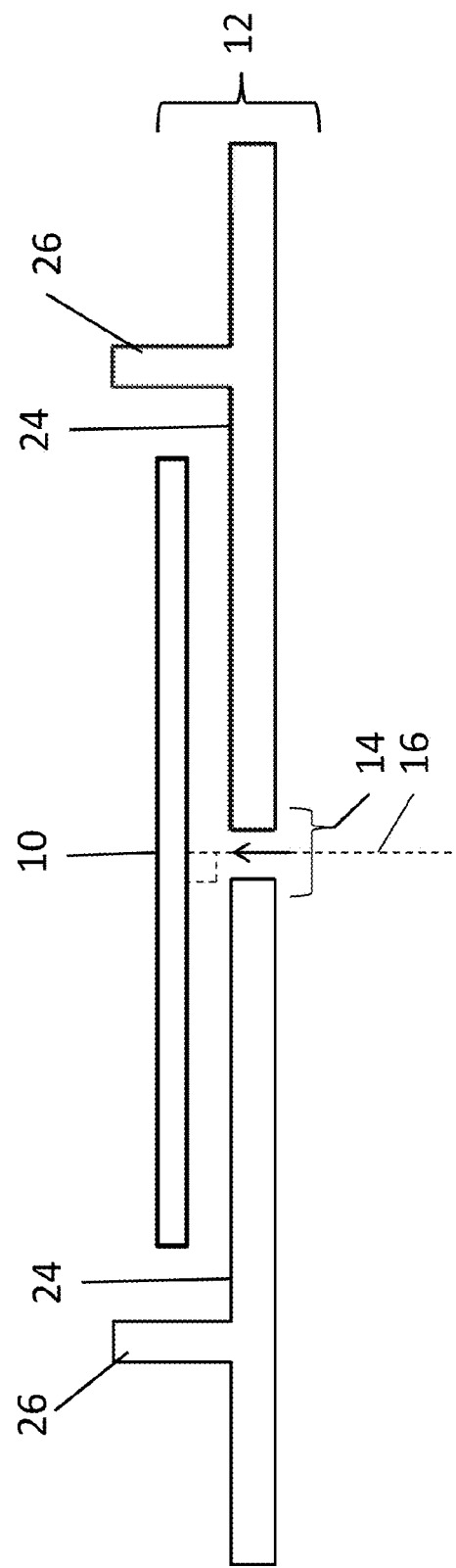

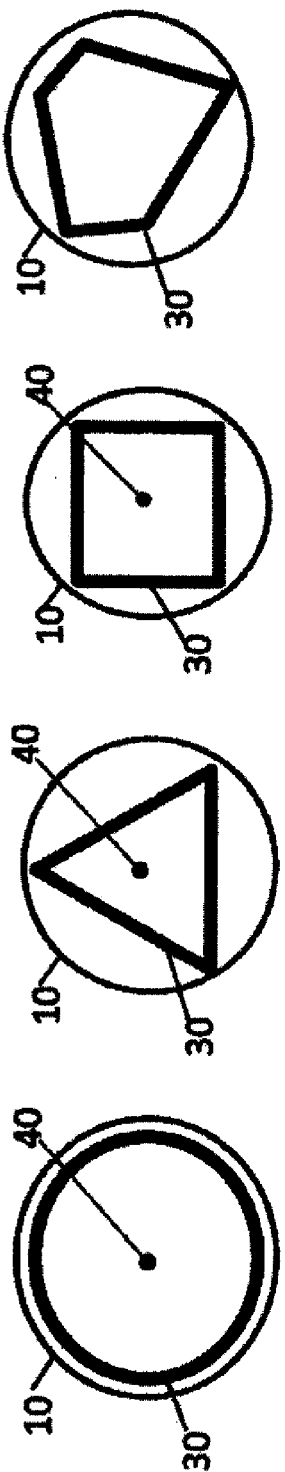
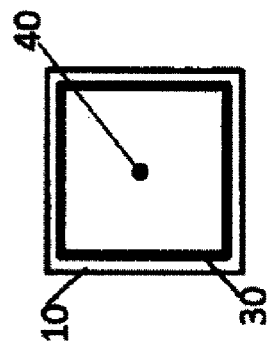
Figure 5d
Figure 5h
Figure 5c
Figure 5g
Figure 5b
Figure 5f
Figure 5a
Figure 5e

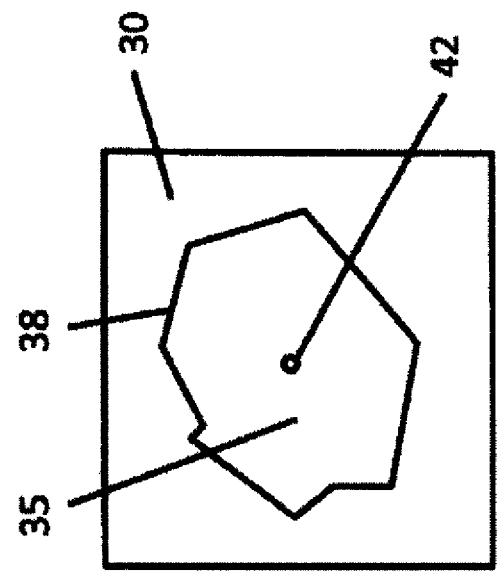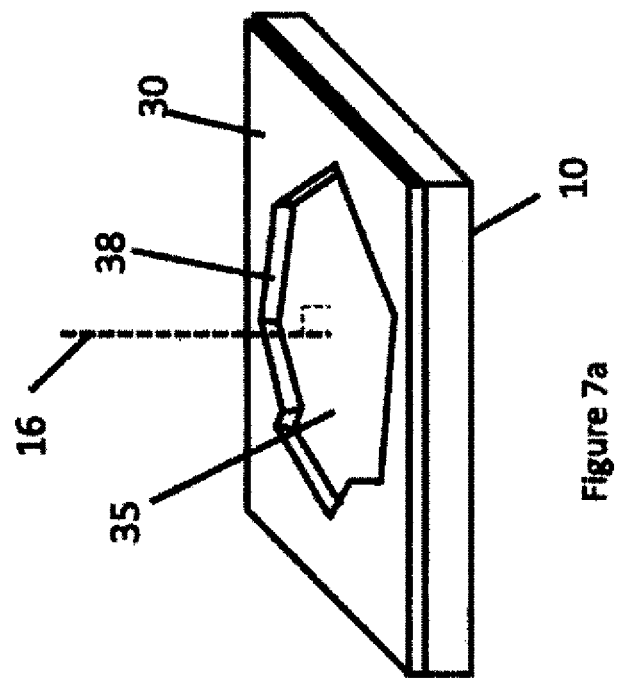

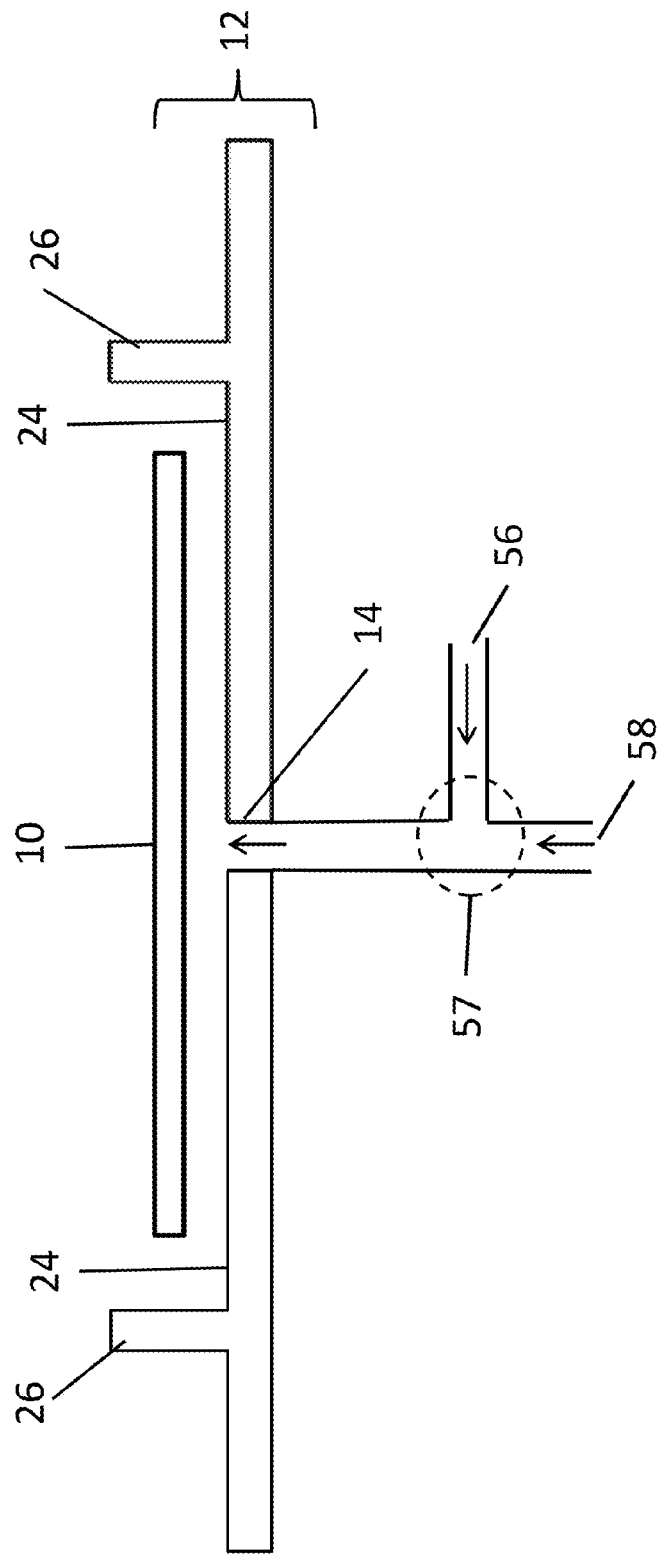
Figure 11 – prior art

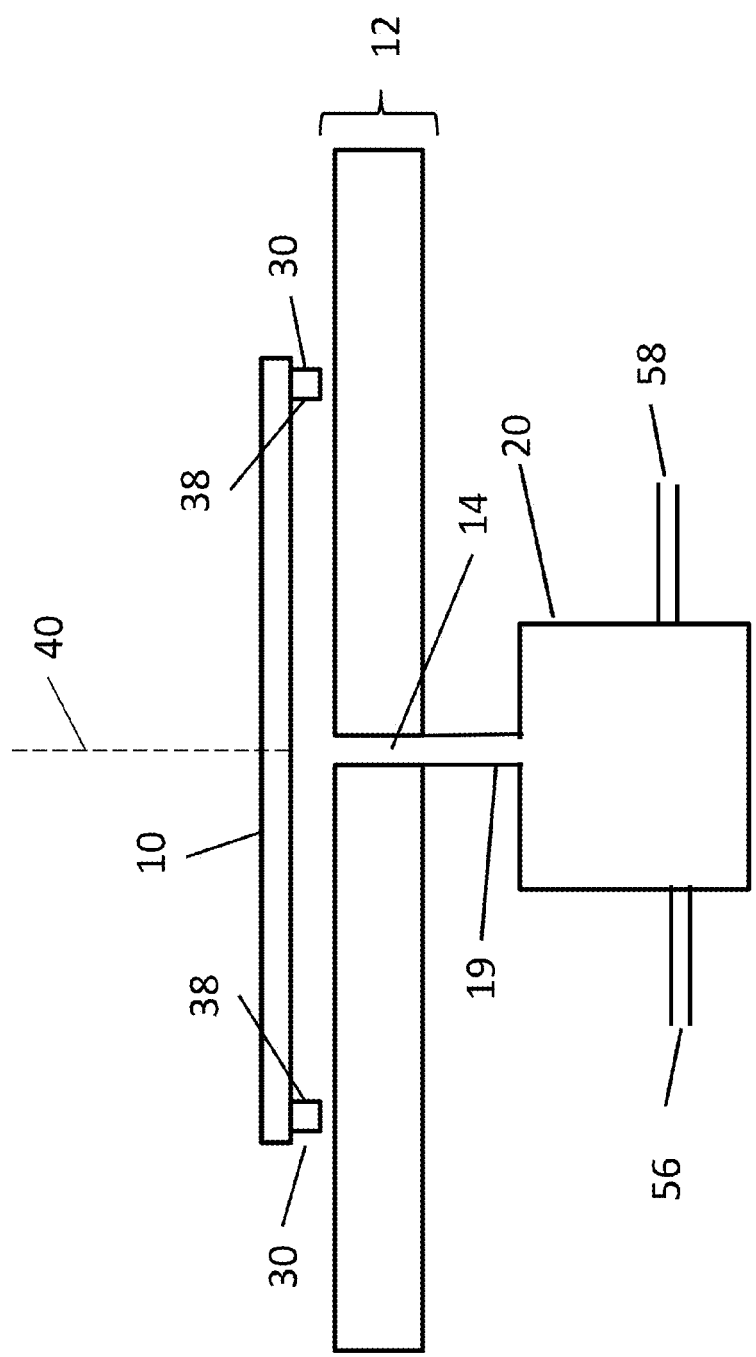
Figure 12 – inventive method

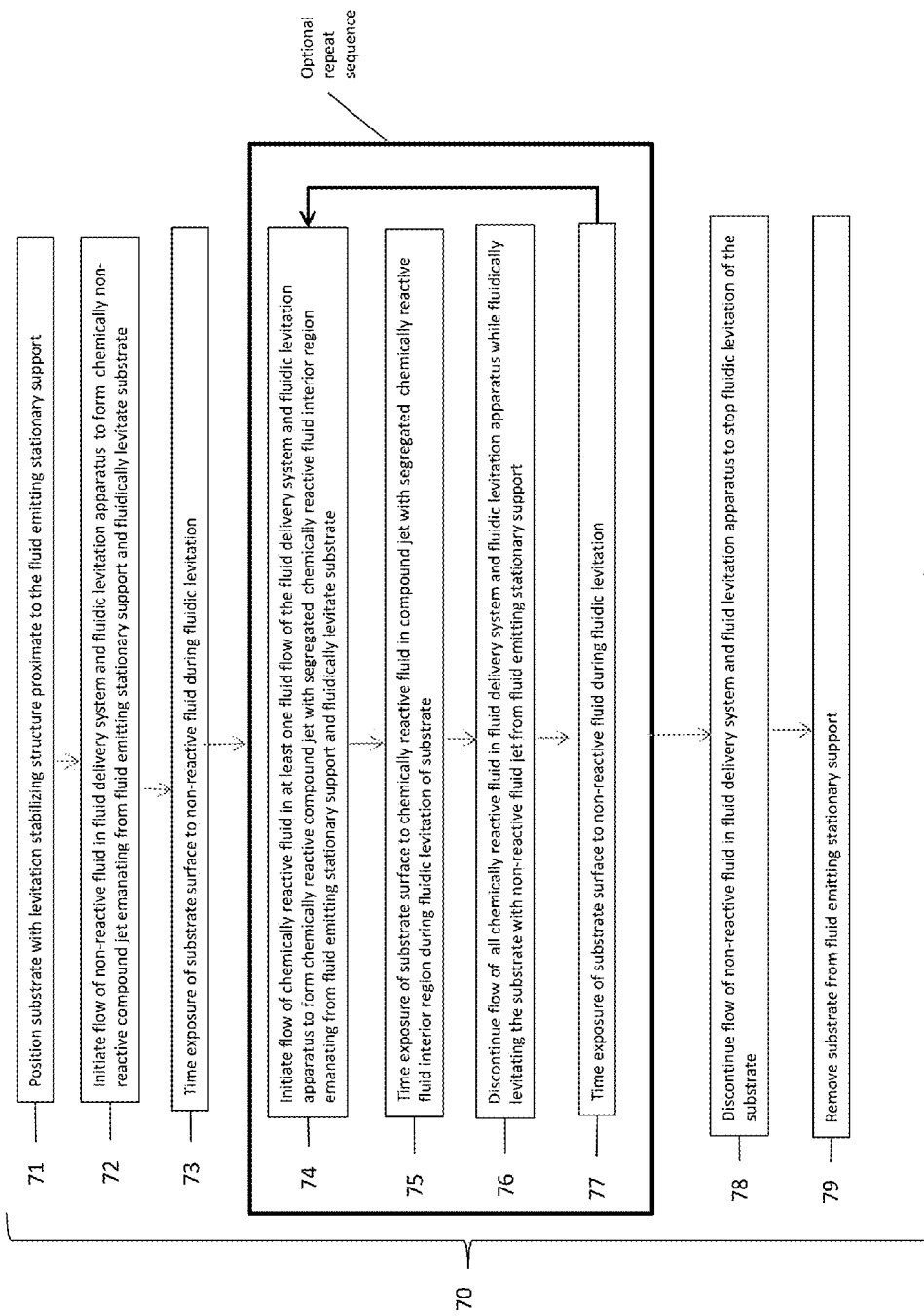
Figure 14 – process step diagram

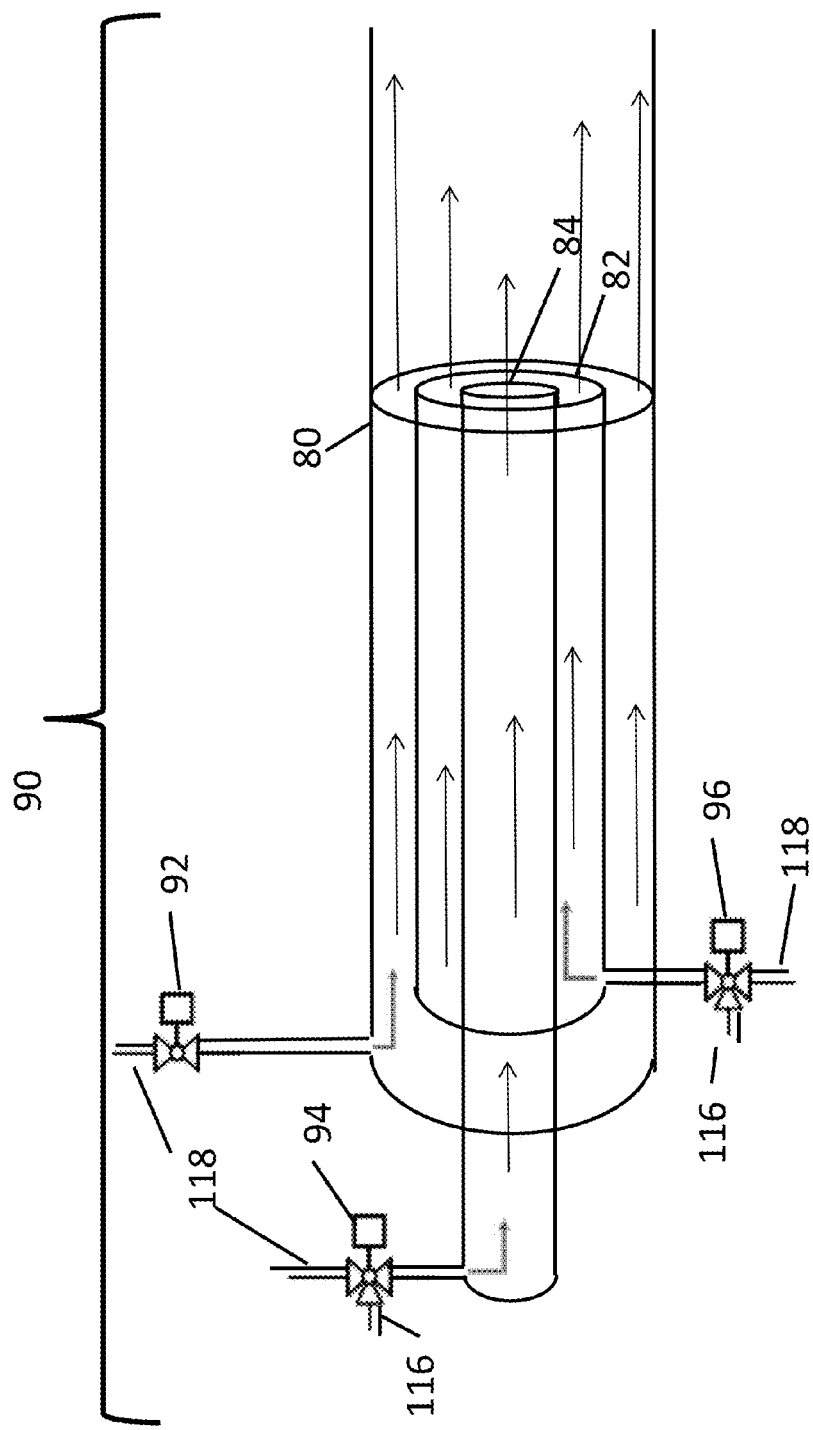
Figure 16- coaxial compound fluid flow delivery assembly

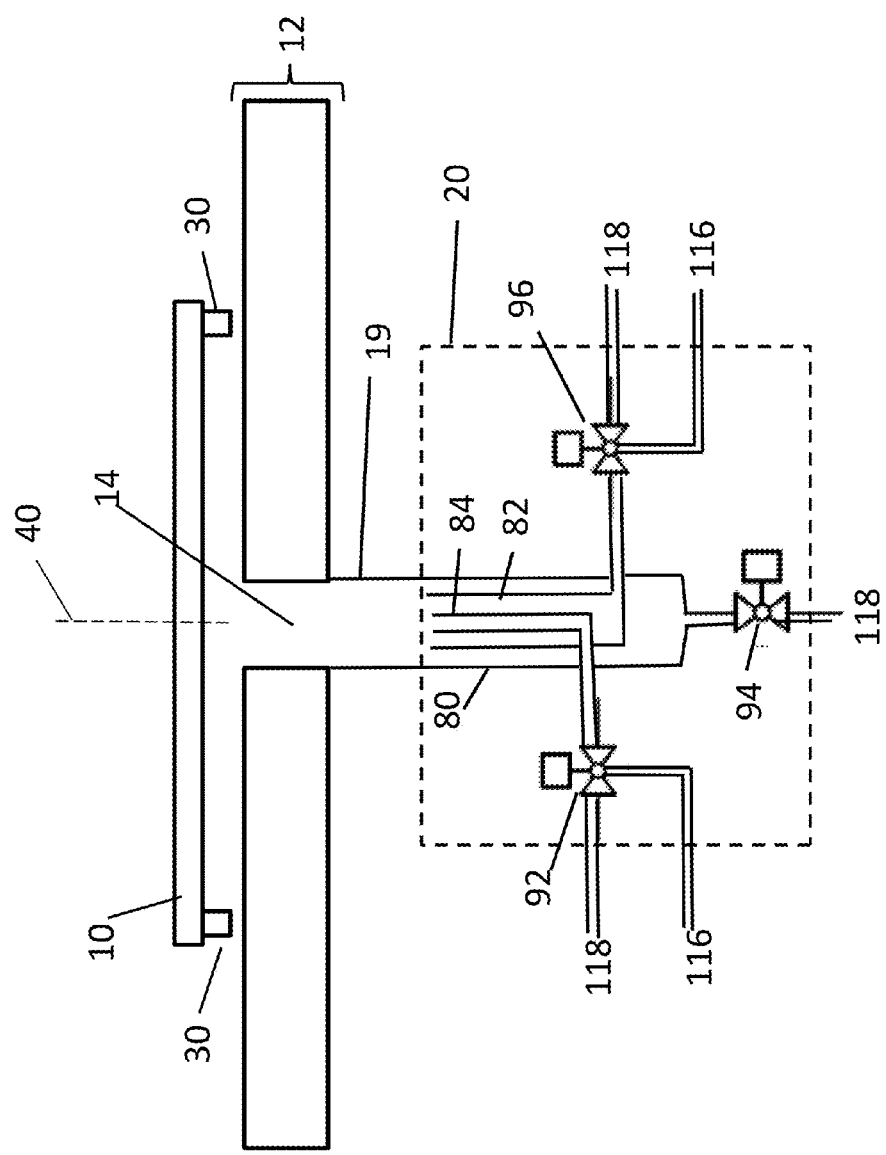
Figure 17 – embodiment of fluidic levitation apparatus with compound coaxial jet

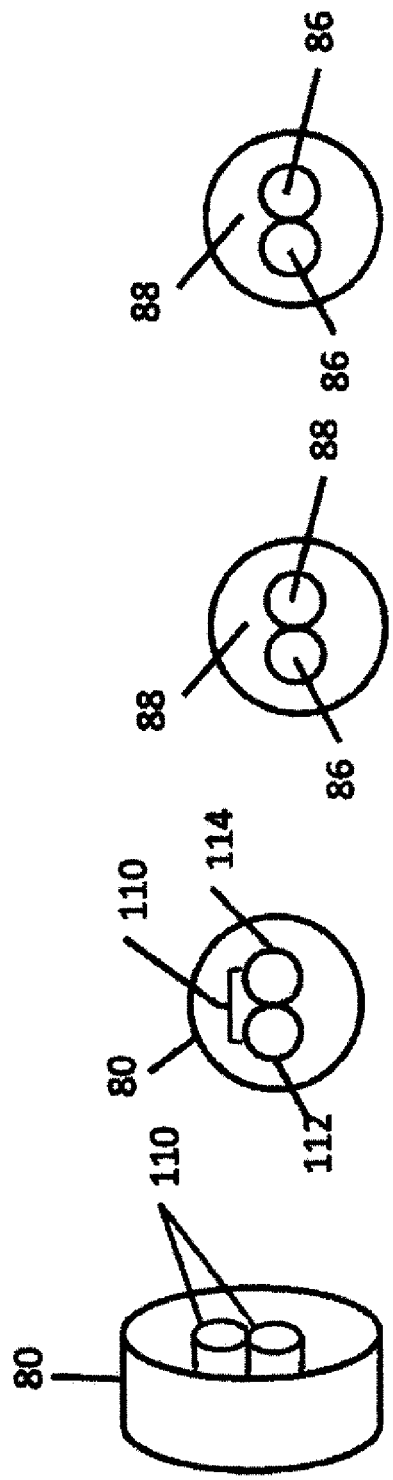

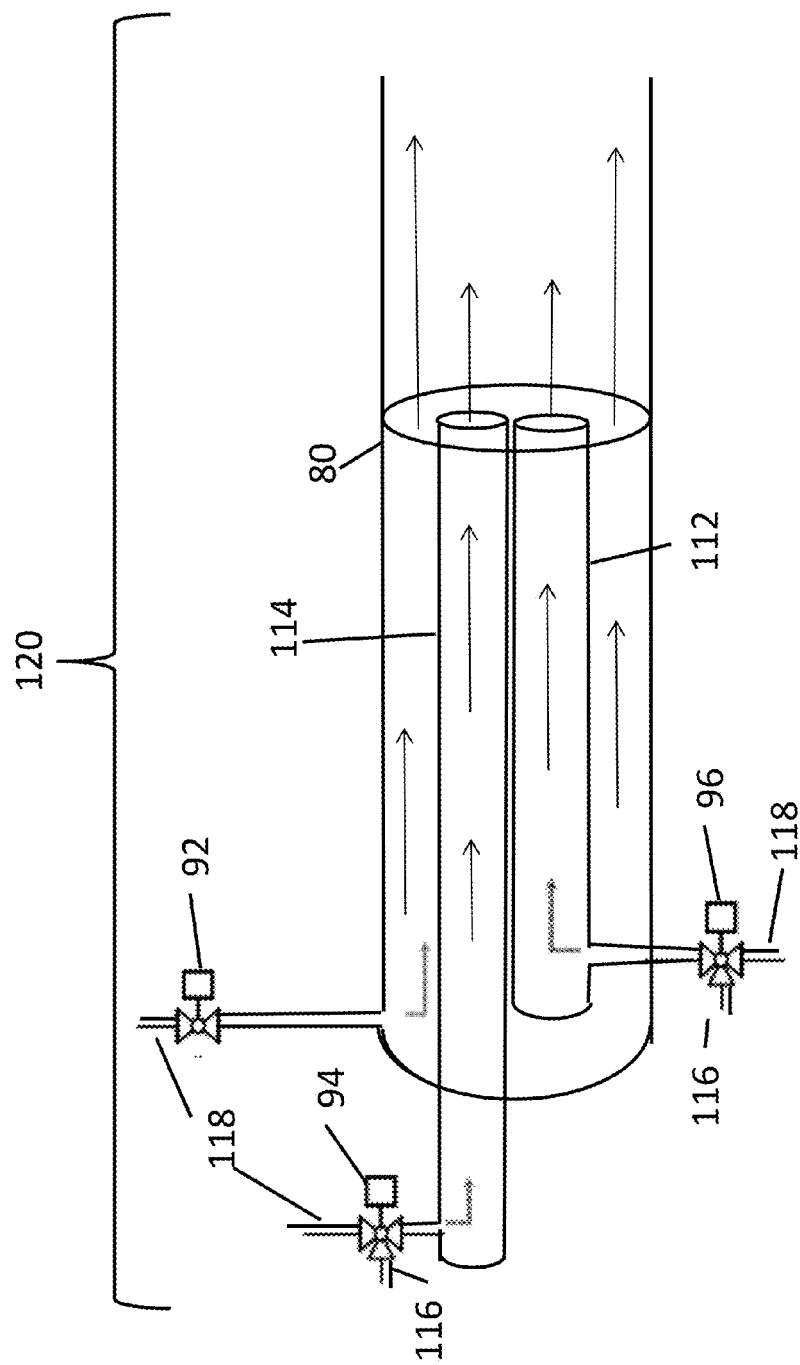
Figure 19- collinear compound fluid flow delivery assembly

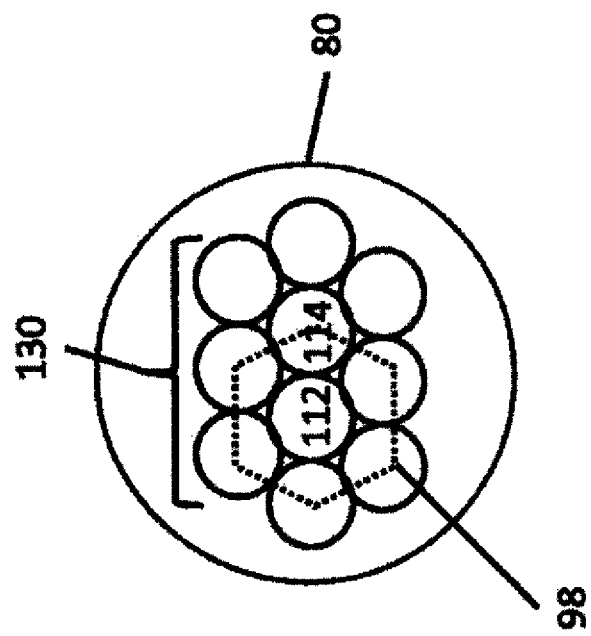
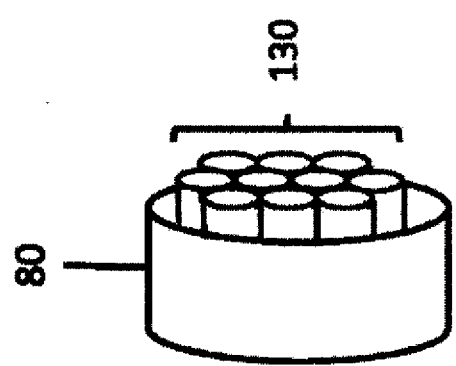
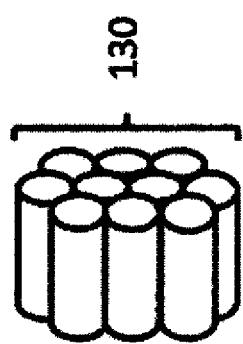

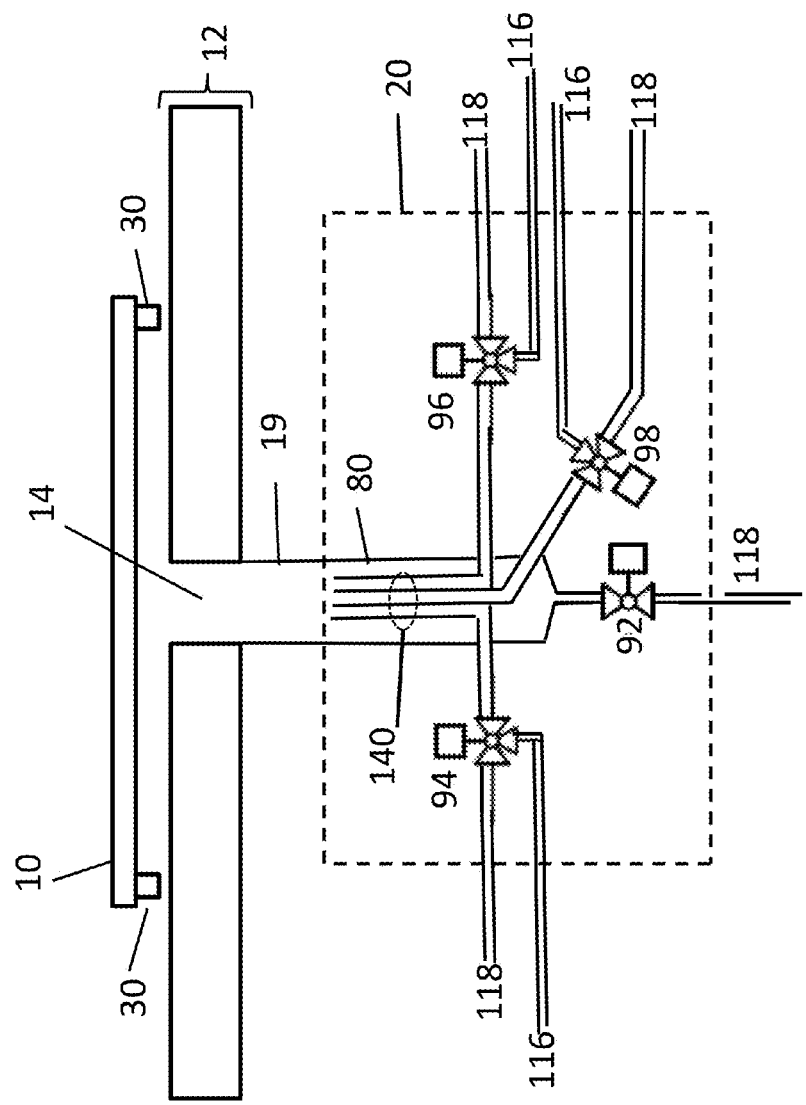
Figure 21 – apparatus with compound collinear jet

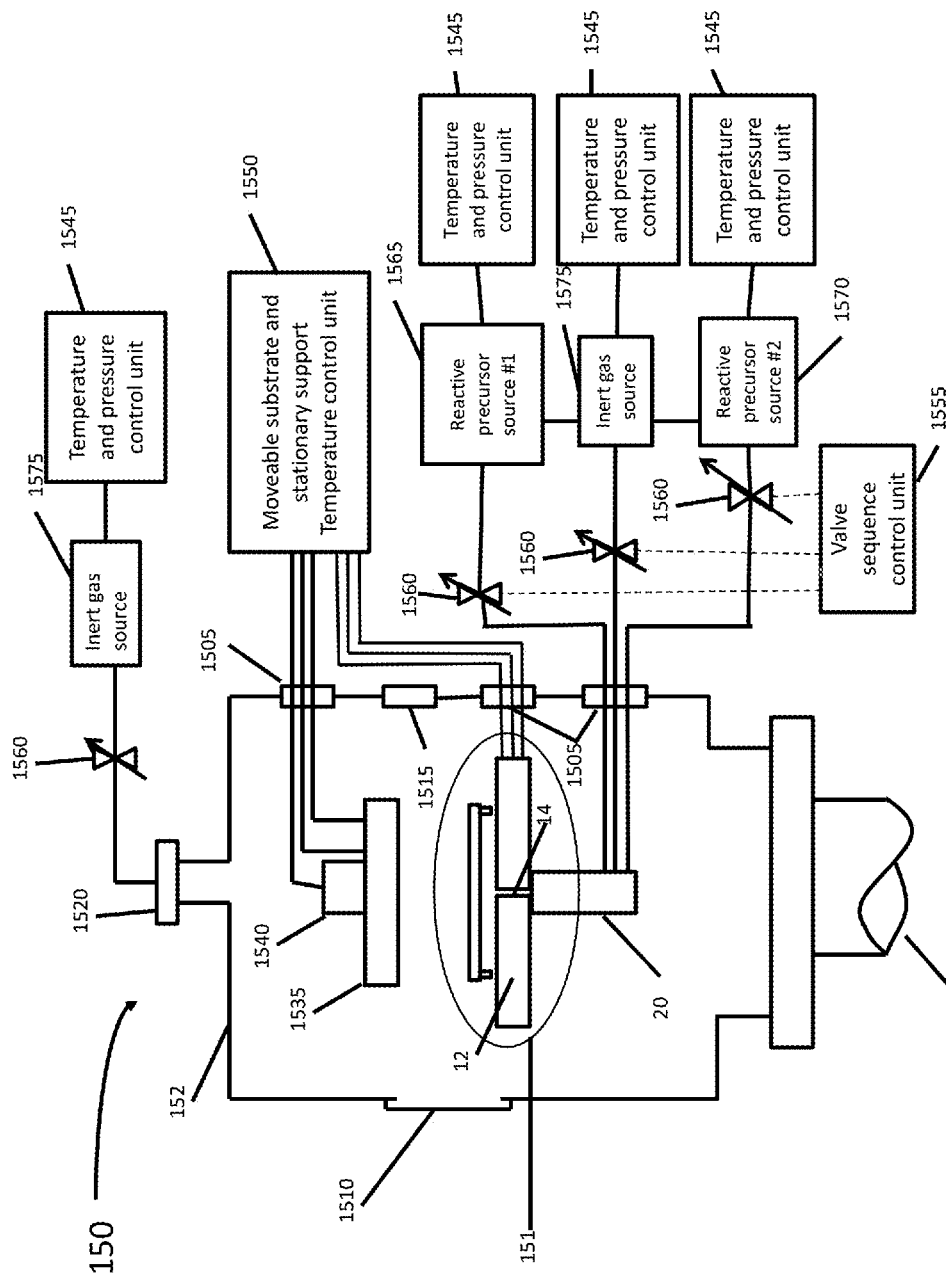
Figure 22 – Process chamber

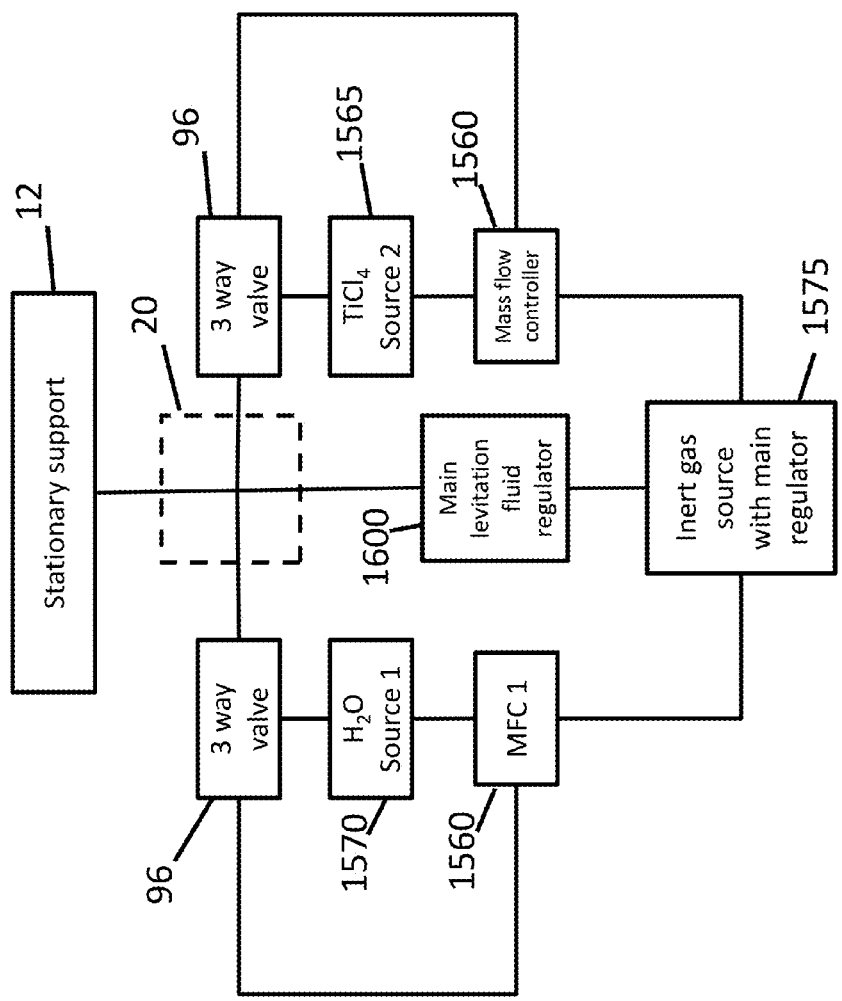
Figure 23 – fluid delivery schematic for example 15

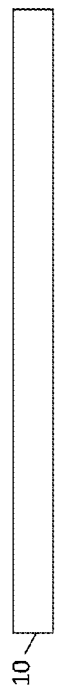
Figure 24a
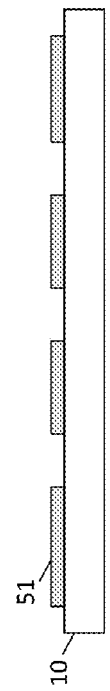
Figure 24b
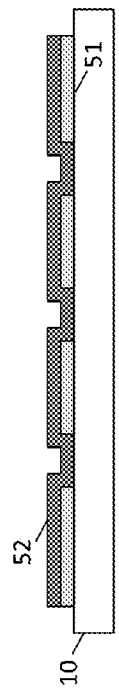
Figure 24c
Figure 24d
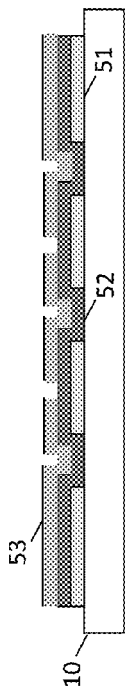
Figure 24e
Figure 24f
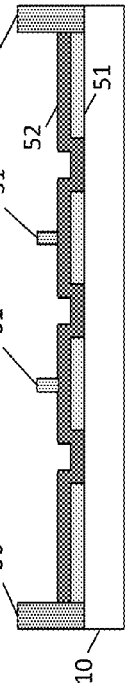
Figure 24g

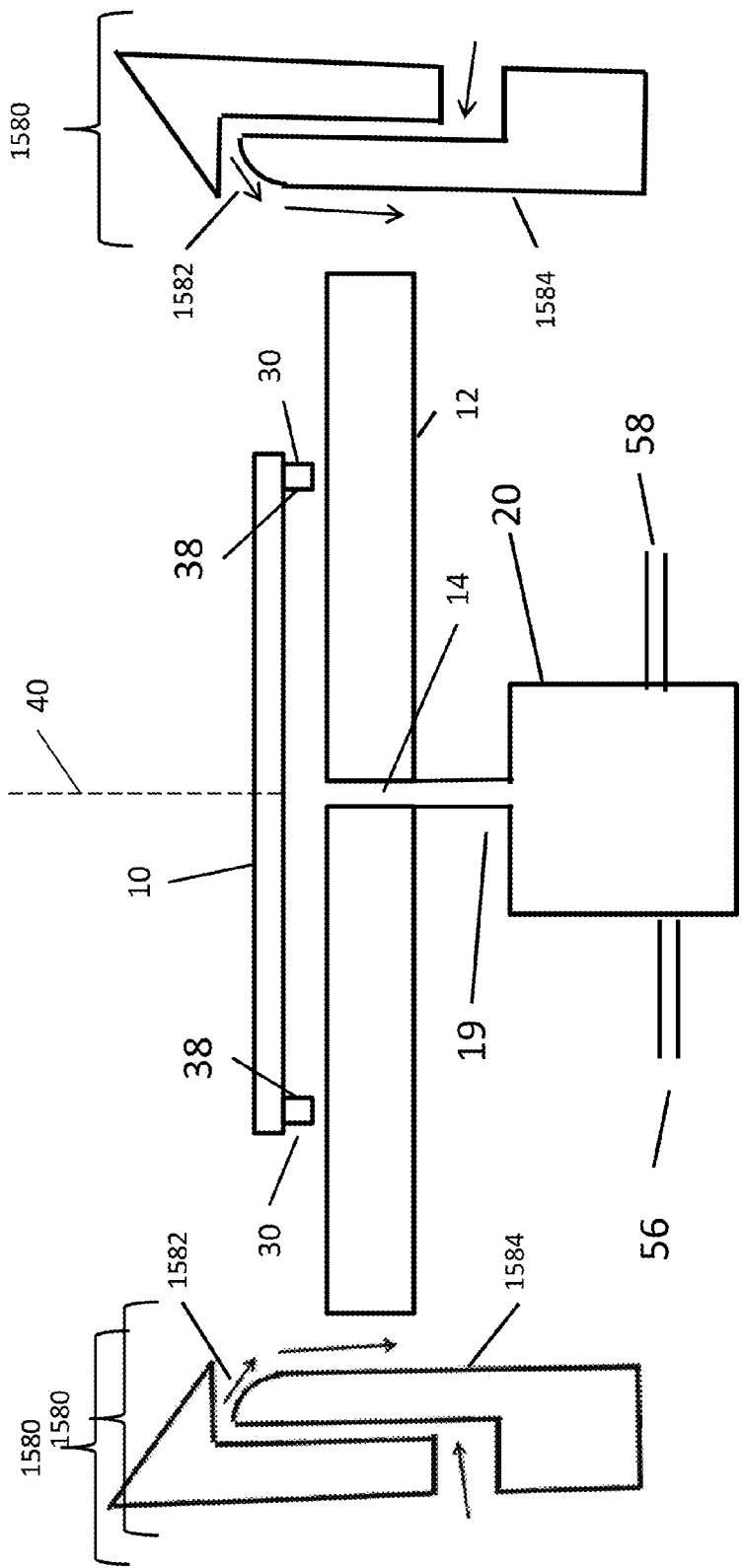
Figure 25 — flow control structure

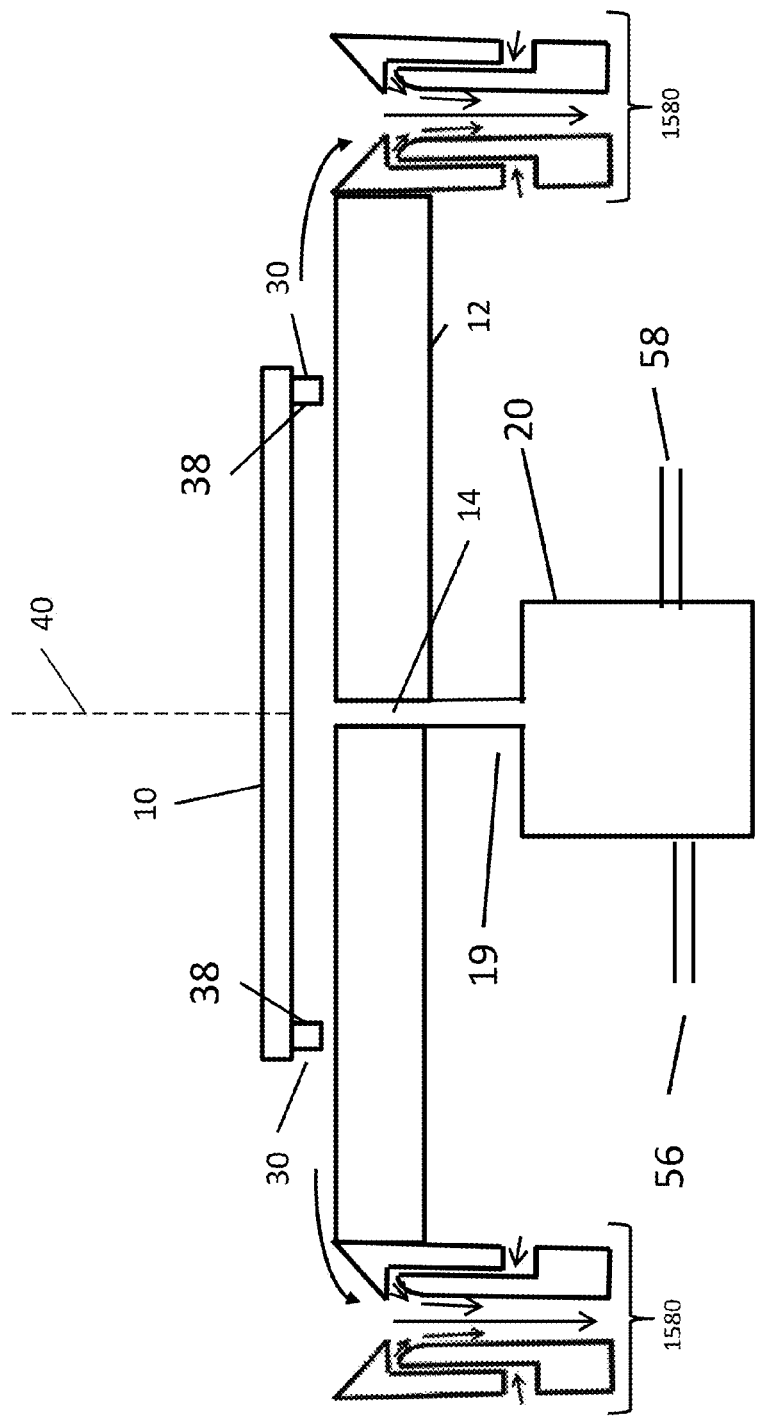
Figure 26 – flow control structure

ATOMIC-LAYER DEPOSITION METHOD USING COMPOUND GAS JET

CROSS REFERENCE TO RELATED APPLICATIONS

Reference is made to commonly-assigned, U.S. patent application Ser. No. 14/621,423, entitled "ATOMIC-LAYER DEPOSITION APPARATUS", Ser. No. 14/621,426, entitled "ATOMIC-LAYER DEPOSITION APPARATUS USING COMPOUND GAS JET", Ser. No. 14/621,432, entitled "ATOMIC-LAYER DEPOSITION SUBSTRATE", Ser. No. 14/621,437, entitled "COATING SUBSTRATE USING BERNOULLI ATOMIC-LAYER DEPOSITION", all filed Feb. 13, 2015.

FIELD OF THE INVENTION

The present invention relates to methods, equipment, and structures for depositing atomic layers on a substrate by employing Bernoulli effects.

BACKGROUND OF THE INVENTION

In general, the processing of substrates refers to the various steps performed or carried out to modify either the surface of a substrate material layer, the material layer of substrate itself, or both the surface of the material layer of the substrate and the material layer of the substrate itself in order to modify and change the functionality of the substrate for a specific purpose. The change in functionality of the substrate is often the result of a modification or change in either the actual properties of the material layer of the substrate itself or a change in the actual properties of surface of the material layer of the substrate. The steps performed during substrate processing may be straightforward. For example, a substrate may be heated to either relieve stress by thermal relaxation or to change the physical hardness of the substrate. In both cases changes in the physical properties of the entire substrate material layer and surface take place. In another example of substrate processing, the surface of the substrate material layer may be cleaned using any means known in the art, such as, for example exposure of the substrate material layer to a combination of ultraviolet light and ozone gas, in order to achieve a demonstrable change in an easily measured metric like contact angle when wetted by a drop of a fluid of known surface tension. The processing of the substrate material layer by means of exposure to ultraviolet light and ozone gas is employed to modify the wetting properties of the surface substrate thereby affecting a change in the surface energy of the surface of the substrate material layer. Processing of substrates may be more complicated, involving steps associated with changing the functionality of the material layer substantially by modifying the chemical composition of the surface of the substrate material layer or the material layer of the substrate itself. In particular, the processing of substrates may result in changes in functionality of the substrate or substrate surface that include alteration of the physical properties of the near surface region of the substrate to achieve desirable physical properties such as increased conductivity or increased resistivity, specific optical properties, specific surface energy, specific chemical reactivity, improved surface topography, and the like. Substrate processing to modify the surface of a substrate is well known in the art of fabrication of integrated circuits where the processing steps and sequences of processing steps have specific purposes. For example, deposition processing, often referred to just as "deposition", may be used to alter the surface composition of a substrate by adding a material layer to a substrate surface by means of a wide variety of methods known in the art for adding a material layer to a surface. Methods for adding a material layer to a substrate or support are well known to those familiar with the art of deposition, can be highly specialized, encompassing a vast array of technologies, and can include such methods as, for example, physical vapor deposition by evaporation and sputtering, chemical vapor deposition, plasma enhanced chemical vapor deposition, electrostatic mist deposition, electrochemical deposition (plating), electroless deposition, spin coating, hopper coating, gravure coating, flexographic printing, silk screen printing, deposition by brush application or spray, electro-spray, thermal plasma, and the like.

Deposition processing is known as an additive processing method because a material layer is added to the surface of the substrate material layer or substrate surface, resulting in a film of measurable thickness placed over and in contact with the substrate surface. Similarly, there is subtractive processing accomplished by means of subtractive processes, that is used to change the functionality of substrate surface by removing a measurable quantity of a material from the substrate surface. Examples of subtractive processes familiar to those knowledgeable in the art of subtractive processing include plasma etching and plasma stripping processes and chemistries, non-plasma based etching and stripping processes employing both the condensed and vapor phase etchant and/or stripping chemistries, electrochemical stripping processes, abrasive polishing processes, cleaning processes, sand blasting, grit blasting, and the like.

The terminology employed in the art for the material layer that is subjected to processes or undergoes processing is highly varied. In this document the material layer that is exposed to and removed from various processing steps and processes is called the substrate. Elsewhere in the art the material layer that undergoes processing is called the support, the workpiece, a slice, a wafer, an object, a web, and is also identified by numerous other terms. The context and description found in the art where the term describing the material layer undergoing processing occurs makes clear when the term "substrate" as employed here can be used interchangeably with the term employed in the art that is used to describe the material layer that is subjected to processes or undergoes processing.

Fluidic Levitation

The substrate processing quality is determined at least in part by the defect levels on the substrate after processing. There are many factors that can prevent acceptable substrate processing by introducing substrate defects. Two factors contributing to substrate defect levels after processing are particle contamination and substrate physical contact. Both particle contamination of the substrate surface and physical contact with either the substrate material layer or the substrate surface can lead to unacceptable substrate defects, some of which are manifest as defects in the uniformity of the surface properties of the substrate after processing. The measurement of the number of defects by any known method such as, for example, light scattering from the surface of the substrate, is known as defectivity. In substrate processing applications where it is important to control defectivity, effort has been made to develop methods that minimize particle contamination and physical contact with the substrate surface. Examples of processes where it is important to control defectivity are optical film deposition, deposition of encapsulation films, and integrated circuit manufacture. In these examples, the substrate may be planar and plate-like, non-planar with complex surface features, spherical, or spheroidal. An example of a planar or plate-like substrate would be a silicon wafer or a glass plate upon which integrated circuit elements are fabricated. An example of a non-planar substrate with a complex shape would be a lens upon which an antireflection film is deposited. A substrate may also be flexible, for example, like a web of polymer film, a flexible web of glass, a long ribbon of metal, or a large sheet of glass. An example of a substrate that is flexible and non-planar is a spool of wire that is to be cleaned prior to application of an electrically insulating coating using additive processing. The desire to minimize particle contamination of the substrate surface and eliminate physical contact with the sample during processing has led to the development of specialized substrate handling methods based on fluidic levitation.

In general, flows of gases over a surface are known and in particular Bernoulli effects are known. Levitation refers to the process of suspending an object in a medium without the use of physical supports contacting the object. In the scientific literature, levitation is the process by which an object is suspended by a physical force, against the force of gravity, in a stable position without the use of physical contact. Fluidic levitation refers to the process of levitation where the physical force suspending the object in a stable position against the force of gravity is produced by means of a fluid said fluid being a moving fluid or a stationary fluid. Fluidic levitation can employ different types of fluids, said fluid being either gaseous compressible fluids or condensed non-compressible liquids. The term compressible refers to a fluid whose density is strongly pressure dependent.

For the purposes of the invention the term "moveable substrate" refers to a substrate that undergoes positional displacement during fluidic levitation upon exposure to a fluidic flow employed for the purpose of inducing fluidic levitation of the substrate and opposing the force of gravity during said levitation state. The term "stationary support" refers to a stationary fluid emitting element that is employed for the purpose of supplying a fluidic flow, said fluidic flow being employed for the purpose of inducing fluidic levitation of the moveable substrate and producing fluidic forces opposing the force of gravity when the moveable substrate is in a levitated state. The term "support during levitation" means that the moveable substrate can be levitated by fluid flow emanating from the stationary support so that gravitational force on the moveable substrate is opposed by the force of a fluidic flow. In contrast to moveable substrates, conventional substrates are fixed in position during processing, for example, using mechanical restraints, vacuum chucks, or electrostatic chucks.

Fluidic levitation is useful for manipulating a substrate during processing and, as a method for sample manipulation, may encompass and advantageously enable many different varieties of substrate processing. There are many substrate processes that require exposure of the substrate surface to chemically reactive substances for the purpose of modifying or changing the properties of the substrate. The prior art disclosing substrate processing with fluidic levitation methods makes little mention of any issues associated with incorporating chemically reactive materials into the levitating fluid flow for the purpose of substrate processing. This is surprising because the problems associated with the handling, manipulation, and fluid transport of chemically reactive materials is well known. Some of these problems are 1) corrosion and dissolution of the materials of construction employed for the pumps, gauges, valves, tubing, and connections in the fluid delivery system leading to equipment failure and 2) deposit build-up at various locations in the fluid system from unintended side reactions of reactive species in the fluid with the materials of construction of the fluid delivery system which can lead to changes in the fluid flow and fluid pressure during fluid delivery system operation. Furthermore, the physical positions of substrates that are subject to fluidic levitation tend to be unstable and the substrate position is mechanically controlled. This mechanical control can induce particulate contamination or damage to the substrate.

U.S. Pat. No. 3,627,590 describes a method for processing a workpiece, for example, a slice of semiconductor material or a wafer of a semiconductor, by floating the substrate on a layer of gas during the series of processing steps required for thin-film processing. Two processes are disclosed in U.S. Pat. No. 3,627,590: heat treatment for enhanced diffusion of a dopant into a film and film deposition by means of thermal decomposition of a thermally unstable precursor. The layer of gas prevents physical contact with the workpiece during processing. The workpiece described in U.S. Pat. No. 3,627,590 is a substrate. U.S. Pat. No. 3,627,590 teaches that film deposition with thermally unstable precursors can be managed when the decomposition temperature of the precursor is high and the thermally decomposable precursor can be kept away from and isolated from portions of the equipment that operate at elevated temperature. However, U.S. Pat. No. 3,627,590 does not teach or disclose a method or apparatus to control and manage the reactivity of the fluid flow as it comes in contact with different surfaces of the fluid delivery system and associated equipment.

The apparatus described in U.S. Pat. No. 3,627,590 is called a pressurized fluid pickup device and is described further by Mammel in U.S. Pat. No. 3,466,079. In U.S. Pat. No. 3,466,079 the term "slice" is used to describe the substrate. According to U.S. Pat. No. 3,466,079 it is " . . . nearly impossible to center the exit orifice for the pressurized fluid over the support . . . . As a result, there is a force component tending to laterally shift the slice relative to the reference surface". This is another way of saying that, left to itself, the slice—which is the substrate—will shift and move laterally in a sidewise manner until none of the surface area of the slice is exposed to the pressurized fluid flow. Lateral motion means that the substrate moves horizontally in a sidewise manner that is parallel to the stationary support and the plane of the layer of gas upon which the substrate is floating. In other words, the lateral motion of the substrate slice moves the substrate away from the pressurized fluid emitting from the reference surface resulting in a failure of the sample to float on the gas layer. The problem identified by Mammel in U.S. Pat. No. 3,466,079 is one of uncontrollable lateral motion of the substrate during fluidic levitation because of the difficulty associated with positioning the substrate in the proper position over the pressurized fluid region. This problem is addressed in U.S. Pat. No. 3,466,079 by the use of physical contact with the substrate: "Shifting of the slice is limited by the lugs 25 with either the points 26 or the rounded ends 26". In both U.S. Pat. Nos. 3,627,590 and 3,466,079 the substrate is kept in place over the pressurized fluid flow by the use of stops or lugs to prevent the sample from shifting position during processing.

The scientific literature describes a method for substrate handling during processing known as "vapor levitation" in which the substrate floats on a cushion of gas emanating from a porous surface opposed to one of the substrate surfaces. This method of substrate handling differs from that described in U.S. Pat. No. 3,627,590 but possesses a commonality in the difficulty of maintaining the sample position during processing due to the frictionless nature of the gaseous floatation layer which enables non-contact processing. The method is described by H. M. Cox, S. G. Hummel and V. G. Keramidas in the following publications: 1) "Vapor Levitation Epitaxial Growth of InGaAsP Alloys Using Trichloride Sources" Inst. Phys. Conf. Ser. No. 79: Chapter 13, page 735 (1986); 2) "Vapor Levitation Epitaxy: System Design and Performance", J. Crystal Growth 79(1986) 900-908; 3) "Vapor Levitation Epitaxy Reactor Hydrodynamics" by J. S. Osinski, S. G. Hummel and H. M. Cox, Journal of Electronic Materials 16(6) (1987) 397-403. The fluid delivery system employed for vapor levitation epitaxy is described in detail by Cox, Hummel, and Keramidas in the article "Vapor Levitation Epitaxy: System Design and Performance" (J. Crystal Growth 79(1986) 900-908). Deposition processes that can occur in the fluid-delivery system are managed by operating the entire fluid-delivery system at elevated temperature and continually scrubbing by contacting the surfaces of the fluid delivery system with reactive gases to clean the surfaces of the fluid delivery system. The fluid-delivery system employed for fluidic levitation of a substrate and substrate processing disclosed in this art does not teach or disclose a method or apparatus to control and manage the reactivity of the fluid flow as it comes in contact with different surfaces of the fluid delivery system and associated equipment.

U.S. Publication No. 20080122151A1 by Ito, Niwa, and Saito titled "Levitation Unit with Tilting Function and a Levitation Device" describes a device comprised of a frictionless spherical joint enabling frictionless tilting of a porous gas emitting surface which is employed for vapor levitation to support large planar objects. The mechanical instability of the device described in U.S>Publication No. 20080122151A1 makes it difficult to see how the device can achieve fluidic levitation of a substrate body on the porous gas emanating surface and keep the substrate body in a stable position with little or no lateral movement.

U.S. Pat. No. 6,805,749B2 by Granneman et al. titled "Method and Apparatus for Supporting a Semiconductor Wafer During Processing" describes a method for contactless processing or treatment of a substrate such as a semiconductor wafer comprising enclosing the wafer in an apparatus and applying two gas streams in opposing directions from first and second side sections located opposite one another to the two opposing planar sides or surfaces of the wafers. Although the use of multiple gas streams or jets is mentioned as a means of providing the levitating fluidic flow, the preferred method of production of the gas streams is through the use of porous plates wherein the porous plates provide the gas passages to produce the gas streams that are used for vapor levitation according to the method described by Osinski, Hummel and Cox in Journal of Electronic Materials 16(6) (1987) 397-403. There is no teaching regarding elimination of lateral movement of the substrate in U.S. Pat. No. 6,805,749B2 and the method described suffers the same shortcomings common to all vapor levitation technology. U.S. Pat. No. 6,805,749B2 mentions that the problem of "supplying process gas at elevated temperature and more particularly when depositing layers is that the apparatus used to supply the process gas becomes contaminated by deposition of the material concerned from the process gas. This means that apparatuses of this type have to be cleaned regularly and that major problems arise with regard to clogging." [Col 3, lines 9-17] This problem is managed in U.S. Pat. No. 6,805,749B2 by operating the apparatus in a temperature region where minimal deposition can occur whilst not eliminating the problem. The fluid delivery system employed for fluidic levitation of a substrate and substrate processing disclosed in this art discloses the use of temperature control as a method to control and manage the reactivity of the fluid flow as it comes in contact with different surfaces of the fluid delivery system and associated equipment.

U.S. Pat. No. 6,805,749 B2 further teaches the use of the "Bernoulli principal" for substrate handling suggesting that the "the Bernoulli principle can be used by allowing the correct gas stream to flow against the top of the wafer. With this arrangement a reduced pressure is created beneath the wafer which reduced pressure ensures that the wafer will float (in a stable manner) beneath the top side section." U.S. Pat. No. 6,805,749 B2, contrary to all other prior art including the art of U.S. Pat. No. 3,466,079, claims that the substrate will "float (in a stable manner) beneath the top side section" in this arrangement. U.S. Pat. No. 6,805,749 B2 does not describe "the correct gas stream" and the specification of the document is insufficient to determine exactly what apparatus was employed to achieve the reported result. It is thoroughly clear that U.S. Pat. No. 6,805,749 B2 does not contain a description of any addition modification of the apparatus or disclose a specialized method that would enable vapor levitation with the sort of positional stability therein described, and thus teaches against the art disclosed by Mammel in U.S. Pat. No. 3,466,079 and others. U.S. Pat. No. 6,805,749 B2 also describes a method of achieving substrate rotation by altering gas emanating channels 10. Substrate rotation can be achieved by "positioning one or more of the channels 10 at an angle with respect to the vertical, as a result of which a spiral gas flow is generated." No further detail concerning substrate rotation is disclosed and it is unclear exactly how this rotation is implemented in the disclosed apparatus or whether stable rotation can be achieved using the disclosed apparatus.

U.S. Pat. No. 5,155,062 by Thomas G. Coleman entitled "Method for Silicon Carbide Chemical Vapor Deposition Using Levitated Wafer System" describes a method of chemical vapor deposition of silicon carbide on a substrate where the substrate is suspended in an upward flow of gas and heated using either induction heating or microwave heating to address control of the extremely high temperatures required to prepare the desired polytype of SiC on the substrate. The method of fluidic levitation is not well described and appears to be similar to that described in U.S. Pat. No. 3,627,590. No teaching on the preferred method of fluidic levitation is given in U.S. Pat. No. 5,155,062 and there is no detail on how reactive fluids are handled in the apparatus. U.S. Pat. No. 5,155,062 teaches the use of highly localized heating methods such as inductive heating of the substrate or microwave heating of the substrate to ensure that thermal decomposition of the precursor occurs only where elevated temperatures are present. The apparatus and method in this art discloses only the use of temperature control as a method to control and manage the reactivity of the fluid flow as it comes in contact with different surfaces of the fluid delivery system and associated equipment. Although not shown in the drawings, U.S. Pat. No. 5,155,062 explicitly calls out a "means for aligning the substrate . . . in the form of the supporting shoulders 12a" (FIG. 1). In FIG. 2 of U.S. Pat. No. 5,155,062 the suspended substrate that is fluidically levitated is located within a cavity that restrains the lateral movement of the substrate during fluidic levitation. FIGS. 1 and 2 in U.S. Pat. No. 5,155,062 indicate that Coleman recognized the difficulty in maintain the substrate in a suitable position during processing and resorted, as in the previous art, to the use of a physical restraint, in this case a "shoulder" on the substrate support or a cavity around the substrate in order to maintain the substrate in a stable position.

U.S. Pat. No. 5,370,709 by Norio Kobayashi titled "Semiconductor Wafer Processing Apparatus Having a Bernoulli Chuck" describes a method and apparatus for non-contact processing of a substrate using a pressurized gas flow method similar to that previously disclosed in U.S. Pat. No. 3,627,590. On a central portion of a suction plate in a reaction chamber, there is formed a blowing port for blowing gas to a rear surface of the suction plate. In the blowing port, there are provided pipes for introducing carrier gas and reactant gas. Gas, which is introduced by these pipes, and the suction plate are heated by a lamp formed in the outside of the reaction chamber. If gas introduced by these pipes and reactant gas are blown from the blowing port to the rear of the suction plate in a state that a semiconductor substrate is close to the portion in the vicinity of the suction plate, the semiconductor substrate is sucked to the suction plate in a noncontact state and an epitaxial layer is formed on the semiconductor substrate in this state.

The particular process disclosed in U.S. Pat. No. 5,370,709 involves the film formation on a pneumatically levitated substrate by means of thermal decomposition of a thermally decomposable volatile precursor. The apparatus disclosed uses a single orifice for delivery of the fluid flow containing the thermally decomposable reactive precursor. The thermally unstable gas phase reactant is injected into a preheated carrier gas near the fluid deliver orifice and col. 5, lines 39-41 reads "The reason why reactant gas is mixed with the preheated gas is to prevent the chemical reaction of reactant gas due to heat." It is apparent that Kobayashi recognized the issues involved in fluid delivery of reactant species during fluidic levitation.

Although the apparatus and method in U.S. Pat. No. 5,370,709 attempts to control the reactivity of the fluid flow by controlling the temperature of the fluid flow it is difficult to see how unintended deposition of the reactive precursor would not occur in the orifice itself during the semiconductor wafer processing operation since the orifice region is heated, also. With continued deposition in the heated vapor delivery orifice during equipment operation, the orifice will eventually block, resulting in equipment failure as the diameter of the orifice decreases with increasing deposition. Thus, U.S. Pat. No. 5,370,709 teaches the use of temperature control as a method to control and manage the reactivity of the fluid flow as it comes in contact with different surfaces of the fluid delivery system and associated equipment during fluidic levitation.

The initial "parallel plate" configuration disclosed in FIG. 1 of U.S. Pat. No. 5,370,709 has no physical restraints for lateral movement of the substrate during levitation and by virtue of its similarity with the apparatus described in U.S. Pat. No. 3,466,079 would suffer from the same problem of positional stability and lateral movement of the substrate during operation thereby resulting in a useless apparatus. All subsequent configurations disclosed in U.S. Pat. No. 5,370,709 employ the use of "stoppers" around the periphery of the substrate while it is floating on the fluid layer of gas to prevent lateral motion of the substrate and keep the substrate from sliding out of position on the nearly frictionless gaseous support layer. For example the description of FIG. 2 of U.S. Pat. No. 5,370,709 reads "The rear surface portion of the suction plate 26 is formed to be smooth and a stopper 31 is provided at four places in the periphery of the rear surface portion." Only two of these stoppers 31 are shown. The suction plate 26, the stopper 31, the pipes, 27, 28, 30 and the nozzle 29, are made of quartz respectively. Thus, U.S. Pat. No. 5,370,709 teaches the necessity of physical stops formed on the suction plate 26 to prevent lateral motion of the substrate during fluidic levitation.

The pneumatic levitation of spherical objects in a gaseous fluid flows is known. U.S. Pat. No. 4,302,311 entitled "Sputter Coating of Microspherical Substrates by Levitation" discloses pneumatic levitation of microspheres under reduced pressure conditions. The moveable substrate is a glass bead microsphere of varying weight and size and the gas-emanating stationary support has a complex structure. The stationary support provides a gas emanating from a collimated-hole structure held in place by an alignment spacer. The disclosure describes the use of shaped collimated hole structures to achieve pneumatic levitation of non-porous glass microbeads under low-pressure conditions. The collimated hole structure employed in U.S. Pat. No. 4,302,311 is a stationary porous gas emitting surface that is shaped with a depression that follows the spherical surface topography of the moveable microspherical substrate to be levitated. Gas uniformly flows underneath the spherical substrate during pneumatic levitation. In this case the ambient environment in which pneumatic levitation is performed is unusual and the ambient pressure during pneumatic levitation is below 500 mTorr—in other words, the pneumatic levitation was performed under reduced pressure conditions. The collimated-hole structure provides multiple parallel gas jets that are used for pneumatic levitation of the microspherical substrates and the gas-emanating collimated-hole structure is "dimpled"—meaning that is has depressions in which the glass microspheres sit. The "dimpled" structure can be hemispherical, cylindrical, or conical. The height of the microspherical substrate above the bottom of the dimple is monitored during pneumatic levitation. The parallel gas jets from the collimated hole structure as well as physical barriers around the gas emitting depressions help keep the microspherical substrates in a stable position during pneumatic levitation and the reactive fluid comprised of a sputtered flux of metal species employed for depositing metal films on the levitating microspherical substrates is incident normal to the collimated hole structure, directly opposing the fluid flow of the levitating jets from the collimated hole structure. The "dimples" of the gas emanating collimated hole structure—meaning the depressions in which the glass microspheres sit—are actually a means of providing a physical stop to keep the spherical substrate in place during pneumatic levitation. The alignment spacer also provides an additional second physical stop that keeps the microspheres in place during pneumatic levitation. U.S. Pat. No. 4,302,311 is an example of managing the reactivity of a fluid flow in a fluid delivery system by means of opposing fluid flows that prevent contact between a reactive fluid and a critical component of the fluid delivery system used for substrate levitation. It is disclosed in the scientific literature and the levitation art dating prior to that of U.S. Pat. No. 4,302,311 that spherical objects will exhibit stable levitation with rotation in a directional gas flow of sufficient velocity and volumetric flow.

U.S. Pat. No. 4,378,209 by Berge, Oran, and Theiss titled "Gas levitator having fixed levitation node for container-less processing" discloses a method and apparatus for processing spherical objects during pneumatic levitation where the levitation is accomplished by use of an "elongated levitation tube having contoured interior in the form of convergent section 12, constriction 15, and divergent section 14 wherein the levitation node 16 is created". The elongated levitation tube with levitation node is disclosed to be suitable for containerless processing of pneumatically levitated spheres and right circular cylinders. The walls of the elongated levitation tube in U.S. Pat. No. 4,378,209 provide physical stops and a means of confinement of the sample during establishment of pneumatic levitation in the levitation node of the apparatus. It is known in the open scientific literature and the art of fluidic levitation that solid spherical objects can be stably levitated in a fluidic flow of sufficient velocity and volumetric flow when the spherical object is allowed to freely rotate in the flow.

U.S. Pat. No. 4,378,209 further discloses the use of an additional concentric tube within the elongated levitation tube that can be employed for various purposes such as supplying solid material to the levitated object or supplying an additional fluid flow whose initial flow direction opposes the fluid flow of the main elongated levitation tube. U.S. Pat. No. 4,378,209 is an example of managing the reactivity of a fluid flow from a fluid delivery system by employing opposing fluid flows during fluidic levitation in order to control contact between a reactive fluid and components of the fluid delivery system used for substrate levitation.

U.S. Pat. No. 4,969,676 titled "Air pressure pick-up tool" by LaMagna discloses a modification of the Bernoulli type pick-up tool disclosed by Mammel in U.S. Pat. No. 3,466,079. The improvement disclosed in U.S. Pat. No. 4,969,676 is the inclusion "of a cavity in the major surface of the head member surrounding the air passage . . . " of the device disclosed in U.S. Pat. No. 3,466,079. The cavity on the bottom surface of the Bernoulli type pick-up is proximate to the exit orifice where gas is injected into the gap between the pick-up surface and the substrate surface and is believed to produce more uniform radial flow of fluid along the substrate surface. U.S. Pat. No. 4,969,676 discloses the use of physical stops to restrain lateral movement of the substrate during fluidic levitation of the planar substrate.

U.S. Pat. No. 5,067,762 titled "Non-contact conveying device" by Akashi discloses a Bernoulli type pick-up tool comprised of a novel gas injection cavity and rim whereupon increased Bernoulli lift force is produced at the levitating substrate surface during fluid flow. U.S. Pat. No. 5,067,762 describes an apparatus comprised of a "cushion-vacuum room" and a Bernoulli surface. U.S. Pat. No. 5,067,762 specifically discloses a "non-contact conveying device that has a guide means to prevent lateral movement of articles." The guide means disclosed in U.S. Pat. No. 5,067,762 comprises "a plurality of bars extending radially and having stoppers extending below the plane in which the Bernoulli surface 4 exists. Also some bars 10a may have steps 10b to contact certain parts of the surface of the article B where contact is acceptable. Article B is prevented from lateral movement and can be placed at a desired position" (col. 7, lines 39-43). Article B is the substrate. U.S. Pat. No. 5,067,762 thus discloses the use of physical stops to restrict substrate motion of planar substrates during fluidic levitation employing gaseous fluids.

WO 96/29446 entitled "Chemical Vapor Deposition of Levitated Objects" by West and Criss discloses an apparatus and a method for deposition rhenium metal films on spherical carbon moveable substrates that are pneumatically levitated under reduced pressure conditions. The gas emanating stationary support is a funnel shaped and provides physical stops that can prevent the pneumatically levitated spherical moveable substrate from moving out of the levitating gas flow. It is known in the open scientific literature and in the patent art dating prior to WO 96/29446 that a solid spherical object can be stably levitated in a fluidic flow when the spherical object is allowed to rotate in a gas flow of sufficient volumetric flow and velocity.

U.S. Pat. No. 5,096,017 by Rey and Merkeley titled "Aero-acoustic levitation device and method" discloses the levitation of the specimen object using a concentrated flow of gas and stabilizing the position of the specimen object using acoustic positioning forces generated by acoustic waves during heating and cooling of the specimen object. The specimen object is spatially confined at the nodes generated by the interacting acoustic positioning forces thus producing stable levitation of the specimen object and achieving container-less processing of the specimen object during heating and cooling of the specimen object. Although it is known in the art that solid spherical objects can be stably levitated in a fluidic flow when the spherical object is allowed to rotate in a fluid flow of sufficient volumetric flow and velocity, U.S. Pat. No. 5,096,017 discloses an apparatus and method by which non-rigid spherical objects, such as liquid or molten liquid drops, can be stably levitated.

U.S. Pat. No. 5,492,566 by Sumnitsch titled "Support for disk-shaped articles using the Bernoulli principle" discloses an apparatus for supporting disk shaped articles. The surface of the apparatus is circularly shaped and equipped with an annular gas ejection nozzle that provides gas flow of sufficient velocity to pneumatically levitate a substrate facing the support surface. The lateral motion of the substrate during pneumatic levitation is prevented by the introduction of at least one mechanically fixed elastic support pad or at least one mechanically fixed elastic support structure located on the surface of the apparatus that contact the opposing substrate surface when the substrate is pulled down towards the apparatus surface by the Bernoulli effect when gas is ejected from the annular nozzle. U.S. Pat. No. 5,492,566 does not disclose a non-contact method for stabilizing the position during pneumatic levitation. The substrate contacts an elastic pad during pneumatic levitation in U.S. Pat. No. 5,492,566.

U.S. Pat. No. 5,967,578 by Frey titled "Tool for the contact-free support of plate like substrates" discloses a tool for handling plate-like circular wafers equipped with a circular "dynamic" gas distribution chamber and an annular gas ejection nozzle that provides gas flow of sufficient velocity to pneumatically levitate a substrate facing the support surface. The lateral motion of the substrate during pneumatic levitation is prevented by the introduction of at least two guiding means arranged at spaced locations to each other and extending vertically with respect to the surface of the tool at a distance besides the gas emitting annular slit." These guiding means are arranged in such a way as to provide "contact points" or "contact lines" for the outer periphery of the wafer to be treated". The guiding means are intended to restrain the lateral motion of the substrate during pneumatic levitation when the tool is employed for supporting a circular plate like substrate.

U.S. Pat. No. 7,328,617 B2 titled "Air levitation apparatus with neutralization device and neutralization methods for levitation apparatus" by Miyachi, Nishikawa, and Suzuki discloses an air levitation device employed to transport plate shaped work, such as thin plates of material like glass, wherein the air levitation device comprises a means of air ionization and a levitation apparatus providing a plurality of air jets as a means of levitating the plate shaped work. The means of air ionization is a corona discharge device employing at least one needle-shaped electrode. The air levitation apparatus of U.S. Pat. No. 7,328,617 B2 is intended as a means of substrate transport, both allowing motion of the plate and providing a means of motion to the plate shaped work and thus the apparatus does not have a function of providing air levitation or pneumatic levitation wherein the plate shaped work is motionless or laterally restricted in motion.

U.S. Publication No. 2007/0215437 A1 titled "Gas bearing substrate-loading mechanism process" by Cassagne discloses pneumatic levitation of a thin plate-like substrate by means of flotation on a layer of gas produced by a plurality of gas emitting ports. Adjacent to these ports and spatially intermingled with the gas emitting ports are vacuum port employed to keep the thin plate-like substrate stationary when required. U.S. Publication No. 2007/0215437 A1 teaches the use of robotic grippers—also called a "clamping system"—or a "pushing/pulling" system to restrict and control the normally unimpeded motion of the substrate on the frictionless gas layer. U.S. Publication No. 2007/0215437 A1 teaches that a system of mechanical restraints is necessary when employing fluidic levitation to levitate a substrate while restricting undesired lateral motion of the substrate.

U.S. Publication No. 2012/0110528 A1 titled "Device and method for the contactless seizing of glass sheets" by Herfert discloses an apparatus for moving large glass sheet with no physical contact to the glass sheet where the gripping force is supplied by balancing a suction force supplied by reduced pressure in a cup with a positive pressure supplied by atmospheric pressure ultrasonic waves. No physical restraints to restrict the movement of the levitated glass sheet are disclosed. The apparatus of U.S. Publication No. 2012/0110528 A1 effectively levitates the large glass sheet at several different locations on the glass sheet substrate and as a result levitates the entire sheet. In the absence of constant adjustment of the levitation position or the use of physical restraints on the perimeter of the substrate, the glass sheet will not remain stationary due to the frictionless nature of the levitation method employed and the glass sheet will begin to be transported in a manner similar to U.S. Pat. No. 7,328,617 B2.

U.S. Pat. No. 6,601,888 B2 titled "Contactless Handling of Objects" by McIlwraith and Christie discloses a method and apparatus for handling large lithographic plates. The disclosed apparatus is a vibration dampening Bernoulli type pick-up device, similar in concept to that disclosed by Mammel in U.S. Pat. No. 3,466,079. U.S. Pat. No. 6,601,888 B2 teaches that flexible plate-like objects will vibrate and emit high intensity acoustic signals when levitated using a Bernoulli type pick-up device and the intensity of the acoustic signals produced during pneumatic levitation can be reduced by introducing a vibration-attenuating surface into the Bernoulli type pick-up device over which the fluid must flow during the levitation process. The vibration-attenuating surface can be prepared by numerous methods, including modifying the surface near the fluid exiting edges of the Bernoulli type pick-up device with ridges, fibers, bristles, or other physical features that can cause interruption of the fluid flow as the pressure of the fluid equalized with the surrounding medium. U.S. Pat. No. 6,601,888 B2 acknowledges that "preventing lateral movement of objects" that are levitated is a problem but does not provide any teaching or inventive disclosure concerning how to address this problem other than to mention the previously disclosed teaching in the art of fluidic levitation concerning the use of physical stops and barriers to prevent substrate motion.

U.S. Pat. No. 8,057,602 B2 by Koelmel et al titled "Apparatus and Method for Supporting, Positioning and Rotating a Substrate in a Processing Chamber" discloses a method and apparatus employing fluids injected through ports on a baseplate support, said fluid contacting a surface of a substrate to control substrate position and rotation. At least 3 ports adapted to receive a fluid from a flow controller and direct the fluid in different directions are employed and at least a portion of the flow of the fluids from the plurality of ports are adapted to support the weight of the substrate. The fluid flow can be either sub-sonic or super-sonic and the advantages of different fluid flow velocities are contemplated for the purposes of providing momentum transfer to a substrate supported by a fluid layer of any type, gaseous or condensed, in order to bring the substrate into a desired position. A process control loop for fluid flow to each port based on sensor feedback indicating the substrate position is contemplated and the process control loop is used to adjust the fluid flow to each port in the plurality of ports in order to stabilize and control the substrate position. Both software and hardware implementations of the control loop are contemplated. The ports contemplated in U.S. Pat. No. 8,057, 602 B2 may be employed to add or remove fluid from the volume between the substrate and the substrate support base plate. The use of thermal edge barriers to restrict overall substrate motion and improve process temperature uniformity is discussed and taught as part of the apparatus. The apparatus described appears complex, requiring control of fluid through multiple fluid ports with complicated electrical feedback circuits being required. The contemplated invention of U.S. Pat. No. 8,057,602 B2 still invokes the use of physical stops called "thermal edge barriers" as an integral part of the apparatus in order to restrict the unpredictable motion of the substrate motion that can occur while the substrate is supported by the essentially frictionless layer of fluid, although the invention claims to solve the problem of physical contact between the substrate and any proximate apparatus employed to provide a means of additional processing during substrate handling by the levitation apparatus.

The scientific literature further discloses additional methods for achieving fluidic levitation with gaseous fluids. Dini, Fantoni, and Failli (G. Dini, G. Fantoni, and F. Failli; "Grasping leather plies by Bernoulli grippers", CRIP Annals, Manufacturing Technology 58 (2009) 21-24) disclose the use of several variants of Bernoulli type pick-up tools for use with leather plies. Li, Kawashima, and Kagawa (X. Li, K. Kawashima, and T. Kagawa; "Analysis of vortex levitation"; Experimental Thermal and Fluid Science, 32 (2008) 1448-1454) disclosed a novel apparatus and method for fluidic levitation which they call "vortex levitation". The apparatus for producing vortex levitation is similar to that disclosed by Akashi in U.S. Pat. No. 5,067,762. As with Akashi, gas is injected into a gas injection cavity—which appears identical to the "cushion-vacuum room" described by Akashi. The gas injection cavity is essentially cup shaped and the gas is injected in the cup at a specific location: the vortex levitation cup of Li et al employs a fluid under pressure that is injected tangentially to the walls of the cup shaped gas injection cavity to induce a swirling flow that exits the gas injection cavity through a rim that functions as a Bernoulli surface. Li et al disclose the use of "a set of vortex cups to achieve better stability and a larger lifting force" on what appears to be a plate shaped object but no further details are provided. Wu, Ye, and Meng (Particle image velocimetry studies on the swirling flow structure in the vortex gripper", Proceedings of the Institution of Mechanical Engineers, Part C, Journal of Mechanical Engineering Science 0(0), (2012)1-11; DOI:10.1177/ 0954406212469323) report a characterization of the fluid movement in a modified vortex gripper during vortex levitation. The modified design investigated by Wu et al introduced a conical frustum in the center of the cup shaped gas injection cavity of the vortex levitation apparatus described by Li et al which was used to simplify particle imaging during levitation.

The scientific article "Levitation in Physics" by E. H. Brandt (Science vol. 243, pg 349-355, 1989) outlines the physical effects allowing for free floatation of solids and even liquid matter. Among the levitation methods disclosed are levitation methods employing a variety of means including jets of gas, sound waves, beams of laser light, radio-frequency fields, charged particles in alternating electric fields, magnetic repulsion, flux pinning of superconductors and the like. Brandt states that "the main problem in the physics of levitation is stability: the levitated body should not slip sideways but should be subjected to restoring forces in all directions horizontally and vertically when it is slightly displaced from its equilibrium position." Brandt discusses the stable levitation of spheres is a flowing jet of gas in the section on "Aerodynamic Levitation", commenting that there are certain apparatus configurations for aerodynamic levitation of spherical objects which are essentially independent of orientation and gravity. There is no discussion of aerodynamic levitation, also known as pneumatic levitation, of disc-shaped objects, plate shaped objects and articles, or other types of planar objects such as planar rectangular shapes, or non spherical object suggesting that, at the time of publication, there is no known method for achieving stable pneumatic levitation of such an object and preventing the sideways slip and lateral motion of the object during the levitation process without physical contact to the sample or the introduction of some sort of additional external restoring force that is imposed upon the intrinsic fluidic forces introduced by the levitation process itself.

Theoretical fluid mechanic analysis of pneumatic levitation processes concludes that it is impossible to fluidically levitate a disc (workpiece) with a single jet of a gaseous fluid except in one specific configuration. A. D. Fitt, G. Kozyreff, and J. R. Ockendon in a paper titled "Inertial Levitation" write in the Journal of Fluid Mechanics (J. Fluid Mech. (2004) vol 508, pp 165-174; page 172 concluding remarks) with respect to moveable substrate levitation with an orthogonal gaseous fluid jet the following: "Of course, if air were blown through a single hole of sufficient radius in the base plate, levitation could not occur because of the pressure drop as the air accelerates in the layer. In fact, it is possible to support a plate by this method by placing the base plate above the workpiece. It can also be supported in such an upside-down configuration by suction through the base plate, and this technique is also used in the glass industry." Fitt et al. indicate that pneumatic levitation of planar workpiece or planar moveable substrate when the fluid emitting baseplate is below the workpiece will not occur. The remarks by Fitt et al. in a peer reviewed scientific journal indicate that a method or apparatus to fluidically levitate a substrate in a stable manner with a fluid flow emanating from a support beneath the substrate is apparently not known and not obvious to those skilled in the art of fluid mechanics.

Pressurized fluid flow devices for the purpose of substrate levitation or flotation on a gaseous layer or gaseous cushion have been integrated into other technologies specifically for the purpose of preventing physical contact with a surface of said substrate during transport or alignment. U.S. Pat. No. 5,470,420 describes the use of pressurized fluid flow devices as a means of handling adhesive labels and preventing contact with the surfaces of the label. A pressurized fluid flow device is employed to support wafer substrates for transport and pre-alignment prior to electrostatic chucking or placement of the substrate on automated inspection systems. In these examples, physical stops such as edges, pins, or walls are employed in the apparatus to provide a barrier to lateral movement of the substrate wafer and to stabilize the substrate position during substrate transport and subsequent alignment operations so that sideways motion of the substrate is prevented while the substrate is suspended on the frictionless gaseous layer or cushion located between the substrate and the proximate fluid emitting support containing one or more nozzles, gas injection cavities, or orifices that provide pressurized fluid between the substrate and the fluid emitting support containing at least one fluid emitting nozzle or fluid emitting orifice employed as a means to provide Bernoulli lift.

Levitation processes can be carried out with both compressible and non-compressible or incompressible fluids. Levitation processes with compressible fluids are also referred to as pneumatic levitation processes or just pneumatic levitation and are commonly achieved through the use of gaseous fluids. Common gaseous fluids employed for pneumatic levitation are air, nitrogen, other inert gases such as argon, and other gases that remain in the gas phase under the conditions encountered by the gas during pneumatic levitation. Levitation processes with non-compressible or incompressible fluids are also referred to as hydraulic levitation processes or just hydraulic levitation and are commonly achieved through the use of incompressible fluids such as liquid phase fluids such as water, various types of specially formulated oils, or other liquid fluids that remain in the liquid phase under the conditions encountered by the liquid during hydraulic levitation.

Stabilizing Lateral Substrate Movement

Most of the previous efforts directed towards stabilizing the position of a non-spherical substrate, including plate-like substrates, during levitation and preventing lateral movement of the substrate during levitation have focused on the use of physical restraints such as walls and stops to constrain and prevent the lateral motion of the substrate during levitation. Other efforts to stabilize substrate position and control lateral motion during levitation have employed complicated schemes for using supplemental fluid flows whose direction must be somehow controlled to introduce appropriate directional corrective forces on the substrate by transfer of momentum from the fluid used as the medium for levitation. This complicated process of fluid momentum transfer to control lateral substrate motion must occur during and in the presence of the gaseous fluid flow employed as a means of achieving fluidic pneumatic levitation and Bernoulli lift. Such schemes are difficult to implement, can lead to levitation height instability and positional oscillation as a result of unstable fluid flows, and require complicated pneumatic control sequences and feedback control loops for execution.

Examples of non-orthogonal jets and their uses are described by Yokajty in U.S. Pat. No. 5,470,420 where tilted jets are employed specifically to transfer momentum from the gaseous fluid flow of the jets so as to induce lateral movement of the substrate movement during pneumatically levitation of the substrate. U.S. Pat. No. 5,470,420 by Yokatjy discloses the use of arrays of tilted jets, (jets which are non-orthogonal with reference to the stationary support surface normal), for the purpose of intentionally destabilizing the position of a movable substrate and inducing substrate movement in a predetermined direction, either rotationally about an axis or in a specific direction parallel to the stationary support surface. In U.S. Pat. No. 5,470,420 the moveable substrate is a label. According to Yokajty, the gaseous flow from the tilted jet array gives rise to an attractive force between the substrate and the stationary support. In describing the interactions that occur when the label is pneumatically levitated by a tilted jet array, Yokajty states with respect to the action of tilted jet causing pneumatic levitation that "The flow of gas causes a zone of reduced gas pressure to be formed between the support surface 52 and label 14, in accordance with the Bernoulli Effect, thereby establishing a pressure differential across the label to hold the label in position on a film of gas flowing over the support surface." In U.S. Pat. No. 5,470,420 it is not clear where this pressure differential occurs and, additionally, the specific objective of the invention is to induce movement of the pneumatically levitated substrate so that it can be properly aligned against a set of stops which physically interrupt the substrate movement. In U.S. Pat. No. 5,470,420 tilted jets are employed specifically to transfer momentum from the gaseous fluid flow of the jets so as to induce substrate movement, including rotational movement, during pneumatically levitation of the substrate. The use of tilted jets, either singly or in an array, excludes the possibility of gaseous fluid flow that is symmetrical about the jet; instead, the gaseous fluid flow patterns generated by tilted jets and tilted jet arrays have strong velocity components which are determined by the tilted jet velocity vectors. The flow velocity vectors generated by tilted jets are neither orthogonal nor parallel to the opposing moveable substrate surface. The pneumatic levitation accomplished by means of tilted jets like those described in U.S. Pat. No. 5,470,420 is sometimes referred to as Bernoulli airflow.

Interestingly, the descriptions by Yokajty in U.S. Pat. No. 5,470,420 of the action of orthogonal jets that are found in the description of FIG. 10 state that orthogonal jets are used to "blow the label onto the article to be labeled" (col. 6 lines 4-6) indicating that according to Yokajty, orthogonal jets cannot show attractive forces or pneumatic levitation of substrates. U.S. Pat. No. 5,470,420 does not teach pneumatic levitation of objects with orthogonal fluid jets. U.S. Pat. No. 5,470,420 does not teach pneumatic levitation of a moveable substrate using both tilted jets and orthogonal jets simultaneously.

U.S. Pat. Nos. 5,492,566 and 5,967,578 disclose the use of an annular nozzle comprised of an infinitely large number of tilted jets for the purpose of producing pneumatic levitation by means of Bernoulli airflow and supporting a moveable substrate 12. Annular nozzles of the type described in U.S. Pat. Nos. 5,492,566 and 5,967,578 are formed when the spacing between a plurality of tilted jets positioned around the circumference of a circle becomes infinitely small and the plurality of orifices from whence the tilted jets emanate are arranged about the circumference of a circle in such a manner that projection of each tilted jet on the gas emanating surface is aligned parallel to a radius of said circle and the fluid flow of each tilted jet is directed away from the center of the circle. The annular nozzle structure disclosed in U.S. Pat. Nos. 5,492,566 and 5,967,578 produces a symmetric radial flow field flowing directionally outward and away from the center of the annular nozzle structure and centered around the centroid of the annular nozzle structure. The pneumatic levitation produced by the apparatus in U.S. Pat. Nos. 5,492,566 and 5,967,578 is unstable with respect to lateral movement of the opposing substrate for the reasons cited in U.S. Pat. No. 3,466,079 because it is nearly impossible to center the centroid of the moveable substrate over the centroid of the annular nozzle structure. Both U.S. Pat. Nos. 5,492,566 and 5,967,578 teach the use of physical stops to restrain lateral movement of a substrate pneumatically levitated by means of an annular nozzle structure.

FIG. 1a illustrates one embodiment of the prior art and shows a cross-sectional view of a gas-emanating stationary support 12 containing a single fluid collimating conduit, nozzle, bore, or orifice 14 that is in fluid communication with a pressurized manifold (not shown). Orifice 14 is hereafter referred to as a fluid collimating conduit 14 and fluid collimating conduit 14 can be employed with liquids or gasses. A fluid collimating conduit employed with flowing gas is also called a gas collimating conduit. A fluid collimating conduit employed with flowing liquid is also called a liquid collimating conduit. Dashed normal line 16 is normal to an opposing surface of moveable substrate 10 and to the gas-emanating surface of stationary support 12. Upon application of pressurized fluid to the opening of the fluid collimating conduit 14 in fluid communication with a pressurized manifold containing pressurized fluid, the single fluid collimating conduit 14 produces an orthogonal jet emanating from the gas emanating surface. The velocity vector of the orthogonal jet, indicated by the arrows in FIG. 1a, is parallel to the dashed normal line 16 and is normal to a surface of moveable substrate 10 and to the surface of gas-emanating stationary support 12. The orthogonal jet thus impinges in an orthogonal fashion on the opposing surface of moveable substrate 10. When sufficient fluidic pressure is applied to produce an orthogonal jet of sufficient pressure and velocity, the moveable substrate 10 is fluidically levitated but is unstable with respect to lateral motion of the substrate.

FIG. 1b illustrates a different embodiment of the prior art and shows a cross-sectional view of the stationary support 12 containing the single fluid collimating conduit 14 that is in fluid communication with a pressurized manifold (not shown). Dashed lines 16 are normal to a surface of moveable substrate 10 and to the surface of stationary support 12. Upon application of pressurized fluid to the opening of the fluid collimating conduit 14 in fluid communication with a pressurized manifold containing pressurized fluid, the single fluid collimating conduit 14 produces a non-orthogonal jet emanating from the surface of the stationary support 12. The single fluid collimating conduit 14, produces a non-orthogonal jet or tilted jet whose velocity vector, indicated by the arrow in FIG. 1b, is not parallel to the dashed normal line 16 and thus is not orthogonal to the surface of moveable substrate 10 and is not orthogonal to the surface of stationary support 12. The non-orthogonal jet thus impinges in a non-orthogonal fashion on the opposing surface of moveable substrate 10. When sufficient fluidic pressure is applied to the fluid flowing through the fluid collimating conduit 14 to produce a non-orthogonal jet of sufficient pressure and velocity, the moveable substrate 10 is fluidically levitated but is unstable with respect to lateral motion of the substrate. As mentioned previously, annular nozzles of the type described in U.S. Pat. Nos. 5,492,566 and 5,967,578 are formed when the spacing between a plurality of tilted jets positioned around the circumference of a circle becomes infinitely small and the plurality of orifices or fluid collimating conduits 14 from whence the tilted jets emanate are arranged about the circumference of a circle in such a manner that projection of each tilted jet on the gas emanating surface is aligned parallel to a radius of said circle and the fluid flow of each tilted jet is directed away from the center of the circle.

FIG. 2 shows a cross-sectional view illustrating one embodiment of the prior art disclosed in U.S. Pat. No. 5,370,709 (discussed above) that is frequently employed to address the difficulty of positional instability during fluidic levitation using gasses. U.S. Pat. No. 5,370,709 discloses the stationary support 12 containing the single fluid collimating conduit 14 in fluid communication with a pressurized manifold (not shown). The single fluid collimating conduit 14 produces a single orthogonal jet whose velocity vector indicated by the arrows in FIG. 2 is parallel to the dashed normal line 16 normal to a surface of moveable substrate 10 and to a surface 24 of stationary support 12. The orthogonal jet thus impinges in an orthogonal fashion on the opposing surface of moveable substrate 10. Stationary support 12 also contains at least one protruding feature 26 extending above the surface 24 of stationary support 12 in the direction of moveable substrate 10 and is located on the surface 24 of stationary support 12 so as to impede horizontal lateral motion of moveable substrate 10 in the direction parallel to surface 24 of stationary support 12. FIG. 2 illustrates the use of physical stops, exemplified by protruding feature 26, that is commonly employed for the purposes of stabilizing the position of the moveable substrate 10 during fluidic levitation so that the moveable substrate 10 remains essentially centered over the single fluid collimating conduit 14 that supplies an orthogonal jet whose velocity vector is parallel to and essentially coincident with a normal to the surface 24 illustrated by the dashed normal line 16. The location of the fluid collimating conduit 14 in the gas-emanating surface is taken as an alignment feature and the moveable substrate 10 is positioned at a desired location relative to the alignment feature. The locations of the protruding features 26 can also be taken as alignment features for positioning of the moveable substrate 10 at a desired location before initiating the fluid flow required for pneumatic levitation.

Reactive Chemical Fluid Flow

The presence of reactive chemical substances in the fluid flow during fluidic levitation can cause complication with equipment operation. In this disclosure, the terms reactive chemical substance, chemically reactive reagent, reactive reagent, reactive chemical, reactive substance, and reactive material will all refer to composition of matter that is not chemically inert to at least one of the materials of construction of the fluid delivery system. In particular, the presence of reactive reagents in the orthogonal jet can cause complications with equipment operation. As taught in the art of fluidic levitation for substrate processing, reactive materials in the fluid flow can react with surfaces of the fluid delivery system and, more importantly, the orifice or orifices or the fluid collimating conduits 14 in the fluid emitting stationary support. The prior art of substrate processing using fluidic levitation methods is focused on primarily on high temperature processes operating above 500° C. An example of a high-temperature process that can be operated using fluidic levitation is chemical vapor deposition. The art teaches that one approach to controlling the chemical reactivity of the fluid flow is to control the temperature of the fluid. This approach is satisfactory if the fluid exhibit chemical reactivity is strongly temperature dependent; however, more recent developments in substrate processing utilize chemical substances in the process fluid flow that are highly reactive with fluid delivery system materials of construction even at room temperature. Highly reactive materials whose reactivity is appreciable even at room temperature are present in the fluid flows that are employed in, for example, atomic layer deposition processes. Some of the highly reactive materials in the low temperature fluid flows of atomic layer deposition processes are organometallic compounds, ozone, metal halides, metal amides, and other reactive fluid substances.

It is desirable, then, to be able to manage the chemical interactions of the highly reactive precursor reagents in the fluid employed for fluidic levitation. If the fluid delivery system surfaces are chemically reactive with the fluid flow then elements of the fluid delivery system whose critical dimensions must be maintained for robust system operation may change over time becoming larger, smaller, or even failing altogether. The chemical reactivity of the fluid delivery system must, therefore, be managed when non-chemically inert materials are employed as part of the fluid composition of matter in the fluid delivery system during fluidic levitation.

Spatially Ordered Fluid-Flow

U.S. Pat. No. 3,368,760 by C. C. Perry titled "Method and apparatus for providing multiple liquid jets" and U.S. Pat. No. 3,416,730 by C. C. Perry titled "Apparatus for providing multiple liquid jets" both describe methods and apparatus for producing compound liquid fluid flows and compound liquid jets. Both U.S. Pat. Nos. 3,368,760 and 3,416,730 disclose methods and apparatus for compound coaxial jet formation with viscous fluids like liquids, fluid aerosols, and non-gaseous liquid-like flowable substances including emulsions, dispersions, resins, colloids, suspensions, and composite. Additional fluid-like materials disclosed in U.S. Pat. No. 3,368,760 include gaseous particle suspensions such as those found when a gas is used to propel a powder through a discharge passage. U.S. Pat. Nos. 3,368,760 and 3,416,730 teach the use of pressure comparators to equalize the velocity of the inner primary liquid jet with the secondary liquid jet velocity in order to prevent mixing and turbulence during compound jet formation, teach the use of switchable valves to vary the overall composition of the compound jet, and teach the use of concentric fluid emitting nozzles for the purpose of formation of a coaxial compound jet with at least a primary fluid jet and a secondary fluid jet sheath in contact with and surrounding the primary fluid jet. In general, both U.S. Pat. Nos. 3,368,760 and 3,416,730 teach the use of a compound coaxial jet as method to transport a reactive primary fluid by employing a sheath of secondary fluid that is in contact with and surrounds the primary fluid as a means of modulating the reactivity of the primary fluid.

Another disclosure of the concept of compound jet is found in U.S. Pat. No. 4,196,437. U.S. Pat. No. 4,196,437 by C. H. Hertz titled "Method and apparatus for forming a compound liquid jet particularly suited for ink jet printing" describes the use of compound liquid jet to form fine droplets for ink-jet printing applications. The apparatus described by Hertz employs a primary stream formed by ejecting under pressure a primary liquid from a nozzle and then causing the primary stream to traverse a thin layer of a secondary fluid to form a compound liquid stream which breaks up to form a compound jet of fine droplets each containing both the primary liquid and the secondary fluid. U.S. Pat. No. 4,196,437 teaches that the primary fluid, the secondary fluid, or both the primary and secondary fluid may be reactive fluids. More importantly, the secondary fluid is essentially a stationary fluid through which the primary fluid traverses, with the result that the secondary fluid is dragged along with the primary fluid jet by fluid momentum interactions. The method of formation of compound jets of the present invention does not employ stationary fluid reservoirs or layers, thereby distinguishing it from U.S. Pat. No. 4,196,437. Additionally, the use of compound jets for fluidic levitation is not mentioned or anticipated anywhere in U.S. Pat. No. 4,196,437.

The concept of a compound jet was further articulated in the open scientific literature by Hertz and Hermanrud in 1983 (J. Fluid Mech. (1983), vol 131, pp 271-287). Hertz and Hermanrud disclosed "a new type of liquid-in-air jet generated by a primary fluid jet that emerges from a nozzle below the surface of a stationary(secondary) fluid. After breaking the surface, the jet consists of the central primary jet surrounded by a sheath of secondary fluid which has been entrained by the primary jet during its passage through the secondary fluid." Hertz and Hermanrud call this new type of jet a "compound jet" formed from a primary and a secondary fluid. According to Hertz and Hermanrud the compound jet is comprised of a central primary jet of primary fluid that is surrounded by a sheath of secondary fluid. The article also teaches that the flow in the compound jet is essentially laminar and that the primary and secondary fluids can only mix by diffusion. Mixing by diffusion is a relatively slow process thus the primary and secondary fluids in the compound jet remain compositionally segregated as the jet propagates though space.

U.S. Pat. No. 6,377,387 B1 discloses a method for preparing particles for use in electrophoretic displays and an apparatus for the formation of compound liquid jets as defined by Hertz and Hermanrud (loc cit) for the purpose of producing substantially uniformly-sized droplets of a first phase, the first phase including a fluid and particles, for introduction into a second phase, for producing substantially uniformly-sized complex droplets having a core formed form a first phase, the first phase including a fluid and particles, and a second phase that surrounds the first phase as a shell. There is no mention or anticipation of the use of compound jets for fluidic levitation processes in U.S. Pat. No. 6,377,387 B1.

WO 02/100558 A1 by Larrell and Nilsson titled "Device for Compound Dispensing" discloses a MEMS based apparatus for dispensing very small amounts of compound volumes of liquids. The apparatus employs a drop-on-demand type fluid ejector to produce a transient fluid jet for a primary fluid traversing a stationary fluid reservoir comprised of a secondary fluid to produce a transient compound liquid jet comprised of a primary fluid stream surrounded by a sheath of secondary fluid that produces an encapsulated drop upon breakoff. There is no mention or anticipation of the use of compound jets for fluidic levitation processes in WO 02/100558 A1.

U.S. Pat. No. 6,699,356 B2 by Bachrach and Chinn titled "Method and apparatus for chemical-mechanical jet etching of semiconductor structures" and U.S. Pat. No. 7,037,854 B2 by Bachrach and Chinn titled "Method for chemical-mechanical jet etching of semiconductor structures" disclose the use of at least one liquid jet impinging on a substrate for the purpose of carrying out various etching operations and processes on various semiconductor substrates. In an alternate embodiment U.S. Pat. Nos. 6,699,356 B2 and 7,037,854 B2 disclose the use of at least one gas jet impinging on a substrate for the purpose of carrying out various etching operations and processes on various semiconductor substrates. The fluidic jets impinge on the surface of a substrate mounted on a substrate holder, said fluidic jet impinging preferably in a non-orthogonal manner so as to minimize the stagnation area on the substrate surface at the jet impingement location. The dual nozzle jets are described in U.S. Pat. No. 7,037,854 B2 at col. 4, lines 30-37 and U.S. Pat. No. 6,699,356 B2 at col. 4, lines 21-28) "dual nozzle, or nozzle within a nozzle (see FIG. 2), in which a concentric annular outer orifice 201 surrounds a central orifice 203, and discharges a secondary high pressure flow of fluid 205, forming a spray curtain surrounding and containing the jet cone 207 for the central orifice, thereby creating a more narrowly focused jet." Clearly, the jet described in U.S. Pat. Nos. 6,699,356 B2 and 7,037,854 B2 is not the same as previous art, but is rather a single jet surrounded by a spray curtain of droplets and the fluid discharges from the secondary high pressure fluid flow is not in intimate contact with the primary high pressure fluid flow from the central orifice. Unlike the prior art of compound jets as described in detail by Hertz and Hermanrud (loc cit), different jet trajectories for the secondary high pressure flow of fluid 205 from the annular outer orifice 201 and a primary high pressure jet cone 207 from the central orifice 203 are used. There is no mention or anticipation of the use of compound jets for fluidic levitation processes in U.S. Pat. Nos. 6,699,356 B2 and 7,037,854 B2.

U.S. Patent Application Publication No. 2012/0203315 A1 by Ripoll et al titled "Method for producing nanofibres of epoxy resin for composite laminates of aeronautical structures to improve their electromagnetic characteristics" describes method for improving the electrical properties of carbon composite materials by application of layers of carbon nanotubes dispersed in epoxy and applied to the carbon composite structure by deposition of nanofibers produced by electrospinning. A compound liquid coaxial jet as defined by Hertz and Hermanrud (loc cit) is produced during the electrospinning process where the primary fluid comprising the interior jet is doped with a sufficient amount of carbon nanotubes or other conductive particles or conductive nanoparticles exceeding the percolation threshold for electrical conductivity and the secondary fluid providing a surrounding sheath for the primary fluid is an epoxy resin dissolved in a solvent. During electrospinning, the field induced Taylor cone formation followed by compound nanojet formation and solvent loss results in the formation of conductive nanofibers deposited on a carbon composite substrate according to the electric field patterns in the deposition system. U.S. Pat. No. 7,794,634 B2 by Ripoll et al titled "Procedure to generate nanotubes and compound nanofibres from coaxial jets" further elaborates on the application of coaxial compound liquid jet for the formation of materials using electrospinning methods. U.S. Pat. No. 7,794,634 B2 teaches a compound fluid jet wherein the primary fluid is a liquid and the secondary fluid providing a surrounding sheath for the primary fluid is a fluid that solidifies before the compound jet breaks up into drops. The compound jet is U.S. Pat. No. 7,794,634 B2 is formed by means of electrospinning whence the field induced Taylor cone formation followed by compound nanojet formation and secondary fluid solidification results in the formation of tubular nanofibers when the primary fluid is removed. Additionally, the formation of compound nanotubes is taught when both the primary and secondary fluids solidify before jet breakup the electrospinning. Further detail on applications of compound jets to the formation of capsules and particles for food products is given in U.S. Pat. RE44,508 E by Ripoll, Calvo, Loscertales, Bon, and Marquez titled "Production of capsules and Particles for improvement of food products". U.S. Pat. RE44,508 E teaches the use of a coaxial compound jet with a primary fluid surrounded by a sheath of secondary fluid generated by electrohydrodynamic forces to produce encapsulated particles upon jet breakup. The coaxial jet must have at least one conducting fluid for the electrohydrodynamic jet to form and either the conducting fluid may be the primary fluid or the secondary fluid. Alternatively, both the primary and secondary fluids may be conducting and contribute to the formation of the electrified jet during an electrospinning-like process. The secondary fluid is used to encapsulate the primary fluid during both jet formation and drop formation during jet breakup. U.S. Pat. RE44,508 E teaches the use of biocompatible fluids in the coaxial compound jet in an electrospray process to produce biocompatible encapsulated particles as vehicles for additives in food formulation. There is no mention or anticipation of the use of compound jets for fluidic levitation processes in U.S. Patent Application Publication No. 2012/0203315 A1, U.S. Pat. No. 7,794,634 B2, or U.S. Pat. RE44,508 E.

U.S. Pat. No. 8,361,413 B2 by Mott et al titled "Sheath flow device" discloses an apparatus providing a means of forming compound jets where a primary fluid flow is in contact with and surrounded by a secondary fluid flow. The device is comprised of a sheath flow system having a channel with at least one fluid transporting structure located in the top and bottom surfaces situated so as to transport the sheath fluid laterally across the channel to provide sheath fluid fully surrounding the core solution. Although U.S. Pat. No. 8,361,413 B2 does not disclose the use of the sheath flow device for the formation of coaxial or collinear compound jets, the apparatus described provides a means for producing compound fluid flows that are useful for compound jet formation and may be used to produce compound jets by, for example, electrohydrodynamic jet formation or other means with suitable fluid formulations.

U.S. Patent Application Publication No. 2014/0027952 A1 by Fan et al titled "Methods for producing coaxial structure using a microfluidic jet" and U.S. Patent Application Publication No. 2014/0035975 A1 by Eissen et al titled "Methods and apparatuses for direct deposition of features on a surface using a two component microfluidic jet" disclose the use of compound microfluidic jets for writing patterns on surfaces and for other applications. Both U.S. Patent Application Publication Nos. 2014/0027952 A1 and 2014/0035975 A1 describe a method for producing coaxial compound jets where a primary liquid is surrounded and in contact with a sheath of a secondary liquid. The surrounding secondary sheath liquid may be chemically inert, chemically reactive with itself in some manner like a UV curable monomer, or chemically reactive with the primary liquid in some manner. Methods are described for generating multi-component flow for the purposes of producing micro-fluidic jets that are used in printing processes. Both U.S. Patent Application Publication Nos. 2014/0027952 A1 and 2014/0035975 A1 describe methods and apparatus for hydrodynamic focusing of coaxial liquids jets to control the diameter of the primary fluid jet as well as methods for producing compound coaxial liquid jets that are undisturbed by Rayleigh breakup for extended periods of time so that the compound coaxial jet itself may be employed as a means of mass transport during printing and deposition processes. There is no mention or anticipation of the use of compound jets for fluidic levitation processes in either U.S. Patent Application Publication 2014/0027952 A1 or 2014/0035975 A1.

Compound Fluid Flows

Compound fluid flows are a type of spatially and compositionally ordered fluid flows. Fluidic levitation of a moveable substrate using an orthogonal jet emanating from a stationary support requires a fluid. The fluid may be either compressible or non-compressible. An example of a compressible fluid is a gas like air, argon, or nitrogen and an example of a non-compressible fluid is a liquid like water or a hydrocarbon fluid. The fluid can have a naturally mixed composition, as in the case of air, or the fluid can have an intentionally varied composition. Intentionally varied fluid compositions are particularly useful for some applications of both hydraulic and pneumatic levitation. The use of intentionally varied fluid compositions requires a means of generating varied fluid compositions.

An unconfined stream of rapidly moving fluid is called a jet. A jet may be formed from either incompressible fluids, such as water, or compressible fluids such as gasses. A jet of fluid whose cross-section does not have a uniform chemical composition is called a compound jet. Compound jets can be formed with either compressible or non-compressible fluids. Compound jets can be formed by several means such as those described by Hertz in U.S. Pat. No. 4,196,437 for non-compressible fluids such as liquids. Formation of gaseous compound jets is known to those skilled in the art of aeronautics and gaseous fluid compound jets are employed in the study and development of turbine engines for aeronautic applications. The production of gaseous fluid compound jets is accomplished by several methods, mostly commonly through the formation of coaxial compound jets or collinear compound jets.

Fluid movement is described by the fluid velocity vector that contains the information about the spatial direction of fluid movement relative to some reference direction and whose scalar magnitude describes the velocity of the fluid movement. The fluid flow axis is defined by line parallel to and superimposed upon the direction of the velocity vector of the jet taken at the centroid of the cross-section of the jet. Put another way, the fluid-flow axis is defined by a line passing through the centroid of the cross-section of the fluid flow that is parallel to and superimposed upon the direction of the velocity vector at the centroid of the cross-section of the fluid flow. The fluid flow axis describes the movement of the fluid comprising the flow at the centroid of the cross-section of the fluid flow. The fluid flow may be a jet of fluid.

Definition of a collinear compound fluid flow: A collinear compound fluid flow is a compound fluid flow in which fluids of at least two different chemical compositions are present and the chemical composition of the fluid varies within the cross-section of the fluid flow such that regions of similar chemical composition flow in parallel paths that are collinear with the fluid flow axis defined by the direction of fluid propagation at the centroid of the cross-section of the fluid flow. The fluid flow may be a jet.

Definition of a coaxial compound fluid flow: A coaxial compound fluid flow is a compound fluid flow in which fluids of at least two different compositions are present and the chemical composition of the fluid flow varies across the cross-sectional area of the fluid flow such that regions of similar chemical composition are segregated into annuli or into circular regions, each region being centered around the same fluid flow axis defined by the velocity vector of the fluid flow taken at the center of the cross-section of the fluid flow so that one region of chemical composition is entirely surrounded by a region of different chemical composition as the regions flow collinearly and simultaneously along an axial direction. The fluid flow may be a jet.

A compound coaxial fluid flow is also a special type of compound collinear fluid flow that has a specific annular arrangement of different chemical compositions. A compound collinear fluid flow may also possess at least one characteristic of a coaxial fluid flow such that one region of chemical composition may be entirely surrounded by a region of different chemical composition as the regions flow collinearly and simultaneously along an axial direction. A difference between a collinear and a coaxial fluid flow is that a collinear jet is not necessarily completely symmetric about the fluid flow axis whilst the coaxial jet is always symmetric about the fluid flow axis.

Thus, a compound fluid flow may have both collinear and coaxial characteristics as defined by the arrangement of regions of different chemical composition within the fluid flow relative to the fluid flow axis as defined by the direction of fluid flow propagation. The chemical distribution in a compound fluid flow changes as a function of time because of lateral diffusion of chemical species. The degree of lateral diffusion which results in a redistribution of chemical concentrations in the cross-section of the fluid flow depends several factors including temperature, fluid velocities, and fluid viscosities. In condensed phases and incompressible fluids the lateral diffusion is small. In compressible fluids near or above atmospheric pressure the lateral diffusion between regions of differing composition is small. If the distance that the compound fluid travels is small relative to the fluid velocity, then the composition and chemical distribution in the compound fluid flow remains essentially unchanged during the transit time of the fluid flow. This is desirable from a process standpoint as it now provides a means for encapsulating reactive precursors with an inert fluid so they can be transported to the moveable substrate surface during the fluidic levitation process.

Atomic Layer Deposition

Atomic layer deposition is a method of forming layers on a substrate that have a well-controlled atomic structure. Such layers can be a single atom thick. Conventionally, the layers are formed by providing a substrate in a vacuum chamber and reacting a first gas with the substrate surface to deposit a single layer of atoms or molecules on the substrate. The first gas is then purged, typically with an inert gas such as nitrogen, and a second gas is reacted with the layer and then purged. By alternately providing gases and purging them, atomic layers of material are built up on the substrate.

Because the atomic layers are so thin, many reaction-purge cycles are necessary to form a thick structure. In consequence, it is preferred to perform each cycle of the operation very quickly, for example within milliseconds. However, the provision and removal of gases in a vacuum typically requires pumping the gases into and out of the vacuum chamber. This process can take seconds, or even minutes. There is therefore a need for rapidly providing gases over a substrate surface.

A prior-art method of forming thin films on a substrate using fluid-flow levitation for atomic-layer deposition is taught in US Patent Application Publication No. US 2009/0130858 A1, published by Levy, on May 21, 2009. This approach uses a gas bearing to support a substrate on a head providing spatially alternate flows of inert and reactant gases. The rate at which layers of material are deposited on the substrate depends on the number of alternating gas flows, and hence the head size, and the rate at which the substrate passes over the head.

There is a need, therefore, for an improved apparatus and method for forming thin films on a substrate using atomic layer deposition that is compatible with existing equipment, provides fast and uniform dispersion of a gas over a substrate in a chamber, and prevents unwanted reactions on chamber surfaces.

SUMMARY OF THE INVENTION

The present invention provides an improved structure, apparatus, and method for forming atomic layers on a substrate that is compatible with existing substrates, provides fast and uniform dispersion of a gas over a substrate, prevents substrate defects and deposition defects, and prevents unwanted reactions on chamber surfaces.

According to an aspect of the invention, a method for depositing a thin film on a substrate using atmospheric pressure atomic-layer deposition includes providing a chamber having an atmosphere and a stationary support located in the chamber. The moveable substrate is located in a spatial relationship with the stationary support. A pressurized compound fluid flow, including an inert fluid surrounding a reactive fluid, is provided simultaneously through the stationary support that impinges on at least a portion of the moveable substrate to fluidically levitate the moveable substrate and expose the moveable substrate to the compound fluid flow to deposit a thin film on the moveable substrate.

BRIEF DESCRIPTION OF THE DRAWINGS

While the description of the invention discloses specific subject matter of the present invention, it is believed that the invention and its associated concepts and extensions will be better understood from the following description when taken in conjunction with the accompanying drawings, wherein:

FIGS. 1a and 1b are representative cross-sectional views of a moveable substrate and a gas-emanating support known in the prior art;

FIG. 2 is a cross-sectional view of a gas-emanating support with physical stops and a moveable substrate known in the prior art;

FIGS. 5a-5h are plan views of different embodiments of levitation stabilizing structures fabricated upon substrates of arbitrary shape wherein the levitation stabilizing structure is circle, an oval, or a concave or convex polyhedral shape;

FIG. 6a is a cross-sectional view of a non-planar substrate and a gas emanating support; 6b is a cross-section showing a spherical substrate upon which a levitation stabilizing structure has been fabricated and a gas emanating support; 6c is a cross-section showing a spherical substrate upon which a levitation stabilizing structure has been fabricated and another embodiment of a gas emanating support; 6d is a plan view normal to the spherical substrate showing a circular levitation stabilizing structure; and 6e is a plan view normal to the spherical substrate showing a pentagonal levitation stabilizing structure;

FIGS. 7a-7b show views of a levitation stabilizing structure; and in particular, FIG. 7a is an isometric view of a levitation stabilizing structure on a substrate wherein the levitation stabilizing structure is a convex polyhedral shape; and FIG. 7b is a plan view of a levitation stabilizing structure on a substrate wherein the levitation stabilizing structure is a convex polyhedral shape;

FIG. 11 is a cross-sectional view of the prior art for delivering a reactive fluid flow during fluidic levitation;

FIG. 12 is a cross-sectional view of one embodiment of an inventive apparatus for delivering a reactive fluid flow during fluidic levitation;

FIG. 13a is a cross-sectional view of a non-planar substrate with a levitation stabilizing structure and a fluid emitting stationary support; FIG. 13b is a plan view of a non-planar substrate with an annular shaped levitation stabilizing structure; and FIG. 13c is a plan view of a non-planar substrate with a symmetric polyhedral shaped levitation stabilizing structure;

FIG. 14 is a flow chart describing the steps of one embodiment of the method for dosing the surface of a substrate with a chemically reactive material during fluidic levitation of the substrate;

FIGS. 15a and 15b are views of coaxial fluid delivery tubes; and FIGS. 15c and 15d are cross-sections of the compound fluid flowing from the outlet of the coaxial fluid delivery tubes of 15a and 15b;

FIG. 16 is a view of a coaxial compound fluid flow delivery assembly for forming and controlling the composition of coaxial fluid flows;

FIG. 17 is a cross-sectional view of an apparatus for fluidic levitation of a moveable substrate with levitation stabilizing structure utilizing coaxial compound fluid flows to control the fluid composition;

FIGS. 18a-18d show views of a collinear fluid delivery tube; and in particular, FIGS. 18a and 18b are views of collinear fluid delivery tubes; and FIGS. 18c and 18d are cross-sections of the compound fluid flowing from the outlet of the collinear fluid delivery tubes of 18a and 18b;

FIG. 19 is a cross-sectional view of an apparatus to control the composition of matter of a collinear compound jet;

FIGS. 20a-20c show views of an array of collinear fluid delivery tube; and in particular, FIGS. 20a and 20b are views of an array of collinear fluid delivery tubes; and 20c is a cross-sectional view of an apparatus for the formation of collinear compound fluid flows;

FIG. 21 is a cross-sectional view of an apparatus to control the composition of matter of a collinear compound jet during fluidic levitation of a substrate with an orthogonal jet emitting from the surface of a stationary fluid emanating support, said substrate having a levitation stabilizing structure;

FIG. 22 is a cross-sectional view of an apparatus for carrying out the method of dosing the surface of a substrate during fluidic levitation, said substrate having a levitation stabilizing structure, by controlling the composition of matter of a compound jet during fluidic levitation of said substrate with an orthogonal jet emitting from the surface of a stationary fluid emanating support;

FIG. 23 is a schematic illustration of a fluid delivery system useful in the present invention;

FIGS. 24a-24g show illustrations of a substrate and thin-film structures; and in particular, FIGS. 24a, 24c, 24e, and 24g are illustrations of a substrate and thin-film structures sequentially deposited using the levitation stabilizing structures of FIGS. 24b, 24d, and 24f and the system of the present invention; FIG. 24a is an illustration of a substrate useful in the present invention; FIG. 24b is an illustration of a levitation stabilizing structure that is useful to deposit the structure illustrated in FIG. 24c; FIG. 24d is an illustration of a levitation stabilizing structure that is useful to deposit the structure illustrated in FIG. 24e; and FIG. 24f is an illustration of a levitation stabilizing structure that is useful to deposit the structure illustrated in FIG. 24g;

FIG. 25 is an illustration of an embodiment of a flow control structure proximate to a stationary fluid emitting support; and FIG. 26 is an illustration of an embodiment of a flow control structure proximate to a stationary fluid emitting support;

Figure 3:
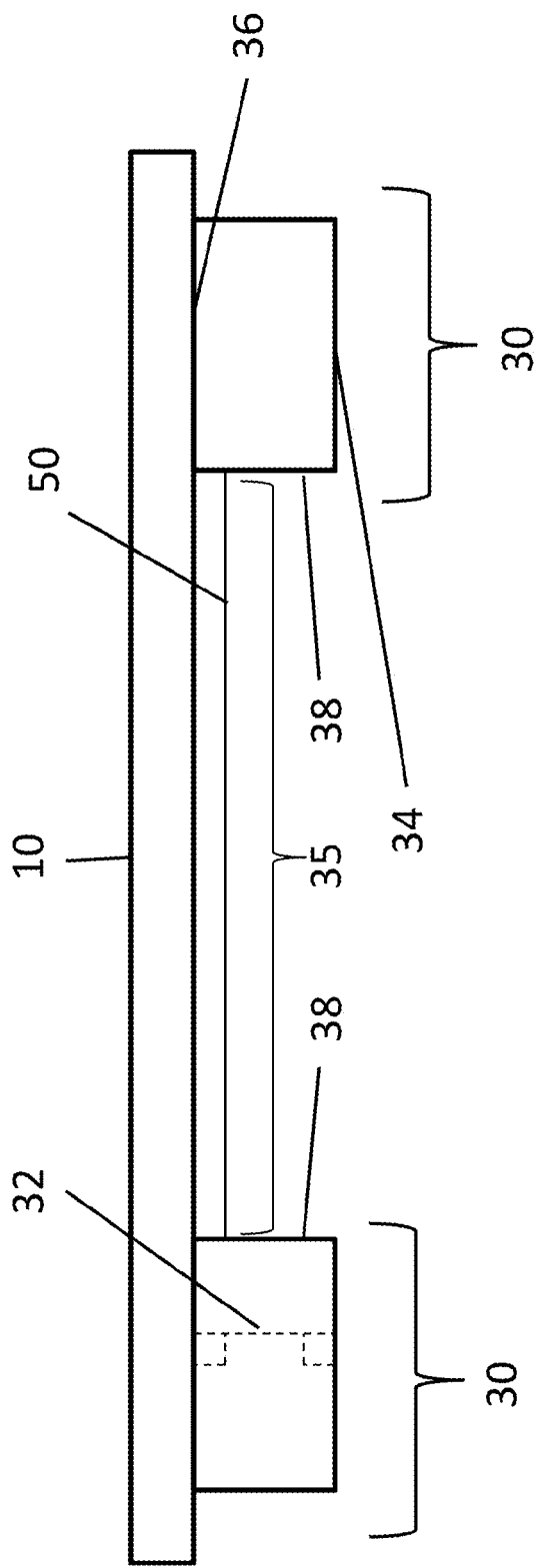
FIG. 3 is a cross-sectional view of one embodiment of the invention including a substrate with a levitation stabilizing structure fabricated thereupon.

The figures are intended to represent the elements of the invention and the positional relationship between elements of the invention. The elements of the invention have been represented using relative dimensions that are felt to best illustrate the elements of the invention and may not correspond to the actual dimension of the elements as the invention is practiced.

DETAILED DESCRIPTION OF THE INVENTION

The present invention is directed toward methods, equipment, and structures for depositing atomic layers on a moveable substrate by employing Bernoulli effects to fluidically levitate the moveable substrate over a stationary support through which fluid will flow. The invention includes a levitation stabilizing structure that is employed during fluidic levitation by attaching the levitation stabilizing structure to the surface of the levitated moveable substrate. The present invention also includes a method for achieving stable fluidic levitation of a moveable substrate with one or more orthogonal jets, and optionally one or more non-orthogonal jets, where the lateral movement of the moveable substrate during the fluidic levitation process is controlled by employing a levitation stabilizing structure on the surface of the substrate.

The present specification also teaches the utility and advantages of fluidic levitation during substrate processing. Some of the advantages of fluidic levitation during substrate processing include contact-less sample processing, rapid heating and cooling of the substrate due to the isolation of the sample by the fluidic flow, particle cleanliness and low particle defectivity, improvement in removal of fluid process products, and improvements in process uniformity. In an embodiment, the present invention discloses a method for providing stable fluidic levitation that employs a single orthogonal jet and optionally one or more tilted jets. In other embodiments, multiple jets are used.

A useful embodiment of the present invention provides a non-contact method for achieving positional stability of a moveable substrate during fluid levitation wherein the fluid is either a gas or a liquid. In particular, the invention provides a non-contact method for achieving positional stability of a moveable substrate during fluid levitation wherein the lateral motion of a planar substrate is controlled during fluid levitation and the fluid is a gas or a liquid. In a further embodiment, the invention provides a non-contact method for achieving positional stability of a substrate during fluid levitation wherein the lateral motion of planar plate-shaped substrates is controlled during fluid levitation and the fluid is a gas or a liquid. An alternative embodiment provides a non-contact method for achieving positional stability of a pneumatically levitated substrate floating on a gaseous fluid layer produced by a collimated fluid gaseous jet during the moveable substrate processing for the purpose of reducing the substrate defectivity incurred as a result of processing. In yet another embodiment, the invention provides a method of moveable substrate handling wherein the defectivity whose root causes are attributed to either repeated physical contact with any portion of the moveable substrate surface or to particles generated as a result of physical contact with the moveable substrate can be minimized or eliminated during substrate processing, the substrate processing including substrate transport, substrate handling, substrate storage, as well as other processing sequences such as, for example, deposition, etching, and cleaning. The invention also provides a method for achieving positional stability of a moveable substrate levitated on a gaseous fluid layer produced by a collimated fluid gaseous jet wherein the method is compatible with normal fabrication methods and workflow employed in the manufacture of integrated circuits and the like. Furthermore, the invention provides a non-contact method of achieving positional stability of a moveable substrate levitated on a gaseous fluid layer produced by a gaseous jet wherein a substrate of variable shape, for example, circular or non-circular, planar or non-planar is employed. An additional embodiment provides a non-contact method of achieving positional stability of a substrate levitated hydraulically or pneumatically on a fluid layer produced by a fluid jet wherein the method is compatible with miniaturization for the purpose of integrating said method of positional stabilization of a substrate during fluidic levitation into microelectromechanical systems for the purpose of producing novel and hitherto unknown miniaturized pneumatic or hydraulic devices as well as novel micromechanical and micro-fluidic devices operating with liquids or gases. In yet another embodiment, the invention provides a method for utilizing and controlling fluid energy and fluid flow on a miniature or microscopic scale by either passive or active means.

A substrate is an object of definite shape and volume comprised of a surface together with the volume enclosed by the surface. In one embodiment, a substrate is an object of definite shape and volume that has at least one surface. A solid substrate is an object of definite shape and volume, not liquid or gaseous, comprised of a surface together with the volume enclosed by the surface. In one embodiment the volume of a substrate enclosed by the substrate surface can be comprised of a non-commingled mixture of liquids, gases, or solids. In an embodiment the volume of a substrate enclosed by the substrate surface can be comprised of a commingled mixture of liquids, gases, or solids. In another embodiment the volume of a substrate enclosed by the substrate surface can be comprised of a mixture of liquids, gases, and solids. In another embodiment, the volume of a substrate enclosed by a substrate surface can be comprised of a mixture of solids and gases. An example of a commingled mixture of a solid and a gas is a solid with holes, bubbles, tunnels, or channels in it where the holes, bubbles, tunnels, or channels are filled with a gas. In one embodiment, the volume of a substrate enclosed by a substrate surface can be comprised of a mixture of solids and liquids. An example of a commingled mixture of a solid and a liquid is a solid with holes, bubbles, tunnels, or channels in it where the holes, bubbles, tunnels, or channels are filled with a liquid. In a further embodiment, the volume of a substrate enclosed by a substrate surface can be comprised of a commingled mixture of gases and liquids. In an embodiment, the volume of a substrate enclosed by a substrate surface can be comprised of a commingled mixture of at least one liquid. An example of a liquid that can be used to form a substrate is supercooled liquid like a glass. Another example of a liquid that can be used to form a substrate is a gel. In a further embodiment, the volume of a substrate enclosed by a substrate surface can be comprised of a commingled mixture of gases and liquids. An example of a commingled mixture of gases and liquids is a glass with bubbles in it. The volume of a substrate enclosed by a substrate surface can be comprised of a commingled mixture of solids. The volume of a substrate enclosed by a substrate surface can be comprised of a non-commingled mixture of solids. In one embodiment of a substrate, the mixture of solids in the volume enclosed by a substrate surface can be layered and comprised of one or more layers of solid material overlaying and in contact with one another. In an embodiment of a substrate, a substrate comprised of a mixture of layered solids in the volume of substrate enclosed by the substrate surface has existing layers. Thin films on a substrate are existing layers.

For the purposes of the invention the term "moveable substrate" refers to a substrate that undergoes positional displacement during fluidic levitation upon exposure to a fluidic flow employed for the purpose of inducing fluidic levitation of the substrate and opposing the force of gravity during said levitation state. The term "stationary support" refers to a stationary fluid emitting element that is employed for the purpose of supplying a fluidic flow, said fluidic flow being employed for the purpose of inducing fluidic levitation of the moveable substrate and producing fluidic forces opposing the force of gravity when the moveable substrate is in a levitated state. The term "support during levitation" means that the moveable substrate can be levitated by fluid flow emanating from the stationary support so that gravitational force on the moveable substrate is opposed by the force of a fluidic flow. When the stationary support located in the chamber supports the moveable substrate during levitation, the fluid flow causes the moveable substrate to levitate, forming a gap through which fluid can flow between at least a portion of the stationary support and a portion of the moveable substrate so that the flowing fluid impinges on at least a portion of the substrate to expose the substrate portion to the fluid.

In contrast to moveable substrates, conventional substrates are fixed in position during processing, for example, using mechanical restraints, vacuum chucks, or electrostatic chucks.

As used herein, the terms "reactive chemical substance", "chemically reactive reagent", "reactive reagent", "reactive chemical", "reactive substance", and "reactive material" will all refer to composition of matter that is not chemically inert to at least one of the materials of construction of the fluid delivery system. A reactive fluid flow is fluid flow containing and comprised of at least one composition of matter that is not chemically inert to at least one of the materials of construction of the fluid delivery system or a surface of the moveable substrate. A reactive fluid flow can be comprised of a chemically reactive gaseous fluid. A reactive fluid flow can be comprised of a chemically reactive condensed fluid like a liquid. A reactive fluid flow can be comprised of a chemically reactive aerosol comprised of solid or liquid particles dispersed and intermingled in a gas. A reactive fluid flow can be comprised of a chemically reactive dispersion comprised of solid particles dispersed and intermingled in a liquid. A reactive fluid flow can be comprised of a chemically reactive dispersion comprised of two immiscible liquids dispersed and intermingled to form a composite liquid fluid.

In general, levitation is the condition that occurs when the force of gravity on a movable substrate has been equaled or exceeded by an external opposing force. Fluidic levitation is the condition where the force of gravity on a substrate has been equaled or exceeded by an external opposing force supplied by a fluid such as a gas or liquid. The term "support during levitation" means that the moveable substrate can be levitated by fluid flow emanating from the stationary support through which fluid will flow so that gravitational force on the moveable substrate is opposed by the force of a fluidic flow. As used here, pneumatic levitation using a gaseous fluid, that is—a compressible gas phase fluid, is the condition occurring when the force of gravity on a substrate has been equaled or exceeded by an external opposing force produced by application of a gaseous fluid and its associated flow proximate to the substrate surface, the substrate being rigid or flexible, and the substrate being held and suspended proximate to a stationary gas emitting support through which fluid will flow and separated from the stationary gas emanating stationary support only by a gaseous layer of fluid which occupies the volume between the moveable substrate and the stationary gaseous fluid emitting support. The substrate is a movable object responding to both the force of gravity and to the external pneumatic forces produced by pneumatic flow, said pneumatic flow occupying the volume between the substrate and the stationary fluid emanating support. In this disclosure the substrate participating in the process of fluidic levitation is also called the moveable substrate because it exhibits motion in response to the application of pneumatic force or fluid force from the fluid emanating from the fluid emitting stationary support. The term "stationary support" means that the application of pneumatic force as a result of the initiation of gas flow from the stationary gaseous fluid emitting support through which fluid will flow results fluidic levitation by virtue of movement of the substrate, not by movement of the fluid emanating support. Of course, it is possible that the stationary gas emitting support can be transported or become movable while a substrate is fluidically levitating thereupon, resulting in simultaneous movement of both the fluidically levitating substrate and the stationary support.

Pneumatic levitation can occur for substrates of many different shapes and many different chemical compositions. A notable example is the pneumatic levitation of a spherical object often exemplified by the pneumatic levitation of a rotating billiard ball in a high velocity proximate gas stream. An industrial application of pneumatic levitation is the handling and transport of essentially planar objects such as labels, webs, and sheets of various materials, including sheets of glass. Pneumatic levitation is also applied to the handling, transport, and positioning of diverse materials such as thin plate-like circular shaped wafers of silicon and large glass sheets for the purpose of minimizing and eliminating physical contact with the surfaces of the movable pneumatically levitating substrate as well as to minimize particle contamination of delicate surfaces such as optical films or integrated circuits that have been fabricated on the surfaces of the movable substrates.

There are several methods for achieving pneumatic levitation of a movable substrate and providing a gaseous fluid proximate to the movable substrate using a stationary gaseous fluid emitting surface for the purpose of pneumatic levitation and providing a gaseous cushion or gaseous layer upon which the movable substrate can be supported or floated, such that the force of gravity on the non-stationary substrate is overcome by an opposing pneumatic force and there is no physical contact between the opposing substrate and the surface of the stationary fluid emitting support assembly employed as a means for providing the frictionless gaseous layer.

The gaseous cushion or gaseous layer upon which the movable substrate can be supported or floated during pneumatic levitation can be achieved with a variety of gas phase fluids when suitable conditions are used. It is preferable that the gaseous fluid employed for the purpose of achieving pneumatic levitation possesses the property that the gas does not undergo phase transitions and condense to either a liquid or a solid but instead remain as a gas in the gas phase under the temperature and pressure conditions employed during the process of pneumatic levitation. The temperature and pressure conditions encountered and experienced by a fluid during the process of pneumatic levitation conditions can involve pressure and temperature excursions leading to gas temperatures and pressures above and/or below standard temperature and pressure (273.15K and 1 atm). It is recognized that phase changes of a gaseous fluid that can occur upon exposure to the varying temperature and pressure conditions encountered during pneumatic levitation can result in unpredictable pneumatic levitation phenomena. It is desirable that the one or more gaseous fluids employed for pneumatic levitation have the property that sufficient gas remains in the gas phase to sustain pneumatic levitation during any temperature and pressure excursions experienced by the gaseous fluid during the pneumatic levitation process. Typical gas phase fluids employed for pneumatic levitation include but are not restricted to air, any gas that is a component of air such as nitrogen, hydrogen, helium, neon, argon, krypton, carbon dioxide, and the like; mixtures of gases that are components of air; organic compounds, organometallic compounds, and inorganic compounds as well as other chemical substances and volatile mixtures thereof that exist is the gaseous phase under pneumatic levitation operating conditions; gas phase mixtures comprised of organic, organometallic, or inorganic gas phase compounds with gases that are components of air, and the like.

The local surrounding fluid pressure proximate to both the moveable substrate and stationary support is called the ambient fluid pressure or just the ambient pressure. The fluid environment can be either a gaseous fluid or a condensed fluid like a liquid and is preferably the same medium as employed for fluidic levitation. Additionally, elements of the moveable substrate that may not be opposing the stationary support may also experience ambient pressure. For example, a portion of a web of polymer can be pneumatically levitated and the remainder of the web, which is an element of a moveable substrate that is not opposing the stationary fluid emitting support and is not undergoing pneumatic levitation, still may experience ambient pressure. When the moveable substrate and stationary support are placed inside a chamber as part of an apparatus, the surrounding or ambient pressure of the moveable substrate and stationary support, that is— the prevailing fluid pressure proximate to both the moveable substrate and the stationary support—may range from the millitorr region to pressures greater than 2 or more bar. Fluidic levitation employing either pneumatic or hydraulic levitation does not require a specific ambient pressure for operation, as has been demonstrated through the many examples reported in the art. For this reason there is not a preferred ambient pressure specification associated with fluidic levitation. In the case of pneumatic levitation, the main ambient pressure requirement is that the ambient conditions fall within the pressure regime required for the gaseous phase to remain gaseous. Similarly, in the case of hydraulic levitation, the main ambient pressure requirement is that the ambient conditions fall within the pressure regime required for the condensed fluid phase to remain as a condensed fluid.

In one embodiment or configuration, the pneumatic layer producing the gravity-opposing pneumatic force, (also called the pneumatic fluid layer, the fluid layer, the gaseous fluid layer or the gaseous layer), can be provided by a stationary assembly or stationary support through which gaseous fluid will flow with a surface in such a way that a gas flow is uniformly distributed over the entire area underneath the moveable substrate using, for example, a porous surface through which gas can flow. A porous surface has spaces, holes, or other features through which a fluid may pass that are distributed over the surface wherein the surface is uniformly susceptible to the penetration of fluids. For example, two fluid filled chambers separated by a porous surface are in fluid communication in a uniform manner over the entire surface area of the porous surface. A porous surface is, therefore, a surface having the property of uniform fluid transport at all locations on the surface. The substrate surface facing the porous gas emitting surface can be planar, non-porous, and essentially featureless or it can be shaped in some manner to conform in topographical manner to pre-existing 3 dimensional features of the porous gas emitting surface. The substrate surface facing the gas emitting surface is also called the substrate surface opposing the porous gas emitting surface of the stationary support. The gaseous fluid emitted by the gas emanating surface of the stationary support possesses an associated gaseous pressure. Pressure is force per unit area and thus the gaseous pressure of the gaseous fluid emitting from the gas emanating surface of a fluid emanating stationary support can exert a force on an object upon which said flow impinges. When a substrate is fluidically levitated using a porous gas emanating stationary support the total gaseous fluid flow is kept as low as possible and the constant gaseous fluid flow provides a localized constant positive pressure region, that is—a localized constant force per units area, perpendicular to the substrate in such a manner as to oppose the force of gravity.

In the special case of a planar porous gas emitting surface, the gaseous fluid layer residing between the substrate surface opposed to the gas emitting surface and the gas emitting surface has a parabolic shaped positive pressure profile in the space between the porous surface and the opposing substrate or support surface. A positive pressure profile is a pressure profile where the pressure in the region of interest is greater than the surrounding ambient gaseous pressure found at the circumference of the substrate, said region of interest being the volume between the gas emanating surface of the stationary support and the opposing substrate surface that is occupied by the flowing gaseous fluid. If the integrated force produced by the positive pressure profile across the substrate surface is sufficient to overcome the force of gravity on the movable substrate the said integrated force results in fluidic levitation of the substrate. Thus, a positive pressure profile producing an integrated force whose magnitude is larger than the opposing force of gravity is employed to provide sufficient force in the form of pneumatic pressure so as to overcome an opposing force such as gravity, thereby achieving pneumatic levitation. In the case of levitation using a fluid emanating from a porous surface, the emanating fluid exhibiting a positive pressure profile also has a laminar flow pattern whose streamline are directed towards the substrate circumference in the region between the porous surface and the substrate surface. This method of pneumatic levitation of a substrate on a gaseous fluid layer and the associated fluid hydrodynamics is described by J. S. Osinski, S. G. Hummel, and H. M. Cox in the article titled "Vapor Levitation Epitaxy Reactor Hydrodynamics" (J. Electronic Materials, 16(6), (1987), 397-403). In the method described by Osinski et al the pressure orthogonal and normal to the substrate surface, that is, perpendicular to the substrate surface, is balanced against the opposing force of gravity, to provide the desired pneumatic levitation, (also called gaseous flotation), of the moveable substrate. According to Osinski's description of vapor levitation hydrodynamics, the gaseous pressure in the volume between the movable substrate and the opposing surfaces of the porous gas emitting surface is above ambient pressure at all points under the substrate—ambient pressure being defined as the prevailing gaseous pressure in the surrounding environment proximate to the substrate and the stationary gas emitting support. Lateral movement of the substrate is still possible when the gas-emanating stationary support is comprised essentially of a porous gas emitting surface, and the use of physical stops is advantageous to restrict lateral motion of the substrate during levitation as the restraining force of the orthogonal gas flow is not sufficient to impede lateral motion of the substrate. The substrate can move in manner similar to a hockey puck on ice in the absence of physical stops the restrain lateral motion.

In a second embodiment or configuration, the pneumatic layer employed to produce a gravity opposing pneumatic force required for pneumatic levitation is provided by a stationary assembly or support having a non-porous surface through which fluid will flow with a defined surface area and providing a gas flow in such a way that the gas flow is distributed across an area of the opposing face of the substrate using a support with a non-porous surface through which fluid will flow containing at least one fluid collimating conduit, nozzle, bore or orifice in fluid communication with a pressurized manifold or plenum, thereby enabling pressurized fluid to flow through the fluid collimating conduit, nozzle, bore, or orifice, resulting in the production of at least one high velocity fluid flow emanating from the stationary support surface. The high-velocity fluid flow emanating from the fluid collimating conduit, nozzle, bore, or orifice is also called a fluid jet. Unless described to the contrary, the term "fluid collimating conduit" refers to a structure through which fluid flows and assists with alignment of the stream lines of the fluid flow. It is understood that in practice it is difficult to achieve completely collimated or aligned fluid flow and fluid collimating conduits of the present invention include fluid collimating conduits that produce partially collimated fluid flows. Thus the non-porous surface of the gas-emanating stationary support through which fluid will flow contains at least one fluid collimating conduit, nozzle, bore, or orifice in fluid communication with a pressurized manifold or plenum, thereby enabling pressurized fluid to flow through the fluid collimating conduit, nozzle, bore, or orifice, resulting in the production of at least one fluid jet impinging on the opposing substrate surface. The opposing movable substrate surface facing the stationary gas emitting surface containing at least one fluid collimating conduit, nozzle, orifice, or bore follows the contours of the stationary gas emitting surface in a conformal-like manner. The surface area of the moveable substrate can be less than that of the stationary support, equal to that of the stationary support, or exceed that of the stationary gas emitting support surface. For example, a web of a moveable substrate that is pneumatically levitated over a gas-emanating stationary support supplying a frictionless, gravity opposing, thin layer of gaseous fluid between the web and the surface of the stationary support is an example of a moveable substrate whose surface area is larger than the opposing gas-emanating stationary support. The amount of surface area of the moveable substrate and the amount of surface area of the gas-emanating stationary support relative to the cross-sectional area of the gas emanating orifice is important for pneumatic levitation: the surface area of the stationary fluid emanating support is at least four times larger than both the cross-sectional area of the fluid collimating conduit, orifice, nozzle, or bore and the cross-sectional area of the collimated fluid jet flowing produced by said fluid collimating conduit, orifice, nozzle, or bore for robust fluidic levitation. Similarly, the surface area of the opposing substrate surface is at least four times larger than the cross-sectional area of the fluid collimating conduit, orifice, nozzle, or bore and the cross-sectional area of the collimated fluid jet produced by said fluid collimating conduit, orifice, nozzle, or bore for robust fluidic levitation.

In a third embodiment or configuration, the pneumatic layer employed to produce a gravity opposing pneumatic force required for pneumatic levitation can be provided by a stationary assembly or support through which fluid will flow having a non-porous surface with a defined surface area and providing a gas flow in such a way that the gas flow is distributed across an area of the opposing face of the substrate using a support with a plurality of fluid collimating conduits, nozzles, bores, or orifices, usually arranged in a specific pattern, where the plurality of fluid collimating conduits, nozzles, bores, or orifices is in fluid communication with a pressurized manifold or pressurized plenum, thereby enabling pressurized fluid to flow through the fluid collimating conduits, bores, or orifices resulting in the production of a plurality of gaseous fluid jets emanating from the stationary support surface. The opposing movable substrate surface facing the stationary gas emitting surface containing a plurality of fluid collimating conduits, may contain only small features and is essentially conformal to the stationary gas emitting surface topography—that is, the shape of the moveable substrate surface essentially follows that of the gas emitting stationary support. As mentioned previously, the surface area of the moveable substrate can be less than that of the stationary support, equal to that of the stationary support, or exceed that of the stationary gas emitting support surface.

The fluid collimating conduits, nozzles, bores, or orifices in the fluid-emitting stationary support through which fluid will flow may produce gaseous jets of varying orientation relative to the stationary support surface normal. The gaseous jets can be parallel to the stationary gas emitting surface normal, in which case they are called orthogonal jets or normal jets that emit from the stationary surface. Gaseous or liquid fluid jets that have their velocity vector parallel to the surface normal are also called jets that are orthogonal or normal to the reference surface, the reference surface being the surface of the stationary support. Alternatively, the stationary support may contain fluid collimating conduits, nozzles and bores that are not oriented parallel to the stationary support surface normal and these fluid collimating conduits can produce fluid jets that can be tilted at an angle relative to the surface normal as described by Yokajty in U.S. Pat. No. 5,470,420 (referenced above). Fluid jets where the fluid is a gaseous or a liquid and whose velocity vector is not parallel to the stationary support normal are called non-orthogonal jets. Fluid jets where the fluid is a gaseous or a liquid and whose velocity vector in not parallel to the stationary support normal are also called tilted jets because they are tilted with respect to the reference surface normal and are not parallel to the normal of the reference surface of the stationary support. When a plurality of fluid jets, comprised of either orthogonal jets, non-orthogonal jets or both orthogonal and non-orthogonal jets, are used to achieve pneumatic levitation the total gaseous fluid flow is often kept as low as possible.

When all jets are closely spaced orthogonal jets, the jets being orthogonal with respect to the gas-emitting stationary support and the moveable substrate is oriented parallel to the stationary support surface, then all jets are orthogonal to the moveable substrate also. In this configuration the gaseous fluid flow provides a constant pressure perpendicular to the substrate by virtue of the interaction of the fluid flow from the closely space orthogonal jets and the flow patterns are similar to those found when the stationary support is a porous surface. This method of pneumatic levitation is similar to the well-known gas bearing, which may utilize fluid collimating conduits, nozzles, bores, or orifices or slots to accomplish the generation of a frictionless positive pressure gaseous film between two surfaces. In one embodiment of a gas bearing employing fluid collimating conduits, nozzles, bores, orifices as a way of providing positive gas pressure underneath a substrate surface, pneumatic levitation of the moveable substrate is the result of the gravity opposing force provided by the positive pressure of the gaseous fluid layer located between the moveable substrate and the stationary support as it flows towards the edges of the movable substrate, there being no pressure below ambient produced anywhere underneath the substrate surface during pneumatic levitation process. Gas bearings may also be formed with a variety of other fluid delivery configurations, including the transverse flow configuration described by Levy et al in U.S. Pat. No. 8,398,770 B2. In the transverse flow configuration the gaseous fluid travels in and is essentially confined to a pressurized channel. The gas emanating from one or more of these pressurized channels can provide a pneumatic force perpendicular to the surface of the moveable substrate and additionally opposing the gravitational force on the apparatus in which the pressurized channels are contained, said pneumatic force being sufficient to allow pneumatic levitation of the channel containing apparatus.

Pneumatic levitation can be accomplished using a single gaseous jet that is orthogonal to locations on both the gas-emanating stationary support and the opposing surface of a moveable substrate and the gas from the single gaseous jet is used to provide a frictionless gaseous cushion or gaseous layer upon which the non-stationary substrate can be supported so that there is no physical contact between the substrate and the gas-emanating stationary support. Pneumatic levitation of this type that is accomplished by using an orthogonal jet that is orthogonal to both the stationary support and the opposing surface of a moveable substrate is known more generally as Bernoulli levitation, and is sometimes also referred to as Bernoulli floatation, or Bernoulli airflow.

Unlike the "vapor levitation" described by Osinski et al, Bernoulli levitation with orthogonal jets relies upon the complex fluid mechanic behavior of the gaseous fluid layer located between a gas emanating support surface and an opposing substrate surface that is supplied by a single orthogonal gaseous jet to produce a frictionless gaseous layer between the gaseous jet emitting surface and the opposing substrate surface. This is the same levitation method referred to in U.S. Pat. No. 5,370,709. Fluid mechanic models describing and distinguishing Bernoulli levitation with gases from other methods of pneumatic levitation, such as those forms of levitation employed in air bearings, have recently appeared in the open scientific literature—for example, see Waltham et al, (Waltham, C. E., Bendall, S., Lotlicki, A., "Bernoulli Levitation", Am. J. Phys. 71(2003) 176-179).

Without wishing to be bound by theory, computational fluid-mechanical models have led to the assertion that in the case of Bernoulli levitation the two surfaces involved in levitation, meaning the two surfaces that are orthogonal to the gaseous jet, each should have an area that is at least 4 times larger than the cross-sectional area of the jet itself.

As the jet-to-jet distance and spacing between the nozzles or fluid collimating conduits in the stationary support increases, the limiting case of a single jet employed for pneumatic levitation is reached. Of particular interest in the present invention is the configuration where only a single fluid collimating conduit, nozzle, bore, or orifice is contained in a non-porous stationary support through which fluid will flow and is in fluid communication with a pressurized manifold or pressurized plenum that is pressurized with a fluid, the fluid being a gas; the single fluid collimating conduit generating a single orthogonal gaseous jet; the orthogonal gaseous jet impinging on an opposing substrate in an orthogonal manner; the surface area of the stationary support being at least 4 times larger than the cross-sectional area of the fluid emitting fluid collimating conduit; and the surface area of the opposing substrate surface being at least 4 times larger than the cross-sectional area of the fluid emitting fluid collimating conduit.

In one embodiment, the two surfaces involved in levitation, meaning the two surfaces that are orthogonal to the gaseous jet, each should have an area that is at least 4 times larger than the cross-sectional area of the fluid emitting fluid collimating conduit, nozzle, bore, or orifice contained in the fluid emanating stationary support, said fluid collimating conduit, nozzle, bore, or orifice being capable of producing a localized gaseous jet using gas flowing from a gas emitting support surface containing at least one of said fluid collimating conduit, nozzle, bore, or orifice; said fluid collimating conduit, nozzle, bore, or orifice being capable of producing a gaseous jet whose velocity vector is essentially orthogonal to at least one point on the gas emitting surface and whose velocity vector is additionally essentially orthogonal to at least one point on the opposing substrate surface.

Again without wishing to be bound by theory, it is believed that the description of Bernoulli air-flow levitation with orthogonal jets involves complex fluid flow patterns: as the orthogonal jet interacts with the opposing surface the orthogonal jet strikes or impinges on the surface of the opposing substrate. A stagnation point where there is no fluid movement is established proximate to the opposing surface and the direction fluid flow of the jet changes proximate to the stagnation point at the opposing substrate surface in a manner that appears as if the stagnation point was deflecting fluid from contact with the surface at the stagnation point location. The flow pattern thereby established is sometimes called stagnation flow and occurs over a cross-sectional area defined by the jet impingement region on the opposing substrate surface said cross-sectional area being at least as large as the fluid jet cross-sectional area. The fluid flow proximate to the stagnation point rapidly changes direction, turning 90 degrees relative to the initial jet velocity vector and becomes a radial symmetric flow centered around the impingement region of the orthogonal jet on the opposing substrate surface. When this directional reorientation of the flow occurs there is an abrupt change in the direction of the fluid velocity vector from a velocity vector which is essentially orthogonal to the substrate surface to a velocity vector that is essentially parallel to the opposing substrate surface. The velocity vector of the fluid flow undergoes a large change in magnitude as the fluid expands radially outwards. The horizontal velocity component that is parallel to the opposing substrate is essentially zero at the edge of the gaseous orthogonal jet and when the jet changes direction as it flows around the stagnation point on the substrate surface the horizontal velocity component increases substantially during radial expansion of the fluid. The sudden change in horizontal fluid velocity that occurs as the fluid expands radially into the volume surrounding the orthogonal jet produces a radially symmetric localized region of reduced pressure surrounding the jet, as described by Bernoulli's theorem. Bernoulli's equation and theorem is well known to those skilled in the art of fluid mechanics. As the fluid further expands into the increasingly large annular volume surrounding the orthogonal jet, the velocity of the gaseous fluid gradually decreases in a manner inversely proportional to distance from the jet until it reaches the circumference of either the levitated substrate or the stationary gas emitting support (whichever is reached first)—at which point the pressure of the gaseous fluid equalizes with local surrounding or ambient pressure, the local surrounding or ambient pressure being defined as the prevailing gaseous fluid pressure proximate to both the moveable substrate and the gas-emanating stationary support. Conservation of mass dictates that the sum total of the flow over all exit points of the radial flow equals the total flow injected into the volume between the moveable substrate and the stationary support by the orthogonal jet.

The spatial profile of gaseous pressure in the volume between the gas-emitting support from whence the orthogonal jet emanates and the opposing substrate surface is complex with multiple features and is a distinguishing feature of Bernoulli levitation and Bernoulli airflow with condensed liquid fluids and gaseous fluids. During pneumatic Bernoulli levitation there is a high pressure region where the orthogonal jet impinges on the opposing substrate and produces stagnation flow. The high-pressure region associated with impingement of the orthogonal jet on the opposing substrate surface generates a net force which acts to push away the opposing surface of the moveable substrate from the gas-emanating stationary support. The localized high-pressure region in the volume between the moveable substrate and the stationary support is surrounded by a reduced pressure region that extends radially outwards in a radially symmetric fashion. The minimum pressure found in the reduced pressure region is significantly lower than the stagnation pressure found at the jet impingement location on the opposing substrate, and the reduced pressure rises to ambient pressure in a monotonic fashion outward along the symmetric radial flow direction from the edge of the orthogonal jet to the ambient pressure exit point of the radial flow. The reduced-pressure region generates an attractive force between the moveable substrate and gas-emanating stationary support, and thus the internal pneumatic pressure from the flowing gas in the radial flow region "pulls" the opposing substrate surface towards the stationary support. The complex spatial pressure distributions produced in the volume between the moveable substrate and the stationary support during pneumatic Bernoulli levitation are characterized by both attractive and repulsive forces that further interact with the gravitation force on the moveable support to produce pneumatic levitation when sufficient flow is present. The integrated force on the surface of the moveable substrate is the sum of all the forces present and includes the force of gravity as well as the pneumatic forces produced by both the impinging high pressure orthogonal jet and the integrated force over the remaining substrate surface that results from the reduced pressure region, or low pressure region, surrounding the impinging orthogonal jet. There are, then, multiple forces produced by pneumatic flow from the orthogonal jet in the volume between the moveable substrate and the stationary support: the orthogonal jet produces a repulsive force that acts to push the moveable substrate away from the stationary support and the low pressure in the radial flow region produces a net attractive force that acts to pull the moveable substrate closer to the stationary support. The net force generated when sufficient flow is present to produce pneumatic levitation by overcoming the effect of gravitational force on a substrate is referred to as "suction" in U.S. Pat. No. 5,370,709 (referenced above).

Without wishing to be bound by theory, computational fluid-mechanical models have led to the assertion that in the case of Bernoulli levitation the two surfaces involved in levitation, meaning the two surfaces that are orthogonal to the gaseous jet, also leads to unique distributions of chemically reactive species during fluid flow. During pneumatic levitation of a moveable substrate using a single orthogonal jet emanating from a stationary support, the gas from the orthogonal impinging jet expands radially into the surrounding volume. As the fluid expands into cylindrical annuli of ever increasing radius, the volume increase of successive cylindrical annuli encountered as the fluid flows radially outward is directly proportional to the distance from the jet. Thus, if a pulse or small quantity of material is injected into the orthogonal jet and produces a number density of $\xi$ of molecules/unit volume at the impingement location of jet, as these molecules flow radially outward and are diluted by additional flow the number density of the molecules will vary as $(\xi/r)$ where r is the radial distance from the impingement location of the orthogonal jet on the moveable substrate. In other words, the number density or concentration of the molecules in the volume between the stationary support and the moveable substrate will decrease in a manner inversely proportional to the distance from the jet as the injected pulse flows radially outward. At the same time, both experimental measurements and theoretical calculations show that the velocity with which the molecules flow outward falls off in a manner that is inversely proportional to r—which means that the residence time of a molecule at a particular location is proportional to the distance from the jet. Thus, the product of the concentration of molecules, (which is inversely proportional to r), and the residence time, (which is proportional to r), is constant during radial flow outward from the jet impingement location. The product of concentration or molecular number density and residence time is known as exposure, and is related to the amount of time that a surface is exposed to a given molecular flux. The radial outward flow from the orthogonally impinging jet has the unique property that exposure of a surface to a vapor phase molecular species remains essentially constant as outward radial flow proceeds as long as the consumption of the molecular species by secondary processes is small in comparison to the initial molecular number density. This unique property of radial flow configurations is particularly advantageous for specific deposition processes involving surface adsorption like, for example, atomic layer deposition, or for any other process where uniform surface exposure is important to achieve spatially uniformity of a chemical reagent on a substrate surface.

The velocities of the gaseous fluid phase as it undergoes outward radial expansion can be quite large. Gas velocities approaching the speed of sound are easily achievable and these high gas velocities lead to very rapid gas exchange in the volume region defined by the gas emanating support surface and the opposing surface of the moveable substrate. Depending on the pneumatic levitation height and fluid throughput, gaseous volume exchange as fast as 100 volume exchanges per second are possible. The advantages of rapid gas volume exchange have been previously disclosed in U.S. Pat. No. 5,370,709 with respect to vapor phase epitaxy processes where it is recognized that both particle contamination and chemical contamination by volatile impurities are minimized in processes where rapid gas exchange is present. Processes having rapid gas exchange can also run faster, leading to higher process throughput, especially if gas phase reactants or impurities must be removed by a purge step while the process is running. The rapid gas exchange that is inherent to pneumatic levitation utilizing radial flow from a single orthogonal jet is particularly well suited for processes like, for example, atomic layer deposition or vapor priming, where gaseous reactants must be repeatedly swept away from the substrate surface during the process sequence.

As mentioned above, pneumatic levitation is the condition where the force of gravity on a substrate has been equaled or exceeded by an external opposing force supplied by a fluid such as a gas or liquid. Pneumatic levitation is the result of a balancing of gravitational and pneumatic forces. The height to which a moveable substrate can be levitated is determined by a number of variables including moveable substrate mass, total pneumatic flow, and the configuration of the stationary gas emitting support and empirically is not highly variable with respect to total pneumatic flow; however, a stationary gas emitting support with a single fluid collimating conduit producing an orthogonal jet and constant gas flow will produce variable height levitation depending on the mass of the moveable substrate, the size of the orthogonal jet, and the volumetric flow of the orthogonal jet. Typical levitation heights for pneumatic levitation for appropriately sized orthogonal gaseous jets are less than 5 mm and often 0.5 mm or less, in other words, 500 microns or less.

In all of the pneumatic levitation methods previously described the moveable substrate is supported by a frictionless film of gas residing between the moveable substrate and the gas-emanating stationary support. The presence of unpredictable horizontal forces on the moveable substrate can result in undesirable substrate motion. For example, a slight tilt of the gas-emanating stationary support with a single orthogonal jet or a failure to exactly center the centroid of the moveable substrate over the orthogonal jet can generate unbalanced pneumatic forces which lead to horizontal, lateral motion of the moveable substrate and eventually result in displacement of the moveable substrate from its initial position until the substrate is no longer pneumatically levitated. When pneumatic levitation fails, the moveable substrate collides with the gas-emanating stationary support. Particle generation as a result of the collision as well as the generation of surface defects due to the physical contact of the collision leads to increased defectivity on the moveable substrate surface. Irregularities in gas flow patterns as a result of excessive surface roughness on the surface of the gas-emanating stationary support or the surface of the opposing substrate can produce similar results. U.S. Pat. No. 3,466,079 notes that during pneumatic levitation with an orthogonal jet it is "nearly impossible to center the exit orifice for the pressurized fluid over the support . . . . As a result, there is a force component tending to laterally shift the slice relative to the reference surface". Thus, the art clearly discloses the difficulty associated with implementing pneumatic levitation methods and keeping the moveable substrate stationary during processing of any type. Prior art has attempted to address this problem through the use of physical restraints such as edges and stops that provide physical contact with the moveable substrate edges and minimize undesirable motion. For applications such as the label positioning application described by Yokajty in U.S. Pat. No. 5,470,420 (referenced above) such a solution is acceptable; however, any physical contact to a substrate can result in substrate defects. Some substrate defects due to physical contact between the substrate and the stationary support during pneumatic levitation include edge deformation due to physical damage of the edge from physical contact with the stops, particle generation on the substrate surface, chipping of edges of brittle moveable substrates, and abrasion leading to particle formation and substrate deformation. In many applications involving the manufacture of high-value products with brittle or rigid substrates such as semiconductor integrated circuits, electro-optical components, and optical films particle related and deformation related defects must be minimized.

Levitation Stabilizing Structure

It has now been discovered that the problem of positional stability of the moveable substrate during pneumatic levitation with radially symmetric flow fields—including the radially symmetric flow fields produced by the annular nozzles arrays described in U.S. Pat. Nos. 5,492,566 and 5,967,578 (referenced above) can be addressed through the use of a levitation stabilizing structure fabricated on the moveable substrate itself rather than through the use of guides or restraining devices located on the gas-emanating stationary support as has been described in the prior art. Furthermore, it has been found that the fabrication of a levitation stabilizing structure for the purpose of processing the moveable substrate by employing pneumatic levitation and the subsequent removal of said levitation stabilizing structure after the processing step is compatible with the normal workflow encountered in the manufacture of integrated circuits, electrical components, and optical films.

Referring to FIG. 3 in an embodiment of the present invention, a moveable substrate 10 has a levitation stabilizing structure 30 (LSS) located on a surface of the moveable substrate 10 and enclosing an area of the moveable substrate 10. The enclosed area forms an interior impingement area 35. The moveable substrate 10 is comprised of at least one material layer. The moveable substrate 10 can have existing layers or thin films contacting and overlaying the surface of at least one material layer of moveable substrate 10. In one embodiment, one or more atomic thin-film layers 50 are formed on the moveable substrate 10 in the interior impingement area 35. The levitation stabilizing structure 30 extends away from a surface of the moveable substrate 10 and can have interior walls 38 that are perpendicular (shown with perpendicular 32) to the moveable substrate 10 surface. The levitation stabilizing structure 30 has a levitation stabilizing structure surface 36 in contact with the moveable substrate 10 surface and a top surface 34 on a side of the levitation stabilizing structure 30 opposed to the moveable substrate 10.

In one embodiment of the present invention, the moveable substrate 10 is planar. In another embodiment, the moveable substrate 10 is not planar, and, for example the moveable substrate 10 is spherical, is a section of a sphere, or has a topography like a structured surface. As used herein, a structured surface is one in which portions of the surface extend away from the moveable substrate 10. In one embodiment, the structured surface can have the portions of the surface extending away from the moveable substrate similar in size to features associated with integrated circuits. Thus, the structured surface on moveable substrate 10 can be comprised of at least one integrated circuit. The structured surface of moveable substrate 10 can be comprised of at least one microfluidic device. The structured surface of moveable substrate 10 can be comprised of at least one electro-optical device. The structured surface of moveable substrate 10 can be comprised of at least one microelectromechanical system. The structured surface of moveable substrate 10 can be comprised of at least one micromachine. The structured surface of moveable substrate 10 can be comprised of at least one molecular electronics circuit. The structured surface of moveable substrate 10 can be comprised of at least one micro-optical assemblies. The structured surface of moveable substrate 10 can be comprised of at least one interconnect assembly. As used here, an interconnect assembly provides communication between locations, the medium of communication being electrical, fluidic, optical, acoustic, radiative, or any other medium used for provide continuity between two locations. In one embodiment, the structured surface of moveable substrate 10 can be comprised of at least one electrical interconnection assembly. In another embodiment, the structured surface of moveable substrate 10 can be comprised of at least one microfluidic device interconnect assembly.

FIG. 3 is a cross-sectional view of levitation stabilizing structure 30 fabricated on a plate-like moveable substrate 10. The drawing in FIG. 3 is not drawn to scale: the size relationship between moveable substrate 10 and levitation stabilizing structure illustrated in FIG. 3 is not exact and has been altered in order to better illustrate the invention and method of use. Although moveable substrate 10 is shown as having parallel planar surfaces, moveable substrate 10 is not bound by this restriction. The surfaces of moveable substrate 10 can be topographically complex. For example, the surface of moveable substrate 10 can be spherical in shape and form with other additional topographical features. The levitation stabilizing structure 30 is a three-dimensional structure and has at least one surface 36 contacting and overlaying a surface of moveable substrate 10; at least one interior wall 38; at least one surface 34 at a height above the surface of moveable substrate 10 wherein the height of surface 34 above the surface of moveable substrate 10 is the thickness of at least one material layer and the thickness is essentially defined by the length of a line segment identified by perpendicular 32 that resides between two points one of which contacts surface 34 and the other of which contacts the surface of moveable substrate 10, said line segment being normal to both surfaces. It is desirable that perpendicular 32 be parallel to the interior wall 38 of levitation stabilizing structure 30 as shown in FIG. 3 but it is not required that the interior wall feature 38 of levitation stabilizing structure 30 extending between surface 34 with the surface of moveable substrate 10 exhibit strict parallelism with perpendicular 32 at each location. Practical experience with fabrication of the levitation stabilizing structure suggests that the interior wall 38 can deviate with respect to parallelism with perpendicular 32 whilst retaining the functionality of the levitation stabilizing structure for positional stabilization during fluidic levitation. The interior impingement area 35 of the levitation stabilizing structure is the region of the surface of moveable substrate 10 that is surrounded and enclosed by the interior walls 38 of levitation stabilizing structure 30 in a continuous manner such that the levitation stabilizing structure functions as a confinement area that restricts direct communication of the surface area of interior impingement area with the surrounding surface area of moveable substrate 10 that is outside of the levitation stabilizing structure 30.

In one embodiment of the present invention, the levitation stabilizing structure 30 has a rim enclosing the interior impingement area. The rim can have a height above the moveable substrate 10 that is less than or equal to 5 mm and greater than or equal to 50 microns. Alternatively, the rim has a height above the moveable substrate that is less than ⅔ of the distance between the moveable substrate 10 and the stationary support 12.

An atomic thin-film layer is a material layer comprised of one or more atomic layers on a surface. One or more atomic layers can be formed on the surface of the interior impingement area 35 on moveable substrate 10 by exposure of the surface to at least one molecular flux. The surface of the interior impingement area 35 is full of atomic scale features and imperfections called surface sites, some of which are non-chemically reactive and others of which are chemically reactive. The total number of surface sites on a surface is characterized by a measurement of how many molecules can sit on the surface in a single layer. The number of molecules sitting on a surface in a single layer is known as a monolayer or atomic layer and is typically around $10^{15}$ molecules/cm$^2$. There can be more or less adsorbed molecules in an atomic layer depending on the nature of the surface (material and crystallographic orientation), the temperature of the surface, the type of molecule being investigated, the partial pressure of said molecules, and the exposure time of the surface to the partial pressure of said molecules. An atomic layer of molecules is formed on a surface when molecular species attach themselves to a surface either by physical adsorption or by chemisorption. Physical adsorption relies on Van der Waals attraction to maintain attraction between the adsorbed molecular species and the surface. Chemisorption relies on the formation of a chemical bond between the molecular species and the surface to maintain attraction between the adsorbed molecular species and the surface. The formation of atomic layers by chemisorption is preferred for atomic layer deposition processes. Atomic layers overlaying and in contact with one another can be formed when a surface is sequentially exposed to two different molecular fluxes whose monolayers or atomic layers chemisorb on each other. For example, molecule A may form an atomic layer on a surface and then molecule B may form a molecular layer by chemisorption onto the pre-existing atomic layer of molecule A. Furthermore, molecule A may form an additional molecular layer by chemisorption onto the pre-existing layer of molecule B, and so on. In this manner multiple atomic layers can be formed on a surface through the use of sequential chemisorption processes. The present invention is useful for efficiently and rapidly forming one or more atomic thin-film layers on a moveable substrate. In a further embodiment the atomic thin-film layers are patterned. Moreover, atomic thin-film layers are typically conformal, so that a structured surface on the moveable substrate 10 is coated to a consistent thickness.

In one embodiment the levitation stabilizing structure is comprised of a material layer having one side in contact with a substrate; having a thickness greater than 20 microns; wherein part of the material layer of the levitation stabilizing structure is absent so as to expose the substrate surface, said substrate surface often being exposed for the purpose of exposure to subsequent processing; and the exposed area of the substrate, when viewed normal to the exposed substrate surface, having the shape of a convex or concave polygon whose centroid is located within the area enclosed by the polygon; wherein the area of the exposed surface within the polygon is at least 4 times larger than the cross-sectional area of the impinging collimated fluid jet employed during the fluid levitation process.

The material layer of the levitation stabilizing structure (LSS) can be provided by forming or fabricating the LSS using additive processes. For example, deposition processes can be employed to form a levitation stabilizing structure material layer having properties appropriate for the substrate type and the levitation application. The LSS can be comprised of multiple layers. The LSS can comprise a material layer and an adhesion promoting layer to enable secure attachment of the LSS to the underlying substrate. Alternately, the LSS can be provided using subtractive forming processes to form a material layer having properties that are appropriate for the substrate type and the levitation application. Furthermore, the LSS can be formed using both additive and subtractive processes, as is the case when a photoresist is applied to a substrate and patterned and cured in an imagewise manner so that some of the photoresist layer is removed in order to form a levitation stabilizing structure.

A method or means for providing a levitation stabilizing structure on a substrate is to print the levitation stabilizing structure directly on the substrate using a 3 dimensional printing technology. Such a method of providing a levitation stabilizing structure on a substrate can be extremely rapid, clean, and convenient. In another embodiment the levitation stabilizing structure on a substrate is printed directly on the substrate using a screen printing method.

Another embodiment of providing a levitation stabilizing structure on a substrate is through the use of material layer that is patternable. A method for providing a levitation stabilizing structure through the use of patternable layers includes the following steps in order:

providing a substrate;

adding a patternable material layer to at least one surface of the substrate so that the patternable material layer is in contact and overlaying with at least one surface of the substrate;

patterning the patternable material layer in an imagewise manner; and forming a levitation stabilizing structure from the patterned material layer, said levitation stabilizing structure comprised of a material layer with a depressed polygonal shaped feature, said levitation stabilizing structure overlaying and in contact with at least one surface of the substrate.

The patternable layer can be patterned by any means known in the art. Means for producing patterns on patternable layers include, for example, imprinting, embossing, hydroforming, sandblasting through a mask, selective chemical and plasma etching, photopatterning with photosensitive materials. The patternable layer can be a photoimageable material layer. The patternable layer employed to prepare the levitation stabilizing structure can be a curable material with cross-linking agents. The patternable layer can be a photosensitive material layer. Examples of a photoimageable material layers are positive and negative photoresists, including dry film photoresists which are laminated upon the surface of the substrate in a conformal-wise manner. The LSS can be comprised of multiple layers wherein one of the layer is an adhesion promoting layer. The adhesion promoting layer element of the levitation stabilizing structure can be added on the substrate surface upon which the patternable material layer overlays to improve the robustness of the fabricated LSS. It is recognized that the patternable material layer in step b) of the method for providing an LSS using patternable layers above does not have to be at least 20 microns thick: a patternable layer may have a thickness less than 20 microns if the patterning process utilizing the patternable layer can be employed as an essential means, for example—as a template—to produces thicker layers. An example of a thin patternable layer that provides and essential means to produce a thicker patterned material layer is a thin evaporated metal layer that is patterned and electroplated to produce a levitation stabilizing structure have a thickness 20 microns or greater. Electroless deposition of thick material layers on a patterned catalytic seed layer is another example of a thin patternable layer that provides an essential means to produce a thicker patterned material layer.

Alternatively, the LSS can be fabricated externally then applied to the desired surface of the substrate. The externally fabricated LSS can be comprised of multiple layers. In one embodiment, a levitation stabilizing structure is comprised of a material layer and an adhesive layer. In another embodiment a levitation stabilizing structure is comprised of a material layer and an adhesion promoting layer. The LSS can be applied to the desired surface of the substrate using any means known in the art including lamination, pressing, sintering, heating, gluing, or other methods familiar to those skilled in the art of mechanical assembly.

Thus, an alternate method for forming a levitation stabilizing structure on a substrate is comprised of the following steps in order:

providing a levitation stabilizing structure comprised of a material layer having a thickness greater than 20 microns; wherein part of the material layer of the levitation stabilizing structure is patterned and the patterned area of the material layer, when viewed normal to the plane of the material layer, has the shape of a convex or concave polygon whose centroid is located within the area enclosed by the polygon;

providing a substrate; and adhering the levitation stabilizing structure to the substrate in a conformal-wise manner so that the levitation stabilizing structure overlays and is in contact with the substrate surface in a conformal-wise manner and the substrate surface is exposed where the material layer of the levitation stabilizing structure is absent; and the exposed area of the substrate, when viewed normal to the exposed substrate surface, has the shape of a convex or concave polygon whose centroid is located within the area enclosed by the polygon.

An example of a levitation stabilizing structure that can be employed for the method above is a levitation stabilizing structure that is fabricated in the form of a label with an adhesive layer where the adhesive layer is protected by a protective cover tape. The label is cut with a pattern reflecting the shape of the desired polygonal levitation stabilizing structure. For example, the desired levitation stabilizing structure can be shaped like an annulus so the levitation stabilizing structure is formed as a label that is cut into the shape of an annulus of the appropriate dimensions. The cover tape protecting the label adhesive is removed in the patterned region reflecting the desired polygonal levitation stabilizing structure to expose the label adhesive and the levitation stabilizing structure is affixed to a surface of the substrate so that the levitation stabilizing structure is overlaying and in contact with the substrate surface in a conformal-wise manner, all additional material of the label except for the annular levitation stabilizing structure being removed from the substrate surface. As used herein the term "on" means "overlaying and in contact with".

Alternately, the levitation stabilizing structure with can be fabricated on an intermediate substrate by other methods such as 3 dimensional printing then transferred to the surface of the substrate and adhered to the substrate surface using for example, an adhesive layer or using heat. The precautions that are necessary to adhere a material layer to a substrate in a conformal-wise manner are familiar to those skilled in the art of lamination and mechanical assembly and include elimination of bubbles and other defects that indicate lack of contact between the substrate and the overlying material layer. Without wishing to be bound by theory, it is preferred that the contours of the LSS closely follow the contours of the underlying substrate upon which it is mounted. The formation of bubbles, ridges, and other surface non-uniformities and surface imperfections in the LSS is undesirable because surface non-uniformities affect the characteristics of fluid flows over the LSS during the fluidic levitation process.

In another embodiment the LSS can be fabricated as an integral part of the substrate itself by employing known technologies used to fabricate articles of complex shape. Examples of technologies employed to fabricate articles of complex shape are conventional machining processes, injection molding, extrusion, stamping, hydroforming, electroforming, 3 dimensional printing, and the like. The LSS may thus be formed as a singular piece optionally integrated with the substrate for subsequent processing applications. In some configurations the area of the LSS can be backfilled with an additional thin material layer resulting in a complex multilayer structure. The LSS can be formed from a wide variety of materials, and the subsequent use of the LSS is part of the criteria determining whether it is compatible with the underlying substrate. The LSS can be comprised of multiple layers. The LSS can be fabricated from the same material as the substrate, including material of the substrate itself, or it can be fabricated from a material of different chemical composition. The levitation stabilizing structure can be comprised of a material layer and one or more adhesion promoting layers to facilitate the adhesion of the LSS to the underlying substrate. In the aforementioned levitation stabilizing structure embodiments, the adhesion promoting layer or adhesive layer contributes to the overall height of the levitation stabilizing structure and is considered part of the levitation stabilizing structure. In one embodiment, wafer bonding can be used to bond an ultrathin wafer to a LSS made from the same material so that the ultrathin wafer can be processed in a non-contact levitated manner.

In another implementation of the levitation stabilizing structure, a multilayer LSS can be formed directly using photoresist whose adhesion to the underlying substrate is optionally promoted by the use of, for example, a vapor priming adhesion promoting layer like hexamethyldisiloxane (HMDS), employing either liquid or dry film positive or negative photoresist to form a patternable material layer on the surface of the moveable substrate and patterning the photoimageable photoresist material layer in an imagewise manner to form a convex or concave polygon of appropriate area to enable either pneumatic or hydraulic levitation of the underlying substrate when the surface of the substrate upon which the LSS is fabricated is exposed to a suitable fluid flow. In this implementation, the fabrication of the levitation stabilizing structure takes advantage of fabrication methods normally employed in integrated circuit manufacture and is easily implemented in the semiconductor integrated circuit fabrication workflow.

Figure 4:
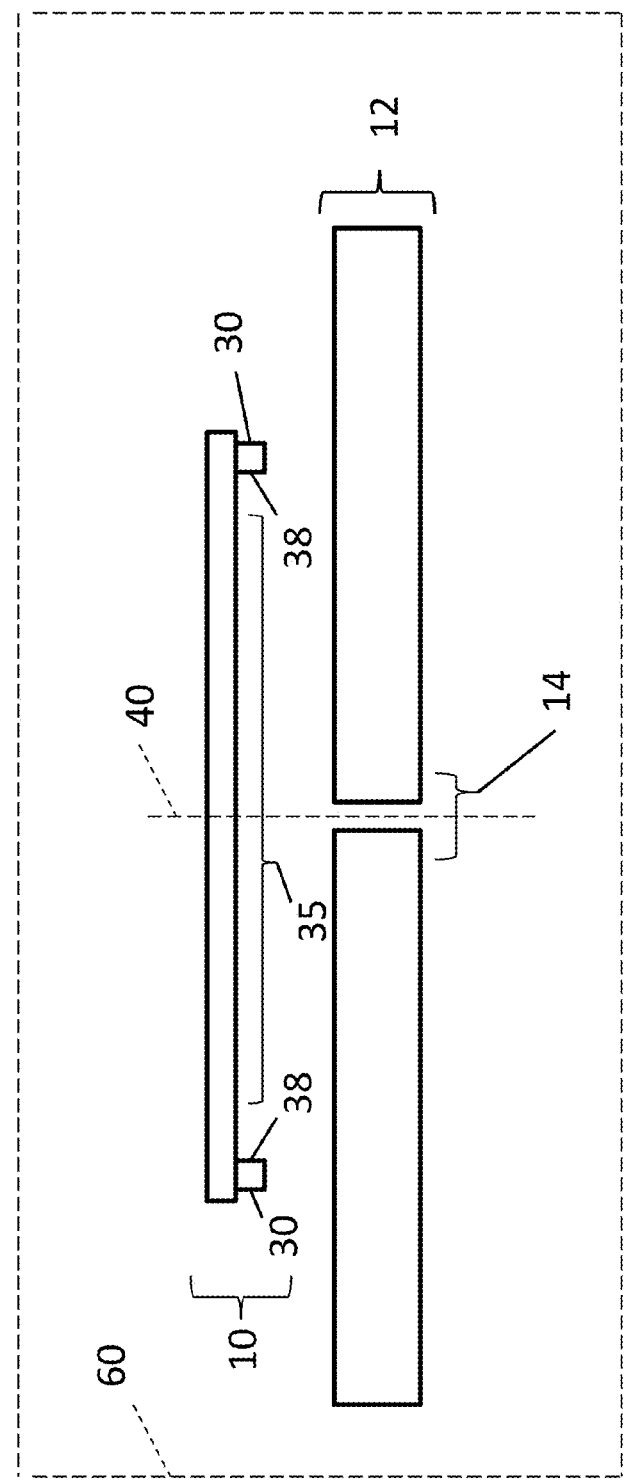
FIG. 4 is a cross-sectional view of one embodiment of the invention including a substrate with a levitation stabilizing structure fabricated thereupon positioned on a gas emanating support.

FIG. 4 is a cross-sectional view illustrating one embodiment of the present inventive method for practicing pneumatic levitation. FIG. 4 shows a chamber 60 containing a moveable substrate 10 with a levitation stabilizing structure 30 fabricated thereupon. The surface of moveable substrate 10 with the levitation stabilizing structure 30 opposes the gas-emanating surface of stationary support 12. The stationary support through which fluid will flow 12 is located in the chamber 60 for supporting the moveable substrate 10. The stationary support 12 extends beyond the enclosed interior impingement area. The stationary support 12 through which fluid will flow has a fluid collimating conduit 14 positioned to deliver gas within the enclosed interior impingement area 35 of the moveable substrate 10. A pressurized-gas source provides a gas flow through the fluid collimating conduit 14 impinging on the moveable substrate surface within the enclosed interior impingement area 35 of the moveable substrate 10 sufficient to levitate the moveable substrate 10 and expose the moveable substrate 10 to the gas while restricting the lateral motion of the moveable substrate 10 with the levitation stabilizing structure 30. In one embodiment, the stationary support 12 is located beneath the moveable substrate 10; in another embodiment, the stationary support 12 is located above the moveable substrate 10.

Fluid collimating conduit 14 is in fluid communication with a pressurized fluidic source. In one embodiment, fluid collimating conduit 14 is in fluid communication with a pressurized-gas source. In one embodiment, fluid collimating conduit 14 is in fluid communication with a pressurized-liquid source. The cross-sectional shape of fluid collimating conduit 14 can be varied with the provision that a collimated fluid jet can be formed at the exit side of the fluid collimating conduit when pressurized fluid is applied to the entrance side of the fluid collimating conduit. The exit side of the fluid collimating conduit is the side of the fluid collimating conduit opposed and facing the moveable substrate in FIG. 4. For example, the cross-sectional shape of fluid collimating conduit 14 can be arbitrary with the provision that a hollow region exists for gas to flow through. Fluid collimating conduit 14 for producing a fluidic jet can have a cross-sectional shape of a simple polygon, convex or concave, with n vertices, where n≥3. Oval, elliptical and circular shapes are considered polygons with an infinitely large number of vertices and sides and thus are permissible for use in the construction fluid collimating conduit 14. In one embodiment fluid collimating conduit 14 has a cylindrical shape open at both ends with a circular cross-section and provides fluid communication of opposing sides of stationary support 12 through which fluid will flow. In another embodiment fluid collimating conduit 14 has a cylindrical shape open at both ends with a circular cross-section and provides fluid communication of opposing sides of stationary support 12 and has additional helical shaped threaded grooves on the interior surface of the fluid collimating conduit to provide a rotational motion component to the fluidic flow as it passes through fluid collimating conduit 14. Helical grooves forming a thread like feature on the interior surface of fluid collimating conduit 14 can impart rotational motion to a jet flow and thereby provide rotational motion to a levitating moveable substrate through centripetal force supplied by the rotation of the fluid jet during contact with the moveable substrate during fluidic levitation. FIG. 4 illustrates the appropriate relative positions of the elements moveable substrate 10 with levitation stabilizing structure 30 relative to the stationary support 12 and fluid collimating conduit 14 for the use of levitation stabilizing structure 30 to be effective as a method of positional stabilization during fluidic levitation with an orthogonal jet emanating from fluid collimating conduit 14. It has been found that the use of the levitation stabilizing structure as a method for improving the lateral stability of a moveable substrate during pneumatic levitation only requires that the fluid jet from jet forming fluid collimating conduit 14 of stationary support 12 impinges on the surface of moveable substrate 10 within the interior impingement area 35 defined by the interior walls 38 of the levitation stabilizing structure 30 fabricated on the surface of moveable substrate 10. It is preferred that the fluid jet from jet forming fluid collimating conduit 14 of stationary support 12 impinge on the surface of moveable substrate 10 at or near the centroid of interior impingement area 35 defined by the interior walls of the levitation stabilizing structure 30 fabricated on the surface of moveable substrate 10. Alternatively, the fluid jet from jet forming fluid collimating conduit 14 of stationary support 12 impinges on the surface of moveable substrate 10 at or near the centroid of the moveable substrate 10. The fluid collimating conduit on the stationary fluid emitting support is an alignment feature on the surface of the stationary fluid emanating support and the centroid of the interior impingement area of the levitation stabilizing structure is aligned with the alignment feature wherein the alignment feature is a fluid collimating conduit on the surface of the stationary fluid emanating support. Thus, the method inventive for fluidic levitation includes the steps of:

providing a substrate;

fabricating a levitation stabilizing structure on a surface of a substrate;

positioning the substrate proximate to a fluid emitting surface of a stationary fluid emanating support in a conformal-wise manner with the levitation stabilizing structure overlaying the surface of the substrate and facing the stationary fluid emanating surface through which fluid will flow;

aligning the centroid of the interior impingement area of the levitation stabilizing structure with at least one alignment feature on the surface of the stationary fluid emanating support through which fluid will flow;

initiating at least one collimated fluid flow from the stationary fluid emanating support surface through which fluid will flow to produce a collimated fluid jet, and controlling the collimated fluid flow emanating from the stationary fluid emanating support to fluidically levitate the substrate and levitation stabilizing structure proximate to the surface of the stationary fluid emanating support.

It has been observed experimentally that the alignment of the centroid of the interior impingement area of the levitation stabilizing structure with at least one alignment feature on the surface of the stationary fluid emanating support is not critical as the levitation stabilizing structure exhibits self-alignment during the levitation process. The reasons for self-aligning behavior during pneumatic levitation are described in more detail below. This is a distinct advantage of using a levitation stabilizing structure during pneumatic levitation.

Mechanisms for accurately controlling the composition, temperature, pressure, and flow of the fluid that is employed for the purpose of producing a collimated fluid jet are known. Typical mechanisms for controlling pressure of gaseous fluids include both passively and actively controlled pressure regulators including electronically controlled pressure regulators and other types of pressure regulator methods known in the art. Typical mechanisms for controlling the temperature of a fluid include feedback loops that control passive and actively controlled heating and cooling units including heat exchangers, feedback loops that control heating tapes and coils as well as cooling coils through which the fluid passes, feedback loops that control temperature controlled reservoirs, and feedback loops that control other devices known to those skilled in the art of temperature control of fluids. Temperature and pressure control loops employed to achieve stable fluid temperatures and fluid pressures may incorporate the use automated temperature and pressure control units. Typical means and mechanisms for controlling the flow of one or more gaseous fluids include the use of high-precision pressure regulators in conjunction with orifices of known diameter with known pressure-flow relationships, gas flow meters, flow controllers, control valves, and variable control valves of all types including mass flow meters and mass flow controllers, rotameters, Coriolis flow meters and flow controllers, turbine flow meters, pitot based flow meters and other types of fluid flow meters familiar to those skilled in the art of process control of flowing fluid media where the fluid is a liquid or a gas.

It is further recognized that the entire assembly represented by the cross-sectional view of FIG. 4 could be rotated by 180 around an axis normal to the plane of FIG. 4 and the positional configuration will still be functional. The use of a levitation stabilizing structure 30 during fluidic levitation does not alter the function of a fluidic levitation apparatus employing Bernoulli airflow with respect to physical orientation of the apparatus, and in fact improves the robustness of fluidic levitation with respect to tilting of the gas-emanating stationary support regardless of the apparatus attitude and orientation. Fluidic levitation can take place when the velocity vector of the orthogonal fluid jet is essentially parallel to the gravitational force vector or when the velocity vector of the orthogonal fluid jet is essentially anti-parallel to the gravitational force vector. The presence of a levitation stabilizing structure 30 on the moveable substrate surface does not alter the relationships between the pneumatic forces that are generated by the fluid flow from the orthogonal jet that flows between the substrate surface and the fluid emitting support surface and the gravitational force vector that are inherently present in fluidic levitation processes employing Bernoulli airflow. This is a distinct advantage of the invention.

It is recognized that the stationary support 12 through which fluid will flow is not restricted to a planar configuration as illustrated in FIG. 4. In one embodiment the features of the stationary support comprise the following: the stationary fluid emitting support through which fluid will flow contains at least one fluid collimating conduit in fluid communication with a manifold and a pressurized fluid source, said fluid collimating conduit having a cross-sectional area less than or equal to ¼ of the surface area of the interior impingement area of the levitation stabilizing structure; the surface area of the stationary fluid emitting support is at least equal to the surface area of the interior impingement area on the moveable substrate; and the fluid flow between the stationary support and the moveable substrate is characterized by radial flow patterns that are essentially symmetric with respect to the centroid of the interior impingement area. It is preferred that said fluid collimating conduit have a cross-sectional area less than or equal to ¼ of the impingement area of the levitation stabilizing structure.

Thus, in one embodiment, if the moveable substrate 10 surface follows the shape of an arc, as is found, for example, on the surface of an optical lens, then a stationary support surface through which fluid will flow can be fabricated that follows the surface features of the moveable substrate surface and produces a radial flow pattern when an orthogonal jet impinges on the moveable substrate surface. Thus, the stationary support is fabricated to follow the surface features of the moveable substrate surface in a conformal-wise manner. In another embodiment, the stationary support topography opposing the moveable substrate resembles a mold of the surface of the moveable substrate. In another embodiment, the stationary support topography opposing the moveable substrate follows the negative three dimensional image of the surface of the moveable substrate. In one example embodiment, the surface shape and form of moveable substrate 30 is continuous and smooth, monotonically varying without a significant number of large surface protrusions; however, practical experience has shown that structured surfaces and surface topographies having a height less than or equal to the levitation stabilizing structure are well tolerated by fluidic levitation processes. In other example embodiments, the surface topography of the moveable substrate 10 includes non-planar or includes three dimensional structures that form a structured surface, for example, surface portions that extend away from a base material layer of the moveable substrate 10.

The function of the levitation stabilizing structure fabricated on the moveable substrate surface is to harness the inherent kinetic energy of the gaseous flow of the fluidic layer employed in fluidic levitation so as to convert said kinetic energy into directional forces for the purpose of introducing positionally restorative forces that act in a restorative manner to control and minimize undesirable lateral movement of the moveable substrate during fluidic levitation. The LSS is useful when the fluid used for fluidic levitation is a gas or a liquid.

The symmetric radially outward flow which occurs during pneumatic levitation processes employing one or more orthogonal jets can thus be harnessed to achieve positional stability of a pneumatically levitated moveable substrate using a levitation stabilizing structure fabricated on the opposing surface of the moveable substrate. Furthermore, the fluid flow from one or a plurality of orthogonal or tilted jets contains substantial pneumatic energy in the form of both kinetic and potential energy and this unharnessed pneumatic energy can be used to achieve positional stability of a pneumatically levitated moveable substrate.

Positional stability of the moveable substrate during pneumatic levitation is achieved most readily when the stationary gas emitting support contains fluid collimating conduits, nozzles, bores, orifices, and fluid collimating conduits used for the generation of gaseous jets—tilted or orthogonal—that impinge within the interior impingement area 35 on the surface of the opposing moveable substrate that is within the confines of the area defined by the interior walls 38 of the levitation stabilizing structure that is located on and in contact with the moveable substrate surface that opposes and faces the stationary gas emitting support surface, as shown in FIG. 3 and FIG. 4. The location of the levitation stabilizing structure on the moveable substrate is a feature that distinguishes the inventive method from all other previous attempts to address positional stability during pneumatic levitation. Furthermore, the inventive method is not restricted to planar plate-like substrates although planar substrates are preferred.

In one embodiment, the levitation stabilizing structure is a symmetrical structure possessing a rotational axis of symmetry that is normal to the plane of the levitation stabilizing structure. The cross-sectional view shown in FIG. 4 shows a dotted line indicating the position of the proper rotation axis of symmetry 40 of levitation stabilizing structure 30 fabricated upon moveable substrate 10. A proper axis of rotation is normally specified by the order of the axis, n. The proper rotation axis of symmetry has the property that an object rotated around the axis by 360/n degrees is indistinguishable from the object in its original, unrotated position. For example, an axis centered in a square that is normal to a plane containing the square has the property that it is an axis of proper rotation of order 4. Thus, when the square is rotated 360/4 or 90 degrees any direction around the axis it will appear as if the orientation of the square has not changed. Similarly, a circle has a proper rotation axis of order ∞ because an infinitely small amount of rotation in any direction will generate an identical object to the original circle. For the purposes of this inventive method, circles and ovals are considered to be convex polygons because these two figures can be considered to be formed from an infinitely large number of sides of infinitely small length and for this reason are considered convex polyhedra having n vertices where n=∞. Another embodiment of the levitation stabilizing structure is characterized by a levitation stabilizing structure possessing at least one symmetry element comprised of a proper rotation axis wherein the proper rotational axis possesses an order that is two or greater.

Without wishing to be bound by theory, the means by which the levitation stabilizing structure functions will now be described for the configuration of a stationary gas emitting support through which fluid will flow emitting a single orthogonal jet emanating from the stationary support surface impinging orthogonally on the opposing moveable substrate surface. It is found that the radial outward gas flow that is parallel to the moveable substrate surface can be harnessed to produce restorative forces using gas impingement on a barrier structure superimposed upon the moveable substrate surface and extending towards the stationary gas emitting support. The levitation stabilizing structure is a barrier structure superimposed on the moveable substrate surface. The polyhedral shape of the barrier structure, said barrier structure being the levitation stabilizing structure, influences the directionality of the restorative forces thereby produced by gas impingement on the barrier structure. A barrier structure characterized by a high degree of symmetry produces a set of highly symmetric restorative forces. In one embodiment, the barrier structure is comprised of a convex or concave polygon having at least w number of sides where w≥3—that is, the polygon has at least three sides. Convex means that a straight line segment drawn between any two points located on any two distinguishable sides of the polygon does not intersect the circumference of the polygon at any location except the two end points of said line segment. In another embodiment, the barrier structure has a polygonal shape with a proper rotation axis of symmetry of order n, also called $C_n$ that is orthogonal to the moveable substrate surface and to the plane containing the symmetric barrier structure wherein n is greater than or equal to 2. A convex polygon of the symmetric barrier structure preferably has at least three sides in order to achieve a balance of horizontal pneumatic restorative force. The horizontal pneumatic restorative force is provided by sum of the each pneumatic force produced by gas impingement pushing on the wall of the barrier structure, said pneumatic force being parallel to the moveable substrate surface and produced by the sum of the pneumatic forces normal to the sides of the symmetrical convex polygon pneumatic barrier structure. The horizontal restorative force resulting from the sum of the pneumatic forces impinging normal to the walls of the symmetrical barrier structure of the levitation stabilizing structure when the number of walls of the barrier structure w meet the condition w≥3 provides a field of balanced restorative forces that require the moveable substrate to come to an equilibrium position and remain roughly stationary. Without wishing to be bound by theory, it is believed that when the centroid of the levitation stabilizing structure coincides with the mass centroid of the substrate then the equilibrium position for pneumatic levitation for a moveable substrate with a levitation stabilizing structure is the position where the orthogonal jet impinges near the centroid of the polygon shaped barrier structure. The centroid of a polygon is defined as the arithmetic mean of all the points in the polygon shape. For example, if a planar polygon is mapped onto a plane and each point on the perimeter is designated an (x,y) coordinate value, then the centroid of the planar polygon is defined as the average value of all the points comprising the perimeter of the planar polygon. In the case of a convex polygon, the centroid of the polygon always lies within the area enclosed by the polygon perimeter. For the levitation stabilizing structure to be most effective it is required that the centroid of the barrier structure comprising the levitation stabilizing structure lie within the interior impingement area of the levitation stabilizing structure and a convex polyhedral shaped levitation stabilizing structure satisfies this requirement. Thus, a levitation stabilizing structure in the form of a convex polygonal barrier structure with a proper rotational axis of symmetry, $C_n$ with n≥2, provides a means to keep the pneumatically levitated moveable substrate in a known position and provides a means for producing in-situ correcting forces that can impede undesirable horizontal substrate movement. Undesirable horizontal substrate movement includes horizontal lateral substrate movement that can occur as a result of normal fluctuations in critical pneumatic variables during pneumatic levitation. It has been discovered during experimentation with levitation stabilizing structures employing different convex polygon shapes that convex polygons with a proper rotational axis of symmetry, $C_n$ where n≥2 can result in pneumatic levitation where the substrate is relatively motionless during levitation with a single orthogonal jet employed as a means for supplying the fluid for pneumatic levitation. Furthermore, it has also been observed that levitation stabilizing structures employing different convex polygon shapes with a proper rotational axis of symmetry, $C_n$ where n=2 can result, under certain conditions in pneumatic levitation where the substrate may exhibit rotation about the axis of rotation symmetry during levitation, especially when the orthogonal jet does not exactly align with the centroid of the levitation stabilizing structure. It is known that many processes show improved spatial uniformity when the substrate is rotated while the process is carried out. Thus, it has now been discovered by observation that substrate rotation can be achieved through the use a levitation stabilizing structure with the use of only an orthogonal jet although the exact origins of this unexpected effect remain unexplained. Unlike the art disclosed in U.S. Pat. Nos. 5,470,420 and 8,057,602 no tilted jets are required to produce substrate rotation during pneumatic levitation and no physical stops are required to force the substrate to remain in a localized region. This is a distinct advantage because it simplified equipment design for improving the uniformity of processes employing pneumatic levitation.

Alternatively, in another embodiment of the invention, the levitation stabilizing structure or rotationally symmetric convex polygonal barrier structure will fulfill its function with non-orthogonal jets also, and is most effective when tilted, non-orthogonal jets are arranged in a symmetrical arrangement so the symmetrical barrier structure of the levitation stabilizing structure can produce the balanced forces necessary to produce a condition where the substrate remains in a steady state or equilibrium position about a rotational axis during momentum transfer from the tilted jets. When non-orthogonal jets emanate from the stationary gas emitting support in an appropriate symmetrical arrangement, rotation of the moveable substrate can be achieved during pneumatic levitation by momentum transfer from the gaseous fluid to the pneumatically levitated moveable support as described in U.S. Pat. Nos. 5,470,420; 5,492,566; 5,967,578; and 8,057,602 B2. Without wishing to be bound by theory, it is believed that it is preferable that the centroid of the levitation stabilizing structure be aligned with the centroid of the polyhedral shape defined by the arrangement of the non-orthogonal fluid collimating conduits in the stationary fluid emitting support, each fluid collimating conduit position being considered as a vertex of the polyhedra. When non-orthogonal jets are used for fluidic levitation of a moveable substrate it is preferable that the stationary fluid emanating support through which fluid will flow contain two or more fluid collimating conduits (for example, orifices, nozzles or bores) so that two or more non-orthogonal tilted jets emanate from the surface of the stationary fluid emanating support. When a circular levitation stabilizing structure is present on the moveable substrate and is located on the moveable substrate surface opposing the gas emitting stationary support with an arrangement of tilted jets similar to those as described in U.S. Pat. No. 5,470,420 then stable high speed rotation of a pneumatically levitated sample can be observed. In one embodiment stable substrate rotation with substrate rotational speeds in excess of 500 rpm are observed during pneumatic levitation of a moveable substrate with an annular levitation stabilizing structure when employing a symmetric arrangement of tilted jets to supply fluid to achieve Bernoulli air flow pneumatic levitation of the substrate. While rotation with pneumatic levitation is suitable and desirable for some applications, it is recognized that the fabrication of the stationary support containing tilted jets is complicated and the uniformity of radial flow during pneumatic levitation is disrupted by the use of tilted jets; however, a moveable substrate with a levitation stabilizing structure exhibiting excellent positional stability with arrays of tilted jets during pneumatic levitation or pneumatically levitated rotation is particularly useful for processes involving cleaning of surfaces such as, for example, the processes described in U.S. Pat. Nos. 5,492,566 and 5,967,578 as well as for certain types of deposition processes. In another embodiment, both tilted and orthogonal fluid collimating conduits are used. In one embodiment, the stationary support for a pneumatic levitation apparatus includes a plurality of fluid collimating conduits through which a plurality of fluids flow, wherein two of the plurality of fluid collimating conduits are tilted with respect to the substrate such that the direction of the fluid flow through the tilted fluid collimating conduits is tilted with respect to the substrate and one of the plurality of fluid collimating conduits is orthogonal to the substrate such that the direction of the fluid flow through the orthogonal fluid collimating conduits is orthogonal to the substrate. In one embodiment, the plurality of fluids are columnar compound fluids. In another embodiment, the stationary support includes a plurality of fluid collimating conduits, wherein two of the plurality of fluid collimating conduits are tilted with respect to the substrate and through which an inert fluid flows and one of the plurality of fluid collimating conduits is orthogonal to the substrate and through which the compound fluid flows. In a further embodiment, two tilted fluid collimating conduits are arranged symmetrically around the orthogonal fluid collimating conduit. In another arrangement, two of the plurality of fluid collimating conduits are tilted with respect to the substrate and an inert fluid flows through them. One of the plurality of fluid collimating conduits is orthogonal to the substrate and a columnar compound fluid flows through it to form a columnar compound fluid jet. In another embodiment, the tilted fluid collimating conduits are arranged symmetrically around the orthogonal fluid collimating conduit.

Referring to FIG. 4, fluidic levitation of moveable substrate with levitation stabilizing structure of various sizes, masses and areas can be accomplished by careful design of the fluid-emitting stationary support surface through which fluid will flow as well as adjustment of the fluid pressure. For example, the pneumatic levitation of a larger area planar substrate with levitation stabilizing structure can be accomplished by adjusting the pneumatic pressure of the orthogonal gaseous fluid jet emanating from the stationary support to achieve sufficient fluid flow to enable fluidic levitation. In another embodiment, the stationary fluid emitting support can be equipped with additional fluid-emitting fluid collimating conduits, tilted or orthogonal, to enable the fluidic levitation of a larger support.

Figure 27:
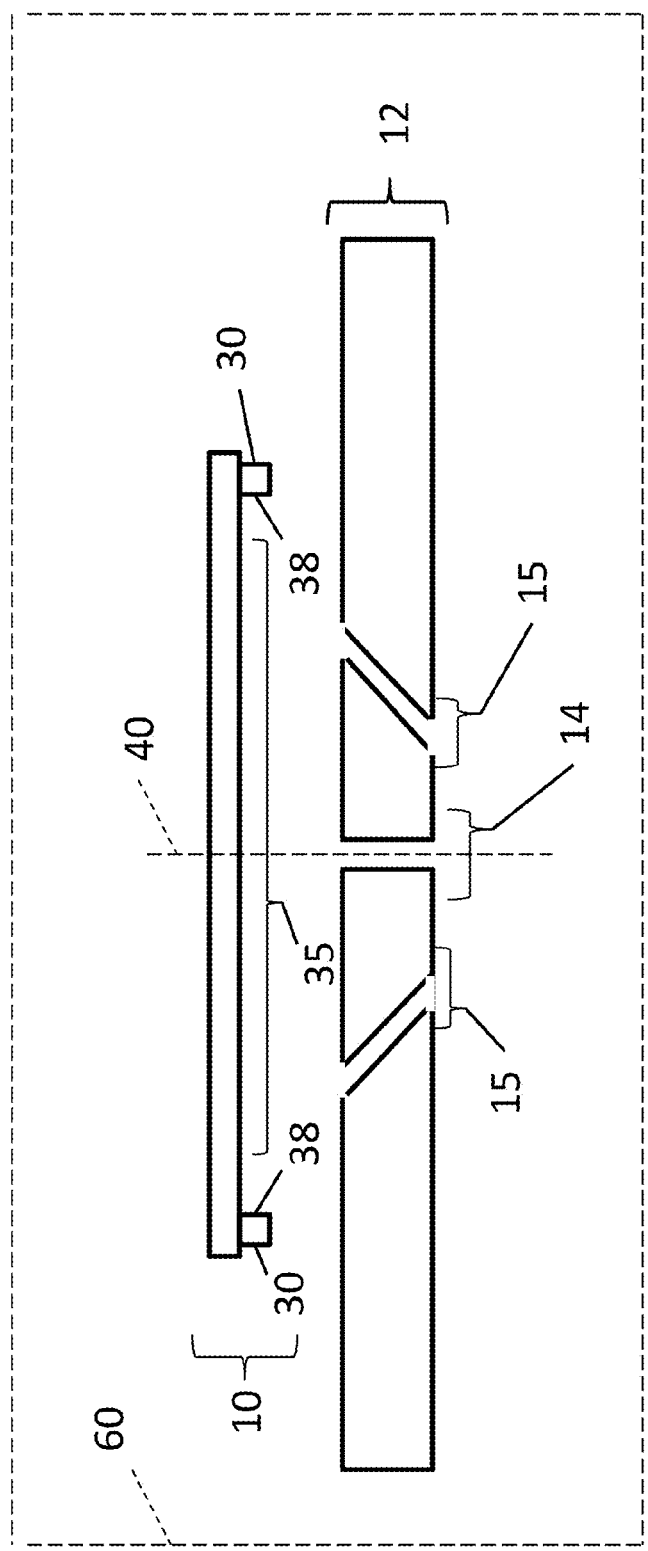
FIG. 27 is a cross-sectional view of one embodiment of the invention including a substrate with a levitation stabilizing structure fabricated thereupon positioned on a gas emanating support wherein the stationary support contains a plurality of fluid collimating conduits.

Referring to FIG. 27, the fluid emitting stationary support 12 located inside chamber or enclosure 60 has at least one orthogonal fluid collimating conduit 14 and at least 2 tilted fluid collimating conduits 15 through which fluids pass. The fluid jets emanating from the fluid collimating conduits 14 and 15 impinge on moveable substrate 10 with levitation stabilizing structure 30 in the interior impingement area 35 enclosed by the levitation stabilizing structure interior walls 38. Proper rotational axis 40 is shown as a dotted line to illustrate the symmetry associated with the two tiled fluid collimating conduits 15 in the stationary fluid emitting support. An axis of order n of proper rotation, $C_n$, is an axis of rotational symmetry essentially orthogonal to the moveable substrate surface. In one embodiment the stationary fluid emitting support through which fluid will flow for pneumatic levitation of a large area planar moveable substrate with levitation stabilizing structure is comprised of a non-porous block with at least one fluid collimating conduit for producing at least one orthogonal jet and at least two fluid collimating conduits for producing at least two tilted jets, said tilted jets being related to each other using a proper rotation axis passing through the orthogonal jet. In another embodiment, the tilted jets are oriented so that the projections of the fluid velocity vector from the tilted jet on the stationary support surface are related by a proper rotation symmetry element located at the orthogonal jet. For example, if the projected velocity vector from a tilted jet onto the stationary support viewed parallel to the proper rotation axis normal to the stationary support surface and passing through point (0,0) extends from the point (0,0) to the point (x,y) then the projected velocity vector that is related by $C_2$ proper rotation around the $C_2$ rotational axis at (0,0) extends from the point (0,0) to the point (-x,-y). The rotation operation around the rotational symmetry element passing through (0,0) takes every point (x,y) of the vector projection of the tilted jet velocity vector onto the stationary support surface and relates it to (-x,-y) by rotational symmetry. Two tilted jets related by rotation around a proper rotational axis of order 2 or greater that is normal to the stationary support surface and located at the position of the orthogonal jet are required to maintain balanced forces on the levitation stabilizing structure and eliminate lateral motion of the substrate during pneumatic levitation.

In another embodiment, the fluid-emanating stationary support is comprised of at least one orthogonal jet and at least one flow control structure and the flow control structure providing a means for exhausting radial flow from at least one orthogonal jet emanating from the stationary support surface.

The present invention is usefully applied to a variety of moveable substrate 10 sizes. For example substrates as small as 50 microns in diameter can incorporate a levitation stabilizing structure to provide flow modulation and pressure control of fluid flows entering into MEMS micro-fluidic devices to deposit atomic this film layers. The present invention can also be used for conventionally sized silicon wafer substrates ranging in size from 50 mm, 100 mm, 150 mm, 200 mm. and 300 mm in diameter. In an alternative example, substrates as large as 500 mm like large silicon wafers can be employed with the present invention.

FIGS. 5a through 5h show plan views of several different types of levitation stabilizing structures 30 on moveable substrates 10. Although the examples shown in FIGS. 5a-5h show planar substrates that are either circular or rectangular, it is recognized that the invention can be more broadly implemented in moveable substrates having other arbitrary shapes, forms, and topographies. In FIGS. 5a through 5h, point 40, when marked in FIGS. 5a-5f, is the location of intersection of a proper rotation axis of symmetry that is normal to the plane of the figure and passes through point 40 in the plane of the illustrated plan view. The proper rotation axis 40 also passes through the centroid of the polyhedral shape that defines the interior impingement area of the levitation stabilizing structure.

FIG. 5a shows a plan view of a moveable circularly shaped substrate 10 upon which an annular or circular levitation stabilizing structure 30 has been fabricated. Point 40 is the location of the proper rotation axis of symmetry for the levitation stabilizing structure 30 which is a $C_n$ axis where n=∞. The proper rotation axis of symmetry intersecting point 40 in FIG. 5a is a $C_\infty$ proper rotation axis. FIG. 5a illustrates a plan view of a levitation stabilizing structure that is reduced to practice in examples 2, 3, and 4.

FIG. 5b is a plan view of a moveable circularly shaped substrate 10 upon which a triangular levitation stabilizing structure 30 has been fabricated. Point 40 is the location of the proper rotation axis of symmetry for the levitation stabilizing structure 30 which is a $C_n$ axis where n=3. The proper rotation axis of symmetry intersecting the plan view at point 40 in FIG. 5b is a $C_3$ proper rotation axis.

FIG. 5c is a plan view of a moveable circularly shaped substrate 10 upon which a rectangular levitation stabilizing structure 30 has been fabricated. Point 40 is the location of the proper rotation axis of symmetry for the levitation stabilizing structure 30 which is a $C_n$ axis where n=2. The proper rotation axis of symmetry intersecting the plan view at point 40 in FIG. 5c is a $C_2$ proper rotation axis. FIG. 5c illustrates a plan view of a levitation stabilizing structure that is reduced to practice in examples 5 and 6.

FIG. 5d is a plan view of a moveable circularly shaped substrate 10 upon which a convex polygonal levitation stabilizing structure 30 has been fabricated. The levitation stabilizing structure 30 has the shape of a convex polygon with no proper rotation axis of symmetry. As a result, point 40 is absent although the centroid of the polygon in FIG. 5d still lies within the perimeter of the polygon.

FIG. 5e is a plan view of a moveable rectangularly shaped substrate 10 upon which an ellipse-shaped oval levitation stabilizing structure 30 has been fabricated. Point 40 is the location of the proper rotation axis of symmetry for the levitation stabilizing structure 30 which is a $C_n$ axis where n=2. The proper rotation axis of symmetry intersecting the plan view at point 40 in FIG. 5e is a $C_2$ proper rotation axis.

FIG. 5f is a plan view of a moveable circularly shaped substrate 10 upon which a concave polygonal levitation stabilizing structure 30 has been fabricated. The levitation stabilizing structure 30 has the shape of a concave polygon with no proper rotation axis of symmetry. As a result, point 40 is absent although the centroid of the polygon in FIG. 5f still lies within the perimeter of the polygon.

FIG. 5g is a plan view of a moveable rectangularly shaped substrate 10 upon which a rectangular levitation stabilizing structure 30 has been fabricated. Point 40 is the location of the proper rotation axis of symmetry for the levitation stabilizing structure 30 which is a $C_n$ axis where n=2. The proper rotation axis of symmetry intersecting the plan view at point 40 in FIG. 5g is a $C_2$ proper rotation axis. FIG. 5e illustrates a plan view of a levitation stabilizing structure whose moveable substrate elements are reduced to practice in example 12.

FIG. 5h is a plan view of a moveable square shaped substrate 10 upon which a square levitation stabilizing structure 30 has been fabricated. Point 40 is the location of the proper rotation axis of symmetry for the levitation stabilizing structure 30 which is a $C_n$ axis where n=4. The proper rotation axis of symmetry intersecting the plan view at point 40 in FIG. 5e is a $C_4$ proper rotation axis. FIG. 5h illustrates a plan view of a levitation stabilizing structure whose moveable substrate elements are reduced to practice in example 10.

Figure 6E:
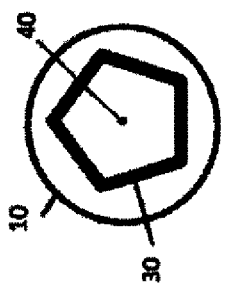
FIGS. 6a-6e show views of a substrate; and in particular.
Figure 6D:
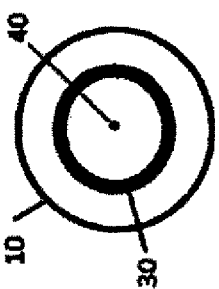
Figure 6C:
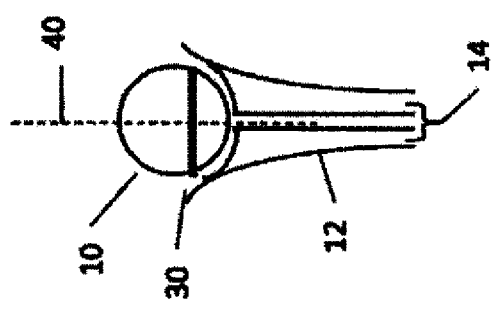
Figure 6B:
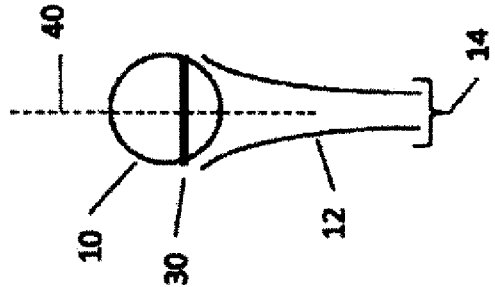
Figure 6A:
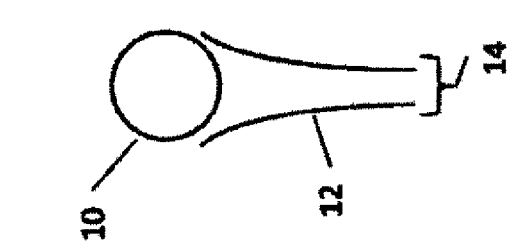

FIGS. 6a through 6e illustrate the application of a levitation stabilizing structure to a non-planar moveable substrate having three dimensional surface shape and topography. FIG. 6a is a cross-sectional view of the prior art from WO 96/29446 showing a spherical moveable substrate 10 positioned over a gas-emanating stationary support 12 containing a fluid collimating conduit 14 that diverges as it approaches the surface of the spherical moveable substrate 10. WO 96/29446 describes the use of the configuration shown in FIG. 6a for pneumatic levitation of carbon spheres for the purpose of producing uniform coatings of rhenium metal on the sphere using thermal decomposition of a volatile rhenium metal containing precursor on the pneumatically levitating spherical substrate 10. Although the stable pneumatic levitation of spherical objects can be achieved with a suitably large volumetric gas flow, the edges of the fluid collimating conduit 14 on the gas-emanating stationary support 12 provide a physical stop to prevent the moveable substrate 10 from shifting out of position during pneumatic levitation. During pneumatic levitation the spherical moveable substrate rotates freely and the orientation of the axis of rotation varies at random, thereby allowing the production of a uniform deposition through the thermal decomposition of a volatile rhenium metal containing precursor. FIG. 6b is a cross-sectional view of one embodiment of the present inventive method applied to the configuration disclosed in WO 96/29446 wherein a levitation stabilizing structure 30 with a proper rotation axis of symmetry 40 has been fabricated and attached to the surface of the spherical moveable substrate 10 and the interior walls of said levitation stabilizing structure 30 are optionally normal to the surface of the spherical moveable substrate. The spherical moveable substrate 10 is positioned above the stationary support 12 and fluid collimating conduit 14 so that the levitation stabilizing structure 30 opposes the gas-emanating stationary support 12. The levitation stabilizing structure 30 allows the spherical moveable substrate 10 to rotate freely about the proper rotation axis of symmetry during pneumatic levitation thereby providing a way of selectively coating one or more portions of the spherical moveable substrate 30 in a uniform fashion during the deposition process. FIG. 6c is a cross-sectional view of another embodiment of the present inventive method applied to the configuration disclosed in WO 96/29446 wherein a levitation stabilizing structure 30 with a proper rotation axis of symmetry 40 has been fabricated and attached to the surface of the spherical moveable substrate 10 and the interior walls of said levitation stabilizing structure 30 are optionally normal to the surface of the spherical moveable substrate. The spherical moveable substrate 10 is positioned above the stationary support 12 and fluid collimating conduit 14 so that the levitation stabilizing structure 30 opposes the gas-emanating stationary support 12. The stationary fluid emitting support structure 12 is modified to follow the surface contours of spherical moveable substrate 10 in a conformal-wise manner and the stationary fluid emitting support structure 12 further provide a single orthogonal fluid jet for the purpose of pneumatic levitation of moveable substrate 10. The levitation stabilizing structure 30 allows the spherical moveable substrate 10 to rotate freely about the proper rotation axis of symmetry during pneumatic levitation thereby providing a way of selectively coating one or more portions of the spherical moveable substrate 30 in a uniform fashion during the deposition process. FIGS. 6d and 6e show two plan views of two embodiments of the moveable spherical substrate with a levitation stabilizing structure compatible with the apparatus configurations shown in FIGS. 6b and 6c. The plan view is directly down the proper rotation axis of symmetry of the levitation stabilizing structure so that the rotational symmetry of the levitation stabilizing structure 30 can be seen. FIG. 6d shows that a circular levitation stabilizing structure 30 on the spherical moveable substrate 10 with a proper rotational axis of symmetry 40 that is a $C_\infty$ axis. FIG. 6e shows that a pentagonal levitation stabilizing structure 30 on the spherical moveable substrate 10 with a proper rotational axis of symmetry 40 that is a $C_5$ axis.

Thus, a further advantage of method of fluidic levitation employing a levitation stabilizing structure is the fluidic levitation of arbitrarily shaped substrates and the processing of selective portions of the surface area of said arbitrarily shaped substrates. In the embodiments shown above in 6a through 6e, the levitation stabilizing structure can be formed on arbitrarily shaped substrate thereby enabling pneumatic levitation of the arbitrarily shaped substrate when the plane of the levitation stabilizing structure is positioned normal to and facing an orthogonal jet emanating from a stationary support. As mentioned previously, the levitation stabilizing structure additionally enables the use of pneumatic levitation with, for example, planar substrates that are shaped like circles, triangles, squares, and other polygonal shapes. The levitation stabilizing structure is particularly useful for pneumatic levitation of silicon wafers that are essentially circular shaped and are additionally marked with a flat or notch so that the wafer is not perfectly symmetric. Wafers marked with a flat can be considered to be arbitrarily shaped substrates and the levitation stabilizing structure is particularly useful for pneumatic levitation of samples of this type. Additionally, the levitation stabilizing structure can be employed with three dimensional moveable substrates, said substrates being planar or non-planar, to enable processing of selected regions on the substrate surface.

In another embodiment, the levitation stabilizing structure fabricated upon a moveable substrate includes a material layer having one surface contacting the moveable substrate surface and having a thickness greater than 20 microns; wherein the material layer is patterned to create a concave or convex polygonal shaped depressed area bounded by a thickness of the material layer, the height of the boundary wall around the depressed area as measured normal to the tangent plane of the moveable support surface being essentially equal to the thickness of the material layer; the centroid of the polygon shaped depressed area lying within the polygon shaped interior impingement area of the patterned material layer; the surface area of the polygonal shaped interior impingement area defined by the patterned material layer being at least 4 times larger than the cross-sectional area of the orthogonal jet impinging on said area.

FIG. 7a is an isometric view of an embodiment of a levitation stabilizing structure 30 fabricated on a planar moveable substrate 10 where at least one surface of levitation stabilization structure 30 is in contact with moveable substrate 10. FIG. 7a shows the moveable substrate surface normal 16, levitation stabilizing structure 30 comprised of a patterned material layer, levitation stabilizing structure interior wall 38, and polygonal shaped interior impingement area 35 bounded by a thickness of the material layer comprising levitation stabilization structure 30 that is characteristic of the height of the interior wall 38. The levitation stabilizing structure 30 overlays and is in contact with the moveable substrate 10. In one embodiment the levitation stabilizing structure 30 overlays and is in contact with the moveable substrate 10 except in the interior impingement area. In another embodiment the material layer of the levitation stabilizing structure 30 overlays and is in contact with the moveable substrate 10 and the thickness of the material layer comprising the levitation stabilizing structure is reduced and is thinner in the interior impingement area so that the height of the interior wall of the levitation stabilizing structure 38 is determined by the difference between the thickness of the material layers inside the interior impingement area and outside the interior impingement area. The height or thickness of the material layer at any point on the substrate surface is measured in relation to the substrate surface by perpendicular 32 (not shown) along moveable substrate surface normal 16. In some applications it can be advantageous that the composition of the exposed surface comprising the polygonal shaped depressed interior impingement area 35 be the same as the composition of the material layer of the levitation stabilization structure 30. In another embodiment, the polygonal shaped depressed interior impingement area 35 of FIGS. 7a and 7b can be fabricated so that the exposed surface area of the polygonal shaped depressed interior impingement area 35 has a different composition from that of the surface of the moveable substrate 10 or a different composition from the levitation stabilizing structure 30. In another embodiment of the inventive method, the polygonal shaped depressed interior impingement area 35 of FIGS. 7a and 7b can be fabricated so as to allow the surface of moveable substrate 10 to be exposed in the interior impingement area.

FIG. 7b shows a plan view of one embodiment of a levitation stabilizing structure 30 comprised of material layer fabricated on a moveable substrate 10, levitation stabilizing structure interior wall 38, polygonal shaped interior impingement area 35, said interior impingement area 35 containing the centroid region 42 of the polygonal shape of interior impingement area 35, showing that the centroid region 42 lies within the interior walls 38 of the polygonal shaped depressed area of interior impingement area 35. The shape of the polygonal shaped depressed area that corresponds to the interior impingement area 35 of the levitation stabilizing structure and is shown in FIGS. 7a and 7b is irregular and concave. The polygonal shape of the interior impingement area 35 is not restricted to concave polyhedral shapes, nor is the polygonal shape of the interior impingement area restricted to those polygonal shapes shown in FIGS. 5a through 5f. Without wishing to be bound by theory, it is believed that a criteria for choosing a particular polyhedral shape for the interior impingement area of the levitation stabilizing structure is that the centroid of the polyhedral shape must lie within the area of the polyhedral shape. In other words, it is believed that the best functioning polyhedral shaped interior impingement areas have their centroid located in the interior area of the polyhedra that is defined by the area enclosed within the circumference of the polyhedra shape. Furthermore, the moveable substrate 10, shown as a planar object in FIGS. 7a and 7b, is not restricted to objects with planar surfaces. The general applicability of the levitation stabilizing structure to non-planar substrates has been previously shown in FIGS. 6a through 6e.

According to the description of FIGS. 7a and 7b, then, in one embodiment, the levitation stabilizing structure can be a continuous patterned layer of a single composition. In another embodiment the levitation stabilizing structure can be comprised of a plurality of layers including a continuous patterned material layer of a single composition, an adhesive layer, and an adhesion promoting layer wherein the levitation stabilizing structure is attached, to an underlying moveable substrate, the continuous nature of the levitation stabilizing structure not allowing exposure of the surface of the underlying moveable substrate through the levitation stabilizing structure material layer. In another embodiment, a multilayer levitation stabilizing structure can be comprised of a non-continuous patterned material layer of a single composition and at least one adhesion promoting layers that provide a means to attach the levitation stabilizing structure to an underlying moveable substrate, the discontinuous or non-continuous nature of the levitation stabilizing structure thus allowing exposure of the surface of the underlying moveable substrate through the levitation stabilizing structure. In a third embodiment, the material layer located in interior impingement area of the levitation stabilizing structure can be of a composition which is different from either the moveable substrate or the material layer of the levitation stabilizing structure.

Thus, in one embodiment the levitation stabilizing structure is comprised of a material layer having one side contacting the moveable substrate surface and having a thickness greater than 20 microns; wherein the material layer is patterned so as to create a depression corresponding to an interior impingement area; the walls of said depression being essentially normal to the moveable support surface; the height of the walls of the depression being essentially equal to the depth of the polygonal shaped depressed area into the material layer; the shape of the depression being the shape of a polygon whose centroid lies within the polygonal shape of the depression; preferably a convex polygon possesses at least three sides wherein the convex polygon has at least one axis of proper rotation, $C_n$, said axis of rotational symmetry being essentially orthogonal to the moveable substrate surface and the plane containing the material layer; wherein the order or coefficient, n, of the axis of proper rotation is equal to or greater than 2; the area of the depression defining the convex polygon whose perimeter corresponds to the interior walls of the interior impingement area in the material layer being at least 4 times larger than the cross-sectional area of the orthogonal impinging jet employed during fluid levitation.

Characteristic features of the levitation stabilizing structure on a substrate such as, for example, the width of the levitation stabilizing structure, can be determined by the process into which the fluid levitation technology will be integrated. For example, the levitation stabilizing structure can be used to mask off just a portion of the moveable substrate surface so that only a particular portion of the surface is exposed to the levitating gas flow whilst all other substrate surfaces are passivated by the material layer of the levitation stabilizing structure—the inventive concept shown in FIGS. 7a and 7b. In practice, the minimum width of the interior walls 38 of the levitation stabilizing structure is determined by the mechanical properties of the material layer employed to fabricate the levitation stabilizing structure and the thickness required to sustain a mechanically rigid barrier to the fluidic pressures encountered during fluidic levitation. A levitation stabilizing structure having insufficient rigidity may exhibit unpredictable behavior during levitation processes, said behavior characterized by interior walls of the interior impingement area that deflect, buckle, bend, or collapse when exposed to fluidic flow under fluidic levitation conditions thereby rendering the levitation stabilizing structure useless. The two contemplated fluidic flows are pneumatic flow involving compressible fluids such as gasses and hydraulic flow involving non-compressible or incompressible fluids such as liquids.

In one embodiment the levitation stabilizing structure is fabricated on an essentially planar substrate. The planar substrate, however, does not have to be a rigid or self-supporting substrate and may comprise a flexible material that remains in a planar configuration when supported by a gas film generated on a planar surface or some other planar support structure.

The thickness of the material layer for the LSS necessary to achieve a desired level of fluidic levitation performance depends on the mass and dimensions of the moveable substrate as well as the total gas flow employed during fluidic levitation. For example, an LSS for a micromechanical gas flow restraining device having a moveable substrate diameter of 100 microns and employing a single orthogonally impinging jet on the moveable substrate may require a material layer thickness for the LSS of less than 50 microns whilst the application of an LSS for the purpose of pneumatic levitation of a 150 mm silicon wafer with a single orthogonal jet emanating from a stationary gas emitting support may require a material thickness for the LSS of between 130 and 300 microns.

The material layer of the levitation stabilizing structure (LSS) fabricated upon a moveable substrate can be formed using additive processes like, for example, deposition processes, to form a material layer having properties appropriate for substrate type and the levitation application. For example, the levitation stabilizing structure can be formed on the moveable substrate using any method familiar to those skilled in the art of additive material processing. Methods for additive substrate processing include deposition methods such as physical vapor deposition, chemical vapor deposition, sputtering, electroplating, electroless deposition, electroforming; additive methods like lamination of an LSS comprised of one or more material layers using adhesion promoting layers with the aid of temperature and/or pressure; and printing methods of all types including lithography, screen printing, inkjet printing, 3 dimensional inkjet printing; 3 dimensional printing with extruded polymers; 3 dimensional printing employing sinterable materials; stenciling, painting, epitaxial growth, spin coating or any other method of additive material deposition known in the art. Alternately, the LSS can be formed by patterning a pre-existing material layer prepared, for example by additive processing. The patterning of the pre-existing material layer can be accomplished using subtractive processes familiar to those skilled in the art of subtractive material processing to form a patterned material layer whose features correspond to those of a levitation stabilizing structure having properties that are appropriate for the substrate type and the levitation application. Many useful subtractive processes include the use of masks to ensure that material is removed from the material layer only in the desired regions. Examples of subtractive processes employed to form a levitation stabilized structure include vapor phase etching methods, liquid phase etching methods, plasma assisted etching methods, subtractive machining and micromachining methods including spark machining and waterjet machining methods, electrostripping methods including patterned electrostripping with the use of passivation layers and masks, subtractive electrochemical machining methods using specially shaped electrodes and masks, subtractive material processing involving patterning of positive and negative photosensitive resist layers, and other subtractive material processing methods for processing and patterning material layers. Furthermore, it may sometimes be desirable that the LSS can be fabricated as an integral part of the substrate itself by employing known technologies used to fabricate articles of complex shape such conventional machining processes, injection molding, extrusion, stamping, hydroforming, electroforming, multistep deposition and patterning of material layers using process steps found in the manufacture of integrated circuits, specialized micromachining methods such variants of chemical mechanical polishing as well as other micromachining methods employed for the manufacture of microelectromechanical systems (MEMS) and devices, and the like. The LSS may thus be formed in a singular piece integrated with the substrate for subsequent processing applications. In some embodiments the interior impingement area of the LSS can be backfilled with an additional thin material layer resulting in a complex multilayer structure as previously described.

Figure 8:
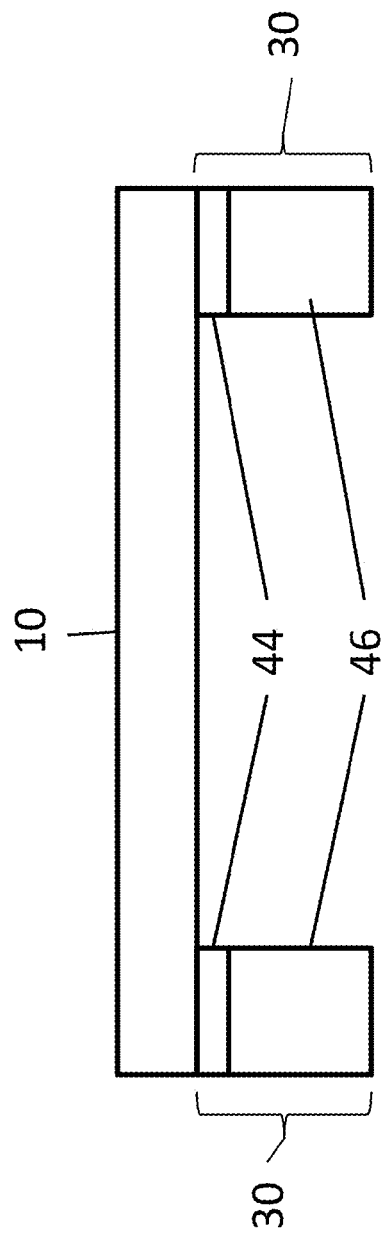
FIG. 8 is a cross-sectional view showing a substrate with a multilayer levitation stabilizing structure wherein the levitation stabilizing structure further includes an adhesion promoting layer.

FIG. 8 shows a cross-sectional view of one embodiment of a multilayer levitation stabilizing structure 30 comprised of a material layer 46 overlaying and contacting an adhesion promoting layer 44, the adhesion promoting layer being positioned and interposed between and in contact with a surface of the material layer 46 and in contact with a surface of the moveable substrate 10. The adhesion promoting layer 44 is shown as a discontinuous layer in FIG. 8; however, the adhesion promoting layer 44 in FIG. 8 may optionally be a continuous layer.

In another embodiment, the levitation stabilizing structure 30 can be formed externally, like a gasket fabricated from a material layer in the appropriate shape and thickness, aligned and adhered to the moveable substrate using an adhesive layer or adhesion promoting layer when desired. The levitation stabilizing structure can be a removable element that can be added or removed from the moveable substrate as desired. The levitation stabilizing structure can be adhered to the moveable substrate by any means familiar to those skilled in the art of adhesion, joining, and gluing; for example, an adhesive promoting glue layer can be employed to attach the levitation stabilizing structure to the moveable substrate thereby providing a moveable substrate with an attached levitation stabilizing structure. In some cases, an externally fabricated levitation stabilizing structure that is attached to the moveable substrate with an adhesive layer can be a preferred method of preparing a moveable substrate with a levitation stabilizing structure because the choice of adhesive or adhesion method may allow easy application of the levitation stabilizing structure to the moveable substrate or optional removal of the levitation stabilizing structure from the moveable substrate surface. Various types of adhesion promoting layers can be employed to attach a levitation stabilizing structure to a moveable substrate for the purposes of fluidic levitation. In one embodiment, the adhesive layer can be comprised of a pressure sensitive, removable adhesive possessing sufficient bonding strength for use in levitation applications. In another embodiment the adhesive layer can be comprised of a more permanent, non-removable type of adhesive, optionally pressure sensitive, possessing sufficient bonding strength for use in levitation applications. In one embodiment, a pressure sensitive adhesive that increases its adhesive strength upon exposure to heat can be used to adhere the levitation stabilizing structure to a moveable substrate. In another embodiment, a pressure sensitive adhesive that loses its adhesive strength upon exposure to heat can be used to adhere the levitation stabilizing structure to a moveable substrate. In another embodiment, an adhesive that is optionally pressure sensitive and increases its adhesive strength upon exposure to ionizing radiation can be used to adhere the levitation stabilizing structure to a moveable substrate. In a further embodiment, an adhesive that is optionally pressure sensitive and loses its adhesive strength upon exposure to ionizing radiation can be used to adhere the levitation stabilizing structure to a moveable substrate. The aforementioned embodiments exemplify the general use of adhesive layers with the levitation stabilizing structure are not meant to be restrictive in any way as the inventors recognize that other adhesive layers can be applicable and fall within the contemplated spirit of the invention.

In a further embodiment the levitation stabilizing structure is mechanically and releasably attached to the moveable substrate to facilitate ease of moveable substrate assembly without the use of supplemental adhesive layers that chemically bond the levitation stabilizing structure to the moveable substrate. In one embodiment the levitation stabilizing structure is mechanically and releasably attached to the moveable substrate through fasteners that can be tightened or loosened to install or remove the levitation stabilizing structure from the moveable substrate. In another embodiment spring loaded fasteners are used to mechanically install the levitation stabilizing structure. In one embodiment magnetic fasteners are used to mechanically and releasably attach the levitation stabilizing structure to the moveable substrate. In one embodiment interlocking mechanical features are used to mechanically fasten and releasably attach the levitation stabilizing structure to the moveable substrate. In a further embodiment, miniature latches are employed to mechanically and releasably attach the levitation stabilizing structure to the moveable substrate. In another embodiment, the movable substrate includes a backing plate and a clamping structure to mechanically and releasably attach the levitation stabilizing structure to the moveable substrate.

As mentioned previously, the LSS can be a multilayer structure formed from a wide variety of materials, and the subsequent use of the LSS for pneumatic levitation during substrate processing is part of the criteria determining whether the LSS is compatible with the underlying substrate. The LSS can be fabricated from the same material as the substrate, including the material of the substrate itself, or it can be fabricated from a material of different chemical composition and may include one or more adhesion promoting layers to facilitate the adhesion of the LSS to the underlying substrate. For example, wafer bonding can be used, to bond an ultrathin wafer to a LSS made from the same material so that the ultrathin wafer can be processed in a non-contact levitated manner.

In one embodiment of the levitation stabilizing structure, the LSS can be formed using a curable material with cross-linking agents. The curable material can be photosensitive and the LSS can be formed by coating the moveable substrate with a curable layer; exposing the curable layer to patterned radiation to form a patterned cured layer; and removing the uncured curable layer to form the levitation stabilizing structure. In a particular embodiment of the levitation stabilizing structure, the LSS can be formed using positive or negative photoresist, employing liquid photoresist. An example of a liquid photoresist that can be used to form a levitation stabilizing structure is the negative photoresist that is commercially available as MicroChem SU8 2050. The liquid photoresist can be applied by spin coating or other methods to form a material layer on the surface of the moveable substrate. The photoresist layer can be further be processed by patterning the photoresist material layer to form a polygon shaped depression of desired area and depth, said polygon being either convex or concave, where the centroid of the polygon lies within the area of the polygon defined by the surface area of the polygon lying within the perimeter of the polygon. In the embodiment of the fabrication of a levitation stabilizing structure using a material layer comprised essential of a patterned and developed photoresist, it is clear that the fabrication of the levitation stabilizing structure is compatible with fabrication methods normally employed in integrated circuit manufacture and is readily implemented in the semiconductor integrated circuit fabrication workflow.

In another embodiment of the invention, the LSS can be formed using a material layer 46 comprised of positive or negative photoresist, employing dry film photoresist. Dry film photoresist can be applied to the moveable substrate using lamination methods or vacuum lamination methods onto the surface of the moveable substrate. An example of a dry film photoresist that can be used for fabricating a levitation stabilizing structure is DuPont WBR2000 series dry resist film. The photoresist layer can be further be processed by patterning the photoresist material layer to form a polygon of appropriate area, said polygon being either convex or concave, where the centroid of the polygon lies within the area of the polygon defined by the surface area of the polygon lying within the perimeter of the polygon. In the example of the fabrication of a levitation stabilizing structure using a material layer comprised essentially of a patterned and developed dry film photoresist, it is clear that the fabrication of the levitation stabilizing structure is compatible with fabrication method normally employed in integrated circuit manufacture and is readily implemented in the semiconductor integrated circuit fabrication workflow.

Additionally, the use of photopatternable photoresist layers for the fabrication of levitation stabilizing structures is compatible with the process flows employed in the fabrication of many microelectromechanical systems (MEMS).

In some cases it can be advantageous to have a permanent levitation stabilizing structure and the material layer 46 of such structures can be prepared by numerous methods including those described above, as well as by using chemically stable photoresist materials such as epoxy based photoresists. In other cases, the levitation stabilizing structure on the moveable substrate may need to be transient and removable—only present for a single processing step. Removable levitation stabilizing structure can be prepared using materials that can be chemically or physically stripped after use. Examples of removable levitation stabilizing structures are levitation stabilizing structures prepared from thick dry film photoresists or prepared using electroforming deposition methods. Electroformed levitation stabilizing structure can be removed by electrostripping or another material removal process, such as chemical dissolution.

In another embodiment, 3-dimensional printing methods can be used to fabricate the levitation stabilizing structure 30 on a moveable substrate 10 with or without the aid of an adhesion promoting layer 44 and the use of 3 dimensional printing methods may provide additional economy with respect to material and fabrication costs of the levitation stabilizing structure.

The disclosed inventive method of fluidic levitation employing a levitation stabilizing structure overlaying and in contact with a moveable substrate is useful for stabilizing fluid levitation of a moveable substrate with both compressible and non-compressible or incompressible fluids. Flexible substrates as well as rigid substrates can be fluidically levitated with a levitation stabilizing structure. Fluidic levitation is generally applicable to moveable substrates of many different types including plastics, semiconductor materials, insulator materials, electrically conducting materials, magnetic materials of all types (meaning ferromagnetic and anti-ferromagnetic, diamagnetic, paramagnetic, and other types of magnetic materials) and other substances that are solid and dimensionally stable under pneumatic levitation conditions. Of course, the composition of the material layer 46 must also be carefully considered with respect to the nature of the fluid employed during levitation so that the fluid does not adversely influence the integrity of the material layer employed to fabricate the levitation stabilizing structure. Those skilled in the art of fluid mechanics will recognize that the levitation stabilizing structure presented here is equally applicable to both pneumatic and hydraulic levitation and thus the use of the levitation stabilizing structure with both pneumatic and hydraulic levitation falls within the contemplated scope of the invention. The advantages of incorporating pneumatic levitation during substrate processing are many and some of the advantages have been previously enumerated in U.S. Pat. No. 5,370,709 wherein the use of a "suction plate" that enables substrate levitation by Bernoulli gas flow is described. The moveable substrate does not come in contact with any member of the processing equipment so no particles are generated. This is not strictly true in the case of U.S. Pat. No. 5,370,709 because the apparatus described therein specifically uses physical stops to prevent substrate motion. The use of a levitation stabilizing structure of the present invention completely removes any physical contact to the moveable substrate during levitation. The gas exchange in the space between the stationary support and the moveable substrate is extremely rapid, thus contamination such as autodoping or contamination from other forms of contaminating outgassing can be minimized during processing. Process times associated with gas exchange such as purge steps to ensure gas purity during processing can be minimized because of the small volume between the moveable substrate and the gas-emanating stationary support. The rapid gas exchange due to high gas velocities combined with small reaction volumes leads to an advantage in gas consumption. The sample is thermally isolated by a layer of gas and, as a result, temperature control can be extremely efficient with a minimum of power being required to achieve process temperature. Cooling is efficient due to the rapid velocity of the gas flow between the moveable substrate and the gas-emanating stationary support. Pneumatic levitation is shown to be an effective technology for film growth on the moveable substrate from the vapor phase such as is employed in vapor phase epitaxy. Fluidic levitation wherein a levitation stabilizing structure is employed to positionally stabilize the moveable substrate eliminates the complexity of the electronic feedback loops and associated sensors and equipment, thus simplifying apparatus design. Bernoulli fluidic levitation that employs at least one fluid jet and a levitation stabilizing structure on the moveable substrate is a self-regulating levitation process in which the distance between the moveable substrate and gas-emanating stationary support is determined by a balance between the gravitational force acting on the moveable substrate and the fluidic force, either hydraulic or pneumatic, on the moveable substrate that is provided by one or more impinging fluid jets. Additionally, the same fluidic flow that enables self-regulated flotation of the substrate on a gas cushion also enables control of lateral substrate movement through the interaction of the fluid flow and the levitation stabilizing structure on the substrate. Thus the self-regulating nature of fluidic levitation can now be used to great advantage by employing the invention of the levitation stabilizing structure during fluidic levitation, thereby allowing the design of new apparatus and associated processes.

It is desirable in some applications that the levitation stabilizing structure exhibit different chemical reactivity than the substrate upon which the levitation stabilizing structure is fabricated. For example, it can be desirable that the levitation stabilizing structure possess a property of chemical non-interaction with the process environment to which said levitation stabilizing structure is exposed. Chemical inertness of the levitation stabilizing structure is particularly useful for certain types of deposition processes to prevent film deposition on the levitation stabilizing structure thereby aiding the efficiency of the removal of the levitation stabilizing structure from the substrate after processing. For example, there is growing interest in a technology known as selective area deposition, or SAD. As the name implies, selective area deposition involves treating portion(s) of a substrate such that a material is deposited only in those areas that are desired, or selected. Sinha et al. (J. Vac. Sci. Technol. B 24 6 2523-2532 (2006)) have remarked that selective area deposition technology as applied to ALD (Atomic Layer Deposition) requires that designated areas of a surface be masked or "protected" to prevent ALD reactions in those selected areas, thus ensuring that the ALD film nucleates and grows only on the desired unmasked regions. Sinha et al., used poly(methyl methacrylate (PMMA) in their protective, chemically non-reactive, masking layer. It is also possible to have SAD processes where the selected areas of the surface area are "activated" or surface modified in such a way that the film is deposited only on the activated areas. There are many potential advantages to selective area deposition techniques, particularly to eliminate the necessity of employing lift-off processes for removing the levitation stabilizing structure after a pneumatically levitated deposition process. Lift off processes have the disadvantages of unwanted film retention in certain substrate areas and possible redeposition of particulates onto the substrate during the lift off removal process. The use of selective area deposition for chemical vapor deposition and atomic layer deposition has been described and is familiar to those skilled in the art. Generally, the use of deposition inhibiting materials comprises providing a substrate and applying a deposition inhibitor material to said substrate; optionally imagewise patterning the deposition inhibitor material; depositing a thin film by chemical vapor deposition or atomic layer deposition; and optionally removing the deposition inhibitor material. The use of deposition inhibitor materials for directed deposition in different processes has been described in the art, including the use of photosensitive and photopatternable deposition inhibitor materials and many different deposition inhibitor materials are known in the art. The levitation stabilizing structure itself can be fabricated from a deposition inhibiting material directly. In an alternative embodiment, the levitation stabilizing structure may have a layer of deposition inhibiting material overlaying and in contact with the levitation stabilizing structure, the layer of deposition inhibiting material imparting selective area deposition properties onto the levitation stabilizing structure and modifying the chemical reactivity of said levitation stabilizing structure with respect to deposition processes.

U.S. Pat. No. 7,848,644B2 discloses the use of photopatternable layers of siloxane based polymers as director inhibitor compounds for selective area deposition.

U.S. Pat. No. 8,153,352 B2 describes a method for fabricating a pixel circuit comprised of selective deposition employing photopatternable inhibition layers sensitized to specific wavelengths. A multilayered, multicolored mask is prepared on a transparent support which allows photopatternable inhibition layers that have been sensitized to respond to specific wavelength of light to be exposed to said wavelength of light for the purpose of sequentially preparing patterned layers using patterned inhibition layers. The photosensitive layers were prepared by adding dyes and sensitizers to a commercially available photoresist (CT2000L from Fuji Photochemicals containing a methacrylate derivative copolymer and a polyfunctional acrylate resin in a mixture of 2-propanol-1-methoxyacetate and 1-ethoxy-2-propanol acetate).

U.S. Pat. No. 8,153,529 B2 describes a method of deposition inhibition for atmospheric pressure atomic layer deposition based on photopatternable layers of hydrophilic polymers wherein the hydrophilic deposition inhibitor polymer is a hydrophilic polymer that is a neutralized acid having a pKa of 5 of less, wherein at least 90% of the acid groups are neutralized. The advantage of the polymer is the ease of processing with aqueous based solution chemistry. U.S. Pat. No. 8,153,529 B2 teaches that the degree of protonation of the deposition inhibition polymer is a potentially important factor determining deposition inhibition performance.

U.S. Pat. No. 7,846,644 B2 describes the use of photo-patternable deposition inhibitor films containing siloxane-polymer based materials for the purpose of providing a means to pattern films during the deposition process by inhibiting deposition on regions where the deposition inhibitor film is present. Siloxane-polymer based materials are generically defined to include compounds substantially comprising, within their chemical structure, a skeleton or moiety made up of alternate Si and O atoms, in which at least one, preferably two organic groups are attached to the Si atom on either side of the —O—Si—O— repeat units. The organic groups can have various substituents such as halogens, including fluorine, but most preferably, the organic groups are independently substituted or unsubstituted alkyl, phenyl, or cycloalkyl groups having 1 to 6 carbon atoms, preferably 1 to 3 carbon atoms, preferably substituted or unsubstituted methyl.

U.S. Pat. No. 8,017,183 B2 describes a process for forming patterned thin films of inorganic materials by applying a patterned layer of an organosiloxane polymer which may optionally be cross-linked or a photopatternable polymethyl methacrylate polymer to a substrate followed by atmospheric pressure atomic layer deposition.

U.S. Pat. No. 7,998,878 B2 describes a method for forming patterned thin films prepared by atomic layer deposition by applying a deposition inhibitor film to a substrate followed by coating. Numerous types of deposition inhibitor films are described with a focus on water soluble polymers. Materials include hydrophilic polymers that are mostly neutralized as well as other hydrophilic polymers like poly (vinyl pyrolidone) based polymers, ethylene oxide based polymers, allylamine based polymers, and oxazoline based polymers.

U.S. Pat. No. 8,030,212 B2 describes a method for forming patterned thin films prepared by atomic layer deposition by applying a deposition inhibitor film to a substrate followed by coating. Numerous types of deposition inhibitor films are described and the polymer materials employed are mostly soluble in organic solvents. Deposition inhibitor polymer films include perfluoroalkyl methacrylate polymers, methyl methacrylate polymers, cyclohexyl methacrylate polymers, benzyl methacrylate polymers, isobutylene polymers, 9,9-dioctylfluorenyl-2,7-dyl based polymers, polystyrene base polymers, vinyl alcohol based polymers, and hexafluorobutyl methacrylate based polymers.

U.S. Pat. No. 8,129,098 B2 describes a process for fabricating multilayer patterned structures where the registration between the patterned layers is optimized through the use of dye sensitized photopatternable deposition inhibition layers that have been patterned using exposure through a multicolored exposure mask. Dye sensitization of the photopatternable deposition inhibition layers is described. The use of several different photopatternable deposition inhibition polymers is described including commercially available methyl methacrylate polymers and commercially available vinyl terminated methyl siloxane polymers.

U.S. Pat. No. 8,168,546 B2 describes a method for forming patterned thin films prepared by atomic layer deposition by applying a deposition inhibitor film to a substrate followed by coating. Numerous types of deposition inhibitor films are described and the polymer materials employed are soluble in solutions that are at least 50% by weight water. Preferred deposition inhibitor material is a hydrophilic polymer that has in its backbone, side chains, or both backbone and side chains, multiple secondary or tertiary amide groups that are represented by the following acetamide structure >N—C(=0)-, where is the hydrophilic polymer satisfies both of the following tests: a) it is soluble to at least 1% by weight in a solution containing at least 50 weight % water as measured at 40° C., and b) it provides an inhibition power of at least 200 Å to deposition of zinc oxide by an ALD process.

U.S. Pat. No. 8,273,654 describes a method of producing a vertical transistor comprising: providing a substrate including a gate material layer stack with a reentrant profile; depositing an electrically insulating material layer over a portion of the gate material layer stack and over a portion of the substrate; depositing a patterned deposition inhibiting material over the electrically insulating material layer; and depositing a semiconductor material layer over the electrically insulating material layer using a selective area deposition process in which the semiconductor material layer is not deposited over the patterned deposition inhibiting material. The patterned deposition inhibiting material is not specified; however, the methods of application of the deposition inhibiting material taught to include inkjet printing processes, flexographic printing processes, gravure printing processes, and photolithographic processes.

U.S. Pat. No. 8,318,249 B2 describes a method for forming a patterned thin film using deposition inhibitor materials in combination with spatial atomic layer deposition comprising: applying a patterned deposition inhibitor material to a substrate and depositing an inorganic this film on the substrate spatial atomic layer deposition such that the film deposits only in those areas where the deposition inhibitor is absent where the deposition inhibitor material is a hydrophilic poly(vinyl alcohol) having a degree of hydrolysis of less than 95%.

U.S. Pat. No. 7,848,644B2, U.S. Pat. No. 8,153,352 B2, U.S. Pat. No. 8,153,529 B2, U.S. Pat. No. 7,846,644 B2, U.S. Pat. No. 8,017,183 B2, U.S. Pat. No. 7,998,878 B2, U.S. Pat. No. 8,030,212 B2, U.S. Pat. No. 8,129,098 B2, U.S. Pat. No. 8,168,546 B2, U.S. Pat. No. 8,273,654, U.S. Pat. No. 8,318,249 B2 all disclose methods and materials useful for achieving selective area deposition and useful to prevent deposition on a levitation stabilizing structure during a pneumatically levitated deposition process, the disclosures of which are hereby incorporated by reference in their entirety.

The deposition inhibiting layer can be added to a levitation stabilizing structure using any method familiar to those skilled in the art of additive deposition methods and processes. In one embodiment the deposition inhibiting layer or deposition inhibiting film can be formed upon a levitation stabilizing structure and moveable support using a vapor deposition process. In another embodiment the deposition inhibiting layer or deposition inhibiting film can be formed upon a levitation stabilizing structure and moveable support using a spin coating process. In a third embodiment the deposition inhibiting layer or deposition inhibiting film can be formed upon a levitation stabilizing structure and moveable support using a dip coating process, a spray painting process, a brush painting process, or a stenciling process. Other methods of forming or applying a deposition inhibiting layer to a levitation stabilizing structure and moveable substrate are conceivable and within the scope and spirit of the inventive concept utilizing the properties of a patterned or unpatterned deposition inhibiting layer in combination with a levitation stabilizing structure on a moveable support. In one embodiment a patterned deposition inhibition layer can be applied to both the moveable substrate and the levitation stabilizing structure.

The use of deposition inhibiting materials to achieve selective deposition on a substrate during, for example, atomic layer deposition is compatible with the use of pneumatic levitation for substrate processing as described in this invention. The use of deposition inhibiting materials on a moveable substrate upon which a levitation stabilizing structure has been fabricated is advantageous because rapid gas exchange properties that are inherent to pneumatic levitation processing methods leads to short processing times that minimize diffusion of reactive materials through the deposition inhibiting material layers, thereby improving the deposition inhibition and improving the selectivity of area deposition. Furthermore, it is particularly advantageous for the levitation stabilizing structure on a moveable substrate to be comprised additionally of one or more layers where the outermost and topmost surface of the levitation stabilizing structure on the movable substrate not in contact with the moveable substrate itself has the material properties of a deposition inhibition material or layer thereby enabling selective area deposition on areas other than the levitation stabilizing structure. A levitation stabilizing structure possessing the property of deposition inhibition as described in the art is called a deposition inhibiting levitation stabilizing structure. The use of a deposition inhibiting levitation stabilizing structure is especially advantageous when pneumatic levitation methods in combination with moveable substrates upon which a levitation stabilizing structure has been fabricated are employed in chemical vapor deposition processes or for the purposes of carrying out atomic layer deposition processes.

Figure 9:
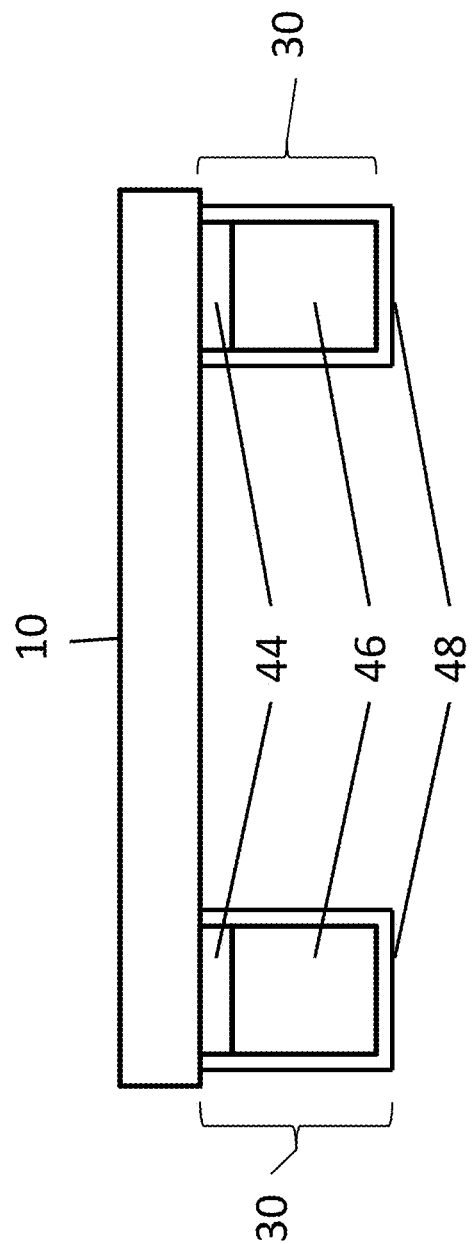
FIG. 9 is a cross-sectional view showing a substrate, with a multilayer levitation stabilizing structure wherein the levitation stabilizing structure further includes an adhesion promoting layer and a deposition inhibiting layer.

FIG. 9 shows a moveable substrate 10 with a levitation stabilizing structure 30 overlaying and in contact with at least one surface of moveable substrate 10. The levitation stabilizing structure is comprised of multiple layers, each layer having a specific function. In one embodiment shown in FIG. 9 adhesion promoting layer 44 overlaying and in contact with on the substrate is employed to ensure optimal adhesion of the entire levitation stabilizing structure 30 to the moveable substrate 10. A material layer 46 of a thickness greater than 20 microns is overlaying and in contact with optional adhesion promoting layer 44. Deposition inhibiting layer 48 is overlaying and in contact with material layer 46 and the exposed portions of the adhesion promoting layer 44 on the walls of levitation stabilizing structure 30. Deposition inhibiting layer 48 is the outermost layer of the levitation stabilizing structure 30 and is employed to modify the chemical reactivity of the levitation stabilizing structure during processing. The outermost deposition inhibition layer 48 is advantageous for minimizing problems such as particle contamination during removal of the levitation stabilizing structure using lift off processes and can be fabricated from any material known in the art to impart deposition inhibiting properties to a surface. Deposition inhibition layer 48 is overlaying and in contact with material layer 46 and material layer 46 is overlaying and in contact with optional adhesion promoting layer 44.

Figure 10:
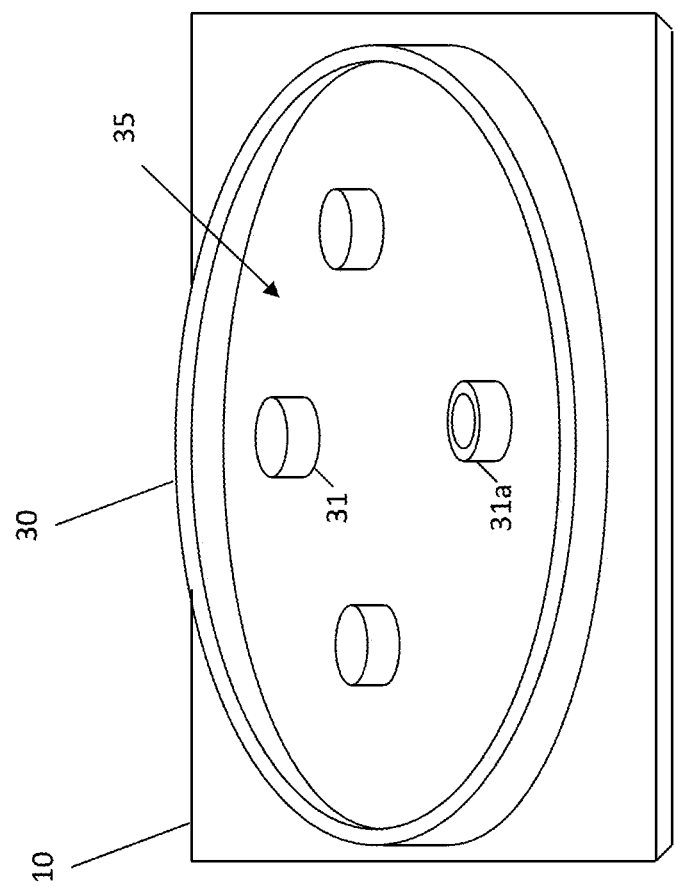
FIG. 10 is an illustration of a levitation stabilizing structure including structures within the interior impingement area according to an embodiment of the present invention.

Referring to FIG. 10 in an embodiment of the present invention, the moveable substrate 10 has a levitation stabilizing structure 30 and includes additional structures 31 located within the enclosed interior impingement area 35. In one embodiment, the additional structures 31 are solid; in another embodiment, the additional structures 31 form a closed curve with its own interior. The additional structures 31 in the levitation stabilizing structure 30 serve to exclude gas from the portion of the moveable substrate 10 covered by the additional structures 31 thereby inhibiting deposition in the covered area, thus allowing the moveable substrate 10 to be provided with patterned thin-film material layers.

Referring to FIGS. 24a-24g in an embodiment of the present invention, the patterning process is illustrated. FIG. 24a illustrates a moveable substrate 10. As shown in FIG. 24b, the moveable substrate 10 has a levitation stabilizing structure 30 and includes additional structures 31 that are applied to the surface of the moveable substrate 10. Referring to FIG. 24c, a patterned first thin-film layer 51 is deposited using an embodiment of the present invention to form an atomic thin-film layer whose pattern corresponds to the inverse of the additional structures 31 in the interior impingement area 35 (not shown). The levitation stabilizing structure 30 is removed and the subsequent levitation stabilizing structure 30 illustrated in FIG. 24d is applied to the moveable substrate 10 over the first thin-film layer 51. The levitation stabilizing structure 30 illustrated in FIG. 24d does not include any additional structures 31 so that the subsequent atomic layer deposition process deposits an unpatterned second thin-film layer 52 on the moveable substrate 10 over the first thin-film layer 51 (FIG. 24e). The levitation stabilizing structure 30 is then removed and the subsequent levitation stabilizing structure 30 with additional structures 31 illustrated in FIG. 24f is applied to the moveable substrate 10 over the patterned first thin-film layer 51 and the unpatterned second thin-film layer 52. A patterned thin-film layer 53 is deposited using the atomic layer deposition system of the present invention (FIG. 24g).

In an embodiment, thin-film layers on a common moveable substrate 10 are patterned using more than one method. For example, thin-film layers are patterned using the method illustrated in FIGS. 24a-24g and using the method of deposition inhibition, as described below. Single layers can be patterned using both techniques together or sequential layers can be alternately patterned using first one method and then another.

In another embodiment the entire levitation stabilizing structure can be fabricated from a material possessing deposition inhibition properties. In this embodiment the material layer 46 of FIG. 9 has the property of enabling selective area deposition, thereby eliminating the need for a separate deposition inhibiting layer 48.

Deposition inhibition materials employed for selective area deposition during deposition process such as but not restricted to atomic layer deposition are typically thin and provide a distinct advantage when such a layer or layer properties are applied to levitation stabilizing structure because the layer can potentially aid in post-processing of the levitation stabilizing structure. For example, when the surface of the levitation stabilizing structure on a moveable substrate has the property of deposition inhibition, then the deposited material from the deposition process like, for example, an oxide film deposited by atomic layer deposition will not be present on the regions having the deposition inhibition material property. The regions where the deposited material is absent will, therefore, be easier to remove in subsequent post-deposition processing if desired. It will be clear to those skilled in the art of post-deposition processing that such processes like, for example, lift-off processes that are commonly used in combination with patterned resists will not be necessary. This is desirable because post-deposition processing steps such as lift-off processes can lead to particle contamination, thereby reducing yield and product quality.

Furthermore, it is advantageous to use a moveable substrate with a deposition inhibiting levitation stabilizing structure during pneumatically levitated atomic layer deposition processing in combination with a patterned deposition inhibition layer on the moveable substrate itself for the purpose of selective deposition of a thin film in the regions on the surface of the moveable substrate where the deposition inhibition layer is absent. The levitation stabilizing structure, with or without deposition inhibiting properties, allows the use of deposition inhibiting materials on a moveable substrate in a pneumatically levitated deposition process without the use of physical stops to stabilize the substrate position during pneumatic levitation.

The inventive method of fluidic levitation stabilization using a levitation stabilizing structure in contact with and overlaying at least one surface of a moveable substrate will be further understood by reference to the examples below wherein the inventive method is employed to achieve fluidic levitation of plate-like substrates.

Examples 1-14

Pneumatic Levitation with and without Levitation Stabilizing Structures

The purpose of the following examples is to demonstrate the effectiveness of levitation stabilizing structures for improving the positional stability of pneumatically levitated moveable substrates. Recalling that all prior art employed physical stops on the gas-emanating stationary support in order to prevent undesirable moveable substrate motion that would cause failure of pneumatic levitation, note that examples 1-14 were carried out in the absence of any physical stops being present on the gas-emanating stationary support that could impede moveable substrate motion. In other words, since the motion of the moveable substrate was completely unimpeded during pneumatic levitation, failure of the sample to remain in a stable position during pneumatic levitation could be easily detected, thereby enabling a simple determination of moveable substrate configurations which are positionally stable during pneumatic levitation.

In examples 1-14 the stationary support through which fluid will flow was comprised of a block of nylon having dimensions of 8"×8"×1" with a 4 mm diameter orifice in the center of the 8"×8" surface. The 4 mm diameter orifice in the stationary support through which fluid will flow was machined so that it produces a gaseous jet from the gas emanating surface of the stationary support that is normal or orthogonal to the surface of the stationary support. During experimentation the moveable substrate was place on the support with one surface opposing the stationary gaseous emitting surface through which fluid will flow such that the orthogonal jet produced by the fluid collimating conduit in the gas emanating stationary support was also orthogonal to the opposing surface of the moveable substrate as illustrated in FIG. 4. The 4 mm fluid collimating conduit of the stationary support was in fluid contact with a manifold to which was equipped with a pressure gauge and a mass flow meter and the manifold was, in turn, in fluid contact with a source of pressurized gaseous fluid. The pressurized gaseous fluid was controlled using a valve and a pressure regulator. Pressurized air was used as the gaseous fluid for the production of orthogonal jets in all experiments. The pressure of the gaseous fluid was measured during experiments using a digital pressure gauge (Cecomp model DPG1000L100 psig) and the gaseous flow was measured using a mass flow meter (Mattheson model 8112-0444 calibrated for air). Sample height before and during pneumatic levitation was measured optically. A video camera (Watek model WAT 902H Ultimate) coupled to a lens assembly (Navitar Corp.) that was focused at the contact point between the moveable substrate to the nylon block and a fiber optic light source was placed such that when the sample was not levitated by pneumatic levitation there was no light to the camera because it was blocked by the substrate; similarly when the substrate underwent pneumatic levitation there was light transmitted through the gap between the moveable substrate and the stationary support containing the orthogonal jet, thereby enabling optical measurement of the displacement of the moveable substrate as a result of pneumatic levitation. Positional stability of the moveable substrate during pneumatic levitation was assessed by visual observation of the lateral displacement of the moveable substrate in directions parallel to the stationary support gas emanating surface. When a moveable substrate was not positionally stable during pneumatic levitation it was found that the moveable substrate would undergo lateral displacements that forced the moveable substrate completely off the surface of the gas emanating stationary support as described in U.S. Pat. No. 3,466,079. Moveable substrates in various configurations were considered positionally stable if the moveable substrate showed no motion of any type during when pneumatically levitated or if the moveable substrate showed stable rotation or oscillatory motion over a time period of several minutes around a rotational axis or oscillation center that was coincident with the orthogonal jet produced by the flow of gaseous fluid from the gas emanating surface of the stationary support.

All levitation stabilizing structures on the moveable substrates were fabricated using conventional methods familiar to those skilled in the art of photolithography. In examples 1-6, 10, and 12 a levitation stabilizing structure was fabricated upon one surface of silicon wafer. Silicon wafers with a diameter of 150 mm and a thickness of 675 microns were employed as silicon wafer substrates. The photoresist used here was a negative photoresist (MicroChem SU8 2050) and the photoresist was developed using a Laurell Technologies spin coater. The exposure masks were prepared using transparencies. All wafers were cleaned by immersion in a 60° C. EKC-256 bath for 10 minutes followed by a spin-rinse-dry cycle. Some wafers were optionally pretreated with an adhesion promoting layer of HMDS to aid adhesion of the photoresist to the wafer surface during processing. The resist was manually dispensed onto the wafer using a spin coater (Mark V Tel Track) using the following procedure: 1) 5-7 grams of SU8-2050 photoresist was dispensed onto the wafer for 3 seconds at 50 psi 2) the wafer was spun at 1000 rpm for 60 seconds followed by edge bead removal 3) the wafer was baked in a two step process at 65° C. for 4 minutes followed by a second bake at 95° C. for 4 minutes. Steps 1-3 were repeated until a resist thickness of approximately 200±10 microns was coated on the wafer. The resist was exposed through the transparency mask using a Karl Suss MA6 exposure tool using an I-line light source with a strong emission at 365 nm. After exposure, the wafers were baked for 10 minutes at 95° C. The photoresist layer on the wafer was developed using a Laurell Technologies spin coater with a propylene-glycol-mono-methyl-ether-acetate (PGMEA) developer. The PGMEA developer was applied using 8-10 puddles with a 60 sec exposure for each puddle. The PGMEA resist development was followed by an isopropyl alcohol rinse for 2 min while spinning at 200 rpm. The wafers were then spun dry using nitrogen for 2 minutes at 2000 rpm. Thus, the levitation stabilizing structure was fabricated on the surface of a moveable substrate—a silicon wafer—using SU8 photoresist with conventional photolithographic methods. It is recognized that other photoresists and photofabrication methods familiar to those skilled in the art of photofabrication can be used to prepare levitation stabilizing structures on the surface of moveable substrates and that it is not required that the substrate be substantially flat and planar.

Example 1

2000 Å of thermal oxide was grown on a 675 micron thick, 150 mm diameter silicon wafer with a flat to indicate wafer orientation. The surface of wafer was completely featureless and planar. The wafer of example 1 was mounted on the stationary gas emitting support and an attempt was made to pneumatically levitate the moveable substrate at orthogonal jet manifold pressures between 10 and 35 psig. Although the wafer substrate levitated, the pneumatic levitation was not positionally stable and exhibited excessive, rapidly developing lateral motion. The moveable substrate of example 1 rapidly slid off the surface of the stationary gas emitting support: it did not remain in stationary during pneumatic levitation. Example 1 failed pneumatic levitation testing due to insufficient positional stability during levitation.

Example 2

A levitation stabilizing structure consisting of an annulus having 100 mm inside diameter, 102 mm outside diameter, and a height of approximately 200 microns was fabricated on the surface of a 650 micron thick, 150 mm diameter silicon wafer with a flat that indicated wafer orientation. The levitation stabilizing structure was fabricated by coating the wafer with SU-8 resist that was photolithographically patterned and developed to produce the levitation stabilizing structure on the surface of the moveable wafer substrate of example 2. The surface of the wafer was completely featureless and planar with the exception of the levitation stabilizing structure. The wafer of example 2 was mounted on the stationary gas emitting support and an attempt was made to pneumatically levitate the moveable substrate at manifold pressures between 10 and 35 psig. The moveable substrate of example 2 was pneumatically levitated at orthogonal jet manifold pressures greater than 10 psig and showed excellent positional stability at 30 psig, giving a pneumatic levitation height of 200 microns. The moveable substrate with levitation stabilizing structure could be disturbed either by physically pushing the moveable substrate of example 2 during pneumatic levitation or by using an air stream to push the sample around. When disturbed, the moveable substrate of example 2 with a levitation stabilizing structure went into oscillations and after a period of time returned to a stable position with minimal movement during pneumatic levitation. Example 2 passed pneumatic levitation testing and demonstrated excellent positional stability during levitation.

Example 3

A 650 micron thick, 150 mm diameter silicon wafer with a flat to indicate wafer orientation onto with a levitation stabilizing structure consisting of an annulus having 125 mm inside diameter, 127 mm outside diameter, and a height of approximately 200 microns. The levitation stabilizing structure was fabricated by coating the wafer with SU-8 resist that was photolithographically patterned and developed to produce the levitation stabilizing structure on the surface of the moveable wafer substrate of example 3. The surface of the wafer was completely featureless and planar with the exception of the levitation stabilizing structure. The wafer with levitation stabilizing structure of example 3 was mounted on the stationary gas emitting support and an attempt was made to pneumatically levitate the moveable substrate at manifold pressures between 10 and 35 psig. The moveable substrate of example 3 was pneumatically levitated at orthogonal jet manifold pressures greater than 10 psig and showed excellent positional stability at 20 psig, giving a pneumatic levitation height of 200 microns. The moveable sample with levitation stabilizing structure could be disturbed either by physically pushing the moveable substrate of example 3 during pneumatic levitation or by using an air stream to push the sample around. When disturbed, the moveable substrate of example 3 with a levitation stabilizing structure went into oscillations and after a period of time returned to a stable position with minimal movement during pneumatic levitation. Example 3 passed pneumatic levitation testing and demonstrated excellent positional stability during levitation.

Example 4

A 650 micron thick, 150 mm diameter silicon wafer with a flat to indicate wafer orientation with a levitation stabilizing structure consisting of an annulus having 135 mm inside diameter, 137 mm outside diameter, and a height of approximately 200 microns. The levitation stabilizing structure was fabricated by coating the wafer with SU-8 resist that was photolithographically patterned and developed to produce the levitation stabilizing structure on the surface of the moveable wafer substrate of example 4. The surface of the wafer was completely featureless and planar with the exception of the levitation stabilizing structure. The wafer of example 4 was mounted on the stationary gas emitting support and an attempt was made to pneumatically levitate the moveable substrate at manifold pressures between 10 and 35 psig. The moveable substrate of example 4 was pneumatically levitated at orthogonal jet manifold pressures greater than 10 psig and showed excellent positional stability at 20 psig, giving a pneumatic levitation height of 150 microns. The moveable sample with levitation stabilizing structure could be disturbed either by physically pushing the moveable substrate of example 3 during pneumatic levitation or by using an air stream to push the sample around. When disturbed, the moveable substrate of example 4 with a levitation stabilizing structure went into oscillations and after a period of time returned to a stable position with minimal movement during pneumatic levitation. Example 4 passed pneumatic levitation testing and demonstrated excellent positional stability during levitation.

Example 5

A 650 micron thick, 150 mm diameter silicon wafer with a flat to indicate wafer orientation with a levitation stabilizing structure consisting of a square having 98 mm inside diameter, 100 mm outside diameter, and a height of approximately 200 microns. The levitation stabilizing structure was fabricated by coating the wafer with SU-8 resist that was photolithographically patterned and developed to produce the levitation stabilizing structure on the surface of the moveable wafer substrate of example 5. The surface of the wafer was completely featureless and planar with the exception of the square shaped levitation stabilizing structure. The wafer of example 5 was mounted on the stationary gas emitting support and an attempt was made to pneumatically levitate the moveable substrate at manifold pressures between 10 and 35 psig. The moveable substrate of example 5 was pneumatically levitated at orthogonal jet manifold pressures greater than 10 psig and showed excellent positional stability between 20 and 30 psig, giving pneumatic levitation heights of 330±20 and 250±20 microns, respectively. The moveable sample with levitation stabilizing structure could be disturbed either by physically pushing the moveable substrate of example 5 during pneumatic levitation or by using an air stream to push the sample around. When disturbed, the moveable substrate of example 5 with a levitation stabilizing structure went into rotation with additional lateral pendulum-like oscillations and after a period of time returned to a stable position with minimal movement during pneumatic levitation. Example 5 passed pneumatic levitation testing and demonstrated excellent positional stability during levitation.

Example 6

A 650 micron thick, 150 mm diameter silicon wafer with a flat to indicate wafer orientation with a levitation stabilizing structure consisting of a rectangle having 73 mm×98 mm inside dimensions, 75 mm×100 mm outside dimensions, and a height of approximately 200 microns. The levitation stabilizing structure was fabricated by coating the wafer with SU-8 resist that was photolithographically patterned and developed to produce the levitation stabilizing structure on the surface of the moveable wafer substrate of example 6. The surface of the wafer was completely featureless and planar with the exception of the rectangular levitation stabilizing structure. The wafer of example 6 was mounted on the stationary gas emitting support and an attempt was made to pneumatically levitate the moveable substrate at manifold pressures between 10 and 35 psig. The moveable substrate of example 6 was pneumatically levitated at orthogonal jet manifold pressures greater than 10 psig and showed excellent positional stability between 20 and 30 psig, giving pneumatic levitation heights of 350±20 and 250±20 microns, respectively. The moveable sample with levitation stabilizing structure could be disturbed either by physically pushing the moveable substrate of example 6 during pneumatic levitation or by using an air stream to push the sample around. When disturbed, the moveable substrate of example 6 with a levitation stabilizing structure went into rotation with additional horizontal pendulum like oscillations and after a period of time returned to a stable position with minimal rotational movement during pneumatic levitation. Example 6 passed pneumatic levitation testing and demonstrated excellent positional stability during levitation.

Example 7

The moveable substrate of example 7 consisted of 90 mm diameter polystyrene petri dish prepared by injection molding. The mold used for injection molding included an 89 mm outside diameter rim or annulus integrated into the dish made of polystyrene and formed at the same time as the petri dish itself. The rim on the bottom of the dish was approximately 600 microns wide and approximately 250 microns in height. Thus, the bottom of the petri dish was equipped with an integrated levitation stabilizing structure that was tested for efficacy. The petri dish of example 7 was mounted on the stationary gas emitting support with the 89 mm outside diameter 250 micron high rim opposing the stationary gas emitting support such that the remaining surface of the bottom of the dish was opposing the gas emitting 4 mm fluid collimating conduit contained in the stationary gas emitting support and an attempt was made to pneumatically levitate the moveable substrate at manifold pressures between 1 and 30 psig. The moveable substrate of example 7 was pneumatically levitated at orthogonal jet manifold pressures greater than 3 psig and showed excellent positional stability at 4.2 psi, giving a pneumatic levitation height of 135±30 microns. The moveable sample with levitation stabilizing structure could be disturbed either by physically pushing the moveable substrate of example 7 during pneumatic levitation or by using an air stream to push the sample around. When disturbed, the moveable substrate of example 7 with a levitation stabilizing structure went into oscillations and after a period of time returned to a stable position with minimal rotational movement during pneumatic levitation. Example 7 passed pneumatic levitation testing and demonstrated excellent positional stability during levitation.

Example 8

The moveable substrate of example 8 consisted of 90 mm diameter polystyrene petri dish prepared by injection molding. The mold used for injection molding included a 89 mm outside diameter rim or annulus integrated into the dish made of polystyrene and formed at the same time as the petri dish itself. The rim on the bottom of the dish was approximately 600 microns wide and approximately 600 microns in height. Thus, the bottom of the petri dish was equipped with an integrated levitation stabilizing structure that was tested for efficacy. The petri dish of example 8 was mounted on the stationary gas emitting support with the 89 mm outside diameter 600 micron high rim opposing the stationary gas emitting support such that the remaining surface of the bottom of the dish was opposing the gas emitting 4 mm fluid collimating conduit contained in the stationary gas emitting support and an attempt was made to pneumatically levitate the moveable substrate at manifold pressures between 1 and 30 psig. The moveable substrate of example 8 was pneumatically levitated at orthogonal jet manifold pressures greater than 1 psig and showed excellent positional stability at 1.8 and 10 psi, giving pneumatic levitation heights of 300±30 and 250±30 microns, respectively. The moveable sample with levitation stabilizing structure could be disturbed either by physically pushing the moveable substrate of example 8 during pneumatic levitation or by using an air stream to push the sample around. When disturbed, the moveable substrate of example 8 with a levitation stabilizing structure went into oscillations and after a period of time returned to a stable position with minimal rotational movement during pneumatic levitation. Example 8 passed pneumatic levitation testing and demonstrated excellent positional stability during levitation.

Example 9

The moveable substrate of example 9 consisted of 92 mm diameter polystyrene petri dish prepared by injection molding. The mold used for injection molding included a 90 mm outside diameter rim or annulus integrated into the dish made of polystyrene and formed at the same time as the petri dish itself. The rim on the bottom of the dish was approximately 600 microns wide and approximately 130 microns in height. Thus, the bottom of the petri dish was equipped with an integrated levitation stabilizing structure that was tested for efficacy. The petri dish of example 9 was mounted on the stationary gas emitting support with the 90 mm outside diameter 130 micron high rim opposing the stationary gas emitting support such that the remaining surface of the bottom of the dish was opposing the gas emitting 4 mm fluid collimating conduit contained in the stationary gas emitting support and an attempt was made to pneumatically levitate the moveable substrate at manifold pressures between 1 and 10 psig. The moveable substrate of example 9 was pneumatically levitated at orthogonal jet manifold pressures greater than 3 psig and showed excellent positional stability at 3.2 and 5 psi, giving pneumatic levitation heights of 130±30 and 90±30 microns, respectively. The moveable sample with levitation stabilizing structure could be disturbed either by physically pushing the moveable substrate of example 9 during pneumatic levitation or by using an air stream to push the sample around. When disturbed, the moveable substrate of example 9 with a levitation stabilizing structure went into oscillations and after a period of time returned to a stable position with minimal rotational movement during pneumatic levitation. Example 9 passed pneumatic levitation testing and demonstrated good positional stability during levitation.

Example 10

The moveable substrate of example 5 was modified by using a dicing saw to trim the roughly circular shape of the moveable silicon substrate to a square shape that roughly matched the dimensions of the levitation stabilizing structure already on the moveable substrate. The outside dimensions of the diced moveable substrate were 105 mm×105 mm. The purpose of this example is to demonstrate that the levitation stabilization structure functions regardless of substrate shape and allows pneumatic levitation of arbitrarily shaped moveable substrates. The square moveable substrate with a square levitation stabilizing structure of example 10 was mounted on the stationary gas emitting support with the levitation stabilizing structure opposing the stationary gas emitting support such that the surface of the moveable substrate was opposing the gas emitting 4 mm fluid collimating conduit contained in the stationary gas emitting support and an attempt was made to pneumatically levitate the moveable substrate at manifold pressures between 1 and 35 psig. The moveable substrate of example 10 was pneumatically levitated at orthogonal jet manifold pressures greater than 5 psig and showed excellent positional stability at 16 psi, giving pneumatic levitation heights of 500±50 microns. The moveable sample with levitation stabilizing structure could be disturbed either by physically pushing the moveable substrate of example 10 during pneumatic levitation or by using an air stream to push the sample around. When disturbed, the moveable substrate of example 10 with a levitation stabilizing structure went into oscillations and after a period of time returned to a stable position with minimal rotational movement during pneumatic levitation. Example 10 passed pneumatic levitation testing and demonstrated good positional stability during levitation and demonstrates the application of a levitation stabilizing structure to essentially planar moveable substrates of arbitrary shape.

Example 11

A 650 micron thick, 150 mm diameter silicon wafer with a flat to indicate wafer orientation and having only native oxide on the moveable substrate surface was diced to a square shape having dimensions of 105 mm×105 mm that was identical to the moveable substrate dimensions of example 10. One of the surfaces of the wafer was completely featureless and planar and the other side was covered with CMOS type circuits (an example of a structured surface). The wafer of example 11 was mounted on the stationary gas emitting support and an attempt was made to pneumatically levitate the moveable substrate at orthogonal jet manifold pressures between 1 and 35 psig. Although the wafer substrate levitated, the pneumatic levitation was not positionally stable and exhibited pronounced rapid lateral motion during pneumatic levitation. The moveable substrate of example 11 rapidly slid off the surface of the stationary gas emitting support: it did not remain in stationary during pneumatic levitation regardless of which side was opposing the orthogonal jet. The experiment was repeated on both sides of the substrate with the same results. Example 11 failed pneumatic levitation testing due to insufficient positional stability during levitation, thereby demonstrating that the stable pneumatic levitation observed in previous examples was not related to the square shape of the substrate, or the presence or absence of additional surface topography on the moveable substrate but is instead attributed to the presence of a levitation stabilizing structure on the moveable substrate surface.

Example 12

The purpose of this example is to demonstrate that the levitation stabilization structure functions regardless of substrate shape and allows pneumatic levitation of arbitrarily shaped moveable substrates. The moveable substrate of example 6 was modified by using a dicing saw to trim the roughly circular shape of the moveable silicon substrate to a rectangular shape that roughly matched the dimensions of the levitation stabilizing structure already on the moveable substrate. The outside dimensions of the diced moveable substrate were 105 mm×80 mm. The rectangular moveable substrate with a rectangular levitation stabilizing structure of example 12 was mounted on the stationary gas emitting support with the levitation stabilizing structure opposing the stationary gas emitting support such that the surface of the moveable substrate was opposing the gas emitting 4 mm fluid collimating conduit contained in the stationary gas emitting support and an attempt was made to pneumatically levitate the moveable substrate at manifold pressures between 1 and 35 psig. The moveable substrate of example 12 was pneumatically levitated at orthogonal jet manifold pressures greater than 5 psig and showed excellent positional stability at 7-8 psi. The moveable sample with levitation stabilizing structure could be disturbed either by physically pushing the moveable substrate of example 12 during pneumatic levitation or by using an air stream to push the sample around. When disturbed, the moveable substrate of example 12 with a levitation stabilizing structure went into oscillations and after a period of time returned to a stable position with minimal rotational movement during pneumatic levitation. Example 12 passed pneumatic levitation testing and demonstrated good positional stability during levitation and demonstrates the application of a levitation stabilizing structure to essentially planar moveable substrates of arbitrary shape.

Example 13

A 650 micron thick, 150 mm diameter silicon wafer with a flat to indicate wafer orientation on the moveable substrate surface was diced to a rectangular shape having dimensions of 105 mm×80 mm that was identical with the moveable substrate dimensions of example 12. One of the surfaces of the wafer was completely featureless and planar and the other side was covered with CMOS type circuits (an example of a structured surface). The wafer of example 13 was mounted on the stationary gas emitting support and an attempt was made to pneumatically levitate the moveable substrate at orthogonal jet manifold pressures between 1 and 35 psig. Although the wafer substrate levitated, the pneumatic levitation was not positionally stable and the moveable substrate of example 13 rapidly slid off the surface of the stationary gas emitting support with a rapid lateral motion: it did not remain in stationary during pneumatic levitation. The experiment was repeated on both sides of the substrate with the same results. Example 13 failed pneumatic levitation testing due to insufficient positional stability during levitation, thereby demonstrating that the stable pneumatic levitation observed in examples 13 was not related to the rectangular shape of the substrate, or the presence or absence of additional surface topography on the moveable substrate but rather to the presence of a levitation stabilizing structure on the surface of the moveable substrate of arbitrary shape.

Example 14

A 650 micron thick, 150 mm diameter silicon wafer with a flat to indicate wafer orientation and having only native oxide on the moveable substrate surface was cleaned in a heated bath of EKC-256 at 60 degrees C. followed by a high purity water rinse and a spin dry cycle. Two layers of 120 micron thick WBR2000 thick film resist were laminated onto the surface of the wafer using a lamination roll pressure of 1.7 kPa at 95 degrees C. and a roll speed of 1.2 meter/min. The photoresist was exposed for a 100 seconds to I line radiation (365 nm) through a mask after which the photoresist was developed with 1.2% by volume DX40 developer for 35 minutes. Following development the wafer was rinsed with high purity water and spun dry. The surface of the wafer was completely featureless and planar with the exception of the annular levitation stabilizing structure with a 128 mm ID and a 130 mm OD protruding approximately 230 microns from the substrate surface. There were some wrinkles and defects in the laminated structure that protruded further than 230 microns from the substrate surface. The wafer of example 14 was mounted on the stationary gas emitting support and an attempt was made to pneumatically levitate the moveable substrate at manifold pressures between 10 and 35 psig. The moveable substrate of example 14 was pneumatically levitated at orthogonal jet manifold pressures greater than 10 psig and showed excellent positional stability around 20 psig, giving a pneumatic levitation height of 350±20 microns. The moveable sample with levitation stabilizing structure could be disturbed either by physically pushing the moveable substrate of example 14 during pneumatic levitation or by using an air stream to push the sample around. When disturbed, the moveable substrate of example 14 with a levitation stabilizing structure went into rotation with additional horizontal pendulum like oscillations and after a period of time returned to a stable position with minimal movement during pneumatic levitation. Example 14 passed pneumatic levitation testing and demonstrated excellent positional stability during levitation. Removal of patterned and developed WBR 2000 film was accomplished using EKC265 followed by O2 plasma cleaning for 1 hour at 900 Watts plasma power. The levitation stabilizing structure comprised of developed WBR2000 resist was removed from the surface of the silicon wafer substrate and defectivity measurements taken using light scattering indicated that the resist was completely removed and substrate was sufficiently clean so that it could be used in subsequent processing operations.

Example 15

A 380 micron thick, 150 mm diameter silicon wafer with a flat to indicate wafer orientation and having surface topography in the form of CMOS circuitry on one side and a plurality of through vias extending from the front side containing the CMOS circuitry to the backside of the wafer so that the front and the backside of the wafer are in fluid communication using the through vias was cleaned in a heated bath of EKC-256 at 60 degrees C. followed by a high purity water rinse and a spin dry cycle. Two layers of 120 micron thick WBR2000 thick film resist were laminated onto the surface of the wafer with CMOS circuitry using a lamination roll pressure of 1.7 kPa at 95 degrees C. and a roll speed of 1.2 meter/min. The photoresist was exposed for a 100 seconds to I line radiation (365 nm) through a mask after which the photoresist was developed with 1.2% by volume DX40 developer for 35 minutes. Following development the wafer was rinsed with high purity water and spun dry. The front surface of the wafer had CMOS circuits and a annular levitation stabilizing structure thereupon, the dimensions of the annular levitation stabilizing structure being 134 mm ID, 136 mm OD, with a height of approximately 240 microns. Thus the annular levitation stabilizing structure was positioned on top of the CMOS circuits on the substrate surface and extended approximately 240 microns from the CMOS circuit surface. There were some wrinkles and defects in the laminated structure that protruded further than 240 microns from the substrate surface. The wafer of example 15 was mounted on the stationary gas emitting support and an attempt was made to pneumatically levitate the moveable substrate at manifold pressures between 10 and 35 psig. The moveable substrate of example 15 was pneumatically levitated at orthogonal jet manifold pressures greater than 10 psig and showed excellent positional stability around 20 psig, giving a pneumatic levitation height of 350±20 microns. The moveable sample with levitation stabilizing structure could be disturbed either by physically pushing the moveable substrate of example 14 during pneumatic levitation or by using an air stream to push the sample around. When disturbed, the moveable substrate of example 15 with a levitation stabilizing structure went into rotation with additional horizontal pendulum like oscillations and after a period of time returned to a stable position with minimal movement during pneumatic levitation. Example 15 passed pneumatic levitation testing and demonstrated excellent positional stability during levitation, demonstrating that the positional stability achieved with a levitation stabilizing structure during pneumatic levitation with an orthogonal fluid jet is applicable to thinned wafers and, unexpectedly, can also stabilizing the pneumatic levitation of wafers containing a plurality of holes as well as wafers with surface topography.

Example 16

A 650 micron thick, 150 mm diameter silicon wafer with a flat to indicate wafer orientation and having surface topography in the form of CMOS circuitry on one side on the moveable substrate surface was cleaned in a heated bath of EKC-256 at 60 degrees C. followed by a high purity water rinse and a spin dry cycle. Three layers of 120 micron thick WBR2000 thick film resist were laminated onto the surface of the wafer using a lamination roll pressure of 1.7 kPa at 95 degrees C. and a roll speed of 1.2 meter/min. The photoresist was exposed to I line radiation (365 nm) through a mask after which the photoresist was developed with 1.2% by volume DX40 developer for 35 minutes. Following development the wafer was rinsed with high purity water and spun dry. The surface of the wafer was topographically complex with an annular levitation stabilizing structure positioned thereupon, the annular levitation stabilizing structure with a 134 mm ID and a 136 mm OD protruding approximately 360 microns from the substrate surface. The wafer of example 16 was mounted on the stationary gas emitting support with the levitation stabilizing structure facing the stationary gas emitting support and an attempt was made to pneumatically levitate the moveable substrate at manifold pressures between 10 and 35 psig. The moveable substrate of example 14 was pneumatically levitated at orthogonal jet manifold pressures greater than 10 psig and showed excellent positional stability around 13.5 psig, giving a pneumatic levitation height of 500±20 microns. The moveable sample with levitation stabilizing structure could be disturbed either by physically pushing the moveable substrate of example 16 during pneumatic levitation or by using an air stream to push the sample around. When disturbed, the moveable substrate of example 16 with a levitation stabilizing structure went into rotation with additional horizontal pendulum like oscillations and after a period of time returned to a stable position with minimal movement during pneumatic levitation. Example 16 passed pneumatic levitation testing and demonstrated excellent positional stability during levitation of a substrate with complex topographical features associated with CMOS circuitry.

The results of examples 1 through 16 are summarized in Table 1 below.

| Example # | Substrate shape | LSS (Yes/No) | LSS shape | Pneumatic levitation test (Pass/Fail) |
|---|---|---|---|---|
| 1 | Circular | No | | Fail |
| 2 | Circular | Yes | Circular | Pass |
| 3 | Circular | Yes | Circular | Pass |
| 4 | Circular | Yes | Circular | Pass |
| 5 | Circular | Yes | Square | Pass |
| 6 | Circular | Yes | Rectangular | Pass |
| 7 | Circular | Yes | Circular | Pass |
| 8 | Circular | Yes | Circular | Pass |
| 9 | Circular | Yes | Circular | Pass |
| 10 | Square | Yes | Square | Pass |
| 11 | Square | No | | Fail |
| 12 | Rectangular | Yes | Rectangular | Pass |
| 13 | Rectangular | No | | Fail |
| 14 | Circular | Yes | Circular | Pass |
| 15 | Circular | Yes | Circular | Pass |
| 16 | Circular | Yes | Circular | Pass |

The results that are summarized in Table 1 demonstrate that samples with levitation stabilizing structures on their surfaces according to the invention exhibit stable pneumatic levitation independent of substrate shape or polygonal shape of the levitation stabilizing structure.

Levitation Apparatus

Another embodiment of the present invention provides an apparatus for fluidic levitation of a moveable substrate with a levitation stabilizing structure using spatially and compositionally ordered fluids of varied composition wherein the composition of the spatially ordered and compositionally ordered fluid can be varied as desired for the purposes of fluidic levitation and fluidic levitation applications. The advantages of substrate processing by fluidic levitation methods have been previously enumerated.

In particular, the invention provides a non-contact method for achieving positional stability of a substrate during fluid levitation wherein the lateral motion of a planar substrate is controlled during fluid levitation and the fluid is a gas or a liquid and the fluid contains a reactive chemical. Another embodiment provides a non-contact method for achieving positional stability of a substrate during fluid levitation wherein the lateral motion of a planar polygonal shaped substrates is controlled during fluidic levitation and the fluid is a gas or a liquid. Other embodiments provide a non-contact method for achieving positional stability of a pneumatically levitated substrate floating on a chemically reactive gaseous fluid layer produced by a collimated reactive fluid gaseous jet during substrate processing for the purpose of reducing the substrate defectivity incurred as a result of processing.

A further embodiment provides a non-contact method of achieving positional stability of a substrate levitated hydraulically or pneumatically on a fluid layer produced by a chemically reactive fluid jet wherein the method is compatible with miniaturization for the purpose of integrating said method of positional stabilization of a substrate during fluidic levitation into microelectromechanical systems for the purpose of producing novel and hitherto unknown miniaturized fluidic, pneumatic, or hydraulic devices as well as novel micromechanical and micro-fluidic devices operating with liquids or gases. The invention also provides a method for utilizing and controlling fluid energy and reactive fluid flow on a miniature or microscopic scale by either passive or active means.

Alternatively, the invention provides a method for producing fluid flows containing chemically reactive substances for the purpose of substrate processing during fluidic levitation of a substrate wherein the fluid is either a gas or a liquid and the fluid exhibits minimal chemical interaction with the fluid delivery system employed in the fluidic levitation process. As such, the invention provides an apparatus for producing fluid flows containing chemically reactive substances for the purpose of substrate processing during fluidic levitation of a substrate wherein the fluid thereby produced exhibits minimal chemical interaction with the fluid delivery system employed in the fluidic levitation process.

In another embodiment, the invention provides a non-contact method for achieving stable fluidic levitation of a substrate with a fluid flow wherein the fluid is either a gas or a liquid, said fluid being chemically reactive. The invention also provides a non-contact method for achieving stable fluidic levitation of a substrate with a fluid flow wherein the fluid is either a gas or a liquid, said fluid being chemically reactive and exposing at least one surface of the levitating substrate to the chemically reactive substances in the chemically reactive fluid flow.

Another embodiment of the invention provides a method for producing compositionally segregated fluid flows for the purpose of fluidic levitation of a substrate wherein the fluid is either a gas or a liquid. An objective of the invention is to provide an apparatus for producing compositionally segregated fluid flows for the purpose of fluidic levitation of a substrate.

Another embodiment of the invention provides a method of fluidic levitation that employs fluids having a non-uniform composition of matter. Another objective of the invention is to provide an apparatus for production of a fluid having a non-uniform composition of matter during a fluidic levitation process.

Another embodiment of the invention provides a method for producing compositionally segregated fluid flows for the purpose of substrate processing during fluidic levitation of a substrate wherein the fluid is either a gas or a liquid. An objective of the invention is to provide an apparatus for producing compositionally segregated fluid flows for the purpose of substrate processing during fluidic levitation of a substrate. It is an objective of the invention to provide an apparatus for generating and creating spatially and compositionally ordered fluids of varied composition wherein the composition of the spatially ordered and compositionally ordered fluid can be varied as desired for the purposes of fluidic levitation and fluidic levitation applications, said fluid being either a liquid or a gas.

Another embodiment of the invention provides a method for producing compositionally segregated fluid flows with at least one chemically reactive compositionally segregated region for the purpose of fluidic levitation of a substrate wherein the fluid is either a gas or a liquid. An objective of the invention is to provide an apparatus for producing compositionally segregated fluid flows with at least one chemically reactive compositionally segregated region for the purpose of fluidic levitation of a substrate.

Another embodiment of the invention provides a method of dosing or exposing a substrate surface to a reactive flow for a known time period with a chemically reactive reagent during fluidic levitation of the substrate by controlling the composition of matter of a compositionally segregated fluid flow during fluidic levitation of a substrate wherein the fluid is either a gas or a liquid. It is an objective of the invention to provide and an apparatus for dosing a surface of a fluidically levitated substrate with a pre-determined quantity of a reactive reagent to control the composition of matter of a compositionally segregated fluid flow during fluidic levitation of a substrate wherein the fluid is either a gas or a liquid.

Another embodiment of the invention provides a method for producing compositionally segregated fluid flows with at least one chemically reactive compositionally segregated region for the purpose of substrate processing of at least one surface of the levitated substrate during fluidic levitation of a substrate wherein the fluid is either a gas or a liquid. An objective of the invention is to provide an apparatus for producing compositionally segregated fluid flows with at least one chemically reactive compositionally segregated region for the purpose of substrate processing of at least one surface of the levitated substrate during fluidic levitation of a substrate.

One or more of the embodiments of the present invention for providing compositionally segregated chemically reactive flows for the purposes of fluidic levitation of a substrate with a levitation stabilizing structure and substrate processing of at least one surface of the substrate during fluidic levitation is achieved using fluidic levitation of substrate with a levitation stabilizing structure using fluid flows comprised of coaxial compound jets or collinear compound jets. An additional embodiment of the invention provides an apparatus for fluidic levitation of substrates with levitation stabilizing structures comprised of a stationary fluid emitting support provided with a means to supply compositionally segregated fluid jets, said compositionally segregated jets being either coaxial compound fluid jets or collinear compound fluid jets. The embodiments providing coaxial compound jets or collinear compound jets for the purpose of utilizing compositionally segregated chemically reactive flows during fluidic levitation of a substrate with a levitation stabilizing structure can be accomplished using an apparatus for fluidic levitation with coaxial compound jets or an apparatus for fluidic levitation with collinear compound jets.

The embodiments described above that provide positionally stable levitation during fluid exposure that occurs during fluidic levitation, including fluid exposure to chemically reactive fluids, can be achieved by a method for fluidically levitating a substrate comprised of the steps in order:

providing a substrate;

providing a levitation stabilizing structure on a surface of a substrate, said levitation stabilizing structure overlaying and contacting the substrate surface in a conformal-wise manner;

positioning the substrate proximate to a fluid emitting surface of a stationary fluid emanating support in a conformal-wise manner with the levitation stabilizing structure overlaying and contacting the surface of the substrate and facing the stationary fluid emanating surface through which fluid will flow;

aligning the centroid of the interior confined area of the levitation stabilizing structure with at least one alignment feature on the surface of the stationary fluid emanating support;

initiating at least one collimated fluid flow from the stationary fluid emanating support surface to produce a collimated fluid jet such that the collimated fluid flow from the collimated fluid jet impinges on at least one point of the opposing surface in an orthogonal manner where the point of fluid impingement is located within the interior confined area of the levitation stabilizing structure;

controlling the collimated fluid flow emanating from the stationary fluid emanating support to fluidically levitate the substrate and levitation stabilizing structure proximate to the surface of the stationary fluid emanating support; and controlling the composition of the fluids employed during levitation using an apparatus for production of compound fluid flows and jets that produces compositionally segregated reactive fluid flows.

The aforementioned fluid levitation method requires providing a levitation stabilizing structure on the surface of a substrate, said levitation stabilizing structure overlaying the substrate surface and contacting the substrate surface and facing or opposing a stationary fluid emitting surface through which fluid will flow in a conformal-wise manner from whence at least one fluid jet emanates and impinges perpendicularly on the opposing moveable substrate surface to be fluidically levitated. In the case of pneumatic levitation, at least one collimated fluid gaseous jets impinging upon the movable substrate surface may impinge in an orthogonal manner; however, at least one collimated fluid gaseous jets impinging in a non-orthogonal manner can be additionally employed, depending on the desired levitation application. A collimated fluid gaseous jet impinging upon the movable substrate in an orthogonal or perpendicular-wise manner is employed when a minimum of substrate motion is desired during fluid levitation and processing. A collimated fluid gaseous jet impinging upon the movable substrate surface in a non-orthogonal or non-perpendicular manner can be employed when initiation of substrate motion, for example, rotational motion, is desired during fluidic levitation and processing.

As will be described later, a method for controlling the composition of the fluids employed for levitation is provided using an apparatus for production of compound fluid flows and jets. The apparatus for production of compound fluid flows and jets also provides a way of producing a compositionally segregated reactive fluid flow for fluidic levitation applications that is non-reactive with the fluid delivery system employed for the distribution of said reactive fluids.

The method of fluidic levitation described above can be made compatible with fabrication processes found, for example, in a fabrication facility for semiconductor circuits by the addition of the steps comprising in order:

1. discontinuing the collimated fluid flow emanating from the stationary fluid emanating support to discontinue the fluidic levitation of the substrate and levitation stabilizing structure proximate to the surface of the fluid emanating stationary support; and 2. removing the substrate and levitation stabilizing structure from the surface of the stationary fluid emanating support.

Alternatively, this method of fluidic levitation can be made more compatible with fabrication processes found, for example, in a fabrication facility for semiconductor circuits by the addition of the steps comprising in order:

1. removing the substrate and levitation stabilizing structure from the fluid flow emanating from the stationary fluid emanating support; and 2. discontinuing the collimated fluid flow emanating from the stationary fluid emanating support through which fluid will flow to discontinue the fluid flow enabling the fluidic levitation of the substrate and levitation stabilizing structure proximate to the surface of the fluid emanating stationary support.

This procedure allows for removal of the moveable substrate from the fluid flow emanating from the stationary fluid emanating support using, for example, a vacuum wand to minimize particle generation on the surface of the moveable substrate during the removal of the moveable substrate from the stationary fluid emitting support.

The aforementioned procedures disclose a non-destructive method for stable fluid levitation of a substrate comprised of providing a levitation stabilizing structure attached to the surface of a substrate, said levitation stabilizing structure providing a means to achieve stable fluidic levitation of a substrate for processing; fluidically levitating the substrate and levitation stabilizing structure by employing a collimated fluid jet impinging in an orthogonal manner on the substrate surface; controlling the composition of the impinging fluid jet during fluidic levitation using an apparatus for production of compound fluid flows and jets; discontinuing the fluidic levitation of the substrate and levitation stabilizing structure; and the removing the levitation stabilizing structure after the levitation process. The removal of the levitation stabilizing structure from the substrate after processing is highly desirable for process compatibility with the many existing workflows, such as those utilized for integrated circuit manufacture. The removal of the levitation stabilizing structure from the surface of the substrate can be accomplished by many different methods including plasma etching, chemical dissolution, sand blasting, melting, scraping, or any other means known in the art for disassembly and removal of surface layers and structures from substrates. Plasma etching and chemical dissolution, including such methods as resist-lift off, are contemplated and considered preferred methods for removal of the levitation stabilizing structure in order to minimize substrate contamination and damage during the levitation stabilizing structure removal process.

The objective of providing a method for producing fluid flows containing chemically reactive substances for the purpose of fluidic levitation of a substrate wherein the fluid is either a gas or a liquid and the fluid exhibits minimal chemical interaction with the fluid delivery system employed in the fluidic levitation process can be achieved by employing a coaxial compound jet in the following method comprised of the following steps:

1. providing a substrate with a levitation stabilizing structure;

2. providing a stationary fluid emitting support through which fluid will flow with at least one fluid collimating conduit for producing an orthogonal jet, said fluid collimating conduit being in fluid communication with an apparatus for producing a coaxial compound laminar fluid flow from two or more fluid flows;

3. placing the substrate with the levitation stabilizing structure on the stationary support through which fluid will flow with substrate surface containing the levitation stabilizing structure opposite and opposing the fluid collimating conduit of the stationary fluid emitting support and aligning the substrate to an alignment feature of the stationary fluid emitting support;

4. initiating fluid flow of at least two fluids, one of which is chemically inert and one of which is chemically reactive in the apparatus for producing a coaxial compound laminar fluid flow that is in fluid communication with the fluid collimating conduit of the stationary fluid emitting support through which fluid will flow to producing a coaxial compound laminar fluid flow; said compound coaxial laminar fluid flow being comprised of an outermost region contacting the fluid delivery system that is surrounding and overlaying at least one continuous interface of an inner region; said fluid flow in the outermost region of the coaxial compound laminar fluid flow being chemical non-reactive; said fluid flow in the interior region of the compound coaxial flow containing chemically reactive substances, said apparatus being in fluid communication with the fluid collimating conduit of the fluid emitting stationary support through which fluid will flow;

5. producing an orthogonal coaxial compound laminar fluid flow with said apparatus by applying the compound coaxial laminar fluid flow to the fluid collimating conduit of the stationary fluid emitting support through which fluid will flow under pressure to provide an orthogonal coaxial compound jet that is orthogonal to the substrate surface with levitation stabilizing structure; said compound fluid flow being comprised of an outermost region surrounding and overlaying at least one continuous interface of an inner region; said fluid flow in the outermost region of the coaxial compound laminar fluid flow being chemical non-reactive; said fluid flow in the interior region of the compound coaxial flow containing chemically reactive substances, said apparatus being in fluid communication with the fluid collimating conduit of the fluid emitting stationary support; and 6. levitating the substrate with the levitation stabilizing structure with fluid flow from said orthogonal coaxial compound jet.

The objective of providing a method for producing fluid flows containing chemically reactive substances for the purpose of fluidic levitation of a substrate wherein the fluid is either a gas or a liquid and the fluid exhibits minimal chemical interaction with the fluid delivery system employed in the fluidic levitation process can be achieved by employing a collinear compound jet in the following method comprised of the following steps:

1. providing a substrate with a levitation stabilizing structure;

2. providing a stationary fluid emitting support through which fluid will flow with at least one fluid collimating conduit for producing an orthogonal jet, said fluid collimating conduit being in fluid communication with an apparatus for producing a collinear compound laminar fluid flow from two or more fluid flows;

3. placing the substrate with the levitation stabilizing structure on the stationary support through which fluid will flow with substrate surface containing the levitation stabilizing structure opposite and opposing the fluid collimating conduit of the stationary fluid emitting support and aligning the substrate to an alignment feature of the stationary fluid emitting support;

4. initiating fluid flow of at least two fluids, one of which is chemically inert and one of which is chemically reactive in the apparatus for producing a collinear compound laminar fluid flow that is in fluid communication with the fluid collimating conduit of the stationary fluid emitting support through which fluid will flow to producing a collinear compound laminar fluid flow; said compound collinear laminar fluid flow being comprised of an outermost region contacting the fluid delivery system that is surrounding and overlaying at least one continuous interface of an inner region; said fluid flow in the outermost region of the collinear compound laminar fluid flow being chemical non-reactive; said fluid flow in the interior region of the compound collinear flow containing chemically reactive substances, said apparatus being in fluid communication with the fluid collimating conduit of the fluid emitting stationary support through which fluid will flow;

5. producing an orthogonal collinear compound laminar fluid flow with said apparatus by applying the compound collinear laminar fluid flow to the fluid collimating conduit of the stationary fluid emitting support under pressure to provide an orthogonal collinear compound jet that is orthogonal to the substrate surface with levitation stabilizing structure; said compound fluid flow being comprised of an outermost region surrounding and overlaying at least one continuous interface of an inner region; said fluid flow in the outermost region of the collinear compound laminar fluid flow being chemical non-reactive; said fluid flow in the interior region of the compound collinear flow containing chemically reactive substances, said apparatus being in fluid communication with the fluid collimating conduit of the fluid emitting stationary support through which fluid will flow; and 6. levitating the substrate with the levitation stabilizing structure with the fluid flow from said orthogonal collinear compound jet.

Note that the method is distinguished from that of Hertz (U.S. Pat. No. 4,196,437) because there is no stationary fluid involved in this embodiment to form compound collinear jets. It is also distinguished from both U.S. Pat. No. 3,368,760 and U.S. Pat. No. 3,416,730 through the use of collinear rather than coaxial jets.

The objective of providing a method for producing fluid flows containing chemically reactive substances for the purpose of fluidic levitation of a substrate wherein the fluid is either a gas or a liquid and the fluid exhibits minimal chemical interaction with the fluid delivery system employed in the fluidic levitation process can be further achieved by employing a collinear or coaxial compound jet in the following method comprised of the following steps:

1. providing a substrate with a levitation stabilizing structure;

2. providing a stationary fluid emitting support through which fluid will flow with at least one fluid collimating conduit for producing an orthogonal jet, said fluid collimating conduit being in fluid communication with an apparatus equipped with a means to control fluid composition for producing a coaxial or collinear compound laminar fluid flow from one or more fluid flows;

3. placing the substrate with the levitation stabilizing structure on the stationary support with substrate surface containing the levitation stabilizing structure opposite and opposing the fluid collimating conduit of the stationary fluid emitting support and aligning the substrate to an alignment feature of the stationary fluid emitting support through which fluid will flow;

4. initiating a fluid flow of a single, chemically inert fluid to produce a laminar fluid flow that is in fluid communication with the fluid collimating conduit of the stationary fluid emitting support through which fluid will flow producing a laminar fluid flow;

5. producing an orthogonal laminar fluid flow of chemically inert fluid with said apparatus by applying the laminar fluid flow to the fluid collimating conduit of the stationary fluid emitting support under pressure to provide an orthogonal jet that is orthogonal to the substrate surface with levitation stabilizing structure; said fluid flow being chemically non-reactive; said apparatus being in fluid communication with the fluid collimating conduit of the fluid emitting stationary support through which fluid will flow;

6. levitating the substrate with the levitation stabilizing structure using the orthogonal jet of chemically non-reactive, chemically inert fluid;

7. initiating fluid flow of at least two distinct fluids in said apparatus equipped with a means to control fluid composition for producing a coaxial or collinear compound laminar fluid flow from one or more fluid flows, wherein one of the fluids is chemically inert and a second fluid is chemically reactive; wherein the apparatus for producing a coaxial or collinear compound laminar fluid flow from at least the first and second fluid is in fluid communication with the fluid collimating conduit of the stationary fluid emitting support through which fluid will flow to allow a coaxial or collinear compound laminar fluid flow through said fluid collimating conduit; said compound coaxial or collinear laminar fluid flow being comprised of an outermost region contacting the fluid delivery system that is surrounding, in contact, and overlaying at least one continuous interface of an inner region; said fluid flow in the outermost region of the coaxial or collinear compound laminar fluid flow being comprised essentially of the first chemical non-reactive fluid; said fluid flow in the interior region of the compound coaxial or collinear flow being comprised essentially of the second chemically reactive fluid containing chemically reactive substances or materials, said apparatus being in fluid communication with the fluid collimating conduit of the fluid emitting stationary support through which fluid will flow;

8. producing an orthogonal coaxial or collinear compound laminar fluid flow with said apparatus by applying the compound coaxial or collinear laminar fluid flow to the fluid collimating conduit of the stationary fluid emitting support under pressure to provide an orthogonal coaxial or collinear compound jet that is orthogonal to the substrate surface with levitation stabilizing structure; said compound fluid flow being comprised of an outermost region contacting, surrounding, and overlaying at least one continuous interface of an inner region; said fluid flow in the outermost region of the coaxial or collinear compound laminar fluid flow being chemical non-reactive; said fluid flow in the interior region of the compound coaxial or collinear flow containing chemically reactive substances, said apparatus being in fluid communication with the fluid collimating conduit of the fluid emitting stationary support through which fluid will flow; and 9. levitating the substrate with the levitation stabilizing structure using the orthogonal coaxial or collinear compound jet comprised of at least one chemically reactive fluid emanating from the stationary fluid emitting support.

The repetition of the last six steps will allow exposure of the substrate surface with levitation stabilizing structure to different chemically reactive fluids whilst controlling the contact of the chemically reactive fluids with critical components of the fluid delivery system. The process above can be further modified after the last step by the following steps:

1. initiating a fluid flow of a single, chemically inert fluid to produce a laminar fluid flow that is in fluid communication with the fluid collimating conduit of the stationary fluid emitting support through which fluid will flow producing a laminar fluid flow;

2. producing an orthogonal laminar fluid flow of chemically inert fluid with said apparatus by applying the laminar fluid flow to the fluid collimating conduit of the stationary fluid emitting support through which fluid will flow under pressure to provide an orthogonal jet that is orthogonal to the substrate surface with levitation stabilizing structure; said fluid flow being chemically non-reactive; said apparatus being in fluid communication with the fluid collimating conduit of the fluid emitting stationary support;

3. levitating the substrate with the levitation stabilizing structure using the orthogonal jet of chemically non-reactive, chemically inert fluid;

4. discontinuing the collimated fluid flow of the chemically non-reactive, chemically inert fluid emanating from the stationary fluid emanating support to discontinue the fluidic levitation of the substrate and levitation stabilizing structure proximate to the surface of the fluid emanating stationary support through which fluid will flow; and 5. removing the substrate and levitation stabilizing structure from the surface of the stationary fluid emanating support through which fluid will flow.

In an alternative embodiment steps 13 and 14 can be reversed to minimize particle generation while removing the sample.

In one alternative embodiment of the above procedure, step 3 is performed after step 4 and step 5 have been executed so that the collimated fluid jet of chemically non-reactive fluid from the stationary fluid emitting support can be established before the moveable support is aligned to the stationary support. When step 3 is performed after the collimated fluid jet is established in step 5, the moveable support is aligned with the stationary support and released from a holder while the collimated fluid jet is flowing resulting in sample levitation when the moveable support is placed over the stationary fluid emanating support Steps 1-14 provide a method for processing a substrate with a levitation stabilizing structure in contact with and overlaying the substrate surface to be processed using fluidic levitation with coaxial or collinear compound jets containing chemically reactive species. The chemically reactive species in the coaxial or collinear compound jet may have reactivity that is additionally accelerated by other processing factors such as heat, pressure, ionizing radiation, or chemical reaction with one or more additional chemically reactive species in the compound collinear or coaxial jet. For example, temperature is an effective way of accelerating the chemical kinetics of surface processes. Thus, the interaction between chemically reactive species in the fluid and the substrate surface can be influenced by controlling the temperature of the levitating fluid containing the chemically reactive species, the temperature of the levitating substrate, or both the levitating fluid and the levitating substrate. In another embodiment, the interaction between chemically reactive species in the fluid employed for fluidic levitation and the substrate surface can be influenced by ionizing radiation. For example, said ionizing radiation can be ultraviolet radiation that is employed to induce photochemical reactions between the chemically reactive species in the fluid flow employed for substrate levitation and the substrate surface. Further, if two or more reactive species are present in an orthogonal jet employed for fluidic levitation of a substrate, then the two reactive species can be chosen to react with each other during the fluidic levitation process thereby producing a third reactive species that selectively interacts with the surface of the substrate during fluidic levitation of said substrate with a compound fluid flow. It is contemplated, for example, that heat, radiation, or pressure may activate one or more reactive species in a compound fluid flow to promote the formation of new reactive species in the compound fluid flow employed for fluidic levitation, said new reactive species interacting with the surface of the fluidically levitating substrate.

FIG. 11 shows a cross-sectional view illustrating one embodiment of the prior art disclosed in U.S. Pat. No. 5,370,709. U.S. Pat. No. 5,370,709 discloses a stationary support through which fluid will flow 12 contains a single fluid collimating conduit 14 that is in fluid communication with a pressurized manifold (not shown). The single fluid collimating conduit 14, also called an orifice, nozzle, or bore produces a single orthogonal jet whose velocity vector indicated by the arrows in FIG. 11 is normal to a surface of moveable substrate 10 at the impingement location of the jet onto the moveable substrate surface and to the surface of stationary support through which fluid will flow 12. The orthogonal jet thus impinges in an orthogonal fashion on the opposing surface of moveable substrate 10. Stationary support 12 also contains at least one protruding feature 26 extending above the surface of support 12 in the direction of moveable substrate 10 and is located on the surface of stationary support 12 so as to impede horizontal lateral motion of moveable substrate 10 in the direction parallel to surface 24 of stationary support 12. FIG. 11 illustrates the use of physical stops, exemplified by protruding feature 26, that is commonly employed for the purposes of stabilizing the position of the moveable substrate during fluidic levitation so that the moveable substrate 10 remains essentially centered over the single fluid collimating conduit 14 that supplies an orthogonal jet whose velocity vector is normal to the stationary support surface 24. The location of the fluid collimating conduit, nozzle, bore, or orifice in the gas emanating surface is taken as an alignment feature and the substrate is positioned at a desired location relative to the alignment feature. The locations of the protruding features 26 can also be taken as alignment features for positioning of the substrate at a desired location before initiating the fluid flow required for pneumatic levitation. A fluid inlet 58 is provided to allow fluid communication between fluid collimating conduit 14 and a pressurized reservoir of chemically inert fluid. A second fluid inlet 56 is provided proximate to fluid collimating conduit 14 to allow fluid communication between fluid collimating conduit 14 and a pressurized reservoir of chemically reactive fluid. At the fluid inlet intersection region 57 indicated in the FIG. 11, the fluid from inlet 58 and inlet 56 mix to form a homogeneous fluid of uniform composition of matter. The fluid mixture flows through fluid collimating conduit 14 from whence a chemically reactive fluid jet is delivered into the volume region between the moveable substrate 10 and the stationary fluid emitting support 12. The chemically reactive fluid is always in contact with the fluid delivery system and U.S. Pat. No. 5,370,709 specifically teaches that the fluid inlet intersection region 57 must be close to fluid collimating conduit 14 in order to minimize deposition of undesirable material in fluid collimating conduit 14 as a result of contact of chemically reactive fluid from fluid inlet 56 with the fluid collimating conduit region 14 of the fluid delivery system. U.S. Pat. No. 5,370,709 employs a chemically reactive material that undergoes thermal decomposition to form a coating on substrate 10. U.S. Pat. No. 5,370,709 teaches that control of fluid and apparatus temperatures can be used to mitigate the undesirable thermal decomposition of the chemically reactive fluid in the fluid delivery system. U.S. Pat. No. 5,370,709 does not teach any method to manage the contact between the chemically reactive fluid and the fluid delivery system elements like fluid collimating conduit 14 other than to minimize the residence time of the chemically reactive fluid in the fluid delivery system by minimizing the length of tubing that the chemically reactive fluid must traverse in the fluid delivery system.

FIG. 12 is a cross-sectional view illustrating one embodiment of the present inventive method for practicing pneumatic levitation. FIG. 12 shows a moveable substrate 10 with a levitation stabilizing structure 30 fabricated thereupon where the surface of moveable substrate 10 with the levitation stabilizing structure 30 opposes the gas emanating surface of stationary support through which gaseous fluid will flow 12 with fluid collimating conduit 14. Fluid collimating conduit 14 is in fluidic communication through fluid outlet 19 with a pressurized fluidic flow emanating from an apparatus for production of compound fluid flows and jets 20 which is, in turn, in fluidic communication with fluid inlet 58 and fluid inlet 56.

FIG. 12 illustrates the appropriate relative positions of the elements moveable substrate 10 with levitation stabilizing structure 30 relative to the stationary support 12 and fluid collimating conduit 14 for the use of levitation stabilizing structure 30 to be effective as a method of positional stabilization during fluidic levitation with an orthogonal jet emanating from fluid collimating conduit 14. It has been found that the use of the levitation stabilizing structure as a method for improving the lateral stability of a moveable substrate during pneumatic levitation only requires that the fluid jet from jet forming fluid collimating conduit 14 of stationary support 12 impinge on the surface of moveable substrate 10 within the interior impingement area defined by the surface bounded and enclosed by the walls of the levitation stabilizing structure 30 fabricated on the surface of moveable substrate 10. It is preferred that the fluid jet from jet forming fluid collimating conduit 14 of stationary fluid emitting support 12 impinge on the surface of moveable substrate 10 near the centroid of interior impingement area defined by the area enclosed by the interior walls of the levitation stabilizing structure 30 fabricated on the surface of moveable substrate 10. It is preferable that the centroid of the interior impingement area enclosed by the interior walls of the levitation stabilizing structure 30 fabricated on the surface of moveable substrate 10 be located within the impingement area enclosed by the interior walls of the levitation stabilizing structure 30. The fluid collimating conduit on the stationary fluid emitting support is an alignment feature on the surface of the stationary fluid emanating support and the centroid of the interior impingement area of the levitation stabilizing structure is aligned with the alignment feature wherein the alignment feature is a fluid collimating conduit on the surface of the stationary fluid emanating support. Thus, one embodiment of a method for fluidic levitation comprises the steps of:

1. providing a substrate;
2. fabricating a levitation stabilizing structure on a surface of a substrate;
3. positioning the substrate proximate to a fluid emitting surface of a stationary fluid emanating support in a conformal-wise manner with the levitation stabilizing structure overlaying the surface of the substrate and facing the stationary fluid emanating surface;
4. aligning the centroid of the interior impingement area of the levitation stabilizing structure with at least one alignment feature on the surface of the stationary fluid emanating support;
5. initiating at least one collimated fluid flow from the stationary fluid emanating support surface to produce a collimated fluid jet, and;
6. controlling the collimated fluid flow emanating from the stationary fluid emanating support to fluidically levitate the substrate and levitation stabilizing structure proximate to the surface of the stationary fluid emanating support.

It has been observed experimentally that the alignment of the centroid of the interior impingement area of the levitation stabilizing structure with at least one alignment feature on the surface of the stationary fluid emanating support is not highly critical as the levitation stabilizing structure exhibits self-alignment during the levitation process. The reasons for self-aligning behavior during pneumatic levitation are described in more detail below. This is a distinct advantage of using a levitation stabilizing structure during pneumatic levitation.

FIG. 12 also shows an apparatus for production of compound fluid flows and jets 20. The compound jet forming apparatus 20 will be described in more detail later and is comprised of multiple elements including mechanisms for providing a means for controlling the temperature, pressure, and flow of at least one fluid. Apparatus 20 in FIG. 12 also provides and includes a means for controlling the composition of the compound fluid flow. The compound fluid flow forming apparatus 20 shown in FIG. 12 has two inlets. Fluid inlet 56 allows a first fluid to flow into apparatus 20 and fluid inlet 58 allows a second fluid to flow into apparatus 20. Apparatus 20 has a fluid outlet 19 in fluid communication with fluid collimating conduit 14. In one embodiment, apparatus 20 is in fluid communication with at least one pressurized-gas sources providing a gas flow through the fluid collimating conduit 14 and impinging on the moveable substrate surface within the enclosed interior impingement area of the moveable substrate sufficient to levitate the moveable substrate and expose the moveable substrate to the gas while restricting the lateral motion of the moveable substrate with the levitation stabilizing structure.

The function of apparatus 20 is to combine at least 2 fluid flows, a first fluid flow and a second fluid flow, to form a compositionally segregated compound fluid flow exiting apparatus 20 through outlet 19 and flowing though fluid collimating conduit 14 of the stationary fluid emitting support through which fluid will flow. Apparatus 20 is in fluid communication with a pressurized fluid source. In one embodiment, apparatus 20 is in fluid communication with a pressurized-gas source. In another embodiment, apparatus 20 is in fluid communication with a pressurized-liquid source.

In one embodiment the first fluid flow can be a reactive fluid and the second fluid flow can be a non-reactive fluid. Unlike any of the prior art utilizing fluid flows for fluidic levitation, the compound fluid flow exiting apparatus 20 at fluid outlet 19 is a spatially non-uniform composition of matter comprised of a chemically reactive fluid flow encased and surrounded by a chemically non-reactive fluid flow. A spatially non-uniform composition of matter is a composition of matter whose chemical composition changes depending on the sampling location with the composition of matter volume. This compound fluid flow emanating from outlet 19 of apparatus 20 is injected through fluid collimating conduit 14 to form a spatially non-uniform compound jet whose fluidic components are distributed so that the compound jet is non-reactive with the critical fluid contact regions of the fluid delivery system employed for fluidic levitation. An additional function of outlet 19 is to provide optional hydrodynamic focusing of the fluid flow. Hydrodynamic focusing or gas dynamic occurs when fluid flows of different velocity come into contact. It is preferred that the flow velocity of all flows in apparatus 20 be limited so that the flow exhibits lamellar behavior. For example, a flow of primary fluid can be squeezed or expanded by the surrounding secondary fluid sheath to occupy a smaller or larger cross-section by employing a suitable choice of primary and secondary fluid velocities. When the velocity of the secondary fluid is larger than that of the primary fluid in a collinear compound flow the primary fluid is "squeezed" to occupy a smaller percentage of cross-sectional area of the compound flow. When the velocity of the secondary fluid is less than that of the primary fluid in a collinear compound flow then the primary fluid expands to occupy a larger percentage of cross-sectional area of the compound flow. Hydrodynamic focusing provides an additional method for managing chemically reactive fluid flows. Contrary to the present invention, the use of hydrodynamic or gas dynamic focusing as a result of velocity differences between the primary and secondary jet is taught as being undesirable during compound jet formation and is not disclosed in either U.S. Pat. No. 3,368,760 or U.S. Pat. No. 3,416,730. There is no mention or anticipation of the use of compound jets for fluidic levitation processes in either U.S. Pat. No. 3,368,760 or U.S. Pat. No. 3,416,730.

Figure 15D:
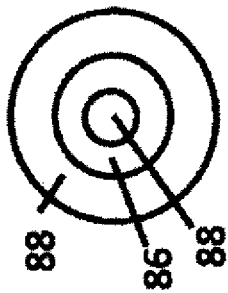
FIGS. 15a-15d show views of a coaxial fluid delivery tube; and in particular.
Figure 15C:
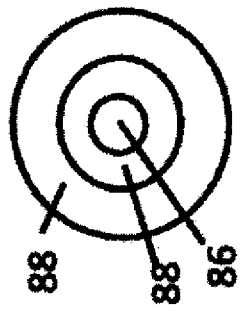

In the present inventions compound fluid flows are produced by apparatus 20 by combining at least two fluid flows and minimizing the mixing between the two fluid flows. When only two fluid flows are present in apparatus 20, a first fluid flow and a second fluid flow, the second fluid flow being an outer sheath fluid flow that is in contact with and surrounds the first fluid flow for formation of a compound fluid flow, then the position of the first fluid flow within the outer sheath fluid flow distinguishes whether the compound fluid flow is coaxial jet or collinear. The distinguishing feature of a coaxial compound fluid flow is that the centroids of the polygons defining the shape of the cross-sectional area of the fluid delivery tubes are all coincident as shown in FIGS. 15c and 15d. The distinguishing feature of a collinear compound jet is that the centroids of the polygons defining the shape of the cross-sectional area of the fluid delivery tubes are not coincident as shown in FIGS. 18c and 18d. A common feature of both coaxial and collinear compound fluid flows is the presence of an outer sheath of fluid surrounding, contacting, and encapsulating the first fluid flow.

Apparatus 20 optionally includes a mechanism providing a means for accurately controlling the temperature, pressure, and flow of the fluids that are employed for the purpose of producing a collimated compound fluid jet. Typical means for controlling pressure of gaseous fluids include both passively and actively controlled pressure regulators including electronically controlled pressure regulators and other types of pressure regulator methods known in the art. Typical temperature control mechanisms for a fluid include passive and actively controlled heating and cooling units including heat exchangers, heating tapes and coils as well as cooling coils through which the fluid passes, temperature controlled reservoirs, and other mechanisms and devices known to those skilled in the art of temperature control of fluids. Temperature and pressure control loops employed to achieve stable fluid temperatures and fluid pressures may incorporate the use automated temperature and pressure control units. Typical means for controlling the flow of one or more gaseous fluids include the use of orifices of known diameter with known pressure-flow relationships, gas flow meters, flow controllers, control valves, and variable control valves of all types including mass flow meters and mass flow controllers, rotameters, Coriolis flow meters coupled with flow controllers, turbine flow meters, pitot based flow meters and other types of fluid flow meters familiar to those skilled in the art of process control of flowing fluid media where the fluid is a liquid or a gas.

Controlling the fluid composition is an important feature of the apparatus, as taught by U.S. Pat. Nos. 3,368,760 and 3,416,730. For example, specific valve configurations can be employed in apparatus 20 to allow the apparatus 20 to produce compound jets whose spatially non-uniform composition can be varied as a function of time as the compound fluid flows through fluid collimating conduit 14. This is a distinct advantage because it allows the surface of moveable substrate 10 that opposes the fluid emitting support to be exposed to a concentration of a reactive fluid for a known amount of time. Exposure of a surface to a chemical species for a known amount of time is also known as surface exposure or surface dosing and an apparatus that provides a means to dose a surface with a specific reactive fluid flow is extremely useful for fluidic levitation applications.

It is further recognized that the entire assembly represented by the cross-sectional view of FIG. 12 could be rotated by 180 around an axis normal to the plane of FIG. 12 and the positional configuration will still be functional. The use of a levitation stabilizing structure 30 during fluidic levitation does not alter the function of a fluidic levitation apparatus employing Bernoulli airflow with respect to physical orientation of the apparatus, and in fact improves the robustness of fluidic levitation with respect to tilting of the gas-emanating stationary support through which fluid will flow regardless of the apparatus attitude and orientation. Fluidic levitation can take place when the velocity vector of the orthogonal fluid jet is essentially parallel to the gravitational force vector or when the velocity vector of the orthogonal fluid jet is essentially anti-parallel to the gravitational force vector. The presence of a levitation stabilizing structure 30 on the moveable substrate surface does not alter the relationships between the pneumatic forces that are generated by the fluid flow from the orthogonal jet that flows between the substrate surface and the fluid emitting support surface and the gravitational force vector that are inherently present in fluidic levitation processes employing Bernoulli airflow. This is a distinct advantage of the invention.

It is recognized that the stationary support through which fluid will flow is not restricted to a planar configuration as illustrated in FIG. 12. The features of the stationary support through which fluid will flow comprise the following: the stationary fluid emitting support contains at least one fluid collimating conduit in fluid communication with a manifold and a pressurized fluid source, said fluid collimating conduit having a cross-sectional area less than or equal to ¼ of the surface area of the interior impingement area of the levitation stabilizing structure; the surface area of the stationary fluid emitting support is at least equal to the surface area of the interior impingement area on the moveable substrate; and the fluid flow between the stationary support and the moveable substrate is characterized by radial flow patterns that are essentially symmetric with respect to the centroid of the interior impingement area. It is preferred that said fluid collimating conduit have a cross-sectional area less than or equal to ¼ of the impingement area enclosed by the walls of the levitation stabilizing structure.

Thus, in one embodiment, if the moveable substrate surface follows the shape of an arc, as is found, for example, on the surface of an optical lens, then a stationary support surface can be fabricated that follows the surface features of the moveable substrate surface and is conformal to the surface features of the moveable substrate surface and produces a radial flow pattern when an orthogonal jet impinges on the moveable substrate surface. Thus, the stationary support is fabricated to follow the surface features of the moveable substrate surface in a conformal-wise manner. In another embodiment, the stationary support topography resembles a mold of the surface of the moveable substrate. In another embodiment, the stationary support topography follows the negative three dimensional image of the surface of the moveable substrate. It is preferred that the surface topography of moveable substrate 30 be continuous and smooth, monotonically varying without a significant number of topographical disparities; however, practical experience has shown that topographical disparities are well tolerated by fluidic levitation processes. In particular, topographical disparities are well tolerated by fluidic levitation processes when the topographical disparity protrusion distance as measured normal to the substrate surface is smaller than the average thickness of the fluid layer formed between the substrate and the stationary fluid emitting support through which fluid will flow during fluidic levitation.

The function of the levitation stabilizing structure (LSS), fabricated on the moveable substrate surface is to harness the inherent kinetic energy of the gaseous flow of the fluidic layer employed in fluidic levitation so as to convert said kinetic energy into directional forces for the purpose of introducing positionally restorative forces that act in a restorative manner to control and minimize undesirable lateral movement of the moveable substrate during fluidic levitation. The LSS is useful when the fluid used for fluidic levitation is a gas or a liquid. Fluidic levitation employing a gaseous fluid is called pneumatic levitation. Fluidic levitation employing a condensed phase liquid fluid is called hydraulic levitation.

The symmetric radially outward flow which occurs during pneumatic levitation processes employing one or more orthogonal jets can thus be harnessed to achieve positional stability of a pneumatically levitated moveable substrate using a levitation stabilizing structure fabricated on the opposing surface of the moveable substrate. Furthermore, the fluid flow from one or a plurality of orthogonal or tilted compound jets contains substantial pneumatic energy in the form of both kinetic and potential energy and this unharnessed pneumatic energy can be used to achieve positional stability of a pneumatically levitated moveable substrate.

Positional stability of the moveable substrate during pneumatic levitation is achieved readily when the stationary gas emitting support through which gaseous fluid will flow contains fluid collimating conduits, nozzles, bores, and orifices used for the generation of gaseous jets—tilted or orthogonal—that impinge within the interior impingement area on the surface of the opposing moveable substrate that is within the confines of the area enclosed by the walls of the levitation stabilizing structure that is located on and in contact with the moveable substrate surface that opposes and faces the stationary gas emitting support surface, as shown in FIG. 12. The location of the levitation stabilizing structure on the moveable substrate is a feature that distinguishes the inventive method from all other previous attempts to address positional stability during pneumatic levitation. Furthermore, the inventive method is not restricted to planar plate-like substrates although planar substrates are preferred. Additionally, as shown in FIG. 12, the use of compound jets during fluidic levitation is a distinguishing feature of the inventive method from all other previous attempts to address delivery of chemically reactive fluids during fluidic levitation.

Figure 13C:
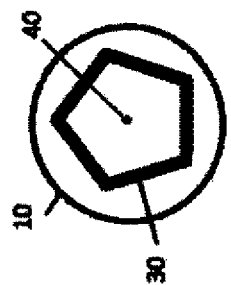
FIGS. 13a-13c show views of a non-planar substrate with a levitation stabilizing structure; and in particular.
Figure 13B:
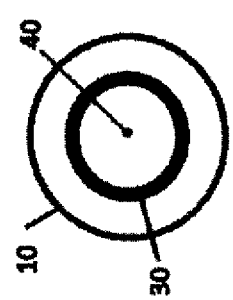
Figure 13A:
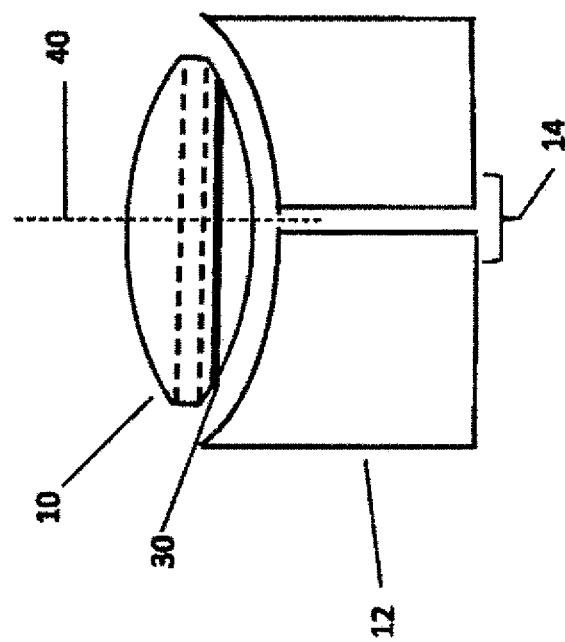

FIGS. 13a through 13c illustrate the application of a levitation stabilizing structure to a moveable substrate having a three-dimensional spherical surface topography. FIG. 13a is a cross-sectional view of a non-planar moveable substrate 10 with levitation stabilizing structure 30 overlaying and in contact with one surface of non-planar moveable substrate 10 wherein non-planar moveable substrate 10 is positioned over a gas-emanating stationary support 12 containing a fluid collimating conduit 14 in fluid communication with a source of at least one fluid whose pressure, temperature, and flow can be controlled by, for example, the previously disclosed apparatus 20. In one embodiment, the non-planar moveable substrate 10 is a circular convex lens. The gas-emanating stationary support 12 has surface topography that is conformal to the surface topography of non-planar moveable substrate 10. In other words, the general contours of the surface of the stationary gas emitting support 12 follow the contours of the surface of moveable substrate 10 in a conformal-wise manner as if the surface of moveable substrate 10 without the levitation stabilizing structure had been imprinted by pressure on the surface of the stationary gas emitting support 12 and said surface of gas emitting support deformed to replicate the negative topography of the non-planar moveable substrate surface. FIGS. 13b and 13c shows two plan views of two embodiments of a levitation stabilizing structure on the non-planar moveable substrate 10 of FIG. 13a that are compatible with the stationary fluid emitting support configuration shown in FIG. 13a. The plan view is directly down the proper rotation axis of symmetry of the levitation stabilizing structure so that the rotational symmetry of the levitation stabilizing structure 30 can be seen. FIG. 13b shows a circular levitation stabilizing structure 30 with a proper rotational axis of symmetry 40 that is a $C_\infty$ axis that has been fabricated on the non-planar moveable substrate 10. FIG. 13c shows a pentagonal levitation stabilizing structure 30 with a proper rotational axis of symmetry 40 that is a $C_5$ axis that has been fabricated on the non-planar moveable substrate 10.

Thus, a further advantage of the method of fluidic levitation employing a levitation stabilizing structure is the fluidic levitation of arbitrarily shaped substrates and the processing of selective portions of the surface area of said arbitrarily shaped substrates. In the embodiments shown above in 5a through 5c, the levitation stabilizing structure can be formed on arbitrarily shaped substrate thereby enabling pneumatic levitation of the arbitrarily shaped substrate when the plane of the levitation stabilizing structure is positioned normal to and facing an orthogonal jet emanating from a stationary support. As mentioned previously, the levitation stabilizing structure additionally enables the use of pneumatic levitation with, for example, planar substrates that are shaped like circles, triangles, squares, and other polygonal shapes. The levitation stabilizing structure is particularly useful for pneumatic levitation of silicon wafers that are essentially circular shaped and are additionally marked with a flat or notch so that the wafer is not perfectly symmetric. Wafers marked with a flat can be considered to be arbitrarily shaped substrates and the levitation stabilizing structure is particularly useful for pneumatic levitation of samples of this type. Additionally, the levitation stabilizing structure can be employed with three dimensional moveable substrates, said substrates being planar or non-planar, to enable processing of selected regions on the substrate surface.

In a general embodiment, the moveable substrate is not necessarily planar and can be topographically complex as in the case of, for example, a spherical shaped substrate. In another embodiment, the moveable substrate can be mostly planar but additionally possessing thickness variations such as decorative or functional patterns fabricated upon the surface. The moveable substrate may possess thickness variations characteristic of three dimensional objects giving rise to surface topographies that are either monotonically concave or monotonically convex. In another embodiment of the use of the levitation stabilizing structure, a regular symmetrically shaped polygonal levitation stabilizing structure, such as a circular, pentagonal, or hexagonal levitation stabilizing structure, is fabricated upon the surface of a sphere using, for example, patterning of a material layer comprised of a patternable material such as photoresist and a non-planar gas-emanating stationary support is used for pneumatic levitation, the non-planar gas-emanating stationary support comprising a concave surface having an interior radius larger than or equal to the internal radius of the spherical object to be levitated and a single fluid collimating conduit normal to the concave interior surface of the gas-emanating stationary support: the surface of the gas-emanating stationary support being an approximate 3 dimensional negative duplication of the three dimensional topography of the moveable substrate. The spherical moveable substrate, when placed inside the concave surface of the gas-emanating stationary support and in contact with an orthogonal jet emanating from the concave surface of the gas-emanating stationary support structure will pneumatically levitate and exhibit restricted motion preventing the spherical moveable substrate from tipping and the forces that produce the restricted motion are the result of balanced pneumatic forces whose origin lies in the interaction between the radial gas flow from the orthogonal jet and the levitation stabilizing structure. In general, the three dimensional negative contours of the gas-emanating stationary support should approximately follow the three dimensional positive contours of the moveable substrate to be pneumatically levitated. When the three dimensional contours of the positive image topography of the moveable substrate become sufficiently small and the moveable substrate approaches planarity there is less need for exact three dimensional negative duplication of the moveable substrate surface topography in the gas-emanating stationary support surface.

Thus, the use of the levitation stabilizing structure with a moveable substrate of arbitrary shape has wide applicability both to planar and three dimensional moveable substrates. The levitation stabilizing structure may follow a scaled projection outline of the perimeter of the planar movable substrate upon which it is fabricated but, in other embodiments, it can be suitable for the levitation stabilizing structure to be a polygonal shape that is different from circumferential polygonal shape of the moveable substrate upon which it is fabricated in order to obtain improved pneumatic levitation stability by optimizing the shape, area, and size of the levitation stabilizing structure with respect to the shape, size, area, and mass of the moveable substrate upon which the levitation stabilizing structure is fabricated.

FIG. 14 shows a process step diagram for the inventive Process 70 of fluidically levitating a substrate with a levitation stabilizing structure for the purpose of exposing the surface of a moveable substrate to a series of fluid flows where at least one fluid flow is a chemically reactive fluid flow. Process 70 is comprised of 9 steps designated steps 71 through 79. The process steps of process 70 are sequentially applied Steps 74 through 77 of Process 70 are sequential steps that can be repeated in a loop-wise manner for the purpose of exposing the surface of the fluidically levitated moveable substrate to more than one chemically reactive fluid flow and in one embodiment of Process 70 the moveable substrate with levitation stabilizing structure is fluidically levitated and exposed to a series of different fluid flows by repetition of steps 74 through 77 of Process 70. As shown in step 71, a moveable substrate with a levitation stabilizing structure on one surface is provided and the moveable substrate with levitation stabilizing structure is positioned proximate to the surface of the fluid emitting stationary support with the levitation stabilizing structure opposed and facing the fluid emitting surface of the stationary support through which fluid will flow. The positioning step also comprises aligning the moveable substrate with alignment markings on the fluid emitting stationary support so that the fluid emitting from the stationary fluid emitting support will impinge proximate to the centroid of the levitation stabilizing structure impingement area. It is not necessary that the moveable substrate with levitation stabilizing structure contact the stationary support during step 71. In an embodiment of process 70, the moveable substrate can be positioned using a substrate holder such as a Bernoulli wand or a vacuum wand during step 71. In step 72 a fluid flow of at least one chemically non-reactive fluid is initiated in the fluidic levitation apparatus to fluidically levitate the moveable substrate with levitation stabilizing structure using an orthogonal fluid jet flowing from the surface of the stationary fluid emanating support. In one embodiment the moveable substrate that is positioned proximate to the stationary support in step 71 using a substrate holder is released from the substrate holder after the non-reactive fluid flow and fluidic levitation is initiated in step 72 thereby allowing unimpeded levitation of the moveable substrate by the non-reactive orthogonal fluid jet after which the substrate holder is temporarily removed so as to not interfere with fluidic levitation of the moveable substrate. In step 73 the moveable substrate is fluidically levitated with a chemically non-reactive fluid for a period of time during which various additional process related variables can be adjusted and stabilized. For example, during step 73 the fluid flow during fluidic levitation can be employed as a means to ensure that particle contamination is minimized at the levitated moveable substrate surface by allowing the high velocity fluid flow in the volume region between the stationary fluid emitting support and the moveable substrate to sweep particles off the surface of the substrate. In another process embodiment, the period of time elapsing during step 73 can be used to heat the levitating substrate to the desired temperature during levitation before exposure of the moveable substrate surface to a chemically reactive fluid flow. Alternately, the timed period of fluidic levitation in step 73 can be used to allow the substrate to come to an equilibrium position during fluidic levitation if the sample was not initially positioned properly. Thus, step 73 is essentially a timed period wherein the apparatus with fluidically levitated moveable substrate is brought to the desired state of operation after initiating the fluidic levitation of the moveable substrate. Sequential step 74 initiates chemically reactive fluid flow during the fluidic levitation process and provides a way exposing the surface of the moveable substrate with levitation stabilizing structure to the chemically reactive fluid flow. Apparatus 20 is employed as an apparatus providing a means to add chemically reactive species to the fluid flow through the production of compound fluid flows that are spatially non-uniform in chemical composition and are comprised of a primary chemically reactive fluid that is surrounded by and in contact with a sheath of a secondary fluid that is chemically non-reactive. Exposure of the levitating substrate surface to a chemically reactive compound fluid flow begins when apparatus 20 is employed to add the chemically reactive compound to the fluid flow employed for substrate levitation during the fluidic levitation of the substrate. In step 75 a period of time is allowed to elapse whilst the surface of the moveable substrate with levitation stabilizing structure is exposed to chemically reactive species in the fluid flow during fluidic levitation. Step 76 is sequentially carried out at the end of the elapsed time period of step 75 and apparatus 20 is employed as a means to change the fluid composition of the compound jet employed during fluidic levitation and remove chemically reactive fluids from the fluid flow employed for fluidic levitation of the substrate. In step 77 a period of time is allowed to elapse to ensure that chemically reactive species have been swept out of the fluid flow employed for fluidic levitation and additionally ensure that the chemically reactive species have been swept out of the fluid volume employed as a fluid layer between the moveable substrate and the stationary support during fluidic levitation.

Process step diagram 70 shows that steps 74 through 77 can be repeated as many times as necessary to expose the surface of the fluidically levitated moveable substrate to a series of fluid flows wherein at least one fluid flow is a chemically reactive fluid flow. In one embodiment of process step diagram 70, steps 74 through 77 can be repeated as many times as necessary to expose the surface of the pneumatically levitated moveable substrate to a series of gas flows wherein at least one gas flow is a chemically reactive gas flow. In one embodiment of the repeat sequence, each repeat of sequential step 74 through 77 may employ chemically reactive flows with the same chemical compositions in the chemically reactive flows. In another embodiment of the repeat sequence, each time steps 74 through 77 are repeated a different chemically reactive flow from the previous repeat sequence of steps 74 through 77 can be employed during the fluidic levitation process. After the required number of repeats of steps 74 through 77 have been executed the next sequential step in process 70 is step 78. In step 78 the chemically non-reactive fluid flow employed for fluidic levitation in step 77 is discontinued in order to terminate the fluidic levitation of the substrate. Step 78 may optionally be a timed step where the flow of chemically non-reactive fluid is allowed to remain for a specific amount of time before being discontinued. In the last process step of process 70 the moveable substrate is removed from the surface of the stationary fluid emitting support in step 79. In an alternate embodiment of process 70, step 78 is a timed step where the moveable substrate is fluidically levitated using a flow of chemically non-reactive fluid for a specific amount of time and in step 79 the moveable substrate is removed from the chemically non-reactive fluid flow using a substrate holder like a vacuum wand or a Bernoulli wand and the chemically non-reactive fluid flow is discontinued. The alternate embodiments disclosed for process 70 provide a way of further reducing particle contamination of the moveable substrate surface. Thus, process 70 discloses a sequence of steps that provide a process for fluidically levitating a substrate with a levitation stabilizing structure in a fluidic levitation apparatus comprised of a stationary fluid emitting support with a fluid collimating conduit providing a means to produce orthogonal jets from a fluid flow and an apparatus in fluid communication with the stationary fluid emitting support providing a means for controlling the composition of the fluid flow of the orthogonal jet through the formation of compound fluid flows comprised of fluid flows with spatially non-uniform compositions. In one embodiment, the process steps of process 70 provide a method of pneumatically levitating a moveable substrate with a series of sequential gas flows wherein at least one of the sequential gas flows is a chemically reactive gas.

Fluidic levitation with radial flow can be used concurrently with deposition processes to provide a method for thermally isolating the moveable substrate and its surfaces from physical contact with any thermal sinks, thereby enabling effective temperature control for both heating and cooling—especially during the use of optional processing steps involving high photon flux radiative exposures such as optionally radiative curing with either IR or UV radiation. The use of processing steps involving the use of radiation of all types for the purposes of stabilizing and inducing further changes in material properties of deposited films during pneumatic levitation is specifically contemplated and such radiation sources may include ionizing radiation sources such as x-rays, gamma rays, and the like as well as lower photon energy radiation types such as ultraviolet radiation and infrared radiation. The use of microwave radiation for substrate treatment of a microwave adsorbing substrate is specifically contemplated as applied to the pneumatic levitation of a moveable substrate with a levitation stabilizing structure. The use of induction heating for substrate treatment of a conducting substrate is specifically contemplated as applied to the pneumatic levitation of a moveable substrate with a levitation stabilizing structure. The rapid radial flow in the volume between the moveable support surface with its levitation stabilization structure and the gas-emanating stationary support enables excellent cleanliness and low contamination during deposition processes executed at elevated temperatures as well as the capability to induce rapid cooling once heating is discontinued. The effluent fluid from the process is optionally managed by the use of a supplemental laminar flow of inert gas around the moveable substrate and stationary support for the purpose of removing the gaseous process effluent from the region proximate to the moveable substrate and the stationary support assembly for disposal. U.S. Pat. No. 5,370,709 has previously disclosed thermal annealing processes and deposition processes using reactive precursors by employing pneumatic levitation with a single orifice but the apparatus disclosed therein required the use of physical stops to prevent the substrate from sliding off the "suction plate". Deposition processes employing pneumatic levitation without the use of substrate motion restraining structures such as physical stops on the stationary support plate are not contemplated in U.S. Pat. No. 5,370,709.

The drawings in FIG. 15 through FIG. 21 are intended to disclose the method of compound fluid formation employed in apparatus 20. FIG. 15a shows an isometric view of three concentric fluid delivery tubes: outer sheath fluid delivery tube 80, inner coaxial fluid delivery tube 82, and inner coaxial fluid delivery tube 84. FIG. 15a shows an isometric view of a plurality of axially parallel tubes that have a common axis wherein the axially parallel tubes are concentric. In an embodiment, apparatus 20 includes a plurality of axially parallel tubes that coaxial, concentric, or collinear.

Figure 15B:
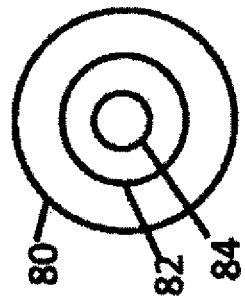
Figure 15A:
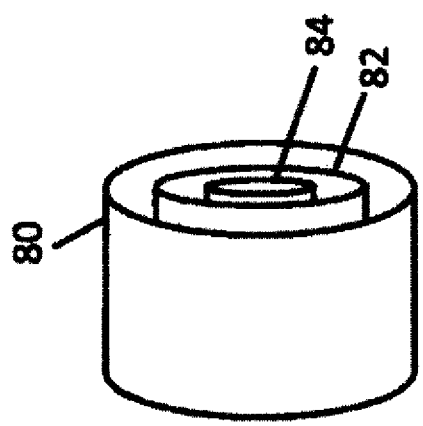

FIG. 15b shows a cross-section of the three coaxial fluid delivery tubes 80, 82, and 84. FIG. 15b shows a cross-sectional view of a plurality of axially parallel tubes 80, 82, and 84 that have a common axis wherein the axially parallel tubes are concentric. When fluids are flowing through coaxial fluid delivery tubes 80, 82, and 84 all fluids flow in an axially symmetric manner. According to the literature conventions disclosed by Hertz and Hermanrud (loc cit), fluids that flow in the interior of an axially symmetric fluid flow will be called primary fluids. Fluids that are in contact with and surround the primary fluid as a sheath are called secondary fluids. FIG. 15c shows a cross-section of one embodiment of an axially symmetric fluid flow emanating from coaxial fluid delivery tube arrangement shown in FIGS. 15a and 15b. FIGS. 15c and 15d show a compositional cross-section of the fluid flow exiting from the coaxial tube arrangement shown in FIG. 15a. FIG. 15c shows that the cross-section of the compound fluid flow emanating from end of coaxial fluid delivery tubes 80, 82, and 84 in FIG. 15a is spatially non-uniform in composition when a primary fluid 86 flows through tube 84 and a secondary fluid 88 flows through coaxial tubes 80 and 82. In another embodiment, when primary fluid 86 flows through coaxial fluid delivery tube 82 whilst secondary fluid 88 flows through coaxial tubes 80 and 84 the compositional cross-section of the compound fluid is shown in FIG. 15d. In another embodiment that is not shown, primary fluid 86 flows through coaxial tubes 84 and 82 whilst secondary fluid 88 flows through tube 80 then the compound fluid flow is similar to FIG. 15c except that the cross-section of the primary fluid is larger. The coaxial arrangement of fluid delivery tubes shown in FIG. 15a can be employed with three fluids to form more complicated compound fluid flows comprised of concentric coaxial compound fluid flows.

Some aspects of FIG. 15 will now be described in more detail for one simple embodiment of the method of use where the fluid is gaseous. Each gas delivery tube in FIG. 15a is coaxial with all other gas delivery tubes. The array of coaxial gas delivery tubes in FIG. 15 consists of a plurality of tubes, the cross-sectional shape of each tubes being arbitrary with the provision that a hollow region exists for gas to flow through, and each of the tubes may contain a gas of differing composition. The tubes employed in the coaxial array for producing a coaxial compound jet can have a cross-sectional shape of a simple polygon, convex or concave, with n vertices, where n≥3. As mentioned previously, oval and circular shapes are considered polygons with an infinitely large number of vertices and sides and thus are permissible for use in construction of a coaxial tube array. FIG. 15b shows a plan view of gas delivery tubes 80, 82, and 84 and the centroids of the polygonal cross-sectional shape of each gas delivery tube 80, 82, and 84 are coincident, thereby demonstrating that gas delivery tubes 80, 82, and 84 are coaxial. Gas delivery tube 80 is in fluid communication with a source of gas A of composition A in such a way that the flow of gas in coaxial gas delivery tubes 82 and 84 does not contact or mix with any other gas until it reaches the exit orifice of inner coaxial gas delivery tubes 82 and 84. The gas of composition A is supplied using a flow control mechanism that can utilize either a pressure feedback loop, a flow feedback loop, or a feedback loop utilizing both pressure and flow control of the gas of composition A. A gas A of composition A is thus flowed through outer sheath delivery tube. Inner coaxial gas delivery tube 82 is in fluid communication with a source of gas B of composition B in such a way that the flow of gas B in tube 82 does not mix with any other gas until it reaches the exit orifice of inner coaxial gas delivery tubes 82 and 84. Inner coaxial gas delivery tube 82 is in fluid communication with a source of gas B of composition B in such a way that the flow of gas B in tube 82 does not mix with any other gas until it reaches the exit orifice of inner coaxial gas delivery tubes 82 and 84. The gas of composition B is supplied using a flow control mechanism that can utilize either a pressure feedback loop, a flow feedback loop, or a feedback loop utilizing both pressure and flow control of the gas of composition B. A gas of composition B is thus flowed through inner coaxial delivery tube 82. Similarly, inner coaxial gas delivery tube 84 is in fluid communication with a source of gas C of composition C in such a way that the flow of gas B in tube 84 does not mix with any other gas until it reaches the exit orifice of inner coaxial gas delivery tubes 82 and 84. Inner coaxial gas delivery tube 84 is in fluid communication with a source of gas C of composition C in such a way that the flow of gas C in tube 84 does not mix with any other gas until it reaches the exit orifice of inner coaxial gas delivery tubes 82 and 84.

The gas of composition C is supplied using a flow control mechanism that can utilize either a pressure feedback loop, a flow feedback loop, or a feedback loop utilizing both pressure and flow control of the gas of composition C. A gas of composition C is thus flowed through inner coaxial delivery tube 84.

Gases A, B, and C flowing in coaxial tubes 80, 82, and 84 flow in the same direction and at the same velocity. It is recognized that the mass flow rates of gas A and gas B may differ for the flow velocities of gas A and gas B to match because gas velocity is dependent on the cross-sectional area of the exit orifice for the two gases. It is within the scope of the invention that the cross-sectional area of the annulus defined by inner coaxial gas delivery tube 82 and inner coaxial gas delivery tube 84 may equal the cross-sectional area of the annular region located between outer sheath gas delivery tube 80 and inner coaxial gas delivery tube 82. Similarly, it is within the scope of the invention that the cross-sectional area defined by inner coaxial gas delivery tube 84 may equal the cross-sectional area of the annular region located between outer sheath gas delivery tube 80 and inner coaxial gas delivery tube 82. A compound coaxial fluid flow is formed by the combination of the fluid flow occurring at the exit of inner coaxial gas delivery tubes, 82 and 84. Each fluid flow in the compound coaxial fluid flow is centered on the same fluid flow axis and each fluid flow may contain a fluid of differing chemical composition. Formation of coaxial compound fluid flow is most effective when flow velocities of gases A, B, and C are limited to regime of flow velocities exhibiting laminar flow characteristics as is familiar to those skilled in the art of fluid mechanics. Gas dynamic focusing can occur when the flow velocity of gas A from outer sheath fluid delivery tube 80 is larger than the gas flow velocity of gas B from coaxial fluid delivery tube 82 and also that of gas C from coaxial fluid delivery tube 84. Gas dynamic focusing can be varied according to the relative gas velocities of gas A, B, and C.

The coaxial compound fluid flow delivery assembly 90 shown in FIG. 16 provides a more complete understanding of the use of the coaxial fluid delivery tube arrangement of FIG. 15a in compound jet forming apparatus 20. Coaxial fluid delivery tubes 80, 82, and 84 are in fluid communication with valves 92, 96, and 94 respectively. Valves 94 and 96 are three way controllable valves in fluid communication with reactive fluid inlet 116 and chemically inert fluid inlet 118. Valve 92 is in fluid communication with inert fluid inlet 118 and 2 way valve 92 controls the supply of chemically inert secondary fluid to the coaxial compound fluid exiting from coaxial fluid delivery tubes 80. The switchable valves 94 and 96 determine the location of the chemically reactive primary fluid in the coaxial compound fluid flow exiting coaxial fluid delivery tubes 80, 82, and 84. When switchable valve 94 allows fluid communication between reactive fluid inlet 116 and coaxial fluid delivery tube 84, then the primary fluid flows through coaxial fluid delivery tube 84 and when the remaining coaxial fluid delivery tubes 80 and 82 are in fluid communication with and flowing chemically inert fluid then the exiting compound fluid flow has a compositional cross-section shown in FIG. 15c. Similarly in another embodiment, when switchable valve 96 allows fluid communication between reactive fluid inlet 116 and coaxial fluid delivery tube 86 when the remaining coaxial fluid delivery tubes 80 and 84 are in fluid communication with and flowing chemically inert fluid, then the chemically reactive primary fluid flows in the annular volume between coaxial fluid delivery tubes 84 and 82 and the exiting compound fluid flow has a compositional cross-section shown in FIG. 15d.

In both configurations chemically inert secondary fluid flows in the annular volume between coaxial fluid delivery tubes 80 and 82. In another embodiment of apparatus 20, the coaxial compound fluid flow delivery assembly of FIG. 16 has coaxial fluid delivery tube 80 extended beyond coaxial fluid delivery tubes 84 and 82 and connected directly to fluid collimating conduit 14 of the stationary fluid emitting support through which fluid will flow through outlet 19 of apparatus 20. In an additional embodiment, the internal diameter of coaxial fluid delivery tube 80 extended beyond coaxial fluid delivery tubes 84 and 82 is reduced in a smooth and monotonic fashion or the outlet 19 of apparatus 20 is reduced in a smooth and monotonic fashion to match the internal diameter of fluid collimating conduit 14 thereby providing a way of hydrodynamically focusing the coaxial compound fluid prior to formation of the coaxial compound jet emanating from fluid collimating conduit 14 in the stationary fluid emitting support.

Some aspects of FIG. 16 will now be discussed in further detail. The coaxial compound fluid flow delivery assembly 90 may optionally contain heating elements to control the temperatures of the fluids flowing through assembly 90. It is advantageous in some applications to control the gas composition flowing from the exit port of a compound fluid flow or a compound coaxial fluid flow. In order to control the final composition of the fluid flow a means for temporally varying the gas composition in one or more of the gas flows making up the compound jet such as a valve is employed. FIG. 16 shows a structure for producing a coaxial compound jet with varying composition by changing the composition of gas flowing through two coaxial fluid delivery tubes, 82 and 84, whose composition can be changed according to a predetermined timed sequence.

In one embodiment, all gas flowing through the outer sheath gas delivery tube 80 and coaxial gas delivery tubes 82 and 84 is the same chemical composition. Preferably the initial composition of the gas flowing in the assembly comprised of elements 80, 82, and 84 is an inert gas such as nitrogen or argon. The composition of the gas flowing through coaxial gas delivery tube 82 is switched to a different composition containing a chemically reactive species by switching a valve 96 so that the chemically reactive fluid flows through coaxial gas delivery tube 82 for a period of time, after which the gas flowing through coaxial gas delivery tube 82 is switched back to inert gas. After a predefined time period, a valve 94 attached to coaxial gas delivery tube 84 is switched to allow a gas mixture containing a second different chemically reactive fluid to flow through coaxial gas delivery tube 84 for a set period of time after which time the gas composition in coaxial gas delivery tube 84 is switched back to inert gas. The timed sequence described is the gas exposure sequence that is similar to the timed fluid exposure sequence employed in many atomic layer deposition processes. In one embodiment, the use of the coaxial compound fluid flow delivery assembly 90 in apparatus 20 is a method of controlling the fluid flow to temporally intersperse single-fluid flows with a fluid flow having two or more fluids. In one embodiment, all gases are delivered to the moveable substrate through the use of a coaxial compound jet produced using elements 80, 82, and 84 that is employed to pneumatically levitate a moveable substrate by Bernoulli levitation through the use of a single orthogonal jet emanating from a stationary support that impinges on a moveable substrate in an orthogonal manner. The moveable substrate may have a levitation stabilizing structure on the opposing surface facing the orthogonal jet, thereby providing stable pneumatic levitation conditions during processing. The use of three way valves as shown in assembly 90 of FIG. 16 can be particularly advantageous when the composition of the gas in a gas delivery tube, like for example a coaxial gas delivery tube 82 or coaxial gas delivery tube 84, is frequently changed between an inert fluid and a gas chemically reactive fluid containing, for example, chemically reactive molecules.

It is preferred that the chemical composition of the outer most layer of the coaxial jet that is produced by fluid flowing through the annular regions between outer sheath gas delivery tube 80 and inner coaxial gas delivery tube 82 be a chemically unreactive fluid in the gaseous state such as argon or nitrogen. Assembly 90 shown in FIG. 16 has the advantage of using a coaxial jet structure to provide a physical barrier of non reactive gaseous fluid material on the outside of the jet through which the reactive chemicals in the collinear jet must pass before contacting a surface such as the interior surface a piece of tubing or the interior surface of a fluid collimating conduit, bore or orifice in the stationary support.

The advantage to using coaxial compound jets and variants thereof, as a way of producing, transporting and delivering a gas flow containing a reactive gas mixture to the stationary support, is to prevent and minimize contact of reactive chemical materials in the jet with the sidewalls of the fluid collimating conduits, orifices, bores, and nozzles in the stationary support plate, thereby avoiding chemical contamination of the fluid collimating conduits in the stationary plate. It is particularly advantageous to have the outermost gas composition which is also called the sheath of a compound fluid flow comprised of an essentially inert, chemically unreactive gas such as argon or nitrogen so that reactive chemicals can only contact the sidewalls, nozzles, bores, fluid collimating conduits, and orifices of the stationary support and associated fluid delivery tubing using sideways gaseous diffusion. For example, if coaxial fluid flow comprised of a center chemical composition containing water vapor surrounded by a nitrogen sheath is prepared then the water will not only travel collinearly and coaxially with the nitrogen flow but it will also begin to diffuse radially outward along the radius of the jet. The diffusion coefficient for water in nitrogen at room temperature is between 0.2 and 0.3 $cm^2$ atm $sec^{-1}$ and the diffusion along the radius of the jet is much slower than the transport speed of water in nitrogen along the fluid flow direction for fluid flows usually employed in substrate processing, thereby limiting potential contamination of the internal surfaces of the apparatus chemical delivery system.

Further clarification of the disclosed inventive method of fluidic levitation is furnished the embodiment of an apparatus for fluidic levitation of a moveable substrate with levitation stabilizing structure shown in FIG. 17. FIG. 17 is a cross-sectional view illustrating an embodiment of the present inventive method for practicing fluidic levitation with chemically reactive species wherein the preferred fluid is a gaseous fluid. FIG. 17 shows a moveable substrate 10 with a levitation stabilizing structure 30 fabricated thereupon where the surface of moveable substrate 10 with the levitation stabilizing structure 30 opposes the gas emanating surface of stationary support through which fluid will flow using fluid collimating conduit 14. Fluid collimating conduit 14 is in fluid communication with a pressurized fluidic source emanating from an apparatus for production of compound fluid flows and jets 20 which is, in turn, in fluid communication with non-reactive gas inlet 118 and reactive gas inlet 116 through valves 92, 94, and 96.

FIG. 17 illustrates the appropriate relative positions of the elements moveable substrate 10 with levitation stabilizing structure 30 relative to the stationary support 12 and fluid collimating conduit 14 for the use of levitation stabilizing structure 30 to be effective as a method of positional stabilization during fluidic levitation with an orthogonal jet emanating from fluid collimating conduit 14. It has been found that the use of the levitation stabilizing structure as a method for improving the lateral stability of a moveable substrate during pneumatic levitation only requires that the fluid jet from jet forming fluid collimating conduit 14 of stationary support 12 through which fluid will flow and impinge on the surface of moveable substrate 10 within the interior impingement area defined by the surface bounded and enclosed by the walls of the levitation stabilizing structure 30 fabricated on the surface of moveable substrate 10. It is preferred that the fluid jet from jet forming fluid collimating conduit 14 of stationary fluid emitting support 12 impinge on the surface of moveable substrate 10 near the centroid of interior impingement area defined by the area enclosed by the interior walls of the levitation stabilizing structure 30 fabricated on the surface of moveable substrate 10. It is preferable that the centroid of the interior impingement area enclosed by the interior walls of the levitation stabilizing structure 30 fabricated on the surface of moveable substrate 10 be located within the impingement area enclosed by the interior walls of the levitation stabilizing structure 30. The fluid collimating conduit on the stationary fluid emitting support is an alignment feature on the surface of the stationary fluid emanating support and the centroid of the interior impingement area of the levitation stabilizing structure is aligned with the alignment feature wherein the alignment feature is a fluid collimating conduit on the surface of the stationary fluid emanating support. Thus, according to the first three steps of the process sequence disclosed in FIG. 14 the method for fluidic levitation comprises the steps of:

1. providing a substrate with a levitation stabilizing structure on a surface of a substrate and positioning said substrate proximate to a fluid emitting surface of a stationary fluid emanating support through which fluid will flow in a conformal-wise manner with the levitation stabilizing structure overlaying the surface of the substrate and facing the stationary fluid emanating surface;

2. initiating at least one collimated fluid flow from the stationary fluid emanating support surface through which fluid will flow to produce a collimated fluid jet; and 3. controlling the collimated fluid flow emanating from the stationary fluid emanating support through which fluid will flow to fluidically levitate the substrate and levitation stabilizing structure proximate to the surface of the stationary fluid emanating support.

It has been observed experimentally that the alignment of the centroid of the interior impingement area of the levitation stabilizing structure with at least one alignment feature on the surface of the stationary fluid emanating support is not highly critical as the levitation stabilizing structure exhibits self-alignment during the levitation process. The reasons for self-aligning behavior during pneumatic levitation are described in more detail below. This is a distinct advantage of using a levitation stabilizing structure during pneumatic levitation.

FIG. 17 also shows an embodiment of an apparatus 20 for production of compound fluid flows and jets. The compound fluid flow forming apparatus 20 is comprised of multiple elements including at least one coaxial compound fluid flow delivery assembly 90 as shown in FIG. 16 and additional means for controlling the temperature, pressure, and flow of at least one fluid. The additional means for controlling the temperature, pressure, and flow of at least one fluid of compound fluid forming apparatus 20 are not shown in FIG. 20.

The coaxial compound fluid flow delivery assembly 90 in FIG. 17 is comprised of coaxial fluid delivery tubes 80, 82 and 84 and valves 92, 94, and 96 and provides a means for controlling the composition of the compound fluid flow. The compound fluid forming apparatus 20 shown in FIG. 17 has at least two inlets. Inlet 116 allows a first reactive fluid to flow into apparatus 20 and inlet 118 allows a second non-reactive fluid to flow into apparatus 20. Apparatus 20 has a fluid outlet 19 in fluid communication with fluid collimating conduit 14. Fluid outlet 19 may also serve as a means to focus the compound fluid flow using hydrodynamic methods prior to formation of a compound coaxial jet emanating from fluid collimating conduit 14. The function of apparatus 20 is to combine at least 2 fluid flows, a first fluid flow and a second fluid flow, to form a compositionally segregated compound fluid flow exiting apparatus 20 through outlet 19 and flowing though fluid collimating conduit 14 of the stationary fluid emitting support. In one embodiment the first fluid flow can be a reactive fluid and the second fluid flow can be a non-reactive fluid. Unlike any of the prior art utilizing fluid flows for fluidic levitation, the compound fluid flow exiting apparatus 20 at fluid outlet 19 is a spatially non-uniform composition of matter in at least one dimension comprised of a chemically reactive fluid flow encased and surrounded by a chemically non-reactive fluid flow. A spatially non-uniform composition of matter is a composition of matter whose chemical composition changes depending on the sampling location with the composition of matter volume. The compound fluid flow emanating from outlet 19 of apparatus 20 is injected through fluid collimating conduit 14 to form a spatially non-uniform compound jet that can be made non-reactive with the critical fluid contact regions of the fluid delivery system employed for fluidic levitation.

The compound fluid forming apparatus 20 optionally includes means for accurately controlling the temperature, pressure, and flow of the fluids that are employed for the purpose of producing a collimated compound fluid jet. Typical means for controlling pressure of gaseous and liquid fluids include both passively and actively controlled pressure regulators including electronically controlled pressure regulators and other types of pressure regulator methods known in the art. Typical means for controlling the temperature of a fluid include passive and actively controlled heating and cooling units including heat exchangers, heating tapes and coils as well as cooling coils through which the fluid passes, temperature controlled reservoirs, and other devices known to those skilled in the art of temperature control of fluids. Temperature and pressure control loops employed to achieve stable fluid temperatures and fluid pressures may incorporate the use automated temperature and pressure control units. Typical means for controlling the flow of one or more gaseous fluids include the use of orifices of known diameter with known pressure-flow relationships, gas flow meters, flow controllers, control valves, and variable control valves of all types including mass flow meters and mass flow controllers, rotameters, Coriolis flow meters coupled with flow controllers, turbine flow meters, pitot based flow meters and other types of fluid flow meters familiar to those skilled in the art of process control of flowing fluid media where the fluid is a liquid or a gas.

Controlling the fluid composition is an important feature of the apparatus. For example, specific valve configurations can be employed in apparatus 20 to allow the apparatus 20 to produce compound jets whose spatially non-uniform composition can be varied as a function of time as the compound fluid flows through fluid collimating conduit 14. This is a distinct advantage because it allows the surface of moveable substrate 10 that opposes the stationary fluid emitting support to be exposed to a chemically reactive fluid with a known amount of chemically reactive species for a known amount of time. Exposure of a surface to a chemically reactive species for a known amount of time is also known as surface exposure or surface dosing and an apparatus that provides a means to dose a surface with a specific reactive fluid flow is extremely useful.

It is further recognized that the entire assembly represented by the cross-sectional view of FIG. 17 could be rotated by 180 around an axis normal to the plane of FIG. 17 and the positional configuration will still be functional. The use of a levitation stabilizing structure 30 during fluidic levitation does not alter the function of a fluidic levitation apparatus employing Bernoulli airflow with respect to physical orientation of the apparatus, and in fact improves the robustness of fluidic levitation with respect to tilting of the gas-emanating stationary support through which fluid will flow regardless of the apparatus attitude and orientation. Fluidic levitation can take place when the velocity vector of the orthogonal fluid jet is essentially parallel to the gravitational force vector or when the velocity vector of the orthogonal fluid jet is essentially anti-parallel to the gravitational force vector. The presence of a levitation stabilizing structure 30 on the moveable substrate surface does not alter the relationships between the pneumatic forces that are generated by the fluid flow from the orthogonal jet that flows between the substrate surface and the fluid emitting support surface and the gravitational force vector that are inherently present in fluidic levitation processes employing Bernoulli airflow. This is a distinct advantage of the invention.

As was previously disclosed in FIG. 13, it is also recognized that the stationary support through which fluid will flow employed for fluidic levitation is not restricted to a planar configuration as illustrated in FIG. 17. The features of the stationary support comprise the following: the stationary fluid emitting support contains at least one fluid collimating conduit in fluid communication with a manifold and a pressurized fluid source, said fluid collimating conduit having a cross-sectional area less than or equal to ¼ of the surface area of the interior impingement area of the levitation stabilizing structure; the surface area of the stationary fluid emitting support is at least equal to the surface area of the interior impingement area on the moveable substrate; and the fluid flow between the stationary support and the moveable substrate is characterized by radial flow patterns that are essentially symmetric with respect to the centroid of the interior impingement area. It is preferred that said fluid collimating conduit have a cross-sectional area less than or equal to ¼ of the impingement area enclosed by the walls of the levitation stabilizing structure.

The function of the levitation stabilizing structure, also referred to as the LSS, fabricated on the moveable substrate surface is to harness the inherent kinetic energy of the gaseous compound fluid jet flow and of the resultant fluidic layer employed in fluidic levitation so as to convert said kinetic energy into directional forces for the purpose of introducing positionally restorative forces that act in a restorative manner to control and minimize undesirable lateral movement of the moveable substrate during fluidic levitation.

The symmetric radially outward flow which occurs during pneumatic levitation processes employing one or more orthogonal compound jets can thus be harnessed to achieve positional stability of a pneumatically levitated moveable substrate using a levitation stabilizing structure fabricated on the opposing surface of the moveable substrate. Furthermore, the fluid flow from one or a plurality of orthogonal or tilted compound jets contains substantial pneumatic energy in the form of both kinetic and potential energy and this unharnessed pneumatic energy can be used to achieve positional stability of a pneumatically levitated moveable substrate.

Positional stability of the moveable substrate during pneumatic levitation is achieved most readily when the stationary fluid emitting support contains fluid collimating conduits used for the generation of fluid jets—tilted or orthogonal, compound or single—that impinge within the interior impingement area on the surface of the opposing moveable substrate that is within the confines of the area enclosed by the walls of the levitation stabilizing structure that is located on and in contact with the moveable substrate surface that opposes and faces the stationary gas emitting support surface, as shown in FIG. 17. The location of the levitation stabilizing structure on the moveable substrate is a feature that distinguishes the inventive method from all other previous attempts to address positional stability during pneumatic levitation. Furthermore, the inventive method is not restricted to planar plate-like substrates although planar substrates are preferred. Additionally, the use of compound jets during fluidic levitation is a distinguishing feature of the inventive method from all other previous attempts to address delivery of chemically reactive fluids during fluidic levitation.

FIG. 18 discloses another embodiment of the method of compound fluid flow formation employed in apparatus 20. FIG. 18a shows an isometric view of three fluid delivery tubes: an outer sheath fluid delivery tube 80 and an array of two parallel collinear fluid delivery tubes 110. FIG. 18a shows an isometric view of an assembly of collinear fluid delivery tubes that can be incorporated into apparatus 20 for the purposes of producing a compound collinear fluid flow and the structure of 18a for providing a compound collinear fluid flow is comprised of an outer sheath gas delivery tube 80 and an array of collinear parallel gas delivery tubes 110. The array of collinear parallel gas delivery tubes 110 consists of a plurality of parallel tubes, the cross-sectional shape of each tubes being arbitrary with the provision that a hollow region exists for gas to flow through, and each of the tubes may contain a gas of differing composition. Thus, in an embodiment, the compound-gas-jet structure includes a plurality of axially parallel tubes.

The tubes employed in the array structure 110 for producing a collinear jet can have a cross-sectional shape of a simple polygon, convex or concave, with n vertices, where $n \geq 3$. As mentioned previously, oval and circular shapes are considered polygons with an infinitely large number of vertices and sides and thus are permissible for use in construction of parallel tube array 110. Each gas delivery tube in FIG. 18a is in individual fluid communication with its own gas source and flow control mechanism such that the flow of gas in each tube of FIG. 18a, including the outer sheath gas delivery tube 80, does not mix with any other gas until it reaches the exit orifice gas delivery tube array 110. FIG. 18b shows a plan view of the structure disclosed in FIG. 18a for producing a compound collinear fluid flow from apparatus 20 and contains outer sheath gas delivery tube 80 and inner array of collinear parallel gas delivery tubes 110. Each gas delivery tube in the collinear fluid delivery tube array 110 can be considered a fluid injection tube or fluid delivery tube whose fluid composition can be changed as desired using, for example, a switchable 3 way valve that is in fluid communication with two fluids of two different compositions.

FIG. 18b shows a cross-section of the three fluid delivery tubes comprised of outer sheath fluid delivery tube 80 and the two polygonal collinear fluid delivery tubes 112 and 114 that comprise the array 110 of parallel collinear fluid delivery tubes. The two collinear fluid delivery tubes 112 and 114 are shown having a circular shape in FIG. 18b. When fluids are flowing through fluid delivery tubes 80, 112, and 114 it is clear that fluids flowing through fluid delivery tubes 112 and 114 of array 110 are not flowing coaxially. Fluids flowing through fluid delivery tubes 112 and 114 of array 110 are flowing in a collinear fashion parallel to the central axis of outer sheath fluid delivery tube 80. The spatial distribution of composition produced in the compound fluid flow emanating from the arrangement of fluid delivery tubes shown in FIGS. 18a and 18b is collinear with the axis of the outermost fluid delivery tube and in this disclosure is called a collinear compound fluid flow. The collinear arrangement of fluid flows distinguishes collinear compound fluid flow from coaxial compound fluid flow. In this disclosure collinear compound fluid flows will be referred to according to the literature conventions established by Hertz and Hermanrud (loc cit), fluids that flow in the interior of a compound fluid flow will be called primary fluids. Fluids that are in contact with and surrounded the primary fluid as a sheath are called secondary fluids. FIG. 18c shows a compositional cross-section of one possible embodiment of a collinear compound fluid flow emanating from the collinear compound fluid delivery tube arrangement shown in FIGS. 18a and 18b. FIG. 18c shows that the cross-section of the compound fluid flow emanating from end of collinear fluid delivery tubes 80, 112, and 114 in FIG. 18a is spatially non-uniform and non-axially symmetric in composition when a primary fluid 86 flows through tube 112 and secondary fluid 88 flows through coaxial tubes 80 and 114. FIG. 18d shows that the cross-section of the compound fluid flow emanating from end of collinear fluid delivery tubes 80, 112, and 114 in FIG. 18a is spatially non-uniform in composition when a primary fluid 86 flows through collinear fluid delivery tubes 112 and 114 and secondary fluid 88 flows through coaxial tubes 80. The collinear arrangement of fluid delivery tubes shown in FIGS. 18a and 18b can be expanded to employ three or more fluids to form more complicated compound fluid flows comprised of three or more collinear compound fluid flows.

The compound collinear fluid flow delivery assembly 120 shown in FIG. 19 provides a more complete understanding of the use of the collinear fluid delivery tube arrangement of FIG. 18a in compound jet forming apparatus 20. Collinear fluid delivery tubes 80, 112, and 114 are in fluid communication with valves 92, 96, and 94 respectively. Valves 94 and 96 are three way controllable valves in fluid communication with reactive fluid inlet 116 and chemically inert fluid inlet 118. Valve 92 is in fluid communication with inert fluid inlet 118 and 2 way valve 92 controls the supply of chemically inert secondary fluid 88 to the collinear compound fluid flowing through collinear fluid delivery tube 80. The fluid inlets 116 and 118 are in fluid communication with pressurized-gas sources containing chemically reactive and chemically non-reactive gasses, respectively. The switchable valves 94 and 96 determine the location of the chemically reactive primary fluid in the collinear compound fluid flow exiting collinear fluid delivery tubes 80, 112, and 114. When switchable valve 94 allows fluid communication between reactive fluid inlet 116 and collinear fluid delivery tube 114, then the primary fluid flows through collinear fluid delivery tube 114 and the exiting compound fluid flow has a compositional cross-section equivalent to that shown in FIG. 18c. Similarly in another embodiment, when switchable valve 96 allows fluid communication between reactive fluid inlet 116 and collinear fluid delivery tube 112 and the chemically reactive primary fluid flows through collinear fluid delivery tube 112 the exiting compound fluid flow has a compositional cross-section equivalent to that shown in FIG. 18c. In both configurations chemically inert secondary fluid flows in the volume between outer sheath fluid delivery tube 80 and collinear fluid delivery tubes 112 and 114. In another embodiment of apparatus 20, the compound collinear fluid flow delivery assembly 120 of FIG. 19 has outer sheath fluid delivery tube 80 extended beyond collinear fluid delivery tubes 114 and 112 and connected directly to fluid collimating conduit 14 of the stationary fluid emitting support by outlet 19 of apparatus 20. In an additional embodiment, the internal diameter of outer sheath fluid delivery tube 80 extended beyond collinear fluid delivery tubes 114 and 112 is reduced in a smooth and monotonic fashion or the outlet 19 of apparatus 20 is reduced in a smooth and monotonic fashion to match the internal diameter of fluid collimating conduit 14 thereby providing a way of hydrodynamically focusing the collinear compound fluid flow prior to formation of the collinear compound jet emanating from fluid collimating conduit 14 in the stationary fluid emitting support through which fluid will flow. In apparatus 20, the fluid outlet 19 that is in fluid communication with fluid collimating conduit 14 can be convergent or divergent, depending on whether the diameter of fluid collimating conduit 14 is larger or smaller than the inner diameter of fluid outlet 19. Regardless of the differences in diameter between fluid collimating conduit 14 and outlet 19, it is desirable that the diameter of the two elements 14 and 19 equal at the point of fluid connection between the two elements 14 and 19. Thus, in one embodiment fluid outlet 19 is monotonically convergent between apparatus 20 and fluid collimating conduit 14 to enable matched interior diameters at the fluid communication junction of apparatus 20 with fluid outlet 19 and to enable matched interior diameters at the fluid communication junction of fluid outlet 19 and fluid collimating conduit 14. In one embodiment, the use of the collinear compound fluid flow delivery assembly 120 in apparatus 20 is a method of controlling the fluid flow to temporally intersperse single-fluid flows with a fluid flow having two or more fluids.

FIG. 20 discloses another embodiment of the method of compound fluid formation employed in apparatus 20. FIG. 20a shows an isometric view of an array of collinear fluid delivery tubes 130 where at least one additional collinear fluid delivery tube has been added to array 110 of two collinear fluid delivery tubes 112 and 114 shown in FIG. 18. FIG. 20b shows an isometric view of an embodiment of the modified collinear fluid delivery tube arrangement comprised of multiple collinear fluid delivery tubes surrounded and enclosed by an outer sheath fluid delivery tube 80. FIG. 20b shows outer sheath fluid delivery tube 80 and an array of ten parallel collinear fluid delivery tubes 130. The internal diameters of the collinear fluid delivery tubes in array 130 can be the same or the internal diameters of the collinear fluid delivery tubes in array 130 can be different. Alternatively, the internal diameter of the collinear fluid delivery tubes in array 130 can be a selection of tubes, some of which have identical internal diameters and some of which have different internal diameters.

FIG. 20c shows a cross-section of the modified collinear fluid delivery tube arrangement comprised of outer sheath fluid delivery tube 80 and an array of ten collinear fluid delivery tubes 130 that is surrounded and enclosed by outer sheath fluid delivery tube 80. The cross-sectional image of FIG. 20c shows a dotted hexagonal outline 98 that defines one embodiment of the arrangement of collinear fluid delivery tubes in array 130. Referring to FIG. 20c, each vertex of the dotted hexagonal outline coincides with the center of a tube in the modified collinear fluid delivery tube array 130. In the embodiment of the modified collinear fluid delivery tube arrangement shown in FIG. 20c the cross-sectional arrangement of the collinear fluid delivery tubes in collinear fluid delivery tube array 130 is based on hexagonally close packed array; however, it is recognized that other packing arrangements of fluid delivery tubes in the collinear fluid delivery tube array are possible and can be preferred for some applications. For example, in an alternate embodiment the array of collinear tubes are arranged in a packed array where the cross-sectional view of the arrangement of the packed array shows that each tube occupies the vertex of a square or some other regular planar polygon. In some applications it can be preferable to have the collinear fluid delivery tubes of array 130 arranged randomly within the cross-sectional area of the outer fluid delivery tube 80. FIG. 20c shows a hexagonal arrangement of gas delivery tubes 130 as indicated by hexagonal outline 98 indicating a hexagonal tube array around located around collinear injection tube 112. Collinear fluid delivery tube 112 is located at the center of the hexagonal array outline 98 and a second collinear fluid delivery tube 114 is identified that is adjacent to collinear injection tube 112. FIG. 20c shows an inner array of collinear parallel gas delivery tubes 130 encompassed and surrounded by outer sheath gas delivery tube 80. Each gas delivery tube in the collinear parallel gas delivery tube array 130 can be considered a fluid delivery tube whose fluid composition can be changed as desired using, for example, a switchable 3 way valve that is in fluid communication with two fluids of two different compositions.

Referring to FIG. 20, the array of collinear parallel gas delivery tubes 130 consists of a plurality of axially parallel tubes, the cross-sectional shape of each of the tubes being arbitrary with the provision that a hollow region exists for gas to flow through, and each of the tubes may contain a gas of differing composition. The tubes employed in the array structure 130 for producing a collinear jet can have a cross-sectional shape of a simple polygon, convex or concave, with n vertices, where n≥3. As mentioned previously, oval and circular shapes are considered polygons with an infinitely large number of vertices and sides and thus are permissible for use in construction of parallel tube array 130.

Referring again to FIG. 20c a method for use of the modified collinear fluid delivery tube arrangement shown in FIG. 20c will be described. When the fluid flow in outer sheath fluid delivery tube 80 and collinear fluid delivery tube array 130 is comprised of fluids with identical chemical composition, then a fluid flow of uniform chemical composition can be formed from the modified collinear fluid delivery tube arrangement shown in FIG. 20c.

When fluids are flowing through fluid delivery tubes 80, and 112, and 114 of array 130 it is clear that fluids flowing through fluid delivery tubes 112 and 114 of array 130 are not flowing coaxially with respect to the fluid flow from the outer sheath fluid delivery tube 80. Fluids flowing through fluid delivery tubes 112 and 114 of array 130 are flowing in a collinear fashion parallel to but not concentric with the central axis of outer sheath fluid delivery tube 80. The spatial distribution of composition produced in the compound flow emanating from the arrangement of fluid delivery tubes is similar to that shown in FIGS. 18a and 18b and is collinear with the axis of the outermost fluid delivery tube and in this disclosure is called a collinear compound fluid flow. The collinear arrangement of fluid flows distinguishes collinear compound fluid flow from coaxial compound fluid flow. In this disclosure collinear compound fluid flows will be referred to according to the literature conventions established by Hertz and Hermanrud (loc cit), fluids that flow in the interior of a compound fluid flow will be called primary fluids. Fluids that are in contact with and surround the primary fluid as a sheath are called secondary fluids. The collinear array 130 of fluid delivery tubes shown in FIG. 20 can be employed with three or more fluids to form more complicated compound fluid flows comprised of three or more collinear compound fluid flows. A collinear compound fluid flow can be formed by changing the fluid composition of the fluid flowing through one of the fluid delivery tubes in the collinear fluid delivery tube array 130. In one embodiment, a chemically reactive fluid flows through collinear fluid delivery tube 112 whilst all other tubes in the collinear fluid delivery tube array 130 have a chemically inert fluid flowing through them. The chemically reactive fluid flowing through collinear fluid delivery tube 112 is the primary fluid of the compound fluid flow and the secondary fluid of the compound fluid flow is furnished by the combination of all other fluid flows from the remaining nine collinear fluid delivery tubes in array 130 and the fluid flow from the outer sheath fluid delivery tube 80. In another embodiment, a chemically reactive fluid flows through collinear fluid delivery tube 114 whilst all other tubes in the collinear fluid delivery tube array 130 have a chemically inert fluid flowing through them. The chemically reactive fluid flowing through collinear fluid delivery tube 114 is the primary fluid of the compound fluid flow and the secondary fluid of the compound fluid flow is furnished by the combination of all other fluid flows from the remaining nine collinear fluid delivery tubes in array 130 and the fluid flow from the outer sheath fluid delivery tube 80. In a third embodiment, a chemically reactive fluid flows through collinear fluid delivery tubes 112 and 114 whilst all other tubes in the collinear fluid delivery tube array 130 have a chemically inert fluid flowing through them. The chemically reactive fluid flowing through collinear fluid delivery tubes 112 and 114 is the primary fluid of the compound fluid flow and the secondary fluid of the compound fluid flow is furnished by the combination of all other fluid flows from the remaining nine collinear fluid delivery tubes in array 130 and the fluid flow from the outer sheath fluid delivery tube 80. The modified collinear fluid delivery tube arrangement shown in FIG. 20c thus provides a means for producing a plethora of different types of compound fluid flows the number of which is determined by the number of possible combinations of fluids that flow through the various tubes in the array. In array 130 there are, for example, 100 different ways to arrange the flow of two different fluids in the 10 collinear fluid delivery tubes, suggesting multiple opportunities for optimizing a compound fluid flow to maximize delivery of a chemically reactive primary fluid while reducing chemical contamination of the fluid delivery system by maximizing the effectiveness of the secondary fluid of the compound fluid flow.

This is a distinctive and inventive feature of the modified collinear fluid delivery tube arrangement. Array 130 also functions as a means to ensure laminar flow in the compound flow. This is a second distinctive and inventive feature of the modified collinear fluid delivery tube arrangement. In one embodiment the collinear fluid delivery tube array 130 can be substituted for the array of parallel fluid delivery tubes 110 shown in FIG. 19 thereby resulting in a modified collinear compound fluid flow delivery assembly that is useful for fluidic levitation.

It is preferred that the chemical composition flowing through volume between the outer sheath gas delivery tube 80 and the array of parallel gas delivery tubes 130 be a chemically unreactive fluid in the gaseous state such as argon or nitrogen. In one embodiment, flow straightening tubes in volume between the outer sheath gas delivery tube 80 and the array of parallel gas delivery tubes 130 are used to ensure laminar flow of a chemically unreactive fluid in the volume between the outer sheath gas delivery tube 80 and the array of parallel gas delivery tubes 130. When a chemically unreactive fluid is flowing through volume between the outer sheath gas delivery tube 80 and the array of parallel gas delivery tubes 130 then the structure shown in FIGS. 20a, 20b, and 20c manifests the advantage of producing a fluid flow with a collinear compound structure that provide a physical barrier on the outside of the jet through which the reactive chemicals from the interior of the collinear fluid flow must pass before contacting a surface of the fluid delivery system such as the interior surface a piece of tubing or the interior surface of a fluid collimating conduit in the stationary support through which fluid will flow.

The advantage to using collinear compound fluid flow and variants thereof, as a way of producing, transporting, and delivering a gas flow containing a reactive gas mixture to the stationary support, is to prevent and minimize contact of reactive chemical materials in the jet with the sidewalls of the fluid collimating conduits, orifices, bores, and nozzles in the stationary support plate, thereby avoiding chemical contamination of the fluid collimating conduits, orifices, bores, and nozzles in the stationary support. It is particularly advantageous to have the outermost sheath of a collinear compound fluid flow comprised of an essentially inert, chemically unreactive gas such as argon or nitrogen so that reactive chemicals can only contact the sidewalls, nozzles, bores, fluid collimating conduits, and orifices of the stationary support and associated fluid delivery tubing using sideways gaseous diffusion. For example, if collinear fluid flow comprised of an inner collinear fluid flow of water vapor in surrounding nitrogen sheath is prepared then the water will not only travel collinearly and coaxially with the nitrogen flow but it will also begin to diffuse radially outward along the radius of the jet. The diffusion coefficient for water in nitrogen at room temperature is between 0.2 and 0.3 $cm^2$ atm $sec^{-1}$ and at the fluid velocity normally employed in substrate processing, this diffusion along the radius of the fluid flow and normal to the direction of fluid flow (normal to the stream line) is much slower than the transport speed of water in nitrogen along the fluid flow direction (along the stream line), thereby limiting potential contamination of the internal walls of the apparatus.

The use of the structure shown in FIG. 20c for generating a collinear jet will now be described for the purposes of pneumatic levitation with variable gas compositions. Initially, all gas flowing through the outer sheath gas delivery tube 80 and the array of parallel gas delivery tubes 130 is the same chemical composition. Preferably the initial composition of the gas flowing in the assembly comprised of elements 80 and 130 is an inert gas such as nitrogen or argon. The composition of the gas flowing through collinear fluid delivery tube 112 in element 130 is changed to a different chemical composition by switching of a valve so that chemically reactive fluid flows through collinear fluid delivery tube 112 for a period of time, after which the gas flowing through collinear fluid delivery tube 112 is switched back to inert gas. After a predefined time period, a valve attached to collinear fluid delivery tube 114 is switched to allow a chemically reactive fluid to flow through collinear fluid delivery tube 114 for a set period of time after which time the gas composition in collinear fluid delivery tube 114 is switched back to inert gas. The timed sequence described is the gas exposure sequence that is similar to that employed in many atomic layer deposition processes for monolayer formation on a substrate surface. In one embodiment, all gases are delivered to the moveable substrate through the use of a collinear compound fluid flow produced using elements 80 and 130 as part of apparatus 20 that is employed to furnish the fluid flow employed to pneumatically levitate a moveable substrate by Bernoulli levitation through the use of a single orthogonal jet emanating from stationary support 12 through which fluid will flow that impinges on a moveable substrate 10 in an orthogonal manner. The moveable substrate 10 may have a levitation stabilizing structure on the opposing surface facing the orthogonal jet, thereby providing stable pneumatic levitation conditions during processing. The use of three way valves can be particularly advantageous when the composition of the gas in a gas delivery tube, like for example a collinear fluid delivery tube 112 or 114, is frequently changed between an inert fluid and a chemically reactive fluid containing a reactive precursor molecule. In one embodiment, the use of the modified collinear compound fluid flow delivery assembly of FIGS. 20 and 21 in apparatus 20 is a method of controlling the fluid flow to temporally intersperse single-fluid flows with a fluid flow having two or more fluids. It is recognized that the mass flow rates of fluids flowing through array 130 and outer sheath 80 may differ for the flow velocities of all fluids to match at the fluid contact point of apparatus 20 because gas velocity is dependent on the cross-sectional area of the exit orifice where the two fluids come into contact. It is within the scope of the invention that the flow velocity of the gas in each of gas delivery tubes in the parallel gas delivery tube array 130 can be equal to the gas flow velocity of the gas flowing between outer sheath gas delivery tube 80 and array of parallel gas delivery tubes 130. It is within the scope of the invention that the flow velocity of the gas in each of gas delivery tubes in the parallel gas delivery tube array 130 can be unequal to the gas flow velocity of the gas flowing between outer sheath gas delivery tube 80 and array of parallel gas delivery tubes 130 thereby allowing gas dynamic focusing of the primary fluid. A compound collinear fluid flow is formed by the combination of the fluid flows occurring at the exit of the array of parallel gas delivery tubes 130. Each fluid flow in the compound collinear fluid flow is parallel to the same jet axis and the chemical composition of gas in each gas delivery tube contributing to the total fluid flow can be variable as a function of time. The formation of a collinear compound fluid flow is effective when flow velocities of all gasses in the gas delivery tubes are equal. It is preferred that the flow velocities of all fluid in the fluid delivery tubes are limited to regime of flow velocities exhibiting laminar flow characteristics as is familiar to those skilled in the art of fluid mechanics. In another embodiment, it can be advantageous in some embodiments to have the fluid velocity of the secondary fluid larger than the fluid velocity of the primary fluid and thus to have unequal fluid velocities at the exit location where the gases contact because this can be used to advantage for hydrodynamic or gas dynamic focusing of the flow of one of the chemically reactive gases to further reduce the likelihood of fluid delivery system contamination.

Further clarification of the disclosed inventive method of fluidic levitation is furnished by the embodiment of an apparatus for fluidic levitation of a moveable substrate with levitation stabilizing structure shown in FIG. 21. FIG. 21 is a cross-sectional view illustrating another embodiment of the present inventive method for practicing fluidic levitation with chemically reactive fluids wherein the preferred fluid is a gaseous fluid. FIG. 21 shows a moveable substrate 10 with a levitation stabilizing structure 30 fabricated thereupon where the surface of moveable substrate 10 with the levitation stabilizing structure 30 opposes the gas emanating surface of stationary support 12 with fluid collimating conduit 14. Fluid collimating conduit 14 is in fluid communication with a pressurized fluidic source emanating from an apparatus for production of compound fluid flows and jets 20 through fluid outlet 19. Apparatus 20 is, in turn, in fluid communication with non-reactive gas inlet 118 or reactive gas inlet 116 through valves 92, 94, 96, and 98.

FIG. 21 illustrates the appropriate relative positions of the elements moveable substrate 10 with levitation stabilizing structure 30 relative to the stationary support 12 through which fluid will flow and fluid collimating conduit 14 for the use of levitation stabilizing structure 30 to be effective as a method of positional stabilization during fluidic levitation with an orthogonal jet emanating from fluid collimating conduit 14. It has been found that the use of the levitation stabilizing structure as a method for improving the lateral stability of a moveable substrate during pneumatic levitation only requires that the fluid jet from jet forming fluid collimating conduit 14 of stationary support 12 through which fluid will flow and impinge on the surface of moveable substrate 10 within the interior impingement area defined by the surface bounded and enclosed by the walls of the levitation stabilizing structure 30 fabricated on the surface of moveable substrate 10. It is preferred that the fluid jet from jet forming fluid collimating conduit 14 of stationary fluid emitting support 12 impinge on the surface of moveable substrate 10 near the centroid of interior impingement area defined by the area enclosed by the interior walls of the levitation stabilizing structure 30 fabricated on the surface of moveable substrate 10. It is preferable that the centroid of the interior impingement area enclosed by the interior walls of the levitation stabilizing structure 30 fabricated on the surface of moveable substrate 10 be located within the impingement area enclosed by the interior walls of the levitation stabilizing structure 30. The fluid collimating conduit on the stationary fluid emitting support is an alignment feature on the surface of the stationary fluid emanating support and the centroid of the interior impingement area of the levitation stabilizing structure is aligned with the alignment feature wherein the alignment feature is a fluid collimating conduit on the surface of the stationary fluid emanating support. Thus, according to the first three steps of the process sequence disclosed in FIG. 14 the method for fluidic levitation includes the steps of:

1. providing a substrate with a levitation stabilizing structure on a surface of a substrate and positioning said substrate proximate to a fluid emitting surface of a stationary fluid emanating support through which fluid will flow in a conformal-wise manner with the levitation stabilizing structure overlaying the surface of the substrate and facing the stationary fluid emanating surface;

2. initiating at least one collimated fluid flow from the stationary fluid emanating support surface through which fluid will flow to produce a collimated fluid jet; and, 3. controlling the collimated fluid flow emanating from the stationary fluid emanating support to fluidically levitate the substrate and levitation stabilizing structure proximate to the surface of the stationary fluid emanating support through which fluid will flow.

It has been observed experimentally that the alignment of the centroid of the interior impingement area of the levitation stabilizing structure with at least one alignment feature on the surface of the stationary fluid emanating support is not highly critical as the substrate with the levitation stabilizing structure exhibits self-alignment during the levitation process. The reasons for self-aligning behavior during pneumatic levitation have been discussed previously. This is a distinct advantage of using a levitation stabilizing structure during pneumatic levitation.

FIG. 21 also shows an embodiment of an apparatus 20 for production of compound fluid flows and jets. The compound fluid flow forming apparatus 20 is comprised of multiple elements including at least one modified collinear compound fluid flow delivery assembly where the array 110 of two collinear fluid delivery tubes shown in FIG. 19 has been replaced with an array 140 of collinear fluid delivery tubes comprised of three collinear fluid delivery tubes. Apparatus 20 for production of compound fluid flows is additionally comprised of means for controlling the temperature, pressure, and flow of at least one fluid. The additional means for controlling the temperature, pressure, and flow of at least one fluid of compound fluid forming apparatus 20 of FIG. 21 are not shown. The modified collinear compound fluid flow delivery assembly in FIG. 21 is additionally comprised of collinear fluid delivery tube array 140, outer sheath fluid delivery tube 80, and valves 92, 94, 96, and 98 and provides a means for controlling the composition of the compound fluid flow. The compound fluid forming apparatus 20 shown in FIG. 21 has at least two inlets. Inlet 116 allows a first reactive fluid to flow into apparatus 20 and inlet 118 allows a second non-reactive fluid to flow into apparatus 20. Apparatus 20 has a fluid outlet 19 in fluid communication with fluid collimating conduit 14. Fluid outlet 19 of apparatus 20 may also serve as a means to alter the compound fluid flow using hydrodynamic or gas dynamic focusing methods prior to formation of a compound collinear jet emanating from fluid collimating conduit 14. The function of apparatus 20 is to combine at least 2 fluid flows, a first fluid flow and a second fluid flow, to form a compositionally segregated compound fluid flow exiting apparatus 20 through outlet 19 and flowing though fluid collimating conduit 14 of the stationary fluid emitting support. In one embodiment the first fluid flow can be a reactive fluid and the second fluid flow can be a non-reactive fluid and the compound fluid flow is a collinear compound fluid flow. Unlike any of the prior art utilizing fluid flows for fluidic levitation, apparatus 20 is employed to produce a chemically reactive compound fluid flow exiting apparatus 20 at fluid outlet 19, said chemically reactive compound fluid flow being a spatially non-uniform composition of matter comprised of a chemically reactive fluid flow encased and surrounded by a chemically non-reactive fluid flow. A spatially non-uniform composition of matter is a composition of matter whose chemical composition changes depending on the sampling location within the composition of matter volume. The said chemically reactive compound fluid flow emanating from outlet 19 of apparatus 20 is injected through fluid collimating conduit 14 to form a spatially non-uniform compound jet that can be made non-reactive at the critical fluid contact regions of the fluid delivery system employed for fluidic levitation by using a chemically inert and chemically non-reactive fluid as the secondary fluid that surrounds, contacts and encloses an inner primary fluid flow of chemically reactive fluid.

The modified compound collinear fluid flow delivery assembly shown as part of apparatus 20 in FIG. 21 is now described in more detail. Collinear fluid delivery tubes of array 140 are in fluid communication with valves 94, 96, and 98 respectively. Valves 94, 96, and 98 are three way controllable valves in fluid communication with reactive fluid inlet 116 and chemically inert fluid inlet 118. Valve 92 is in fluid communication with inert fluid inlet 118 and valve 92 controls the supply of chemically inert secondary fluid to the collinear compound fluid exiting from apparatus 20 through fluid outlet 19. The switchable valves 94, 96, and 98 determine the location of the chemically reactive primary fluid in the collinear compound fluid flow exiting outer sheath fluid delivery tube 80 and collinear fluid delivery tube array 140. For example, when switchable valve 94 allows fluid communication between reactive fluid inlet 116 and a collinear fluid delivery tube of array 140, then the primary fluid flows through one of the collinear fluid delivery tubes and the exiting compound fluid flow has a compositional cross-section similar to that shown in FIG. 21c. Similarly in another embodiment, when switchable valve 96 allows fluid communication between reactive fluid inlet 16 and a collinear fluid delivery tube of array 140 and the chemically reactive primary fluid flows through said collinear fluid delivery tube and the exiting compound fluid flow has a compositional cross-section again similar to that shown in FIG. 18c. In both configurations chemically inert secondary fluid flows in the volume between outer sheath fluid delivery tubes 80 and collinear fluid delivery tube array 140. In another embodiment of apparatus 20 the default configuration of valves 92, 94, 96, and 98 allows chemically inert fluid to flow through all fluid delivery tubes in apparatus 20. In another embodiment of apparatus 20, the modified compound collinear fluid flow delivery assembly of FIG. 21 has outer sheath fluid delivery tube 80 extended beyond collinear fluid delivery tube array 140 and connected directly to fluid collimating conduit 14 of the stationary fluid emitting support by outlet 19 of apparatus 20. In an additional embodiment, the internal diameter of outer sheath fluid delivery tube 80 extended beyond collinear fluid delivery tubes array 140 is reduced in a smooth and monotonic fashion or the outlet 19 of apparatus 20 is reduced in a smooth and monotonic fashion to match the internal diameter of fluid collimating conduit 14 thereby providing a way of hydrodynamically or gas dynamically focusing the collinear compound fluid flow prior to formation of the collinear compound jet emanating from fluid collimating conduit 14 in the stationary fluid emitting support through which fluid will flow. In apparatus 20, the fluid outlet 19 that is in fluid communication with fluid collimating conduit 14 can be convergent or divergent, depending on whether the diameter of fluid collimating conduit 14 is larger or smaller than the inner diameter of fluid outlet 19. Regardless of the differences in diameter between fluid collimating conduit 14 and outlet 19, it is desirable that the diameter of the two elements 14 and 19 be equal at the point of fluid connection between the two elements 14 and 19. Thus, in one embodiment the cross-sectional area of fluid outlet 19 is monotonically convergent between apparatus 20 and fluid collimating conduit 14 to enable matched interior cross-sectional areas and cross-sectional shapes at the fluid communication junction of apparatus 20 with fluid outlet 19 and to enable matched interior cross-sectional areas and cross-sectional shapes at the fluid communication junction of fluid outlet 19 and fluid collimating conduit 14.

The compound fluid forming apparatus 20 of FIG. 21 includes temperature control mechanisms, pressure control mechanisms, and flow control mechanisms providing means for accurately controlling the temperature, pressure, and flow of the fluids that are employed for the purpose of producing a collimated compound fluid jet. A typical pressure control mechanism for controlling pressure of gaseous and liquid fluids include both passively and actively controlled pressure regulators including electronically controlled pressure regulators and other types of pressure regulator methods known in the art. A typical temperature control mechanism for controlling the temperature of a fluid include passive and actively controlled heating and cooling units including heat exchangers, heating tapes and coils as well as cooling coils through which the fluid passes, temperature controlled reservoirs, and other devices known to those skilled in the art of temperature control of fluids. Temperature and pressure control loops employed to achieve stable fluid temperatures and fluid pressures may incorporated the use automated temperature and pressure control units. Typical means for controlling and measuring the flow of one or more gaseous fluids include the use of orifices of known diameter with known pressure-flow relationships, gas flow meters, flow controllers, control valves, and variable control valves of all types including mass flow meters with valves, mass flow controllers, rotameters with and without variable valves, Coriolis flow meters coupled with flow controllers, turbine flow meters, pitot based flow meters and other types of fluid flow meters familiar to those skilled in the art of process control of flowing fluid media where the fluid is a liquid or a gas.

The mechanisms for controlling fluid composition providing means for controlling the fluid composition are an important feature of the apparatus. For example, specific valve configurations can be employed in apparatus 20 of FIG. 21 to allow the apparatus 20 to produce compound jets whose spatially non-uniform composition can be varied as a function of time as the collinear compound fluid flows through fluid collimating conduit 14. This is a distinct advantage because it allows the surface of moveable substrate 10 that opposes the stationary fluid emitting support to be exposed to a concentration of a reactive fluid for a known amount of time. Exposure of a surface to a chemical species for a known amount of time is also known as surface exposure or surface dosing and an apparatus that provides a means to dose a surface with a specific reactive fluid flow is extremely useful.

It is further recognized that the entire assembly represented by the cross-sectional view of FIG. 21 could be rotated by 180 around an axis normal to the plane of FIG. 21 and the positional configuration will still be functional. In other words, moveable substrate 10 can still be supported during levitation when the assembly shown in FIG. 21 is rotated and the fluid velocity vector of the orthogonal collimated fluid jet, compound or otherwise, is parallel to the direction of gravitational pull. The use of a levitation stabilizing structure 30 during fluidic levitation does not alter the function of a fluidic levitation apparatus employing Bernoulli airflow with respect to physical orientation or attitude of the apparatus, and in fact improves the robustness of fluidic levitation with respect to tilting of the gas-emanating stationary support regardless of the apparatus attitude and orientation. Fluidic levitation can take place when the velocity vector of the orthogonal fluid jet is essentially parallel to the gravitational force vector or when the velocity vector of the orthogonal fluid jet is essentially anti-parallel to the gravitational force vector. The presence of a levitation stabilizing structure 30 on the moveable substrate surface does not alter the relationships between the pneumatic forces that are generated by the fluid flow from the orthogonal jet that flows between the substrate surface and the fluid emitting support surface and the gravitational force vector that are inherently present in fluidic levitation processes employing Bernoulli airflow. This is a distinct advantage of the invention.

As was previously disclosed in FIG. 13, it is also recognized that the stationary support through which fluid will flow is not restricted to a planar configuration as illustrated in FIG. 21. The features of the stationary support comprise the following: the stationary fluid emitting support contains at least one fluid collimating conduit in fluid communication with a manifold and a pressurized fluid source containing pressurized fluid, said fluid collimating conduit having a cross-sectional area less than or equal to ¼ of the surface area of the interior impingement area of the levitation stabilizing structure; the surface area of the stationary fluid emitting support is at least equal to the surface area of the interior impingement area on the moveable substrate; and the fluid flow between the stationary support and the moveable substrate is characterized by radial flow patterns that are essentially symmetric with respect to the centroid of the interior impingement area. It is preferred that said fluid collimating conduit have a cross-sectional area less than or equal to ¼ of the impingement area enclosed by the walls of the levitation stabilizing structure.

Fluid mechanical models show that radial flow in the volume space between two topographically conformal surfaces is achieved when an orthogonal jet emanating from the stationary support impinges on the moveable substrate and the cross-sectional area of the fluid collimating conduit is less than or equal to ¼ of the opposing surface area of the moveable substrate and less than or equal to ¼ of the surface area of the stationary support that surrounds the fluid collimating conduit. If the cross-sectional area of the fluid collimating conduit has a larger cross-sectional surface area relative to the surface area of the opposing moveable substrate or the stationary support surface area, then radial flow will not fully develop and the characteristic pressure distributions (the low pressure radial flow expansion adjacent to the high pressure fluid jet impingement region) in the volume between the opposing moveable substrate surface and the stationary support surface will not fully develop leading to unpredictable fluidic levitation and, additionally, the levitation stabilizing structure will show unpredictable behavior with respect to stabilization of the moveable substrate lateral motion. The radial flow region in the volume between a moveable substrate and a stationary support is the volume region where parallel surfaces are present as the fluid expand is a radial fashion from the orthogonal jet source. Topographically conformal surfaces are also parallel surfaces in the sense that a normal extending from a point on one surface is also normal to the opposing surface at the point of intersection. When the moveable substrate is not topographically conformal to the stationary substrate radial flow diminishes, fluidic levitation becomes unpredictable, and stabilization of the moveable substrate lateral motion by a levitation stabilizing structure on the surface of the moveable substrate becomes unpredictable. Accordingly, in one embodiment, fully developed radial flow from an orthogonal jet in the volume between the moveable substrate and the stationary support is achieved when the surface area of the stationary support is greater than or equal to the surface area of the opposing moveable substrate so that the flow boundary for the radial flow region is the perimeter of the moveable substrate. For substrate processing of planar moveable substrates like silicon wafers or other planar substrates useful for microelectronics applications, it is preferred that the surface area of the stationary support is greater than or equal to the surface area of the opposing moveable substrate. In another embodiment, fully developed radial flow from an orthogonal jet in the volume between the interior impingement area on the moveable substrate and the stationary support is achieved when the surface area of the stationary support is greater than or equal to the surface area of the interior impingement area opposing moveable substrate so that one flow boundary for the radial flow region is the interior wall of the levitation stabilizing structure of the moveable substrate. Thus, for substrate processing of planar moveable substrates like silicon wafers or other planar substrate useful for microelectronics applications, it is preferred that the surface area of the stationary support is greater than or equal to the surface area of the interior impingement area on the surface of the opposing moveable substrate.

The advantages of incorporating pneumatic levitation during substrate processing have been previously enumerated. The use of pneumatic levitation is shown to be effective for film growth on the moveable substrate from the vapor phase such as is employed in vapor phase epitaxy. The use of pneumatic levitation with levitation stabilizing structures for atomic layer deposition is unknown but should be advantaged due to the rapid gas exchange properties of radial flow during pneumatic levitation with orthogonal jets. Without wishing to be bound by theory, it is thought that the rapid gas exchange leads to conditions where monolayer formation by surface adsorption processes on the moveable substrate is limited by diffusion from the gaseous fluid through the fluid boundary layer at the moveable substrate surface rather than by transport of reactants into and out of the reaction volume surrounding the moveable substrate surface. During pneumatic levitation of a moveable substrate using a single orthogonal jet emanating from a stationary support, the gas from the orthogonal impinging jet expands radially into the surrounding volume. As the fluid expands into cylindrical annuli of ever increasing radius, the volume increase of successive cylindrical annuli encountered as the fluid flows radially outward is directly proportional to the distance from the jet. Thus, if a pulse or small quantity of material is injected into the orthogonal jet and produces a number density of $\xi$ of molecules/unit volume at the impingement location of jet, as these molecules flow radially outward and are diluted by additional flow the number density of the molecules will vary as $(\xi/r)$ where r is the radial distance from the impingement location of the orthogonal jet on the moveable substrate. In other words, the number density or concentration of the molecules in the volume between the stationary support and the moveable substrate will decrease in a manner inversely proportional to the distance from the jet as the injected pulse flows radially outward. At the same time, both experimental measurements and theoretical calculations show that the velocity with which the molecules flow outward falls off in a manner that is inversely proportional to r—which means that the residence time of a molecule at a particular location is proportional to the distance from the jet. Thus, the product of the concentration of molecules, (which is inversely proportional to r), and the residence time, (which is proportional to r), is constant during radial flow outward from the jet impingement location. The product of concentration or molecular number density and residence time is known as exposure, and is related to the amount of time that a surface is exposed to a given molecular flux. Dose is exposure multiplied by time. The radial outward flow from the orthogonally impinging jet has the unique property that exposure of a surface to a vapor phase molecular species remains essentially constant as outward radial flow proceeds as long as the consumption of the molecular species by secondary processes is small in comparison to the initial molecular number density. This unique property of radial flow configurations is particularly advantageous for specific deposition processes involving surface adsorption like, for example, atomic layer deposition, or for any other process where uniform surface exposure is important to achieve spatial uniformity of a chemical reagent on a substrate surface. The velocities of the gaseous fluid phase as it undergoes outward radial expansion can be quite large. Gas velocities approaching the speed of sound are easily achievable and these high gas velocities lead to very rapid gas exchange in the volume region defined by the gas emanating support surface and the opposing surface of the moveable substrate. It is preferred that the gas velocities during substrate processing remain subsonic in order to minimize effects of sonic shock waves that can interfere with mass transport. Depending on the pneumatic levitation height, gaseous volume exchange as fast as 100 volume exchanges per second are possible. The advantages of rapid gas volume exchange have been previously disclosed in U.S. Pat. No. 5,370,709 with respect to vapor phase epitaxy processes where it is recognized that both particle contamination and chemical contamination by volatile impurities are minimized in processes where rapid gas exchange is present. Processes having rapid gas exchange can run faster, leading to higher process throughput, especially if gas phase reactants or impurities must be removed by a purge step while the process is running. The rapid gas exchange that is inherent to pneumatic levitation utilizing radial flow from a single orthogonal jet is particularly well suited for processes like, for example, atomic layer deposition or vapor priming, where gaseous reactants must be repeatedly swept away from the substrate surface during the process sequence.

Contrary to the teachings of U.S. Pat. No. 5,370,709 concerning the advantageous use of pneumatic levitation during substrate processing involving deposition processes, more recent art U.S. Pat. No. 6,289,842 B1 by Tompa describes a plasma enhanced chemical vapor deposition system that is a vertical reactor with rotating disc substrates specifically teaches that substrate levitation is not useful and is an impediment to deposition. U.S. Pat. No. 6,289,842 also specifically teaches the use of physical restraints to force the substrate to remain in a single position during deposition; however, U.S. Pat. No. 6,289,842 does not examine pneumatic or hydraulic levitation as the method of levitation and does not teach or anticipate the use of pneumatic levitation during deposition or as a method of chemically reactive fluid delivery. Additionally, U.S. Pat. No. 6,289,842 does not teach the use of a levitation stabilizing structure to stabilize the moveable substrate position during pneumatic levitation. The levitation method described in U.S. Pat. No. 6,289,842 involves levitation of a conducting substrate by a radiofrequency field thus, according to U.S. Pat. No. 6,289,842 the beneficial and advantageous use of pneumatic levitation or hydraulic levitation during substrate processing such as a chemical vapor deposition processing or an atomic layer deposition processing is not obvious.

U.S. Pat. No. 6,289,842 B1 teaches the use of a reactant gas distribution unit having a chamber for providing a uniform flow of carrier gas and a gas distribution chamber that includes baffling designed to preclude gas phase mixing of the reactants. Although a coaxial baffle configuration is disclosed in U.S. Pat. No. 6,289,842 B1, and the stated purpose of the coaxial baffle is for the separation of reactive materials, the flow into and out of the coaxial baffles is through porous material of limited conductance and, as such, the configuration does not allow high gas flow or gas velocity that is required for fluidic levitation using Bernoulli levitation methods. Furthermore, the objective of the reactant gas distribution unit of U.S. Pat. No. 6,289,842 B1 is to produce a uniform gas flow over the surface of the rapidly rotating substrate. The porous materials and baffling used in the reactant gas distribution unit taught in U.S. Pat. No. 6,289,842 B1 are not compatible with the pressures and flow velocities required for the formation of high speed orthogonal jets employed for pneumatic levitation, especially at ambient pressures near atmospheric pressure. Compound fluid flows, coaxial compound fluid flows and collinear compound fluid flows cannot be formed using the apparatus configurations taught in U.S. Pat. No. 6,289,842 B1. Therefore, the use of coaxial compound fluid flows or jets is not taught or anticipated by U.S. Pat. No. 6,289,842 B1. The use of compound jets in either a collinear or coaxial configuration for the segregation and delivery of reactive gaseous precursors is not taught or anticipated by U.S. Pat. No. 6,289,842 B1. The use of compound jets in either a collinear or coaxial configuration for the segregation and delivery of reactive gaseous precursors in a deposition process employing pneumatic levitation of a moveable substrate with a levitation stabilizing structure is not taught or anticipated by U.S. Pat. No. 6,289,842 B1.

In a separate publication Tompa et al. teach methods of simultaneously exposing the surface of a rotating substrate to a gas flow containing more than one reactive precursor during metal-organic chemical vapor deposition processes. (G. S. Tompa, A. Colibaba-evulet, J. D. Cuchiaro, L. G. Provost, D. Hadnagy, T. Davenport, S. Sun, F. Chu, G. Fox, R. J. Doppelhammer, and G. Heubner (2001) "MOCVD Process Model for Deposition of Complex Oxide Ferroelectric Thin Films", Integrated Ferroelectrics: An International Journal, 36:1-4, 135-152, DOI: 10.1080/10584580108015536). Tompa discloses several embodiments of compositional variation of gases along streamlines that are useful during chemical vapor deposition processes. For the purposes of this invention, a streamline is the curve that is instantaneously tangent to velocity vector of the flow at all times. Tompa teaches the use of gas flows in which the composition of the gas spatially varies along the streamlines of the gas flow because the composition of the gas varies as a function of time—a method that is useful for deposition processes like atomic layer deposition. Tompa further teaches that it is useful for the gas composition to vary both along stream lines, that is—parallel to the stream lines, as well as orthogonal to the stream lines, that is—perpendicular to the stream lines of the flow. Tompa also teaches the use of the resulting time varying gas flow embodiments for impingement on a substrate for the purposes of creating a thin film using thermal decomposition of a reactive precursor. Prior art, especially U.S. Pat. No. 4,413,022, teaches that composition variation along gas stream lines is advantageous for the purposes of atomic layer deposition; U.S. Pat. No. 4,413,022 also teaches the use of compositional variation perpendicular the gas flow streamlines as being advantageous for atomic layer deposition when combined with the use of a rotating substrate. The use of compound jets comprised of multiple collinear or coaxial jets provides a means to implement the compositional variation along streamline teachings of Tompa et al. and that of U.S. Pat. No. 4,413,022 in an inventive manner that was not anticipated by the prior art.

FIGS. 15 through 21 show detailed configurations of embodiments of apparatus 20 that can be incorporated into apparatus 150 to form compound gaseous fluid flows. The compound gaseous fluid flow of apparatus 150 is comprised of two or more gases including a first fluid and a second fluid wherein the first fluid is surrounded in at least one dimension by the second fluid and first and second fluid flows are collinear. The compound fluid flow of two or more gases can include at least a first, second and third fluids wherein the first fluid is separated in at least one dimension by the second fluid. In one embodiment, the apparatus 150 has a complex compound fluid flow wherein the at least two fluids are separated in at least one dimension is achieved by sequential switching of valves in apparatus 20 incorporated into apparatus 150 thereby allowing the formation of complex fluid flows of three or more fluids where the first fluid separated from the third fluid in at least one dimension by a second fluid. In one embodiment, the second fluid is inert. FIGS. 15, 16, and 17 illustrate portions of an embodiment of apparatus 20 incorporated into process apparatus 150 useful for forming the fluid flow in a collimated fluid flow comprised of at least two fluid flows that are coaxial. FIGS. 18, 19, 20, and 21 illustrate portions of an embodiment of apparatus 20 incorporated into process apparatus 150 useful for forming the fluid flow in a collimated fluid flow comprised of at least two fluid flows that are axially collinear. Pneumatic levitation of a substrate with a levitation stabilizing structure is a particularly useful method processing of a substrate when no physical contact to the substrate during processing is desired. FIG. 22 illustrates an embodiment of an apparatus for pneumatic levitation of a moveable substrate with a levitation stabilizing structure for the purpose of exposing the levitated substrate surface to a chemically or thermally reactive fluid during processing. Elements of FIG. 22 are also common to chamber designs utilizing condensed fluids during the substrate processing that employ hydraulic levitation as a method of non-contact substrate processing. Many processes can be modified to take advantage of pneumatic levitation by incorporating the invention of the levitation stabilizing structure on the moveable substrate. The apparatus of FIG. 22 provides a thin film deposition system for depositing a thin film on a moveable substrate using atmospheric pressure atomic-layer deposition. The apparatus of FIG. 22 for carrying out various processes on a substrate using pneumatic levitation with a levitation stabilizing structure will now be discussed.

FIG. 22 shows one embodiment of a pneumatically levitated moveable substrate processing apparatus 150. A container or chamber 152 is equipped with multiple feed throughs 1505. The chamber 152 can be fabricated from any material that has suitable mechanical and chemical properties for use as a containment chamber for the fluids or chemically reactive fluids employed during the substrate processing and pneumatic levitation of the substrate. Feed throughs 1505 provide communication between the interior of chamber 152 and the exterior of chamber 152. Feed throughs 1505 are used to provide communication across the wall of chamber 152 for fluids—said fluid being either liquid or gaseous or aerosol or dispersion. Feed through 1505 are used to provide communication across the wall of chamber 152 for electrical power transmission to elements of apparatus 150 located within chamber 152. Feed throughs 1505 are used to provide communication across the wall of chamber 152 for electrical signals from sensors for control loops as well as other types of electrical or mechanically generated signals that are acquired to aid process operation. Feed throughs 1505 used to provide electrical communication across the wall of chamber 152 for electrical signals for the purpose of process control are sometimes called instrumentation feed throughs 1505. Feed throughs 1505 may also be employed to provide communication of optical signals across the wall of chamber 152. Thus, feed throughs 1505 provide communication between the interior of chamber 152 and the exterior of chamber 152 and are employed to aid the execution of processes that are carried out on the interior of the chamber 152.

The chamber 152 can be gas tight, in other words, the chamber can be constructed so as to contain the gasses therein and prevent contamination of the internal gasses with substances located on the exterior of the chamber. In one embodiment, the atmosphere of chamber 152 is at a pressure substantially equal to the air pressure outside the chamber. In a further embodiment, the atmosphere of chamber 152 has a pressure greater than or equal to 1 psig. Typical gaseous contaminants considered for exclusion are water, carbon dioxide, amines and ammonia, sulfur based volatile compounds, volatile hydrocarbons, and oxygen. The process chamber 152 can include a means for monitoring the chemical composition of the internal volume of the chamber (not shown). Such means may include the use of spectroscopic methods such as mass spectrometry and gas phase vibrational spectroscopy, gas phase optical absorption spectroscopies—including the use of cavity ringdown spectroscopy. A feed through 1505 (not shown) is employed to allow the spectroscopic measurement instrumentation or other process feedback measurement instrumentation to communicate with the interior of chamber 152. The process chamber can include transparent windows 1515 for the purpose of visual process observation by human or machine observation means as well as for optional transmission of optical signals. The process chamber optionally includes a way of measuring the pressure and temperature inside the process chamber (not shown). The container or chamber 152 has a means for introducing and removing a sample, such as a door with a fluid tight seal 1510 through with a sample can be passed, said door 1510 being equipped with a means to achieve gas tight sealing to prevent or minimize chamber contamination. The container or chamber 152 also contains the stationary gas emitting support assembly 151 as well as other additional elements that will now be further described. The door 1510 of chamber 152 can be made compatible with cluster tool door interlock geometries or may interface directly with a Front Opening Unified Pod with a robotic automated material handling system for sequential processing of multiple substrates.

The process chamber 152 optionally includes a sample transport mechanism providing means for transporting the moveable substrate sample through door 1510 in and out of the container or chamber such as, for example, a robotic arm with a means to grasp the sample, such as an electrostatic chuck, a mechanical chuck, a Bernoulli wand, a Bernoulli chuck, a vacuum chuck, or a vacuum wand. An automatic material handling system can be interfaced with the chamber 152 utilizing door 1510. Alternately, the moveable substrate sample may by handled manually and transported in and out through the door 1510 for the purposes of performing processes on the moveable substrate sample.

The process apparatus 150 includes a stationary fluid emitting support 12 through which fluid will flow with a surface area at least as large as the surface area of the moveable substrate to be processed, said stationary support through which fluid will flow containing at least one fluid collimating conduit 14 in fluid communication with a plenum or manifold through fluid outlet 19, said plenum optionally contained in apparatus 20, that is in fluid communication with at least one pressurized source of gaseous fluid 1575 optionally through a feed through 1505. A moveable substrate 10 with a levitation stabilizing structure 30 opposing the fluid emitting surface of the stationary support is also shown in FIG. 22 to illustrate an embodiment of substrate positioning in apparatus 150.

The stationary support 12 through which fluid will flow can optionally be equipped with temperature sensors, position and distance indicating sensors to detect the presence of an opposing moveable substrate, a way of heating the stationary support itself, and a temperature control mechanism. The surface of gas-emanating stationary support assembly 12 can be essentially planar for use with essentially planar substrates or the surface of gas-emanating stationary support can be formed in such a way as to approximately replicate the 3 dimensional negative image of the three dimensional topography one or more regions inherent to the surface topography of the moveable substrate surface.

The process apparatus 150 includes a temperature control mechanism providing a means for controlling the temperature of at least one fluid. The process apparatus 150 includes a temperature control mechanism providing a means for controlling the temperature of one or more gaseous fluids contained in one or more plenums or manifolds, each plenum or manifold being capable of fluid communication with the fluid collimating conduit 14 of the stationary fluid emitting support 12. Temperature and pressure control units 1545 are used for controlling the temperature of one or more gaseous fluids contained in one or more plenums or manifolds each plenum or manifold being capable of fluid communication with the fluid collimating conduit 14 of the stationary fluid emitting support 12. Typical means for controlling temperature of gaseous fluids include both passively and actively controlled gas heating assemblies, including heating tapes and heat exchangers of any type familiar to those skilled in the art of temperature control. Typical means for controlling the temperature of one or more gaseous fluids include temperature feedback mechanisms controlling resistive heaters of all types, radiative heaters of all types, Hilsch vortex devices for production of hot and cold gases, inductive heating methods, the use of heat exchangers utilizing secondary exchange fluids whose temperature is regulated by any temperature control mechanism method familiar to those skilled in the art of heat exchangers and temperature control; methods of fluid temperature control based on mixing of hot and cold fluids to regulate gas temperature, and other temperature control methods familiar to those skilled in the art of process control of flowing fluid media. In one embodiment, temperature and pressure control units 1545 are employed to control the temperature of the inert gas flow from pressurized-gas source 1575, reactive precursor source #1 1565, and reactive precursor source #2 1570 as well as controlling the flow of inert gas from pressurized—gas source 1575, the flow of reactive precursor #1 from reactive precursor source #1 1565, and the flow of reactive precursor #2 from reactive precursor source #2 1570 using flow controllers 1560. In the embodiment shown in FIG. 22, inert gas from pressurized-gas source 1575 is a carrier gas for reactive precursor #1 from reactive precursor source #1 1565 and inert gas from pressurized inert gas source 1575 is a carrier gas for reactive precursor #2 from reactive precursor source #2 1570.

The process apparatus 150 includes pressure control mechanism and a flow control mechanism providing means for controlling the pressure 1545 and flow 1560 of one or more gaseous fluids contained in one or more plenums or manifolds, each plenum or manifold being in fluid communication with the fluid collimating conduit, nozzle, bore, or orifice of the stationary support. Typical means for controlling pressure of gaseous fluids include both passive and actively controlled pressure regulators and can be incorporated into the temperature and pressure control units 1545. Typical means for controlling the flow 1560 of one or more gaseous fluids include gas flow meters and gas flow controllers of all types including mass flow meters and mass flow controllers, rotameters with and without adjustment valves, turbine flow meters, pitot based flow meters and other types of gas flow meters familiar to those skilled in the art of process control of flowing gaseous media. In one embodiment shown in FIG. 22 the gaseous fluids employed during substrate processing are controlled by mass flow controllers equipped with mass flow meters 1560 to allow precise control over the gas flow entering process chamber 152 by stationary fluid emitting support 12 and optionally controlling the mass flow of gases leaving the chamber by exhaust outlet 1530 (exhaust flow control unit not shown).

The process apparatus 150 also includes a mechanism for forming compound fluid flows providing a means for combining one or more fluids into a laminar flow and optionally includes a means for combining one or more fluids into a compound laminar flow possessing an outer sheath of inert chemically non-reactive gas that covers an inner core of chemically reactive gasses or gas mixtures. Apparatus 20 located inside chamber 152 in fluid communication with fluid emitting stationary support 12 by fluid outlet 19 provides a way to combine one or more fluids into a laminar flow and optionally includes a structure for combining one or more fluids into a compound laminar flow possessing an outer sheath of inert chemically non-reactive gas that surrounds, is in contact with, and covers an inner core of chemically reactive gasses or gas mixtures with optional hydrodynamic or gas dynamic focusing of the compound laminar flow. Compound jet forming apparatus 20 is in fluid communication with the fluids employed to provide either hydraulic or pneumatic levitation and provides a means for combining one or more fluids into a compound flow possessing an outer sheath of inert chemically non-reactive fluid that covers an inner core of chemically reactive fluids or fluid mixtures. A preferred fluid type is a gas or a gas mixture. In one embodiment, the compound flow may have characteristics of a coaxial flow where the inner region of gas is axially symmetric with the outer sheath of inert gas direction of flow as would be produced by an embodiment of apparatus 20 similar to that illustrated in FIGS. 16 and 17. In another embodiment, the compound flow may have the characteristics of a collinear flow where the inner region of reactive is flowing in the same direction as the outer sheath of inert gas but is not axially symmetric with respect to the outer inert gas sheath direction of flow as would be produced by an embodiment of apparatus 20 similar to that illustrated in FIG. 21. A compound flow is considered axially symmetric if the chemical composition of the gases, examined in the direction perpendicular to the flow direction, appears unchanged when rotated about an axis defined by the flow direction. Similarly, a compound flow is considered collinear if the chemical composition of the gases, examined in the direction perpendicular to the flow direction, appears to change when rotated about an axis defined by the flow direction. Compound flows can be formed by employing, for example, an embodiment of apparatus 20 designed according to the principles illustrated in FIG. 17 and FIG. 21 to combine fluid flows for the purpose of producing collinear or coaxial compound fluid flows as previously described. The compound fluid flows can be used to produce columnar compound fluid jets emanating from stationary fluid emitting support assembly 12 through which fluid will flow by injection of the fluid flow through fluid outlet 19 (not shown) with optional hydrodynamic focusing of the compound fluid flow to fluid collimating conduit 14 through which one or more fluids flow and the columnar compound fluid jets emanating from the surface of stationary support assembly 12 can be coaxial or collinear.

In one embodiment the compound jet formation apparatus 20 is in fluid communication with a plurality of fluids through feed through 1505 that is in fluid communication with a fluidic network which is shown in FIG. 22 to reside on the exterior of the chamber 152. FIG. 22 shows the compound jet formation apparatus 20 in fluid communication with reactive precursor source #1, 1565, pressurized gas source, 1575, reactive precursor source #2, 1570, each fluid source controlled independently by mass flow controllers 1560 that are controlled by a valve sequence control unit 1555. The valve sequence control unit 1555 determines how much flow each mass controller valve 1560 allows to flow into compound jet formation apparatus 20, thereby providing a way of adjusting the composition of the compound jet exiting the stationary fluid emitting support assembly 12 through which fluid will flow through fluid collimating conduit 14. The valve sequence control unit 1555 provides a way of providing temporal as well as spatial variation in the gas composition of the compound jet formed by the compound jet formation apparatus 20. The temporal variation of the composition of a compound jet is useful for vapor phase deposition processes such as chemical vapor deposition and atomic layer deposition according to the process step diagram of FIG. 14. Other configurations of the fluidic network and compound jet formation apparatus 20 are, of course, possible within the spirit and scope of the apparatus shown in FIG. 22.

Apparatus 20 provides a mechanism for providing a single-gas flow of an inert fluid or inert gaseous fluid to process apparatus 150. Apparatus 20 provides a mechanism for controlling the fluid flow and chemical composition of the fluid flow to alternately provide an inert single-fluid flow with a reactive fluid flow having an inert fluid and a reactive fluid to the stationary fluid emitting support in process apparatus 150. Apparatus 20 provides a mechanism for controlling the fluid flow to alternately provide a first reactive fluid flow having an inert fluid and a first reactive fluid and a second reactive fluid flow having an inert fluid and a second reactive fluid different from the first reactive fluid to the stationary fluid emitting support in process apparatus 150. Apparatus 20 and stationary fluid emitting support 12 provide a mechanism for forming the fluid flow of two or more fluids into a columnar compound fluid jet that is coaxial or collinear. Apparatus 20 provides a mechanism for providing a fluid flow including at least a first reactive fluid, a second inert fluid, and a third reactive fluid wherein the first and second reactive fluids are spatially separated by the second inert fluid in at least one dimension. Apparatus 20 provides a mechanism for providing two or more fluids at the same time from a pressurized—fluid source through the stationary support into the gap so that the fluid flow impinges on at least a portion of the substrate and exposes the substrate portion to the fluid to deposit a thin film on the substrate.

It is recognized that process apparatus 150 can be operated over a wide variety of internal chamber pressures. The internal operating pressure of process apparatus 150 can be above atmospheric pressure with an internal chamber pressure of at least 1 psig. The internal operating pressure of process apparatus 150 can be below atmospheric pressure. As previously discussed, the ambient environment around the moveable substrate during levitation is a factor in the levitation process and pneumatic levitation of a moveable substrate can be accomplished in both elevated and reduced pressure environments.

The process apparatus 150 includes a mechanism for exhausting fluids from process chamber 152 that provides a means for exhausting the gaseous fluid emanating from the surface from the stationary fluid emitting support 12. The exhausting of the gaseous fluid may utilize any number of means, such as pumping through exhaust port 1530 with a matched process flow using a throttle valve (not shown) at pre-set chamber pressure; venting the chamber gas through exhaust port 1530 at a pre-set chamber pressure using a pre-set process flow controlled by a throttle valve and a structure that measures the exhaust flow through exhaust port 1530; or more simplistically, allowing the chamber to exhaust through an orifice or an array of multiple orifices of known conductance connected to a plenum or manifold incorporated into exhaust port 1530 as a method of controlling exhaust flow. It is advantageous to a have supplemental laminar flow supplied to chamber 152 as is customary in the design of chemical reactors utilizing continuous fluid flow. A supplemental gas flow is provided by gas distribution assembly 1520 in fluid communication with a mass flow controller 1560. The gas distribution assembly 1520 of process apparatus 150 can be a showerhead comprised of a plurality of nozzles, orifices, bores, or gas delivery tubes in fluid communication with a pressurized-gas source to achieve laminar flow of gas from the gas distribution assembly 1520 to the exhaust outlet 1530. Mass flow controller 1560 supplying pressurized-gas to the gas distribution assembly 1520 is in fluid communication with a pressurized source of inert gas 1575 whose temperature and pressure is controlled by temperature and pressure control until 1545. Furthermore, it is advantageous for the purpose of particle control to allow the exhaust flow from stationary fluid emitting support 12 to mix with and be entrained by an additional laminar flow of gas moving along the interior walls of the container or chamber to minimize chemical and particle contamination of the interior of the chamber—a method that is well known to those skilled in the art of process chamber design for process equipment. The fluidic flow in the chamber 152 exits apparatus 150 through exhaust port 1530 where it is directed to a suitable scrubbing unit for removal of any potentially hazardous exhaust materials.

Part of the exhaust flow in chamber 152 can be supplied by a flow control structure 1580 located proximate to the stationary fluid emitting support. In one embodiment shown in FIG. 25*a* flow control structure 1580 in chamber 152 is located proximate to the fluid emitting stationary support 12 and is supplied by a flow control structure comprised of an annular tilted fluid emitting slot or ring nozzle surrounding the stationary support and directing an exhaust flow towards the chamber exhaust. In one embodiment the annular tilted fluid emitting slot assembly is similar to an air amplifier, also called herein a gas amplifier, operating with an inert gas wherein the inert gas is nitrogen or argon and the exhaust of the amplifier is directed towards the chamber exhaust. In another embodiment shown in FIG. 26 the flow control structure 1580 is comprised of at least one gas amplifier, each gas amplifier operating with inert gas, wherein the intake surface of each gas amplifier is coplanar with the fluid emitting surface of the stationary support structure 12 and all exhaust fluid flows through the flow control structure. In a further embodiment, the flow control structure of FIG. 26 is in fluid contact with the exhaust outlet through one or more lengths of gas-tight tubing. The disclosed embodiments are particularly advantageous for operation at atmospheric pressure and above and under conditions where the mean free path of the gas is at least 100 times smaller than the largest physical dimension of the flow control structure because a flow control structure comprised of gas flow amplifiers is efficient in managing aerosol and gas-based contamination by effective gas and aerosol entrainment in the amplified exhaust flow exiting the flow control structure.

Referring to FIG. 25, the principle by which the pneumatic flow control structure operates is as follows: high pressure gas is injected through the annular nozzle 1582 at high velocity and the high velocity gas flow adheres to the internal profile 1584 of flow control structure 1580 by the Coanda effect and the change in velocity of the injected high pressure gas results in reduced pressure proximate to the annular nozzle. The reduced pressure proximate to the annular nozzle induces a high volume flow of surrounding gas into the high velocity flow at the internal profile of the flow control structure 1580 resulting in a high volume, high velocity flow directed at the exhaust outlet 1530.

It can also be desirable in some applications to heat the walls of the process chamber 152 during processing as it is known in the art of deposition that thermal energy applied to the walls of a process chamber such as process chamber 152 is advantageous for process control and process cleanliness. Thus, chamber 152 can optionally have heated walls, said heated walls being heated by means familiar to those in those skilled in the art of chamber design including temperature controlled heating tapes and pads; heat exchanging tubing mounted on the exterior of chamber 152 through with temperature controlled fluids are passed; radiant heating of the chamber walls employing radiation heating sources like, for example, infrared radiation heating sources; and other known methods of controlling the temperature of process chamber walls.

The process apparatus 150 can also include a mechanism for determining moveable substrate position providing a means (not shown) for providing feedback indicating the state of the moveable substrate with respect to pneumatic levitation of the moveable substrate to determine, for example, whether pneumatic levitation of the moveable substrate has been achieved. Means for verifying pneumatic levitation include optical imaging methods with video cameras that are computer analyzed; reflective methods utilizing displacement of an optical beam from a predefined path to determine whether the moveable substrate is levitating; detection of moveable substrate height variation using optical methods such as low coherence interferometry or other methods such as the use of capacitance sensors or an array of position and distance sensitive sensors of any type familiar to those skilled in the art of position and distance sensing. Methods for sensing moveable substrate position are disclosed in, for example, U.S. Pat. No. 8,057,602 B2.

The process apparatus 150 can also include temperature control mechanism providing a means for heating the moveable substrate 10 and controlling the temperature of the moveable substrate as well as an optional means for heating the gas emanating stationary support and controlling the temperature of the gas emanating stationary support (not shown). In one embodiment, the moveable substrate 10 is heated by heater 1535 located inside process chamber 152. Moveable substrate and stationary support temperature control unit 1550 is part of a temperature control mechanism of chamber 150 and provides a means for controlling the heating of the moveable substrate utilizing moveable substrate heater 1535 as well as an optional means for controlling the heating the gas emanating stationary support. In one embodiment the stationary support temperature control unit to moveable substrate heater 1535 is in electrical communication with heater 1535 and optionally heaters incorporated into the stationary support assembly 12 (not shown) by feed throughs 1505.

The moveable substrate and stationary support temperature control unit can supply electrical energy or other forms of energy, such as radio frequency or microwave energy, that are used to control the temperature of the moveable substrate and the stationary support assembly. In one embodiment of the temperature control mechanism, the moveable substrate and stationary support temperature control unit supplies radiofrequency energy to both the moveable substrate and the stationary support assembly. In another embodiment, the energy supplied by the moveable substrate stationary support temperature control unit is converted to infrared radiant energy by moveable substrate heater 1535. In the embodiment shown in FIG. 25, substrate heater 1535 is shown enclosed within process chamber 152; however, alternatively, substrate heater 1535 of process apparatus 150 can be located outside of process chamber 152 and the energy for heater transmitted through the walls of process chamber 152 for the purpose of heating substrate 10 and optionally stationary fluid emitting support 12. Infrared energy and radiofrequency energy are examples of energy for heating moveable substrate 10 that are transmissible through the walls of chamber 152 when process chamber 152 is constructed out of appropriate materials. In another embodiment of process chamber 150, heating of both the moveable substrate and the stationary support and the temperature control mechanism for heating of both the moveable substrate and the stationary support can be achieved by any method familiar to those skilled in the art of heating and heat transfer including, radiative heating, resistive heating, inductive heating, microwave heating, control of the temperature of the stationary support by the use of heat transfer fluids, control of the temperature of the moveable substrate by the use of heated gases emanating from the stationary support.

In one embodiment, as taught in U.S. Pat. No. 5,370,709 by Kobayashi, a transparent window that is used to allow transmission of the infrared radiant energy for the purpose of heating the substrate and the exhaust gas flow can be designed around the transmission area for the infrared radiation from a radiant light source that is used to heat the substrate and the method of generating a laminar exhaust flow in chamber 152 can be substantially different from what is shown in FIG. 22. In one embodiment not taught or disclosed in U.S. Pat. No. 5,370,709, the majority of the volume of the supplemental laminar exhaust flow can be supplied by a polygonal shaped annular duct where the emitted flow from said polygonal shaped annular duct is directed essentially at the locations near the perimeter of the levitating substrate where the process effluent is primarily emitted.

In an embodiment of process chamber 150 shown in FIG. 22 a temperature control mechanism comprised of a temperature measurement mechanism 1540 and the use of a temperature feedback loop supplied by temperature control unit 1550 is advantageous for enabling reproducible processes with fluidic levitation, particularly with pneumatic levitation. In one embodiment of the temperature control mechanism, temperature sensing of the moveable substrate is provided by temperature measurement sensor 1540 and is preferably a non-contact temperature measurement method in order to preserve the advantage of non-contact processing with unrestricted natural motion of the substrate with levitation stabilizing structure during fluidic levitation. In another embodiment of the temperature control mechanism, temperature sensing of the stationary fluid emitting support 12 is provided by temperature measurement sensor (not shown) that is attached to the stationary support assembly. Temperature sensing can be achieved by any means familiar to those skilled in the art of temperature measurements including the use of thermocouple, resistance temperature detectors (RTDs), thermistors, and other types of calibrated resistors and electrical components such as temperature sensitive diodes whose electrical properties changes as a function of temperature, as well as the sensing of temperature with a measurement of infrared radiation emitted by the object of interest. Other methods for temperature sensing include the use of optically excited fluorescence signals, calibrated dilatometric methods as well as sensing of secondary process variables such as gas temperature through any known means such as the use of a thermocouple as well as temperature measurements based on other physical properties such fluid viscosity. The determination of the temperature of the moveable substrate and the stationary support assembly is accomplished by the temperature control unit 1550 that is equipped with electrical circuits whose function is the conversion of the output signal received from said temperature sensor into a calibrated temperature measurement.

Process apparatus 150 employing an orthogonal fluid jet for fluidic levitation with radial flow provides a method for thermally isolating the moveable substrate and its surfaces from physical contact with any thermal sinks, thereby enabling effective temperature control for both heating and cooling—especially during the use of optional processing steps involving high photon flux radiative exposures such as optionally radiative curing with either IR or UV radiation. The use of processing steps involving the use of radiation of all types for the purposes of supplemental processing of moveable substrates with levitation stabilizing structures during pneumatic levitation is specifically contemplated and considered inclusive in process apparatus 150 and such radiation sources may include ionizing radiation sources such as x-rays, alpha rays, beta rays, electron beams, gamma rays, and the like as well as lower photon energy radiation types such as ultraviolet radiation, visible photon radiation that is photochemically active, and infrared radiation. The use of microwave radiation during processing is specifically contemplated as applied to the pneumatic levitation of a moveable substrate with a levitation stabilizing structure. The use of terahertz radiation during processing is specifically contemplated as applied to the pneumatic levitation of a moveable substrate with a levitation stabilizing structure. The rapid radial flow in the volume between the moveable support surface with its levitation stabilization structure and the gas-emanating stationary support enables excellent cleanliness and low contamination during deposition processes executed at elevated temperatures as well as the capability to induce rapid cooling once heating is discontinued. The effluent fluid from the process is optionally managed by the use of a supplemental laminar flow of inert gas around the moveable substrate and stationary support for the purpose of removing the gaseous process effluent from the region proximate to the moveable substrate and the stationary support assembly for disposal. U.S. Pat. No. 5,370,709 has previously disclosed thermal annealing processes and deposition processes using reactive precursors by employing pneumatic levitation with a single orifice (or single fluid collimating conduit) but the apparatus disclosed therein required the use of physical stops to prevent the substrate from sliding off the "suction plate". Deposition processes employing pneumatic levitation without the use of substrate motion restraining structures such as physical stops on the stationary support plate are not contemplated in U.S. Pat. No. 5,370,709. The use of supplemental exposure of the moveable substrate to ionizing radiation as part of substrate processing during fluidic levitation is not contemplated in U.S. Pat. No. 5,370,709. The use of supplemental exposure of the moveable substrate to photochemically active radiation as part of substrate processing during fluidic levitation is not contemplated in U.S. Pat. No. 5,370,709.

Thus, the apparatus 150 shown in FIG. 22 achieves one or more of the following objectives:

fluidically levitating a moveable substrate with a levitation stabilizing structure over a stationary support assembly 12 through which fluid will flow using an orthogonal compound jet originating at fluid collimating conduit 14;

forming a compound jet of variable chemical composition using a compound jet formation assembly 20;

controlling the flow of the compound jet formed using the compound jet formation assembly 20;

controlling the chemical composition of the compound jet formed using the compound jet formation assembly 20;

controlling the temperature of the levitating moveable substrate 10 with a levitation stabilizing structure 30;

optionally controlling the temperature of the process chamber 152;

controlling the temperature of all fluids in the process chamber 152;

controlling the temperature of the stationary support assembly 12;

forming an orthogonal compound jet for the purposes of fluidic levitation of a moveable substrate with a levitation stabilizing structure of apparatus 20 and fluid collimating conduit 14;

exposing a pneumatically levitated substrate to a chemically reactive fluid during pneumatic levitation;

inserting and positioning a moveable substrate inside an apparatus over a stationary support assembly at a location suitable for fluidic levitation;

removing a moveable substrate from an apparatus;

controlling the gas composition of a compound jet used for fluidic levitation and providing a means for varying the chemical composition of a compound jet as a function of time, said compound jet being either coaxial or collinear; or controlling the exhaust flow from an apparatus used for fluidic levitation in a controlled fashion for the purposes of proper effluent management and disposal.

Other embodiments of the inventive concepts herein disclosed are possible and fall with the contemplated spirit and scope of the inventive method and apparatus.

The differences between the present atmospheric pressure deposition method and two other methods of atomic layer deposition disclosed in the art can be further understood by considering the mean free path of the gas molecules of the fluid during substrate processing, regardless of whether the substrate is fluidically levitated. The mean free path of the inert gas Argon at a given temperature and pressure can be calculated by the formula $$l = \frac{k_b T}{2\pi d_o^2 P}$$

where $k_b$ is Boltzmann's constant, T is the temperature in Kelvin, P is the pressure in Pascals, and $d_o$ is the molecular diameter of the monatomic Argon gas molecule.

Suntola et al (U.S. Pat. No. 4,413,022) disclosed a method of atomic layer deposition that is commonly employed for substrate processing and Suntola's method requires well controlled gaseous mass transport with a large mean free path that is characteristic of laminar viscous flow of a low pressure gaseous fluid as is found at sub-atmospheric Argon pressures between 50 Pa and 10,000 Pa where the mean free path of Argon molecules in the gaseous fluid is constant and has values between 200 microns and 1 microns, respectively. In contrast to the method of Suntola, the method of spatial atomic deposition disclosed by Levy (U.S. Pat. No. 7,413,982) requires a laminar viscous flow of gaseous fluid with a gas pressure sufficient high to provide gas bearing behavior when the pneumatic fluid is trapped between two surfaces and surrounded by atmospheric pressure. The pneumatic pressure employed in Levy's method is typically above atmospheric pressure, (between 100,000 Pa and 300,000 Pa). At the gas pressures required for gas bearing operation in Levy's method, the free path of Argon molecules in the gaseous fluid is constant with a maximum value of around 0.1 microns and a typical mean free path of the molecules in the gas phase that is smaller than 0.1 microns at the higher gas pressures required for gas bearing operation. In both the method of Suntola and the method of Levy the operating pressure in the volume region where deposition takes place is static—that is, the pressure in the volume region where the deposition takes place is essentially constant and unchanging therefore the mean free path of the molecules in the gas phase is constant during processing. The process fluid pressure is constant in the method of Suntola because of the process requirement that laminar flow be constant throughout all process steps for predictable mass transport. Similarly, the method of Levy also requires constant positive pressure above the deposition regions for constant mass transport during the process and also for proper operation of the gas bearing transport mechanism that is utilized by Levy's method to achieve spatially separated sequential reagent exposure on the substrate surface during the deposition process cycles where the apparatus and substrate move relative to each other. In both these methods, the mean free path of the molecules in the gaseous fluid is constant in the volume of the deposition apparatus where deposition occurs during substrate processing.

In contrast to the methods of Suntola and Levy, the method disclosed in the present invention employs outward radial flow from a central gas inlet (sometimes called Bernoulli flow) to enable a spatially varying pressure distribution in the volume where the deposition process takes place and proximate to the surface of the moveable substrate upon which deposition occurs. As a result of the spatially varying pressure distribution, the mean free path of the gaseous fluid is not constant in the volume where the deposition takes place and fluid mechanic models combined with mean free path calculations show that the mean free path of gaseous Argon molecules in the deposition volume of the present invention can vary by as much as a factor of 5 (between 0.06 microns and 0.33 microns) or more when the inventive process is operated using a moveable substrate comprised of a 150 mm silicon wafer with a 128 mm ID levitation stabilizing structure extending 240 microns from the moveable substrate surface and employing a fluid pressure at the stationary fluid emitting support of around 160,000 Pa at 101,000 Pa ambient pressure. The minimum mean free path of the gaseous Argon molecules in the present invention is determined by the pressure of the gaseous fluid jet required to achieve the desired height of pneumatic levitation of the moveable substrate. The pressure of the gaseous fluid jet required to achieve pneumatic levitation of the substrate is, in turn, influenced by several factors, one of the most important factors being the substrate weight and size. Another factor limiting the pressure of the gaseous fluid jet required to achieve pneumatic levitation of the substrate in the present inventive method is the preferred practice of the invention wherein the gaseous fluid velocity remain sub-sonic—that is below the speed of sound in the fluid—in order to avoid the formation of turbulent flow in the volume between the moveable substrate and the stationary fluid emitting support. Pneumatic levitation of a moveable substrate with a levitation stabilizing structure occurs in the present invention when the sum of all the pneumatic forces acting on the moveable substrate opposes and exceeds the force of gravity on the moveable substrate. There is a range of pressures wherein the present inventive method operates because the sum of all the pneumatic forces acting on the substrate to oppose the gravitational force on the moveable substrate is comprised of multiple pneumatic forces including the ambient pneumatic pressure as well as the pneumatic forces resulting from the fluid emanating from the stationary fluid emanating support. The ambient pneumatic pressure is determined by the immediate environment around the moveable substrate and the stationary fluid emitting support. In an embodiment, the moveable substrate and the stationary fluid emitting support can be in a process chamber as shown in apparatus 150 of FIG. 22, and the ambient pressure that is determined by the pressure in the process chamber can vary over a wide pressure range from 10 pascals to megapascals ($10^6$ pascals).

Examples of applications of levitation stabilizing structures to moveable substrate processing are discussed below.

In one embodiment a moveable substrate may utilize a levitation stabilizing structure fabricated thereupon for the purpose of achieving pneumatic levitation to minimize physical contact with moveable substrate during transport as well during storage, thereby providing a method for employing pneumatic levitation to minimize physical contact to a moveable substrate during transport and storage. A linear array of orthogonal jets that is suitably spaced relative to the dimensions of the moveable substrate with the levitation stabilizing structure will allow the substrate to be physically moved over the length of the orthogonal jet array with no physical contact to the substrate. The initial horizontal motion can be initiated by any number of means, including moveable substrate displacement initiated using a pneumatic force produced by a tilted gas jet impinging on any surface of the moveable substrate similar to that described by Yokajty in U.S. Pat. No. 5,470,420.

A levitation stabilizing structure fabricated on a moveable substrate can be employed to provide a method of stable pneumatic levitation of the moveable substrate during various processes used to modify the substrate properties. Examples of processes used to modify the substrate properties include surface cleaning, surface modification, thermal annealing, laser scribing, aerosol deposition, surface etching, chemical vapor deposition, atomic layer deposition, self-assembled monolayer deposition, and other processes employed to modify the properties of the moveable substrate are given below.

The scope of application of the fluid levitation stabilization through the use of levitation stabilizing structure is, of course, not limited to just the disclosed process embodiments and it is recognized that other processes used to modify a moveable substrate can benefit when a levitation stabilizing structure in employed to achieve stable fluid levitation during process execution. Such embodiments may include processes in which the fluid is non-compressible, such as a non-compressible or incompressible liquid, rather than a gas. The application of the levitation stabilizing structure to various processes will now be described further. In the exemplary process embodiments disclosed below, the process steps disclosed in FIG. 14 can be followed with respect to the use of fluidic levitation during processing of the substrate with levitation stabilizing structure.

Exemplary Process Embodiment 1

A moveable substrate with a levitation stabilizing structure employed in a cleaning process with pneumatic levitation.

In one method embodiment a moveable substrate with levitation stabilizing structure is placed in a chamber upon a transparent UV transmitting gas-emanating stationary support. The moveable substrate is placed so that the levitation stabilizing structure is facing or opposing the gas-emanating stationary support. The stationary UV transmitting gas emanating support is made of, for example—vitreous silicon oxide, and equipped with an ultraviolet radiation source such as a high intensity UV emitting plasma lamp positioned to radiate UV radiation through the UV transmitting gas-emanating stationary support onto the opposing surface of the moveable substrate. Alternately, the gas-emanating stationary support can be opaque and the moveable sample can be irradiated with UV radiation on the side which does not face the gas-emanating stationary support. In yet another embodiment, both sides of the moveable substrate can be irradiated at once using a plurality of irradiating sources. The stationary support contains a fluid collimating conduit in fluid communication with an oxygen bearing gas, such as pure oxygen or an ozone bearing gas such as the effluent from a dielectric barrier discharge ozone generator. UV-ozone cleaning can be achieved during levitation of the moveable substrate when the substrate surface facing the UV emitting radiation source is irradiated with ultraviolet radiation having at least emissions between 180 nm and 300 nm when employing a cleaning fluid, for example, an oxygen containing gas or ozone containing gas as the gaseous cleaning fluid emanating from the stationary support surface for pneumatic levitation. In this example the chemical composition of the material layer employed to fabricate the levitation stabilizing structure should be considered to ensure that the LSS remains intact during UV-ozone cleaning due to the corrosive nature of UV-ozone exposure to certain types of material compositions. An advantage to the method is the rapid gas exchange ensuring rapid process effluent removal during cleaning. In one embodiment, the cleaning fluid is surrounded by the inert gas and serves to clean the moveable substrate. In another embodiment, the cleaning fluid is not surrounded by the inert gas and serves to clean both the moveable substrate and the interior surfaces of apparatus 20 and fluid outlet 19.

Exemplary Process Embodiment 2

A moveable substrate with a levitation stabilizing structure employed in a surface modification process with pneumatic levitation.

In another method embodiment a moveable substrate with levitation stabilizing structure where the substrate has a surface of hydrated silicon oxide with exposed surface hydroxyl groups is placed in process apparatus 150 upon a gas-emanating stationary support. The moveable substrate with levitation stabilizing structure and exposed surface hydroxyl groups is placed so that the levitation stabilizing structure is facing or opposing the gas-emanating stationary support and the moveable support is pneumatically levitated by a gaseous fluid. The stationary support contains a fluid collimating conduit in fluid communication with a gas containing a reactive vapor phase precursor that is generated by apparatus 20. The gaseous fluid composition is chosen to contain a reactive vapor phase precursor that reacts with the moveable substrate surface and exposed surface hydroxyl groups in such a way as to uniformly expose the moveable substrate surface to the molecular vapor of the reactive precursor with the intent of forming a molecular layer or monolayer of a chemical composition similar to the reactive precursor on the surface of the moveable substrate. Pneumatic levitation is used as method for exposing the moveable substrate surface to a molecular flux of the reactive precursor. The gas containing a reactive vapor phase precursor may optionally be a compound fluid flow, said fluid flow being either a coaxial compound fluid flow or a collinear compound fluid flow. The conditions of radial flow during pneumatic levitation with an orthogonal jet are favorable for the formation of uniform molecular layers because, as previously discussed, the exposure of the moveable substrate surface (which equals the molecular flux to the surface multiplied by the amount of time the surface is in contact with the molecular flux) is uniform over the entire surface area that is exposed to radial flow. In one embodiment, the reactive vapor phase precursor can be a member of the class of compounds known as fluoroalkyl-trichlorosilanes which are known to be highly reactive with hydrated silicon oxide surfaces and are used for the formation of low surface energy self-assembled monolayers. Exposure of the hydrated silicon oxide surface to vapor phase fluoroalkyl-trichlorosilanes will result in liberation of HCL gas and the formation of an fluoroalkyl polysiloxane monolayer that is chemically bonded to the silicon oxide surface where the organic functional groups are oriented so that they face outwards from the substrate surface, thereby imparting substantially different, Teflon-like chemical properties to the silicon oxide surface. Optionally the moveable substrate with levitation stabilizing structure can be heated during exposure of the substrate surface to the fluoroalkyl-trichlorosilane vapor to improve the surface mobility of the adsorbed surface species and improve the kinetics of formation for the self-assembled monolayer.

Exemplary Process Embodiment 3

A moveable substrate with a levitation stabilizing structure employed in a surface modification process with pneumatic levitation.

Another method embodiment comprises a moveable substrate with levitation stabilizing structure that is placed in process apparatus 150 upon a gas-emanating stationary support through which fluid will flow for the purposes of preparing an adhesion promoting layer on the surface of the moveable substrate through exposure of the moveable substrate surface to vapors of the adhesion promoting chemical reagent hexamethyldisilizane or HMDS. HMDS was first described in U.S. Pat. No. 3,549,368 by R. H. Collins and F. T. Devers of IBM (1970) as a photoresist adhesion promoter for semiconductor applications. Since then HMDS vapor priming has become a well understood and preferred technique for photoresist coating applications. HMDS resist adhesion promotion allows for reduced chemical consumption and substrate surface modification that can be chemically stable for several weeks. In addition to aiding proper resist adhesion, HMDS also helps control surface moisture levels on the substrate. Surface moisture is an additional factor that can degrade resist adhesion and result in resist pattern peel off or unwanted lateral etching through the cracks under the resist. Like the surface modification method of hypothetic process embodiment 2, the purpose of vapor priming is to change the surface properties of the moveable substrate in such a way as to change the surface energy and the chemical reactivity. HMDS vapor prime produces specific surface chemistry that promote adhesion of photoresist formulations. The moveable substrate with levitation stabilizing structure is placed in processing apparatus 150 so that the levitation stabilizing structure is facing or opposing the gas-emanating stationary support and the moveable support is pneumatically levitated by a gaseous fluid. The stationary support contains a fluid collimating conduit in fluid communication with a gas containing a reactive vapor phase precursor that is generated by apparatus 20. The gas containing a reactive vapor phase precursor may optionally be a compound fluid flow, said fluid flow being either a coaxial compound fluid flow or a collinear compound fluid flow. The gaseous fluid composition is chosen to contain a reactive vapor phase precursor—HMDS—that reacts with the moveable substrate surface in such a way as to uniformly expose the moveable substrate surface to the molecular vapor of the reactive precursor with the intent of forming a molecular layer or monolayer of a chemical composition similar to the reactive precursor on the surface of the moveable substrate. Pneumatic levitation with radial flow is used as method for exposing the moveable substrate surface to a molecular flux of the reactive precursor. The conditions of radial flow during pneumatic levitation are favorable for the formation of uniform molecular layers because, as previously discussed, the exposure of the moveable substrate surface (which equals the molecular flux to the surface multiplied by the amount of time the surface is in contact with the molecular flux) is uniform over the entire surface area that is exposed to radial flow. In one embodiment, the substrate is a silicon wafer with a hydrated silicon oxide surface and the reactive vapor phase precursor is hexamethyldisilazane which is known to be highly reactive with hydrated silicon oxide surfaces and is used for the formation of lower surface energy surfaces that are still chemically reactive with photoresist formulations. Exposure of the hydrated silicon oxide surface of the substrate to vapor phase HMDS will result in liberation of $NH_3$ gas and the formation of a trimethylsiloxane monolayer that is chemically bonded to the silicon oxide surface where the organic functional groups are oriented so that they face outwards from the substrate surface, thereby imparting substantially different, hydrophobic properties to the silicon oxide surface while still retaining the chemical reactivity of the trimethylsilane functional group. Additionally, pneumatic levitation with optional heating of the moveable substrate and levitation stabilizing structure can be used during, prior or after moveable substrate processes like the HMDS vapor prime process to carry out a method of pneumatically levitated thermal annealing or thermal dehydration.

Exemplary Process Embodiment 4

A moveable substrate with a levitation stabilizing structure employed in a vapor phase dry etching process with gaseous hydrofluoric acid with pneumatic levitation.

In another method embodiment a moveable substrate with levitation stabilizing structure is placed in a chamber upon a gas-emanating stationary support. The moveable substrate is placed in processing apparatus 150 so that the levitation stabilizing structure is facing or opposing the gas-emanating stationary support and the moveable support is pneumatically levitated by a gaseous fluid. The stationary support through which fluid will flow contains an fluid collimating conduit in fluid communication with a gas containing a reactive vapor phase precursor that is generated by apparatus 20. The gas containing a reactive vapor phase precursor may optionally be a compound fluid flow, said fluid flow being either a coaxial compound fluid flow or a collinear compound fluid flow. The gaseous fluid composition is chosen to contain a reactive vapor phase precursor that reacts with the moveable substrate surface in such a way as to uniformly expose the moveable substrate surface to the molecular vapor of the reactive precursor with the intent of removing or etching away portions of the surface of the moveable substrate by surface reactions that produce volatile products. Pneumatic levitation with radial flow is used as method for exposing the moveable substrate surface to a molecular flux of the reactive precursor. An example of a vapor phase reactive precursor that is used for the purpose of removing portions of a substrate is gaseous hydrofluoric acid, HF. HF is used in vapor phase etching of silicon substrates in the fabrication of micro electromechanical systems on silicon wafer substrates. The HF etch is an isotropic process that etches all surface exposed to the HF vapor and provides a method of achieving a dry isotropic etch as part of the fabrication of micro electromechanical systems in silicon. The conditions of radial flow during pneumatic levitation are favorable for the formation of surface exposure because, as previously discussed, the exposure of the moveable substrate surface (which equals the molecular flux to the surface multiplied by the amount of time the surface is in contact with the molecular flux) is uniform over the entire surface area that is exposed to radial flow. As mentioned, in one embodiment, the substrate is a silicon wafer with regions of the wafer selectively patterns for exposure to a vapor phase etching agent and the reactive vapor phase etching agent is hydrofluoric acid vapor. An optional inert carrier gas can be employed to minimize the amount of HF gas used. Exposure of the hydrated silicon oxide surface to vapor phase HF will result in liberation of water and silicon tetrafluoride gas thus the silicon oxide surface is etched away from the moveable substrate surface and removed in the form of volatile products. The rapid radial flow in the volume between the moveable support surface with its levitation stabilization structure and the gas-emanating stationary support enables rapid etch product removal and excellent cleanliness during the etching process thereby ensuring that the etch process is limited only by diffusion of the gas phase reactive species—in this case, HF—to the moveable substrate surface. The effluent from the etch process is managed by the use of a supplemental laminar flow of inert gas around the moveable substrate and stationary support for the purpose of removing the gaseous process effluent from the process chamber for disposal. It is recognized that temperature control of the process is advantageous. Process temperature control can be achieved through, for example, supplemental heating or cooling of process gases by such means as, for example, heating or cooling of the reactive gas stream or, alternatively, heating the moveable substrate by inductive heating or radiative heating.

Exemplary Process Embodiment 5

A moveable substrate with a levitation stabilizing structure employed in a temperature controlled process with pneumatic levitation—an example of which is a thermal annealing process with pneumatic levitation.

Another method embodiment comprises a moveable substrate with levitation stabilizing structure that is placed in process apparatus 150 upon the gas-emanating stationary support through which fluid will flow and exposing the moveable substrate to thermal energy for the purpose of thermal annealing of the moveable substrate or carrying out thermally promoted processes like thermal dehydration, thermal polymerization, or thermal treatment for the purpose of changing crystallite size or relieving stress in the moveable substrate. The moveable substrate is placed so that the levitation stabilizing structure is facing or opposing the gas-emanating stationary support and the moveable support is pneumatically levitated by a chemically inert gaseous fluid. The stationary support contains an fluid collimating conduit in fluid communication with an inert gas such as a helium, neon, argon, krypton, or xenon or nitrogen. The stationary IR transmitting gas emanating support is made of, for example—vitreous silicon oxide or some other infrared transmitting (IR) material, and equipped with an infrared radiation source such as a high intensity T-3 quartz halogen lamp with suitable reflectors positioned to provide a uniform radiation field on the surface of the opposing moveable substrate when IR radiation is transmitted through the IR transmitting gas-emanating stationary support onto the opposing surface of the moveable substrate surface. Optionally, the moveable substrate with a levitation stabilizing structure can be irradiated with, for example, a T-3 quartz halogen irradiation source, from the opposite side of the moveable substrate—that is, the side of the moveable substrate that does not face the gas-emanating stationary support. The gaseous fluid composition may optionally be chosen to have a minimal infrared adsorption at the emission wavelengths of the radiation source so as to maximize transmission of infrared energy to the moveable substrate for the purpose of raising the temperature of the moveable substrate by infrared radiation adsorption. Alternatively, the gaseous fluid can be heated by any means familiar to those skilled in the art of process temperature control. Such methods include the use of resistive heaters, inductive heaters, radiative heaters, heat exchangers using secondary heating or cooling reservoirs in conjunction with a heat exchanging assembly, and the like. The temperature of the substrate or of the gaseous fluid itself can be measured for the purposes of process control by controlling the thermal energy imparted to the moveable substrate or the gaseous fluid itself. Temperature measurement methods are well known and include the use of infrared thermocouples and infrared temperature sensors, thermocouples, resistive thermal detectors, temperature sensitive diodes, temperature controlled oscillators whose oscillation frequency changes with temperature, temperature sensitive fluorescence measurements where the decay time of fluorescence varies with temperature and any other methods known to those skilled in the art of temperature measurement. Pneumatic levitation with radial flow is used as method for thermally isolating the moveable substrate and its surfaces from physical contact with any thermal sinks, thereby enabling the most effective use of temperature control and effective use of infrared radiative heating. The rapid radial flow in the volume between the moveable support surface with its levitation stabilization structure and the gas-emanating stationary support enables excellent cleanliness during the heating process as well as the capability to induce rapid cooling when heating is discontinued. The effluent fluid from the process is managed by the use of a supplemental laminar flow of inert gas around the moveable substrate and stationary support for the purpose of removing the gaseous process effluent from the process chamber for disposal. U.S. Pat. No. 5,370,709 has previously disclosed thermal annealing processes and deposition using reactive precursors by employing pneumatic levitation with a single orifice but the apparatus disclosed therein required the use of physical stops to prevent the substrate from sliding off the "suction plate". Therefore thermal annealing during pneumatic levitation without the use of substrate motion restraining structures such as physical stops on the stationary support plate was not contemplated in U.S. Pat. No. 5,370,709.

Exemplary Process Embodiment 6

A moveable substrate with a levitation stabilizing structure employed in a deposition process with aerosols wherein pneumatic levitation is employed to promote even and uniform disposition of aerosol particles upon the moveable substrate surface during pneumatic levitation.

Another method embodiment comprises a moveable substrate with levitation stabilizing structure that is placed in processing apparatus 150 upon a gas-emanating stationary support through which fluid will flow and exposing the moveable substrate to an aerosol gaseous fluid optionally with thermal energy for the purpose of deposition of the aerosol particles on the moveable substrate with optional thermal annealing of the moveable substrate or carrying out thermally promoted processes like thermal dehydration, thermal polymerization, or thermal treatment for the purpose of changing the properties of the surface of the moveable substrate. The moveable substrate is placed so that the levitation stabilizing structure is facing or opposing the gas-emanating stationary support and the moveable support is pneumatically levitated by a gaseous fluid that is generated by apparatus 20. The gas containing an aerosol may optionally be a compound fluid flow, said fluid flow being either a coaxial compound fluid flow or a collinear compound fluid flow. The aerosol can be a chemically reactive aerosol that undergoes chemical reaction with the substrate surface upon contact with the substrate surface. The stationary support through which fluid will flow contains an fluid collimating conduit in fluid communication with a gas such as an inert gas like helium, neon, argon, krypton, or xenon or nitrogen and the gas may contain aerosol particles, said aerosol particles being either solid, liquid, or a combination of solids suspended in a liquid matrix. Optional temperature control methods as previously described can be employed for temperature of the process. The aerosol can be optionally be generated through the use of supercritical fluids such as $CO_2$ or through the use of any method known to those skilled in the art of gaseous aerosol formation. Examples of methods for preparing gaseous aerosols includes the use of atomizers and nebulizers, ultrasonic atomizers, electrospray devices, and the use of other devices designed to prepare small particles the remain essentially dispersed in a gas phase fluid. For example, the aerosol can be prepared by dispersion of nanoparticulate material in a gaseous stream followed by cyclonic separation to promote aerosol particle size uniformity prior to fluid entry to apparatus 20. The gas-emanating stationary support can be IR transmitting and made of, for example—vitreous silicon oxide or some other infrared transmitting (IR) material, and equipped with an infrared radiation source such as a high intensity T-3 quartz halogen lamp with suitable reflectors positioned to provide a uniform radiation field on the surface of the opposing moveable substrate when IR radiation is transmitted through the IR transmitting gas-emanating stationary support onto the opposing surface of the moveable substrate surface. Optionally, the moveable substrate with a levitation stabilizing structure can be irradiated with, for example, a T-3 quartz halogen irradiation source, from the opposite side of the moveable substrate—that is, the side of the moveable substrate that does not face the gas-emanating stationary support. The gaseous fluid composition can be chosen to have a minimal infrared adsorption at the emission wavelengths of the radiation source so as to maximize transmission of infrared energy to the moveable substrate for the purpose of raising the temperature of the moveable substrate by infrared radiation adsorption. Alternatively, the gaseous fluid can be heated by any means familiar to those skilled in the art of process temperature control. Such methods include the use of resistive heaters, inductive heaters, radiative heaters, heat exchangers using secondary heating or cooling reservoirs in conjunction with a heat exchanging assembly, and the like. The temperature of the substrate or of the gaseous fluid itself can be measured for the purposes of process control, the process control employed as a controlling the thermal energy imparted to the moveable substrate or the gaseous fluid itself. Temperature measurement methods are well known and include the use of infrared thermocouples and infrared temperature sensors, thermocouples, resistive thermal detectors, temperature sensitive diodes, temperature controlled oscillators whose oscillation frequency changes with temperature, temperature sensitive fluorescence measurements where the decay time of fluorescence varies with temperature and any other methods known to those skilled in the art of temperature measurement. Without wishing to be bound by theory, it is considered that an aerosol particle can be thought of as a very large molecular assembly. Pneumatic levitation with radial flow is used, then, as method for exposing the moveable substrate surface to a flux of particles or a flux of large molecular assemblies. The conditions of radial flow during pneumatic levitation are favorable for the formation of uniform particulate layer from an aerosol because, as previously discussed, the exposure of the moveable substrate surface (which equals the particle flux to the surface multiplied by the amount of time the surface is in contact with the particle flux) is uniform over the entire surface area that is exposed to radial flow. The aerosol fluid flow and subsequent aerosol jet emitted from fluid collimating conduit 14 can be compound fluid flows produced by apparatus 20 and can be collinear or coaxial and the compound fluid flow may consist of more than two chemically distinct composition regions that are temporally separated thereby depositing more than one type of aerosol on the surface of the moveable substrate. The temporal variation in the composition of the compound jet is achieved through the use of temporal—that is, time based-sequencing of valves of processing apparatus 150 by employing valve sequence control unit 1555 to control the chemical composition of the fluid passing through apparatus 20.

The use of a repeat sequence in steps 74-78 in process 70 for exposure of a levitated substrate to a reactive fluid flow is not specific to the type or state of matter of the reactive fluid. For example, the reactive fluid can be comprised of aerosol particles, liquid or solid or mixed liquid and solid. The temporally variable exposure of the surface of the moveable substrate to aerosols of different chemical compositions can be advantageous in a number of processes including monolayer formation processes using aerosol based precursors. Thus the use of aerosol deposition by the inventive pneumatic levitation deposition method allows the construction of multilayer particular structures for various technical applications. For example, the method disclosed in exemplary process example 6 can be employed to prepare a multilayer structure of nanoparticulate materials that allows the formation of nanoparticulate composite materials with surface unique properties. In one example embodiment, a multilayer varnish that is optically transparent can be applied by such a method on optics to furnish anti-reflective coatings or anti-scratch coating. In another embodiment, a multilayer varnish that is optically transparent can be applied by such a method on an integrated thus providing encapsulation for integrated or other electronic components for improved environmental robustness.

Pneumatic levitation with radial flow can be used concurrently with aerosol deposition to provide a method for thermally isolating the moveable substrate and its surfaces from physical contact with any thermal sinks, thereby enabling effective temperature control for both heating and cooling—especially during the use of optional processing steps involving high photon flux radiative exposures such as optionally radiative curing with either IR or UV radiation. The use of processing steps involving the use of radiation of all types for the purposes of stabilizing and inducing further changes in material properties of deposited films during pneumatic levitation is specifically contemplated and such radiation sources may include ionizing radiation sources such as x-rays, gamma rays, and the like as well as lower photon energy radiation types such as ultraviolet radiation and infrared radiation. The use of microwave radiation is specifically contemplated as applied to the pneumatic levitation of a moveable substrate with a levitation stabilizing structure. The rapid radial flow in the volume between the moveable support surface with its levitation stabilization structure and the gas-emanating stationary support enables excellent cleanliness and low contamination during deposition processes executed at elevated temperatures as well as the capability to induce rapid cooling once heating is discontinued. The effluent fluid from the process is optionally managed by the use of a supplemental laminar flow of inert gas from process apparatus element 1520 around the moveable substrate and stationary support for the purpose of removing the gaseous process effluent from the region proximate to the moveable substrate and the stationary support assembly for disposal.

Exemplary Process Embodiment 7

A moveable substrate with a levitation stabilizing structure employed in a deposition process with pneumatic levitation.

Another method embodiment a moveable substrate with levitation stabilizing structure is placed in a processing apparatus 150 upon a gas-emanating stationary support through which fluid will flow and the pneumatically levitated moveable substrate is exposed to thermal energy and a reactive precursor for the purpose of depositing a thin film on the surface of the moveable substrate by thermal decomposition of the reactive precursor on the surface of the moveable substrate and additionally carrying out thermally promoted processes like thermal dehydration, thermal polymerization, or thermal treatment for the purpose of changing crystallite size or relieving stress in the moveable substrate with the deposited thin film. The process apparatus 150 is equipped with a supplemental laminar gas flow for the purpose of managing the gaseous process effluent stream. The effluent fluid from the process is managed by the use of a supplemental laminar flow of inert gas around the moveable substrate and stationary support for the purpose of removing the gaseous process effluent from the process chamber for disposal. The moveable substrate is placed so that the levitation stabilizing structure is facing in an opposing manner the gas-emanating stationary support and the moveable support is pneumatically levitated by a gaseous fluid. The stationary support assembly 12 through which fluid will flow contains a fluid collimating conduit 14 in fluid communication with a gas that can be chemically reactive with the substrate surface. The fluid can be chemically oxidizing, chemically reducing or chemically inert. An example of a chemically oxidizing gas is oxygen gas. An example of chemically reducing gas is hydrogen. Examples of chemically inert gases include helium, neon, argon, krypton, or xenon or nitrogen. The gas flow optionally contains a reactive precursor that can be added into the gas flowing through the stationary support by coaxial or a compound fluid flow formation employing apparatus 20—the overall composition of the gaseous process fluid being adjusted by adjusting the composition of the compound fluid by valve sequencing control unit 1555 and control valves 1560 according to the desired deposition process. The flow of the gaseous fluids through the chamber and the flow of the gaseous fluids through the stationary support assembly 12 in fluid communication with one or more gas sources is controlled by any means known to those skilled in controlling gas flow. Such means include the measurement of gas flow and a feedback loop that includes a means for controlling the gas flow. Gas flow measurement methods include pitot tubes, rotameters, mass flow meters and the like. Gas flow control methods include the use of variable conductance valves and variable conductance orifices whose gas flow properties can be controlled by an external means. Gas flow control methods also include pressure control measurements where the gas pressure across, for example, an orifice of known conductance, can be used to regulate gas flow through said orifice of known conductance. The temperature of the moveable substrate with levitation stabilizing structure and optionally the temperature of the stationary support assembly 12 through which fluid will flow can be regulated by a temperature control loop contained in moveable substrate and stationary support temperature control unit 1550. For example, the stationary fluid emitting support 12 can be a stationary IR transmitting gas emanating support is made of, for example—vitreous silicon oxide or some other infrared transmitting (IR) material, and equipped with an infrared radiation source such as a high intensity T-3 quartz halogen lamp with suitable reflectors positioned to provide a uniform radiation field on the surface of the opposing moveable substrate when IR radiation is transmitted through the IR transmitting gas-emanating stationary support onto the opposing surface of the moveable substrate surface. Optionally, the moveable substrate with a levitation stabilizing structure can be irradiated with, for example, a T-3 quartz halogen irradiation source, from the opposite side of the moveable substrate—that is, the side of the moveable substrate that does not face the gas-emanating stationary support thereby utilizing absorption of infrared radiation on the side opposite the levitation stabilizing structure as a means for controlling the temperature of the pneumatically levitated moveable substrate. Alternatively, the gaseous fluid or plurality of gaseous fluid employed in the process can be heated by any means familiar to those skilled in the art of process temperature control optionally additionally employing fluid temperature and pressure control units 1545. Such methods include the use of resistive heaters, inductive heaters, radiative heaters, heat exchangers using secondary heating or cooling reservoirs in conjunction with a heat exchanging assembly, and the like. The temperature of the moveable substrate or of the gaseous fluid itself or of both the moveable substrate and the gaseous fluid can be measured for the purposes of process control by a feedback loop controlling the thermal energy imparted to the moveable substrate or the gaseous fluid itself and thereby controlling the temperature of the gaseous fluid and/or the moveable substrate. Temperature measurement methods are well known and include the use of infrared thermocouples and infrared temperature sensors, thermocouples, resistive thermal detectors, temperature sensitive diodes, temperature controlled oscillators whose oscillation frequency changes with temperature, temperature sensitive fluorescence measurements where the decay time of fluorescence varies with temperature and any other methods known to those skilled in the art of temperature measurement. Methods for constructing feedback loops for process control of process variable such as temperature and gas flow are well known to those skilled in the art of process control. Many different volatile precursors can be used as reactive precursors to form compound fluid flows with a chemically inert gas stream with the provision that the reactive precursors will thermally decompose on the surface of the moveable substrate with the formation of the desired thin film composition. Deposition reactions of this type are well known to those skilled in the art of chemical vapor deposition. Examples of reactive precursor molecules include volatile compounds like silanes which are used to prepare silicon films, organosilanes which can be used to prepare silicon carbide films, organosilanes containing silicon nitrogen bonds which can be used to prepare silicon nitride films, alkoxysilanes containing silicon-oxygen bonds which can be used to prepare silicon oxide films, and other volatile inorganic and organometallic compounds familiar to those skilled in the art of chemical vapor deposition. Other examples of reactive molecules that can be incorporated into a gaseous fluid flow employed for pneumatic levitation are water and ozone. In some applications more than one reactive species can be desired to prepare a film of the desired stoichiometry. The reactive precursors can be delivered into the reaction volume between the moveable substrate and the stationary support by a compound jet formed using fluid emanating from apparatus 20 that is in fluid communication with fluid collimating conduit 14 of stationary fluid emitting support 12 through which fluid will flow. The reactive precursor compound fluid flow can be formed through the use of the apparatus 20 and the compound fluid flow can be collinear or coaxial, and the compound fluid flow may consist of more than two chemically distinct composition regions that are temporally separated thereby exposing the surface of the pneumatically levitating moveable substrate to more than one type of reactive precursor on the surface of the moveable substrate in a temporally sequential manner.

FIG. 14 discloses the process steps carried out in processing apparatus 150 for exposure of a fluidically levitated substrate with levitation stabilizing structure to a reactive fluid flow. It is also recognized that the repeat sequence of step 74 through 78 can allow the surface of the moveable substrate with levitation stabilizing structure to be exposed to two or more chemically different fluid flows during the process sequence—something that is particularly important in constructing multilayer films and coatings. The inclusion of repeating sequences of steps 74 through 78 in process step diagram 70 is within the spirit and scope of the disclosed exemplary process embodiments 1 through 7. The temporally variable exposure of the surface of the moveable substrate to gaseous, thermally decomposable, reactive precursors of different chemical compositions allows the construction of multilayer structures for various technical applications. It is recognized that through the use of apparatus 20 in process apparatus 150 several different gaseous, thermally decomposable, reactive precursors can be used to form several different types of chemically distinct compound jets from chemically distinct compound fluid flows containing the different gaseous reactive precursors to enable the formation of thin films of complex stoichiometry involving multiple chemically distinct elements. It is also recognized that a plurality of gaseous, thermally decomposable or thermally activated, reactive precursors can be used to form compound jets from compound fluid flows to enable the formation multilayered films of a highly complex structure with unique optical and electrical properties. Pneumatic levitation with radial flow is used as method for thermally isolating the moveable substrate and its surfaces from physical contact with any thermal sinks, thereby enabling the most effective use of substrate heating to promote thermal decomposition of the reactive precursors on the substrate surface for the purpose of film formation. The rapid radial flow in the volume between the moveable support surface with its levitation stabilization structure and the gas-emanating stationary support enables excellent cleanliness during the heating process as well as the capability to induce rapid cooling once heating is discontinued. U.S. Pat. No. 5,370,709 has previously disclosed deposition and thermal annealing processes using pneumatic levitation but the apparatus disclosed therein required the use of physical stops to prevent the substrate from sliding off the "suction plate". Therefore deposition and annealing during pneumatic levitation where the substrate position was stabilized by the use of a levitation stabilizing structure and pneumatic levitation was achieved without the use of substrate motion restraining structures such as physical stops on the gas-emanating stationary support was not contemplated in U.S. Pat. No. 5,370,709.

Example 17

Atomic layer deposition process embodiment at atmospheric pressure on a moveable substrate using Bernoulli levitation with a levitation stabilizing structure.

A planar 8"×8"×1" stationary fluid emitting support through which fluid will flow made of anodized aluminum was machined with a single 4 mm ID fluid collimating conduit in the center of the plate. An infrared heating system was facing the fluid emitting surface of the stationary fluid emitting plate to allow heating of the levitating moveable substrate. The fluid collimating conduit in the stationary fluid emitting support was in fluid communication with a pressurized manifold containing pressurized fluid. The valves, pressure regulator, mass flow controllers, power supplies, tubing, pulse generator and waveform generator are commercially available. The devices used in this example are cited below. The pressurize manifold was used to deliver argon gas as the main gaseous fluid for moveable substrate levitation and the pressurized manifold containing pressurized gas was also used to deliver chemically reactive gasses into the levitation gas flow by switchable three way valves (Gems Sensors and Controls 3 way valve model A3314-2m-AD-V-VO-C204). The three-way valve and associated electronics had a minimum switching time of around 50 msec, below which the voltage pulse time was too short to initiate a change in valve position. Argon gas saturated with titanium tetrachloride vapor or water vapor was prepared by use of bubblers that were connected to three way valves as shown in FIG. 23. Referring to FIG. 23, the stationary support 12 through which fluid will flow with 4 mm ID fluid collimating conduit is in fluid communication with two three way valves 96 and also in fluid communication with main levitation fluid regulator 1600. The main levitation fluid regulator controls the majority of the flow through fluid collimating conduit 14 of stationary support 12 to establish fluidic levitation of moveable substrate 10 with a gas. The pressurized-gas or pressurized inert gas source 1575 supplies the main regulator 1600 as well as two mass flow controllers 1560. A three way valve 96 is used to direct the flow from the each mass flow controller so that the inert gas flow exiting valve 96 is either chemically inert or saturated with a reactive chemical species by either reactive precursor source 1 1565 or reactive precursor source 2 1570. Again referring to FIG. 23, when mass flow controller 1560 is operational, the reactive precursor sources 1565 and 1570 are pressurized and the three way valve 96 serves to determine whether the inert gas flow exiting three way valve 96 passes through the reactive precursor source or not. Reactive precursor sources 1 and 2 are room temperature bubblers containing deionized water and titanium tetrachloride, respectively. 99% pure titanium tetrachloride was obtained from Fluka Chemicals. The moveable substrate with levitation stabilizing structure was comprised of a 150 mm diameter silicon wafer with a 225 micron thick resist ring prepared from Dupont WBR2120 dry film resist. The resist ring had an ID of 128 mm and an OD of 130 mm and was prepared as described in example 14. The moveable substrate was placed over the fluid collimating conduit of the stationary fluid emitting support and an argon gas flow was initiated using approximately 9 psig levitation pressure (about 70 slpm Ar). Mass flow controllers were used to provide an initial flow of 1 slpm argon through each 3 way valve that served to establish an inert gas flow through the delivery lines for the reactive gases as well as pressurize the reactive precursor sources for delivery of the chemically reactive fluid into the main inert gas flow. The infrared heating system with T3 lamps was used to bring the levitating moveable substrate wafer to approximately 160+−10 degrees C. The moveable substrate with levitation stabilizing structure showed stable pneumatic levitation with limited oscillatory lateral motion even at the elevated process operating temperature. After temperature stabilization, an atmospheric pressure atomic layer deposition pulse sequence was initiated using a multichannel digital signal generator (Stanford Research Instruments DG535 Delay/

Pulse Generator) to control the sequencing of the three way valves. Repetitive valve sequencing was accomplished by triggering the multichannel digital signal generator with an external logic signal furnished by a digital waveform generator (Wavetek model 29A). The pneumatically levitated moveable substrate with levitation stabilizing structure was exposed to 100 atomic layer deposition cycles comprised of a 500 msec water pulse, a 500 msec inert gas purge pulse, a 150 msec titanium tetrachloride pulse, and a 500 msec inert gas purge pulse. After the atomic layer deposition cycles were complete, the infrared heating lamp was turned off and the moveable substrate was allowed to cool while pneumatically levitating. After cooling the levitation was discontinued and the sample was removed for examination by variable wavelength ellipsometry. Ellipsometry showed that a 63±2 Å TiO2 film was deposited on the surface of the levitated substrate with a refractive index of 2.32 at 633 nm demonstrating that rapid atomic layer deposition processes can be performed at atmospheric pressure while pneumatically levitating a moveable substrate with a levitation stabilizing structure. The atomic layer deposition process disclosed in example 17 is approximately 10 times faster than the low-pressure processes disclosed in the open scientific literature by Sinha et al (loc cit).

Example 17 discloses the atomic layer deposition of titanium oxide at atmospheric pressure using outward radial flow over the surface of a moveable substrate whose pneumatic levitation is stabilized using a levitation stabilizing structure. The temperature of the moveable substrate during the process was not optimized. The length of the timed pulses of water, argon inert gas, and titanium tetrachloride were not optimized and the flow rate of argon carrier gas through the water and titanium tetrachloride sources was 0.5 slpm. Reduction in the length of the timed pulses employed during the deposition process can be achieved by varying the gas flow rate through the reactive species source bubblers for water and $TiCl_4$, increasing the temperature of reactive species source bubblers for water and $TiCl_4$. As the overall concentration of reactive species in a timed gas flow pulse increases, the pulse length can be decreased thereby reducing the overall cycle time required to execute a sequence of 4 consecutive gas pulses across the surface of the moveable substrate. Faster cycle times are also enabled by valves with faster valve switching times between states so that shorter gas pulses can be executed during the process. Example 17 illustrates a method of controlling the fluid flow employed for an atmospheric pressure atomic layer deposition process with fluidic levitation to provide different fluid for time periods of less than five hundred milliseconds. In one embodiment of the atmospheric pressure deposition method illustrated by example 17 the fluid flowing through the stationary support is controlled to sequentially provide first and second fluid flows of different fluids within the time period required for the fluid to propagate from the fluid collimating conduit to the substrate edge so that at least two different fluids are present in the volume gap between the moveable substrate and the stationary support at the same time.

In one embodiment of the atmospheric pressure atomic layer deposition method illustrated by example 17 the fluid flowing from the stationary support impinging at a location on the substrate is controlled so the time period between different fluid pulses is shorter than the time required for the fluid to propagate from the columnar collimated fluid jet impingement location on the substrate to an edge of the substrate. In a further embodiment of an atmospheric pressure atomic layer deposition method the fluid flow impinging on the moveable substrate is controlled to sequentially provide first, second, and third fluid flows of different fluids within the time period required for the fluid flow to propagate from the impingement location of the fluid on the substrate to the edge of the substrate so that at least three different fluids are present in the gap volume between the moveable substrate and the stationary support at the same time and wherein the first and third fluid include different reactive fluids and the second fluid is an inert fluid. The embodiments of an atmospheric pressure atomic layer deposition method with fluidic levitation of a moveable substrate are possible because of the high fluid velocity in the volume gap between the moveable substrate and the stationary support combined with high speed valve switching and provides a significant advantage in overall processing speed for the manufacture of single layer and multilayer thin films by atomic layer deposition or other deposition methods employing volatile precursors.

In an embodiment of the invention, the use of valves that can be switched at a millisecond time rate allows the user to switch between gases at a very rapid rate, thus enabling not only a fast deposition but rapid formation of multilayer structures and is particularly useful for the manufacturing of corrosion-resistant multilayer thin films of the type disclosed in, for example U.S. Pat. No. 8,567,909. The deposition cycle rate can be as fast as 10 or 100 complete deposition cycles per second and is therefore well suited to the preparation of complex multilayer structures by atomic layer deposition methods of manufacturing. The deposition speed is ultimately limited by mass transport to the moveable substrate surface associated with gas mean free path and gas diffusion to and from the moveable substrate surface through boundary layers under radial flow conditions. The invention thus allows the development of high-speed atomic layer deposition cluster tools for single wafer and single substrate processing in a manufacturing environment. Deposition tools for atomic layer deposition that operate below atmospheric pressure often have large chamber volumes and, as a result, must include exposure and purge times that allow the laminar flow of the gas in the chamber to sweep the reactive fluid flow in and out of the chamber—a process that often takes seconds to accomplish even at high flow rates. Thus, rapid switching time of the present invention are not accessible because the turnover time of the chamber is large due to the larger chamber volume. Gas bearing type atmospheric pressure atomic layer deposition tools have quite small effective chamber volumes but are limited in physical size by the complicated construction of the deposition tool gas bearing structure for reactive fluid exposure (the deposition head). Gas bearing type atmospheric pressure deposition tools have difficulty with topographically complex surfaces and do not coat circular substrates well. In spite of the obvious advantages of multiple exposure regions in gas bearing deposition methods like spatial atomic layer deposition, the gas bearing deposition head is limited in size because of the difficulty associated with the mechanical construction of a large deposition head with multiple deposition zones and the deposition cycle throughput is limited by the speed at which the gas bearing device can be translated over the substrate. The present invention is significantly less expensive, easier to implement, and is not bound by the aforementioned limitations.

The invention has been described in detail with particular reference to certain embodiments thereof, but it will be understood that variations and modifications can be effected within the scope of the invention.

The invention claimed is:

1. A method for depositing a thin film on a moveable substrate using atmospheric pressure atomic-layer deposition, comprising:
providing a chamber having an atmosphere and a stationary support located in the chamber;
locating the moveable substrate in a spatial relationship with the stationary support; and
providing a pressurized collinear compound fluid flow including an inert fluid surrounding a reactive fluid flowing simultaneously through a conduit and through an opening in the stationary support, wherein the collinear compound fluid flow impinges on at least a portion of the moveable substrate to fluidically levitate the moveable substrate and expose the moveable substrate to the reactive fluid in the collinear compound fluid flow thereby depositing a thin film on the moveable substrate by an atomic-layer deposition process;
wherein the inert fluid and the reactive fluid in the collinear compound fluid flow are in contact with each other and are compositionally segregated from each other and flow through the conduit along substantially parallel paths in the same flow direction such that a chemical composition of the fluid in the collinear compound fluid flow varies within a cross-section of the collinear compound fluid flow;
wherein the inert fluid in the collinear compound fluid flow shields an interior surface of the conduit from the reactive gas to substantially prevent deposition on the interior surface of the conduit; and
wherein the moveable substrate undergoes fluidic levitation due to a Bernoulli lift force caused by the impingement of the collinear compound fluid flow onto the moveable substrate.

2. The method of claim 1, wherein providing the pressurized collinear compound fluid flow includes forming the compound fluid flow as two fluid flows that are axially collinear.

3. The method of claim 1, wherein providing the pressurized collinear compound fluid flow includes forming the collinear compound fluid flow as two fluid flows that are co-axial.

4. The method of claim 1, further comprising controlling the pressurized collinear compound fluid flow temporally to intersperse a single-fluid flow with a fluid flow having two or more fluids.

5. The method of claim 4, wherein the single-fluid flow is an inert fluid.

6. The method of claim 4, further comprising controlling the pressurized collinear compound fluid flow to alternately provide an inert fluid surrounding a first reactive fluid and an inert fluid surrounding a second reactive fluid different from the first reactive fluid.

7. The method of claim 6, further comprising interspersing the inert single-fluid flow between the first reactive fluid and the second reactive fluid.

8. The method of claim 1, wherein providing the pressurized collinear compound fluid flow includes forming the collinear compound fluid flow as a columnar compound fluid jet.

9. The method of claim 8, wherein the columnar compound fluid jet is a co-axial fluid jet.

10. The method of claim 8, wherein the columnar compound fluid jet includes at least two fluid jets having distinct axes.

11. The method claim 1, further comprising directing the pressurized collinear compound fluid flow orthogonal to the substrate.

12. The method of claim 1, further comprising directing the pressurized collinear compound fluid flow in a direction that is tilted with respect to the substrate.

13. The method of claim 1, wherein the pressurized collinear compound fluid includes gasses.

14. The method of claim 4, wherein controlling the pressurized collinear compound fluid flow to alternately provide an inert fluid surrounding a first reactive fluid and an inert fluid surrounding a second reactive fluid different from the first reactive fluid includes providing the second reactive fluid within a time period of less than five hundred milliseconds after the first reactive fluid.

15. The method of claim 4, wherein controlling the pressurized collinear compound fluid flow to alternately provide an inert fluid surrounding a first reactive fluid and an inert fluid surrounding a second reactive fluid different from the first reactive fluid includes providing the second reactive fluid within a time period of less than ten milliseconds after the first reactive fluid.

16. The method of claim 1, wherein the pressurized collinear compound fluid flow propagates from a location at which the fluid flow first impinges on the substrate portion, the method further comprising controlling the pressurized compound fluid flow to provide fluid flow for a time period less than the time required for the fluid to propagate from the first impingement location to an edge of the substrate.

17. The method of claim 16, further comprising controlling the pressurized collinear compound fluid flow to sequentially provide first and second fluid flows of different fluids within the time period so that at least two different fluids are present between the first impingement location and the edge of the substrate at the same time.

18. The method of claim 16, further including controlling the pressurized collinear compound fluid flow to sequentially provide first, second, and third fluid flows of different fluids within the time period so that at least three different fluids are present between the first impingement location and the edge of the substrate at the same time, wherein the first and third fluids include different reactive fluids and the second fluid is an inert fluid.

19. The method of claim 1, wherein a levitation stabilizing structure is attached to and protrudes from a surface of the moveable substrate defining an enclosed interior impingement area of the moveable substrate, and wherein fluid flow impinging on the levitation stabilizing structure restricts a lateral motion of the moveable substrate during levitation.

* * * * *